(12) United States Patent
Towfighian et al.

(10) Patent No.: US 12,091,313 B2
(45) Date of Patent: Sep. 17, 2024

(54) ELECTRODYNAMICALLY LEVITATED ACTUATOR

(71) Applicant: The Research Foundation for The State University of new York, Binghamton, NY (US)

(72) Inventors: Shahrzad Towfighian, Vestal, NY (US); Mark Pallay, Binghamton, NY (US); Meysam Daeichin, Endicott, NY (US); Ronald Miles, Newark Valley, NY (US)

(73) Assignee: The Research Foundation for The State University of New York, Binghamton, NY (US)

( * ) Notice: Subject to any disclaimer, the term of this patent is extended or adjusted under 35 U.S.C. 154(b) by 1059 days.

(21) Appl. No.: 17/000,634

(22) Filed: Aug. 24, 2020

(65) Prior Publication Data
US 2021/0061648 A1    Mar. 4, 2021

Related U.S. Application Data

(60) Provisional application No. 62/891,915, filed on Aug. 26, 2019.

(51) Int. Cl.
*B81B 7/02* (2006.01)
*B81B 3/00* (2006.01)
*B81B 7/00* (2006.01)
*H02N 2/18* (2006.01)
*H01H 59/00* (2006.01)

(52) U.S. Cl.
CPC .............. *B81B 7/02* (2013.01); *B81B 3/0021* (2013.01); *B81B 7/0022* (2013.01); *B81B 7/008* (2013.01); *H02N 2/181* (2013.01); *H02N 2/186* (2013.01); *H01H 59/0009* (2013.01)

(58) Field of Classification Search
CPC ....... B81B 7/02; B81B 3/0021; B81B 7/0022; B81B 7/008; B81B 2201/0235; B81B 2201/0242; B81B 2201/0264; B81B 2203/053; B81B 3/0086; H02N 2/181; H02N 2/186; H02N 1/006; H01H 59/0009
See application file for complete search history.

(56) References Cited

U.S. PATENT DOCUMENTS 3,937,917 A   2/1976   Consoli
3,955,426 A   5/1976   Klinchuch
(Continued)

*Primary Examiner* — Ahmed M Saeed
(74) *Attorney, Agent, or Firm* — Hoffberg & Associates; Steven M. Hoffberg

(57) ABSTRACT

A microelectromechanical actuator, comprising: a substrate, having a surface; a conductive beam suspended parallel to the substrate, displaceable along an axis normal to the surface of the substrate; a center electrode on the substrate under the beam; a pair of side electrodes on the substrate configured, when charged, to exert an electrostatic force normal to the surface of the substrate on the beam that repulses the beam from the substrate, and exerts a balanced electrostatic force on the beam in a plane of the surface of the substrate, the center conductive electrode being configured to shield the beam from electrostatic forces induced by the side electrodes from beneath the beam, and the center electrode being configured to have a voltage different from a voltage on the beam, to thereby induce an attractive electrostatic force on the beam.

20 Claims, 41 Drawing Sheets

(56) References Cited

U.S. PATENT DOCUMENTS

| | | |
|---|---|---|
| 4,074,580 A | 2/1978 | Boltinghouse et al. |
| 4,521,854 A | 6/1985 | Rhim et al. |
| 4,553,917 A | 11/1985 | Lee |
| 4,802,680 A | 2/1989 | Fuchs |
| 4,929,400 A | 5/1990 | Rembaum et al. |
| 4,981,625 A | 1/1991 | Rhim et al. |
| 4,990,813 A | 2/1991 | Paramo |
| 5,015,528 A | 5/1991 | Pinneo |
| 5,015,906 A | 5/1991 | Cho et al. |
| 5,136,162 A | 8/1992 | Miyamoto et al. |
| 5,150,392 A | 9/1992 | Hohn et al. |
| 5,162,969 A | 11/1992 | Leung |
| 5,166,516 A | 11/1992 | Kajimura |
| 5,168,159 A | 12/1992 | Yagi |
| 5,196,999 A | 3/1993 | Abe |
| 5,206,504 A | 4/1993 | Sridharan |
| 5,215,688 A | 6/1993 | Williamson et al. |
| 5,216,631 A | 6/1993 | Sliwa, Jr. |
| 5,231,286 A | 7/1993 | Kajimura et al. |
| 5,245,863 A | 9/1993 | Kajimura et al. |
| 5,247,144 A | 9/1993 | Abe |
| 5,274,230 A | 12/1993 | Kajimura et al. |
| 5,289,004 A | 2/1994 | Okada et al. |
| 5,298,975 A | 3/1994 | Khoury et al. |
| 5,307,311 A | 4/1994 | Sliwa, Jr. |
| 5,331,275 A | 7/1994 | Ozaki et al. |
| 5,336,887 A | 8/1994 | Yagi et al. |
| 5,338,932 A | 8/1994 | Theodore et al. |
| 5,374,801 A | 12/1994 | Leung et al. |
| 5,394,741 A | 3/1995 | Kajimura et al. |
| 5,436,448 A | 7/1995 | Hosaka et al. |
| 5,461,605 A | 10/1995 | Takimoto et al. |
| 5,464,977 A | 11/1995 | Nakagiri et al. |
| 5,467,642 A | 11/1995 | Hosaka et al. |
| 5,481,528 A | 1/1996 | Eguchi et al. |
| 5,515,719 A | 5/1996 | Lindsay |
| 5,517,027 A | 5/1996 | Nakagawa et al. |
| 5,565,987 A | 10/1996 | Jain et al. |
| 5,583,446 A | 12/1996 | Takeuchi et al. |
| 5,585,722 A | 12/1996 | Hosoki et al. |
| 5,610,898 A | 3/1997 | Takimoto et al. |
| 5,633,455 A | 5/1997 | Quate |
| 5,653,175 A | 8/1997 | Milligan |
| 5,675,154 A | 10/1997 | Lindsay et al. |
| 5,729,026 A | 3/1998 | Mamin et al. |
| 5,744,704 A | 4/1998 | Hu et al. |
| 5,783,335 A | 7/1998 | Laia, Jr. et al. |
| 5,789,843 A | 8/1998 | Higuchi et al. |
| 5,804,709 A | 9/1998 | Bourgoin et al. |
| 5,804,710 A | 9/1998 | Mamin et al. |
| 5,822,285 A | 10/1998 | Rugar et al. |
| 5,854,487 A | 12/1998 | Braunstein et al. |
| 5,856,617 A | 1/1999 | Gurney et al. |
| 5,856,672 A | 1/1999 | Ried |
| 5,866,021 A | 2/1999 | Yagi et al. |
| 5,866,807 A | 2/1999 | Elings et al. |
| 5,880,360 A | 3/1999 | Hu et al. |
| 5,923,637 A | 7/1999 | Shimada et al. |
| 5,969,848 A | 10/1999 | Lee et al. |
| 5,992,233 A | 11/1999 | Clark |
| 6,004,444 A | 12/1999 | Aksay et al. |
| 6,057,546 A | 5/2000 | Braunstein et al. |
| 6,066,265 A | 5/2000 | Galvin et al. |
| 6,067,858 A | 5/2000 | Clark et al. |
| 6,076,397 A | 6/2000 | Binnig et al. |
| 6,100,524 A | 8/2000 | Yagi et al. |
| 6,101,164 A | 8/2000 | Kado et al. |
| 6,172,506 B1 | 1/2001 | Adderton et al. |
| 6,189,374 B1 | 2/2001 | Adderton et al. |
| 6,228,248 B1 | 5/2001 | Aksay et al. |
| 6,242,736 B1 | 6/2001 | Honma et al. |
| 6,250,156 B1 | 6/2001 | Seshia et al. |
| 6,276,147 B1 | 8/2001 | Sgarbi et al. |
| 6,286,323 B1 | 9/2001 | Sgarbi et al. |
| 6,287,765 B1 | 9/2001 | Cubicciotti |
| 6,291,822 B1 | 9/2001 | Umemoto et al. |
| 6,296,779 B1 | 10/2001 | Clark et al. |
| 6,310,342 B1 | 10/2001 | Braunstein et al. |
| 6,369,006 B1 | 4/2002 | Sgarbi et al. |
| 6,383,823 B1 | 5/2002 | Takahashi et al. |
| 6,452,170 B1 | 9/2002 | Zypman et al. |
| 6,469,825 B1 | 10/2002 | Digonnet et al. |
| 6,470,738 B2 | 10/2002 | Narita et al. |
| 6,484,539 B1 | 11/2002 | Nordine et al. |
| 6,489,611 B1 | 12/2002 | Aumond et al. |
| 6,490,081 B1 | 12/2002 | Feillens et al. |
| 6,530,266 B1 | 3/2003 | Adderton et al. |
| 6,541,892 B2 | 4/2003 | Hoen |
| 6,547,940 B2 | 4/2003 | Aksay et al. |
| 6,549,703 B1 | 4/2003 | Tanielian et al. |
| 6,592,689 B2 | 7/2003 | Hays |
| 6,601,888 B2 | 8/2003 | McIlwraith et al. |
| 6,626,039 B1 | 9/2003 | Adams et al. |
| 6,642,517 B1 | 11/2003 | Ghislain et al. |
| 6,672,144 B2 | 1/2004 | Adderton et al. |
| 6,677,697 B2 | 1/2004 | Struckmeier et al. |
| 6,679,118 B1 | 1/2004 | Esashi et al. |
| 6,681,094 B2 | 1/2004 | Horrall et al. |
| 6,684,676 B2 | 2/2004 | Oumi et al. |
| 6,686,299 B2 | 2/2004 | Montemagno et al. |
| 6,721,093 B2 | 4/2004 | Feillens et al. |
| 6,762,025 B2 | 7/2004 | Cubicciotti |
| 6,781,750 B2 | 8/2004 | Feillens et al. |
| 6,788,796 B1 | 9/2004 | Miles et al. |
| 6,810,720 B2 | 11/2004 | Adderton et al. |
| 6,827,979 B2 | 12/2004 | Mirkin et al. |
| 6,828,786 B2 | 12/2004 | Scherer et al. |
| 6,841,917 B2 | 1/2005 | Potter |
| 6,851,301 B2 | 2/2005 | Kim et al. |
| 6,856,067 B2 | 2/2005 | Frey et al. |
| 6,856,145 B2 | 2/2005 | Pelz et al. |
| 6,858,184 B2 | 2/2005 | Pelrine et al. |
| 6,859,542 B2 | 2/2005 | Johannsen et al. |
| 6,862,924 B2 | 3/2005 | Xi et al. |
| 6,880,388 B1 | 4/2005 | Kley |
| 6,900,440 B2 | 5/2005 | Reed et al. |
| 6,904,791 B2 | 6/2005 | Honma |
| 6,906,789 B2 | 6/2005 | Carter et al. |
| 6,906,855 B2 | 6/2005 | Feillens et al. |
| 6,923,044 B1 | 8/2005 | Kley |
| 6,935,167 B1 | 8/2005 | Sahin et al. |
| 6,950,175 B2 | 9/2005 | Galburt et al. |
| 6,955,078 B2 | 10/2005 | Mancevski et al. |
| 6,963,653 B1 | 11/2005 | Miles |
| 6,972,896 B2 | 12/2005 | Feillens et al. |
| 6,986,280 B2 | 1/2006 | Muckenhirm |
| 7,010,949 B2 | 3/2006 | Oumi et al. |
| 7,013,717 B1 | 3/2006 | Struckmeier et al. |
| 7,017,398 B2 | 3/2006 | Adderton et al. |
| 7,019,955 B2 | 3/2006 | Loeb et al. |
| 7,023,220 B2 | 4/2006 | Pelz et al. |
| 7,036,357 B2 | 5/2006 | Adderton et al. |
| 7,044,007 B2 | 5/2006 | Struckmeier et al. |
| 7,053,520 B2 | 5/2006 | Zetti et al. |
| 7,061,964 B2 | 6/2006 | Kawasaki et al. |
| 7,066,015 B2 | 6/2006 | Honma |
| 7,070,665 B2 | 7/2006 | Hays |
| 7,076,996 B2 | 7/2006 | Markakis et al. |
| 7,081,624 B2 | 7/2006 | Liu et al. |
| 7,116,462 B2 | 10/2006 | Ikeda |
| 7,137,292 B1 | 11/2006 | Kley |
| 7,155,964 B2 | 1/2007 | Huang et al. |
| 7,163,658 B2 | 1/2007 | Bension |
| 7,179,356 B2 | 2/2007 | Aksay et al. |
| 7,200,493 B2 | 4/2007 | Nilsson et al. |
| 7,204,131 B2 | 4/2007 | Adderton et al. |
| 7,225,674 B2 | 6/2007 | Clark |
| 7,242,129 B2 | 7/2007 | Kim et al. |
| 7,252,001 B2 | 8/2007 | Boletis et al. |
| 7,253,407 B1 | 8/2007 | Kley |
| 7,253,488 B2 | 8/2007 | Zhan et al. |
| 7,256,927 B2 | 8/2007 | Selbrede |
| 7,260,959 B2 | 8/2007 | Chang et al. |
| 7,262,984 B2 | 8/2007 | Schindler et al. |

(56) References Cited

U.S. PATENT DOCUMENTS

| | | |
|---|---|---|
| 7,279,686 B2 | 10/2007 | Schneiker |
| 7,280,290 B2 | 10/2007 | Araki et al. |
| 7,281,419 B2 | 10/2007 | Wang et al. |
| 7,297,946 B2 | 11/2007 | Xi et al. |
| 7,328,446 B2 | 2/2008 | Binnig et al. |
| 7,344,756 B2 | 3/2008 | Mirkin et al. |
| 7,359,037 B2 | 4/2008 | Carter et al. |
| 7,372,548 B2 | 5/2008 | Carter et al. |
| 7,373,806 B2 | 5/2008 | Kitajima et al. |
| 7,387,035 B2 | 6/2008 | Struckmeier et al. |
| 7,393,699 B2 | 7/2008 | Tran |
| 7,395,698 B2 | 7/2008 | Degertekin |
| 7,420,106 B2 | 9/2008 | Williams et al. |
| 7,425,749 B2 | 9/2008 | Hartzell et al. |
| 7,441,447 B2 | 10/2008 | Degertekin et al. |
| 7,446,324 B2 | 11/2008 | Mirkin et al. |
| 7,447,250 B2 | 11/2008 | Kawasaki et al. |
| 7,449,356 B2 | 11/2008 | Weigold |
| 7,451,638 B1 | 11/2008 | Sahin et al. |
| 7,453,183 B2 | 11/2008 | Zettl et al. |
| 7,456,043 B2 | 11/2008 | Lin et al. |
| 7,456,400 B2 | 11/2008 | Shigeno et al. |
| 7,456,859 B2 | 11/2008 | Asahi et al. |
| 7,461,543 B2 | 12/2008 | Degertekin |
| 7,489,211 B2 | 2/2009 | Naito et al. |
| 7,493,794 B2 | 2/2009 | Mancevski et al. |
| 7,513,142 B2 | 4/2009 | Rice et al. |
| 7,520,173 B2 | 4/2009 | Lee et al. |
| 7,523,650 B2 | 4/2009 | Wang et al. |
| 7,524,534 B2 | 4/2009 | Mirkin et al. |
| 7,538,401 B2 | 5/2009 | Eriksen et al. |
| 7,538,477 B2 | 5/2009 | Fazzio et al. |
| RE40,781 E | 6/2009 | Johannsen et al. |
| 7,544,245 B2 | 6/2009 | Yono et al. |
| 7,545,592 B2 | 6/2009 | Lee |
| 7,545,945 B2 | 6/2009 | Miles |
| 7,551,265 B2 | 6/2009 | Phillips |
| 7,552,625 B2 | 6/2009 | Degertekin |
| 7,555,940 B2 | 7/2009 | Su et al. |
| 7,564,559 B2 | 7/2009 | Choo et al. |
| 7,579,753 B2 | 8/2009 | Fazzio et al. |
| 7,586,659 B2 | 9/2009 | Turner et al. |
| 7,596,989 B2 | 10/2009 | Humphris et al. |
| 7,599,143 B2 | 10/2009 | Iida |
| 7,600,533 B2 | 10/2009 | Tai et al. |
| 7,603,891 B2 | 10/2009 | Proksch |
| 7,621,471 B2 | 11/2009 | Howe |
| 7,637,149 B2 | 12/2009 | Degertekin et al. |
| 7,642,115 B2 | 1/2010 | Eriksen et al. |
| 7,658,097 B2 | 2/2010 | Su et al. |
| 7,665,350 B2 | 2/2010 | Giessibl |
| 7,696,653 B2 | 4/2010 | Tanaka |
| 7,701,834 B2 | 4/2010 | Rinerson et al. |
| 7,705,514 B2 | 4/2010 | He et al. |
| 7,707,873 B2 | 5/2010 | Degertekin |
| 7,710,766 B2 | 5/2010 | Mullner et al. |
| 7,726,035 B2 | 6/2010 | Chang et al. |
| 7,757,544 B2 | 7/2010 | Huang et al. |
| 7,765,607 B2 | 7/2010 | Faris |
| 7,781,249 B2 | 8/2010 | Laming et al. |
| 7,785,912 B2 | 8/2010 | Zhan et al. |
| 7,794,553 B2 | 9/2010 | Duan et al. |
| 7,794,657 B2 | 9/2010 | Stewart |
| 7,795,063 B2 | 9/2010 | Hsieh et al. |
| 7,795,695 B2 | 9/2010 | Weigold et al. |
| 7,798,011 B2 | 9/2010 | Warren et al. |
| 7,815,484 B2 | 10/2010 | Kriman et al. |
| 7,826,629 B2 | 11/2010 | Miles et al. |
| 7,852,739 B2 | 12/2010 | Koga et al. |
| 7,855,095 B2 | 12/2010 | Miyashita et al. |
| 7,856,804 B2 | 12/2010 | Laming et al. |
| 7,864,829 B2 | 1/2011 | Asahi et al. |
| 7,876,924 B1 | 1/2011 | Miles et al. |
| 7,885,423 B2 | 2/2011 | Weigold |
| 7,895,885 B2 | 3/2011 | Sretavan et al. |
| 7,903,835 B2 | 3/2011 | Miles |
| 7,908,908 B2 | 3/2011 | Brown et al. |
| 7,928,343 B2 | 4/2011 | King et al. |
| 7,931,784 B2 | 4/2011 | Medoff |
| 7,940,150 B2 | 5/2011 | Fu et al. |
| 7,941,909 B2 | 5/2011 | Miyashita et al. |
| 7,951,636 B2 | 5/2011 | Lee et al. |
| 7,952,154 B2 | 5/2011 | Guo et al. |
| 7,958,776 B2 | 6/2011 | Wang |
| 7,961,897 B2 | 6/2011 | Weigold |
| 7,979,916 B2 | 7/2011 | Pittenger et al. |
| 7,989,164 B2 | 8/2011 | Sahin et al. |
| 7,992,283 B2 | 8/2011 | Miles |
| 7,996,860 B2 | 8/2011 | Binnig et al. |
| 8,013,405 B2 | 9/2011 | Eriksen et al. |
| 8,019,640 B2 | 9/2011 | Barel et al. |
| 8,020,216 B2 | 9/2011 | Jin |
| 8,023,393 B2 | 9/2011 | Duerig et al. |
| 8,024,963 B2 | 9/2011 | Proksch et al. |
| 8,028,541 B2 | 10/2011 | Yono et al. |
| 8,029,503 B2 | 10/2011 | Sretavan |
| 8,030,112 B2 | 10/2011 | Hsieh et al. |
| 8,030,823 B2 | 10/2011 | Sinha et al. |
| 8,036,401 B2 | 10/2011 | Poulsen et al. |
| 8,041,064 B2 | 10/2011 | Kimura |
| 8,065,919 B2 | 11/2011 | Takeuchi |
| 8,067,169 B2 | 11/2011 | Sahin et al. |
| 8,073,167 B2 | 12/2011 | Miles |
| 8,081,782 B2 | 12/2011 | Klinghult |
| 8,091,143 B2 | 1/2012 | Faucher et al. |
| 8,093,087 B2 | 1/2012 | Hsieh et al. |
| 8,094,839 B2 | 1/2012 | Lee et al. |
| 8,094,846 B2 | 1/2012 | Hovesten et al. |
| 8,103,027 B2 | 1/2012 | Zhang et al. |
| 8,114,700 B2 | 2/2012 | Miyashita et al. |
| 8,130,979 B2 | 3/2012 | Harney et al. |
| 8,141,573 B2 | 3/2012 | Tai et al. |
| 8,146,425 B2 | 4/2012 | Zhang et al. |
| 8,151,368 B2 | 4/2012 | Kawakatsu et al. |
| 8,158,492 B2 | 4/2012 | Liu et al. |
| 8,169,042 B2 | 5/2012 | Weigold et al. |
| 8,179,278 B2 | 5/2012 | Shakra et al. |
| 8,187,673 B2 | 5/2012 | Mirkin et al. |
| 8,188,557 B2 | 5/2012 | Rombach et al. |
| 8,205,487 B2 | 6/2012 | Rice et al. |
| 8,208,671 B2 | 6/2012 | Chen et al. |
| 8,214,999 B2 | 7/2012 | Miles |
| 8,220,318 B2 | 7/2012 | Degertekin |
| 8,221,098 B2 | 7/2012 | Yang et al. |
| 8,222,795 B2 | 7/2012 | Sinha et al. |
| 8,228,675 B2 | 7/2012 | Koplow |
| 8,233,314 B2 | 7/2012 | Mullner et al. |
| 8,243,962 B2 | 8/2012 | Qiao |
| 8,258,591 B2 | 9/2012 | Lee et al. |
| 8,258,678 B2 | 9/2012 | Buccafusca et al. |
| 8,261,602 B2 | 9/2012 | Degertekin |
| 8,266,718 B2 | 9/2012 | Lai et al. |
| 8,270,634 B2 | 9/2012 | Harney et al. |
| 8,276,254 B2 | 10/2012 | Miles |
| 8,295,528 B2 | 10/2012 | Rombach et al. |
| 8,296,856 B2 | 10/2012 | Humphris et al. |
| 8,309,386 B2 | 11/2012 | Weigold |
| 8,322,220 B2 | 12/2012 | Prater et al. |
| 8,330,239 B2 | 12/2012 | Tang et al. |
| 8,336,380 B2 | 12/2012 | Kandori et al. |
| 8,338,898 B2 | 12/2012 | Schrank et al. |
| 8,341,760 B2 | 12/2012 | Fukuma et al. |
| 8,345,895 B2 | 1/2013 | Chen |
| 8,345,910 B2 | 1/2013 | Chae et al. |
| 8,351,632 B2 | 1/2013 | Harney et al. |
| 8,356,521 B2 | 1/2013 | Takizawa |
| 8,358,793 B2 | 1/2013 | Weigold |
| 8,363,860 B2 | 1/2013 | Zhang |
| 8,368,153 B2 | 2/2013 | Huang et al. |
| 8,370,105 B2 | 2/2013 | Kobayashi et al. |
| 8,371,182 B1 | 2/2013 | Israelachvili |
| 8,374,363 B2 | 2/2013 | Onishi |
| 8,374,371 B2 | 2/2013 | Miles |
| 8,384,372 B1 | 2/2013 | Behlow, Jr. et al. |

(56) References Cited

U.S. PATENT DOCUMENTS

| | | |
|---|---|---|
| 8,387,443 B2 | 3/2013 | King et al. |
| 8,405,138 B2 | 3/2013 | Dickerson et al. |
| 8,416,970 B2 | 4/2013 | Sakurauchi et al. |
| 8,422,703 B2 | 4/2013 | Weigold |
| 8,428,281 B2 | 4/2013 | Song et al. |
| 8,433,084 B2 | 4/2013 | Conti et al. |
| 8,443,461 B2 | 5/2013 | Ohnesorge |
| 8,448,501 B2 | 5/2013 | Proksch |
| 8,453,498 B2 | 6/2013 | Warren et al. |
| 8,454,803 B2 | 6/2013 | Medoff |
| 8,455,288 B2 | 6/2013 | Yang et al. |
| 8,460,961 B2 | 6/2013 | Guo et al. |
| 8,461,657 B2 | 6/2013 | Tang et al. |
| 8,477,983 B2 | 7/2013 | Weigold et al. |
| 8,479,310 B2 | 7/2013 | Humphris |
| 8,485,027 B2 | 7/2013 | Payton |
| 8,487,511 B2 | 7/2013 | Sinha et al. |
| 8,488,812 B2 | 7/2013 | David et al. |
| 8,490,209 B2 | 7/2013 | Saito |
| 8,502,329 B2 | 8/2013 | Hsieh et al. |
| 8,503,701 B2 | 8/2013 | Miles et al. |
| 8,507,306 B2 | 8/2013 | Chen et al. |
| 8,519,596 B1 | 8/2013 | Kim et al. |
| 8,524,519 B2 | 9/2013 | Wang et al. |
| 8,524,613 B1 | 9/2013 | Dickerson et al. |
| 8,525,389 B2 | 9/2013 | Tan et al. |
| 8,528,110 B2 | 9/2013 | Humphris |
| 8,533,861 B2 | 9/2013 | King et al. |
| 8,536,760 B1 | 9/2013 | Kim et al. |
| 8,542,850 B2 | 9/2013 | Wang et al. |
| 8,545,942 B2 | 10/2013 | Prokofiev et al. |
| 8,548,178 B2 | 10/2013 | Miles |
| 8,553,911 B2 | 10/2013 | Chen |
| 8,555,711 B2 | 10/2013 | Proksch et al. |
| 8,565,452 B2 | 10/2013 | Coronato et al. |
| 8,582,795 B2 | 11/2013 | Miles et al. |
| 8,583,403 B2 | 11/2013 | De Crecy et al. |
| 8,587,078 B2 | 11/2013 | Huang et al. |
| 8,590,136 B2 | 11/2013 | Yang et al. |
| 8,593,155 B2 | 11/2013 | Sparks et al. |
| 8,609,409 B2 | 12/2013 | Li et al. |
| 8,625,809 B2 | 1/2014 | Josefsson et al. |
| 8,637,284 B2 | 1/2014 | Medoff |
| 8,641,919 B2 | 2/2014 | Yu et al. |
| 8,643,129 B2 | 2/2014 | Laming et al. |
| 8,646,109 B2 | 2/2014 | Hu et al. |
| 8,646,344 B2 | 2/2014 | Israelachvili |
| 8,646,345 B2 | 2/2014 | Israelachvili |
| 8,650,660 B2 | 2/2014 | Shi et al. |
| 8,664,733 B2 | 3/2014 | Rombach |
| 8,673,732 B2 | 3/2014 | Hsieh et al. |
| 8,677,809 B2 | 3/2014 | Proksch et al. |
| 8,680,467 B2 | 3/2014 | Prater et al. |
| 8,710,601 B2 | 4/2014 | Huang et al. |
| 8,719,960 B2 | 5/2014 | King |
| 8,726,409 B2 | 5/2014 | Esch et al. |
| 8,728,779 B2 | 5/2014 | Medoff |
| 8,732,861 B2 | 5/2014 | Humphris et al. |
| 8,739,309 B2 | 5/2014 | Hu et al. |
| 8,747,624 B2 | 6/2014 | Medoff |
| 8,755,541 B2 | 6/2014 | Liu et al. |
| 8,756,711 B2 | 6/2014 | Plodinec et al. |
| 8,764,948 B2 | 7/2014 | Medoff |
| 8,771,480 B2 | 7/2014 | Medoff |
| 8,783,113 B2 | 7/2014 | Robert et al. |
| 8,787,600 B2 | 7/2014 | Conti et al. |
| 8,793,811 B1 | 7/2014 | Prater et al. |
| 8,818,007 B2 | 8/2014 | Robert |
| 8,828,773 B2 | 9/2014 | Weigold |
| 8,831,246 B2 | 9/2014 | Josefsson |
| 8,833,171 B2 | 9/2014 | Besling et al. |
| 8,835,142 B2 | 9/2014 | Medoff |
| 8,836,111 B2 | 9/2014 | Conti et al. |
| 8,837,754 B2 | 9/2014 | Formosa et al. |
| 8,841,101 B2 | 9/2014 | Medoff |
| 8,841,737 B2 | 9/2014 | Laming et al. |
| 8,841,738 B2 | 9/2014 | Harney et al. |
| 8,842,859 B2 | 9/2014 | Delaus et al. |
| 8,847,289 B2 | 9/2014 | Wang |
| 8,852,896 B2 | 10/2014 | Medoff |
| 8,860,154 B2 | 10/2014 | Wang |
| 8,865,500 B2 | 10/2014 | Huang et al. |
| 8,869,310 B2 | 10/2014 | Ruiter et al. |
| 8,875,311 B2 | 10/2014 | Hofrichter et al. |
| 8,877,472 B2 | 11/2014 | Medoff |
| 8,897,470 B2 | 11/2014 | Huang et al. |
| 8,901,683 B2 | 12/2014 | Je |
| 8,910,311 B2 | 12/2014 | Humphris et al. |
| 8,914,911 B2 | 12/2014 | King et al. |
| 8,915,790 B2 | 12/2014 | Smoot |
| 8,921,473 B1 | 12/2014 | Hyman |
| 8,921,956 B2 | 12/2014 | Dehe |
| 8,931,950 B2 | 1/2015 | King et al. |
| 8,934,648 B2 | 1/2015 | Weigold |
| 8,939,029 B2 | 1/2015 | Zhang et al. |
| 8,940,361 B2 | 1/2015 | Smith et al. |
| 8,940,639 B2 | 1/2015 | Liu et al. |
| 8,942,394 B2 | 1/2015 | Conti et al. |
| 8,943,611 B2 | 1/2015 | Cannara et al. |
| 8,946,831 B2 | 2/2015 | Liu et al. |
| 8,948,419 B2 | 2/2015 | Zhang |
| 8,950,010 B2 | 2/2015 | Rychen |
| 8,952,468 B2 | 2/2015 | Ishimoto et al. |
| 8,955,161 B2 | 2/2015 | Andreev |
| 8,955,212 B2 | 2/2015 | Mao et al. |
| 8,962,368 B2 | 2/2015 | Wang |
| 8,963,659 B1 | 2/2015 | Goldsmith et al. |
| 8,965,027 B2 | 2/2015 | Bologna et al. |
| 8,973,161 B2 | 3/2015 | Zou et al. |
| 8,973,446 B2 | 3/2015 | Fukuzawa et al. |
| 8,980,602 B2 | 3/2015 | Medoff |
| 8,988,881 B2 | 3/2015 | Koplow |
| 8,995,693 B2 | 3/2015 | Harney et al. |
| 8,997,260 B2 | 3/2015 | Murdick et al. |
| 8,997,261 B2 | 3/2015 | Noel et al. |
| 9,002,036 B2 | 4/2015 | Harney et al. |
| 9,002,039 B2 | 4/2015 | Zhang |
| 9,005,281 B2 | 4/2015 | Christie et al. |
| 9,023,183 B2 | 5/2015 | Medoff |
| 9,029,179 B2 | 5/2015 | Liu et al. |
| 9,029,963 B2 | 5/2015 | Sparks et al. |
| 9,039,976 B2 | 5/2015 | Sparks et al. |
| 9,040,439 B2 | 5/2015 | Endo et al. |
| 9,042,581 B2 | 5/2015 | Zoellin et al. |
| 9,052,337 B2 | 6/2015 | Williams et al. |
| 9,052,339 B2 | 6/2015 | Williams et al. |
| 9,055,372 B2 | 6/2015 | Grosh et al. |
| 9,061,494 B2 | 6/2015 | Rogers et al. |
| 9,061,889 B2 | 6/2015 | Lander |
| 9,069,007 B2 | 6/2015 | Proksch |
| 9,078,068 B2 | 7/2015 | Langlois et al. |
| 9,078,069 B2 | 7/2015 | Bharatan et al. |
| 9,078,461 B2 | 7/2015 | Medoff |
| 9,091,705 B2 | 7/2015 | Kim |
| 9,096,424 B2 | 8/2015 | Conti et al. |
| 9,110,092 B1 | 8/2015 | Magonov et al. |
| 9,113,249 B2 | 8/2015 | Miles et al. |
| 9,116,168 B2 | 8/2015 | Ruiter et al. |
| 9,132,420 B2 | 9/2015 | Nakayama et al. |
| 9,133,016 B2 | 9/2015 | Rombach |
| 9,134,341 B2 | 9/2015 | Prater et al. |
| 9,138,715 B2 | 9/2015 | Medoff |
| 9,140,720 B2 | 9/2015 | Kim |
| 9,143,870 B2 | 9/2015 | Liu et al. |
| 9,150,403 B2 | 10/2015 | Wang et al. |
| 9,150,407 B2 | 10/2015 | Tan et al. |
| 9,154,886 B2 | 10/2015 | Chen et al. |
| 9,157,856 B2 | 10/2015 | Guo et al. |
| 9,173,024 B2 | 10/2015 | Bologna et al. |
| 9,178,446 B2 | 11/2015 | Wang et al. |
| 9,179,221 B2 | 11/2015 | Barzen et al. |
| 9,181,080 B2 | 11/2015 | Dehe et al. |
| 9,181,086 B1 | 11/2015 | Miles et al. |
| 9,186,646 B2 | 11/2015 | Medoff |

(56) References Cited

U.S. PATENT DOCUMENTS

| | | |
|---|---|---|
| 9,207,023 B2 | 12/2015 | Koplow |
| 9,207,167 B2 | 12/2015 | Andreev |
| 9,212,052 B2 | 12/2015 | Bolognia |
| 9,213,047 B2 | 12/2015 | Li et al. |
| 9,219,963 B2 | 12/2015 | Yang et al. |
| 9,226,052 B2 | 12/2015 | Khenkin et al. |
| 9,227,843 B2 | 1/2016 | Dehe |
| 9,237,402 B2 | 1/2016 | Loeppert |
| 9,244,095 B2 | 1/2016 | Plodinec et al. |
| 9,249,008 B2 | 2/2016 | Hsu et al. |
| 9,254,496 B2 | 2/2016 | Dhiman et al. |
| 9,259,590 B2 | 2/2016 | Kim et al. |
| 9,264,814 B2 | 2/2016 | Je et al. |
| 9,266,716 B2 | 2/2016 | Feyh et al. |
| 9,267,962 B2 | 2/2016 | Sarkar et al. |
| 9,267,963 B2 | 2/2016 | Gellineau et al. |
| 9,274,139 B2 | 3/2016 | Shi et al. |
| 9,281,206 B2 | 3/2016 | Jin et al. |
| 9,287,487 B2 | 3/2016 | Bae et al. |
| 9,291,640 B2 | 3/2016 | Su et al. |
| 9,297,827 B2 | 3/2016 | Proksch et al. |
| 9,302,904 B2 | 4/2016 | Huang et al. |
| 9,309,105 B2 | 4/2016 | Dehe et al. |
| 9,309,109 B2 | 4/2016 | Chu et al. |
| 9,309,162 B2 | 4/2016 | Azimi et al. |
| 9,309,545 B2 | 4/2016 | Medoff |
| 9,316,665 B2 | 4/2016 | Geisberger et al. |
| 9,318,031 B2 | 4/2016 | Boyd |
| 9,321,635 B2 | 4/2016 | Hsieh et al. |
| 9,322,842 B2 | 4/2016 | Hu et al. |
| 9,329,610 B2 | 5/2016 | David et al. |
| 9,332,332 B2 | 5/2016 | Bolognia et al. |
| 9,332,345 B1 | 5/2016 | Melanson et al. |
| 9,338,538 B2 | 5/2016 | Weigold et al. |
| 9,340,413 B2 | 5/2016 | Merassi et al. |
| 9,343,455 B2 | 5/2016 | Gueorguiev et al. |
| 9,344,809 B2 | 5/2016 | Muza et al. |
| 9,346,667 B2 | 5/2016 | Ghahremani et al. |
| 9,351,690 B2 | 5/2016 | Nachaliel |
| 9,352,294 B1 | 5/2016 | Medoff |
| 9,354,249 B2 | 5/2016 | Novak et al. |
| 9,357,296 B2 | 5/2016 | Josefsson et al. |
| 9,359,188 B1 | 6/2016 | Bharatan |
| 9,371,173 B2 | 6/2016 | Smith et al. |
| 9,372,111 B2 | 6/2016 | Hall et al. |
| 9,372,154 B2 | 6/2016 | Prater |
| 9,381,528 B2 | 7/2016 | Dhiman et al. |
| 9,383,388 B2 | 7/2016 | Proksch et al. |
| 9,386,379 B2 | 7/2016 | Sparks et al. |
| 9,394,875 B2 | 7/2016 | Wang et al. |
| 9,407,997 B2 | 8/2016 | Delaus et al. |
| 9,409,140 B2 | 8/2016 | Medoff |
| 9,409,763 B2 | 8/2016 | Dehe et al. |
| 9,419,562 B1 | 8/2016 | Melanson et al. |
| 9,427,679 B2 | 8/2016 | Mahmoudi et al. |
| 9,438,979 B2 | 9/2016 | Dehe |
| 9,444,031 B2 | 9/2016 | Park et al. |
| 9,448,126 B2 | 9/2016 | Dehe et al. |
| 9,451,359 B2 | 9/2016 | Mucha et al. |
| 9,453,774 B2 | 9/2016 | Bao et al. |
| 9,453,857 B2 | 9/2016 | Proksch et al. |
| 9,462,395 B2 | 10/2016 | Nicollini et al. |
| 9,462,402 B2 | 10/2016 | Cho et al. |
| 9,484,524 B2 | 11/2016 | Yu et al. |
| 9,484,842 B2 | 11/2016 | Wang et al. |
| 9,487,002 B2 | 11/2016 | Rogers et al. |
| 9,488,541 B2 | 11/2016 | Fukuzawa et al. |
| 9,490,306 B2 | 11/2016 | Kim et al. |
| 9,491,271 B2 | 11/2016 | Olah et al. |
| 9,492,272 B2 | 11/2016 | Christie et al. |
| 9,494,477 B2 | 11/2016 | Wiesbauer et al. |
| 9,498,312 B2 | 11/2016 | Dykes et al. |
| 9,498,934 B2 | 11/2016 | Paxson et al. |
| 9,500,670 B2 | 11/2016 | Lim et al. |
| 9,505,614 B2 | 11/2016 | Liu et al. |
| 9,510,107 B2 | 11/2016 | Dehe et al. |
| 9,510,121 B2 | 11/2016 | Xu et al. |
| 9,517,444 B2 | 12/2016 | Medoff |
| 9,518,956 B2 | 12/2016 | Chung et al. |
| 9,535,085 B2 | 1/2017 | Stan et al. |
| 9,543,860 B2 | 1/2017 | Wang et al. |
| 9,544,678 B2 | 1/2017 | Lorenz et al. |
| 9,554,213 B2 | 1/2017 | Miles et al. |
| 9,557,347 B2 | 1/2017 | Humphris |
| 9,562,897 B2 | 2/2017 | Samuels et al. |
| 9,569,055 B2 | 2/2017 | Post et al. |
| 9,571,009 B2 | 2/2017 | Wang et al. |
| 9,571,931 B1 | 2/2017 | Melanson et al. |
| 9,575,090 B2 | 2/2017 | Liu et al. |
| 9,580,299 B2 | 2/2017 | Dehe et al. |
| 9,584,889 B2 | 2/2017 | Escher-Poeppel et al. |
| 9,587,258 B2 | 3/2017 | Medoff |
| 9,588,136 B2 | 3/2017 | Hu et al. |
| 9,595,894 B2 | 3/2017 | Wang et al. |
| 9,596,547 B2 | 3/2017 | Zhang |
| 9,599,636 B2 | 3/2017 | Humphris |
| 9,604,846 B2 | 3/2017 | Proksch et al. |
| 9,605,287 B2 | 3/2017 | Medoff |
| 9,605,288 B2 | 3/2017 | Medoff |
| 9,611,135 B1 | 4/2017 | Klein |
| 9,621,975 B2 | 4/2017 | Liu et al. |
| 9,625,075 B2 | 4/2017 | Smith et al. |
| 9,625,330 B2 | 4/2017 | Park et al. |
| 9,626,981 B2 | 4/2017 | Chesney |
| 9,628,101 B1 | 4/2017 | Onishi |
| 9,628,920 B2 | 4/2017 | Bach et al. |
| 9,631,996 B2 | 4/2017 | Wiesbauer et al. |
| 9,641,950 B2 | 5/2017 | Loeppert et al. |
| 9,656,854 B2 | 5/2017 | Hur et al. |
| 9,658,247 B2 | 5/2017 | Yang et al. |
| 9,670,059 B2 | 6/2017 | Dehe et al. |
| 9,674,618 B2 | 6/2017 | Uchida et al. |
| 9,674,619 B2 | 6/2017 | Liu |
| 9,676,614 B2 | 6/2017 | Johari-Galle et al. |
| 9,676,615 B2 | 6/2017 | Miao |
| 9,681,234 B2 | 6/2017 | Yuan et al. |
| 9,681,242 B2 | 6/2017 | Harney et al. |
| 9,681,243 B2 | 6/2017 | Guo et al. |
| 9,691,500 B2 | 6/2017 | Caldeira et al. |
| 9,691,873 B2 | 6/2017 | Rogers et al. |
| 9,695,038 B2 | 7/2017 | Cargill et al. |
| 9,695,040 B2 | 7/2017 | Bologna et al. |
| 9,696,342 B2 | 7/2017 | Proksch et al. |
| 9,700,266 B2 | 7/2017 | Nachaliel |
| 9,700,868 B2 | 7/2017 | Medoff |
| 9,701,534 B2 | 7/2017 | Lin et al. |
| 9,709,598 B2 | 7/2017 | Novak et al. |
| 9,719,916 B2 | 8/2017 | Andreev et al. |
| 9,724,001 B2 | 8/2017 | Dykes et al. |
| 9,725,300 B2 | 8/2017 | Stahl et al. |
| 9,735,338 B2 | 8/2017 | Guillou et al. |
| 9,745,604 B2 | 8/2017 | Medoff |
| 9,745,609 B2 | 8/2017 | Medoff |
| 9,748,868 B2 | 8/2017 | Taghavi et al. |
| 9,749,752 B2 | 8/2017 | Yoo |
| 9,758,369 B2 | 9/2017 | Schoen et al. |
| 9,759,618 B2 | 9/2017 | Fukuzawa et al. |
| 9,762,151 B2 | 9/2017 | Zhang et al. |
| 9,769,562 B2 | 9/2017 | Khenkin et al. |
| 9,773,141 B2 | 9/2017 | Kozicki |
| 9,778,282 B2 | 10/2017 | Yang et al. |
| 9,787,320 B1 | 10/2017 | Onishi |
| 9,790,928 B2 | 10/2017 | Wang et al. |
| 9,803,222 B2 | 10/2017 | Medoff |
| 9,809,444 B2 | 11/2017 | Klein |
| 9,809,448 B2 | 11/2017 | Lim et al. |
| 9,810,713 B2 | 11/2017 | Shi et al. |
| 9,812,993 B2 | 11/2017 | Wang et al. |
| 9,816,881 B2 | 11/2017 | Dehe et al. |
| 9,825,558 B2 | 11/2017 | Zhang et al. |
| 9,828,237 B2 | 11/2017 | Walther et al. |
| 9,836,633 B2 | 12/2017 | Kozicki |
| 9,837,933 B2 | 12/2017 | Park et al. |
| 9,837,934 B2 | 12/2017 | Kim et al. |

(56) References Cited

U.S. PATENT DOCUMENTS

| | | |
|---|---|---|
| 9,841,436 B2 | 12/2017 | Proksch et al. |
| 9,843,275 B2 | 12/2017 | Wang et al. |
| 9,847,659 B2 | 12/2017 | Olah et al. |
| 9,856,134 B2 | 1/2018 | Dehe |
| 9,860,620 B2 | 1/2018 | Aurongzeb et al. |
| 9,872,112 B2 | 1/2018 | Bolognia et al. |
| 9,874,679 B2 | 1/2018 | Tan |
| 9,887,644 B2 | 2/2018 | Kim et al. |
| 9,891,246 B2 | 2/2018 | Serry |
| 9,899,939 B2 | 2/2018 | Karagozler et al. |
| 9,900,677 B2 | 2/2018 | Hung et al. |
| 9,902,818 B2 | 2/2018 | DeSimone et al. |
| 9,906,869 B2 | 2/2018 | Miles et al. |
| 9,908,288 B2 | 3/2018 | Harkness et al. |
| 9,910,064 B2 | 3/2018 | Liu et al. |
| 9,914,636 B2 | 3/2018 | Buck et al. |
| 9,919,282 B2 | 3/2018 | Medoff |
| 9,919,913 B2 | 3/2018 | Pan et al. |
| 9,921,242 B2 | 3/2018 | Proksch et al. |
| 9,921,678 B2 | 3/2018 | Wang et al. |
| 9,924,288 B2 | 3/2018 | Cagdaser et al. |
| 9,930,453 B2 | 3/2018 | Zou et al. |
| 9,938,133 B2 | 4/2018 | Kautzsch et al. |
| 9,939,460 B2 | 4/2018 | Humphris |
| 9,945,746 B2 | 4/2018 | Wiesbauer et al. |
| 9,945,884 B2 | 4/2018 | Froemel et al. |
| 9,949,037 B2 | 4/2018 | Chau |
| 9,961,450 B2 | 5/2018 | Hsu et al. |
| 9,963,763 B2 | 5/2018 | Demetriou et al. |
| 9,969,970 B2 | 5/2018 | Hsiao et al. |
| 9,970,039 B2 | 5/2018 | Medoff |
| 9,972,354 B2 | 5/2018 | Boyd |
| 9,975,064 B2 | 5/2018 | Mahmoudi et al. |
| 9,985,554 B2 | 5/2018 | Wang et al. |
| 9,986,344 B2 | 5/2018 | Dehe et al. |
| 9,994,440 B2 | 6/2018 | Jenkins et al. |
| 9,995,764 B2 | 6/2018 | Pieper et al. |
| 9,995,765 B2 | 6/2018 | Su et al. |
| 9,998,828 B2 | 6/2018 | Scheben |
| 9,999,770 B2 | 6/2018 | Walraevens et al. |
| 10,000,374 B2 | 6/2018 | Schelling et al. |
| 10,000,819 B2 | 6/2018 | Kim et al. |
| 10,006,824 B2 | 6/2018 | Tsai et al. |
| 10,008,867 B2 | 6/2018 | Olah et al. |
| 10,011,222 B1 | 7/2018 | Wu et al. |
| 10,011,479 B2 | 7/2018 | Schelling et al. |
| 10,014,799 B2 | 7/2018 | Byun et al. |
| 10,027,187 B2 | 7/2018 | Matthews |
| 10,033,307 B2 | 7/2018 | Lee et al. |
| 10,034,633 B2 | 7/2018 | Weinberg et al. |
| 10,041,970 B2 | 8/2018 | Zou et al. |
| 10,042,446 B2 | 8/2018 | Yoon et al. |
| 10,042,504 B2 | 8/2018 | Post et al. |
| 10,045,121 B2 | 8/2018 | Harney et al. |
| 10,045,126 B2 | 8/2018 | Berger et al. |
| 10,047,384 B2 | 8/2018 | Medoff |
| 10,048,289 B2 | 8/2018 | Lal et al. |
| 10,065,851 B2 | 9/2018 | Bryzek |
| 10,065,852 B2 | 9/2018 | Cheng et al. |
| 10,068,747 B2 | 9/2018 | Budach et al. |
| 10,074,000 B2 | 9/2018 | Kozicki |
| 10,075,100 B2 | 9/2018 | Kim et al. |
| 10,081,537 B2 | 9/2018 | Sooriakumar et al. |
| 10,082,430 B2 | 9/2018 | Fukuzawa et al. |
| 10,082,523 B2 | 9/2018 | Yang et al. |
| 10,087,071 B2 | 10/2018 | Wu et al. |
| 10,092,512 B2 | 10/2018 | Johnston et al. |
| 10,092,890 B2 | 10/2018 | Medoff |
| 10,103,649 B2 | 10/2018 | Rutgers et al. |
| 10,104,478 B2 | 10/2018 | Glacer et al. |
| 10,104,490 B2 | 10/2018 | Family et al. |
| 10,106,401 B1 | 10/2018 | Rabani |
| 10,108,305 B2 | 10/2018 | Post et al. |
| 10,111,021 B2 | 10/2018 | Deas et al. |
| 10,118,817 B2 | 11/2018 | Cargill et al. |
| 10,129,651 B2 | 11/2018 | Zhang et al. |
| 10,129,676 B2 | 11/2018 | Walther et al. |
| 10,131,541 B2 | 11/2018 | Chu |
| 10,138,115 B2 | 11/2018 | Theuss et al. |
| 10,155,179 B2 | 12/2018 | Mahmoudi et al. |
| 10,155,656 B2 | 12/2018 | Cheng et al. |
| 10,158,949 B2 | 12/2018 | Sun et al. |
| 10,158,952 B2 | 12/2018 | Sun et al. |
| 10,166,740 B2 | 1/2019 | Johnson et al. |
| 10,170,685 B2 | 1/2019 | Grosh et al. |
| 10,171,916 B2 | 1/2019 | Valli et al. |
| 10,177,027 B2 | 1/2019 | Wang |
| 10,177,690 B2 | 1/2019 | Boyd |
| 10,189,699 B2 | 1/2019 | Walther et al. |
| 10,191,081 B2 | 1/2019 | Park et al. |
| 10,191,082 B1 | 1/2019 | Kley |
| 10,193,472 B2 | 1/2019 | Zhang et al. |
| 10,197,596 B2 | 2/2019 | Shi et al. |
| 10,199,958 B2 | 2/2019 | Shin et al. |
| 10,201,795 B2 | 2/2019 | Burakowska-Meise et al. |
| 10,206,023 B2 | 2/2019 | Loeppert |
| 10,211,758 B2 | 2/2019 | He et al. |
| 10,215,773 B2 | 2/2019 | Proksch et al. |
| 10,223,567 B2 | 3/2019 | Kozicki |
| 10,228,387 B2 | 3/2019 | Hurst et al. |
| 10,228,388 B2 | 3/2019 | Prater et al. |
| 10,233,561 B2 | 3/2019 | Lee et al. |
| 10,237,650 B2 | 3/2019 | Mucha et al. |
| 10,241,131 B2 | 3/2019 | Prater |
| 10,244,901 B2 | 4/2019 | Ophardt et al. |
| 10,250,963 B2 | 4/2019 | Hung et al. |
| 10,250,998 B2 | 4/2019 | Hsieh et al. |
| 10,256,381 B2 | 4/2019 | Liu et al. |
| 10,257,609 B2 | 4/2019 | Bologna et al. |
| 10,265,025 B2 | 4/2019 | Ashton et al. |
| 10,274,513 B2 | 4/2019 | Friedman et al. |
| 10,276,147 B2 | 4/2019 | Yoo |
| 10,279,192 B2 | 5/2019 | Malchano et al. |
| 10,289,799 B2 | 5/2019 | Bathe et al. |
| 10,293,177 B2 | 5/2019 | Malchano et al. |
| 10,301,174 B2 | 5/2019 | Cargill et al. |
| 10,302,673 B2 | 5/2019 | Walter et al. |
| 10,307,611 B2 | 6/2019 | Malchano et al. |
| 10,307,723 B2 | 6/2019 | Burakowska-Meise et al. |
| 10,312,427 B2 | 6/2019 | Umeda et al. |
| 10,315,912 B2 | 6/2019 | Nawaz et al. |
| 10,318,090 B2 | 6/2019 | Post et al. |
| 10,322,481 B2 | 6/2019 | Dehe et al. |
| 10,330,581 B2 | 6/2019 | Robinson et al. |
| 10,330,632 B2 | 6/2019 | Lindsay et al. |
| 10,330,698 B2 | 6/2019 | Pinno-Rath et al. |
| 10,343,893 B2 | 7/2019 | Sasaki et al. |
| 10,343,898 B1 | 7/2019 | Chen et al. |
| 10,343,901 B2 | 7/2019 | Cargill et al. |
| 10,349,170 B2 | 7/2019 | Harney et al. |
| 10,349,187 B2 | 7/2019 | Zhan et al. |
| 10,349,188 B2 | 7/2019 | Meisel et al. |
| 10,351,419 B2 | 7/2019 | Gao et al. |
| 10,351,464 B2 | 7/2019 | Eguchi |
| 10,352,964 B2 | 7/2019 | Lee et al. |
| 10,362,408 B2 | 7/2019 | Kuntzman et al. |
| 10,367,431 B2 | 7/2019 | Wang et al. |
| 10,370,242 B2 | 8/2019 | Dehe et al. |
| 10,375,475 B2 | 8/2019 | Melanson et al. |
| 10,384,238 B2 | 8/2019 | Robinson et al. |
| 2001/0017054 A1 | 8/2001 | Narita et al. |
| 2001/0023024 A1 | 9/2001 | Aksay et al. |
| 2002/0027664 A1 | 3/2002 | Hyers et al. |
| 2002/0034757 A1 | 3/2002 | Cubicciotti |
| 2002/0053375 A1 | 5/2002 | Hays |
| 2002/0062572 A1 | 5/2002 | Bindell et al. |
| 2002/0062684 A1 | 5/2002 | Adderton et al. |
| 2002/0063212 A1 | 5/2002 | Mirkin et al. |
| 2002/0066307 A1 | 6/2002 | Oumi et al. |
| 2002/0068304 A1 | 6/2002 | Urry |
| 2002/0093251 A1 | 7/2002 | Hoen |
| 2002/0104963 A1 | 8/2002 | Mancevski |
| 2002/0106314 A1 | 8/2002 | Pelrine et al. |
| 2002/0121131 A1 | 9/2002 | Mancevski et al. |

(56) References Cited

U.S. PATENT DOCUMENTS

| | | |
|---|---|---|
| 2002/0130524 A1 | 9/2002 | McIlwraith et al. |
| 2002/0140533 A1 | 10/2002 | Miyazaki et al. |
| 2002/0173033 A1 | 11/2002 | Hammerick et al. |
| 2002/0174715 A1 | 11/2002 | Kim et al. |
| 2002/0181725 A1 | 12/2002 | Johannsen et al. |
| 2002/0187618 A1 | 12/2002 | Potter |
| 2002/0189330 A1 | 12/2002 | Mancevski et al. |
| 2003/0015807 A1 | 1/2003 | Montemagno et al. |
| 2003/0033863 A1 | 2/2003 | Ashby et al. |
| 2003/0049381 A1 | 3/2003 | Mirkin et al. |
| 2003/0049642 A1 | 3/2003 | Nilsson et al. |
| 2003/0068179 A1 | 4/2003 | Horrall et al. |
| 2003/0068446 A1 | 4/2003 | Mirkin et al. |
| 2003/0086154 A1 | 5/2003 | Feillens et al. |
| 2003/0094036 A1 | 5/2003 | Adderton et al. |
| 2003/0110844 A1 | 6/2003 | Struckmeier et al. |
| 2003/0112499 A1 | 6/2003 | Feillens et al. |
| 2003/0141453 A1 | 7/2003 | Reed et al. |
| 2003/0150268 A1 | 8/2003 | Takeda et al. |
| 2003/0157254 A1 | 8/2003 | Mirkin et al. |
| 2003/0158474 A1 | 8/2003 | Scherer et al. |
| 2003/0168594 A1 | 9/2003 | Muckenhirn |
| 2003/0218132 A1 | 11/2003 | Honma |
| 2003/0233870 A1 | 12/2003 | Mancevski |
| 2004/0008042 A1 | 1/2004 | Pelz et al. |
| 2004/0020774 A1 | 2/2004 | Aksay et al. |
| 2004/0037959 A1 | 2/2004 | Mirkin et al. |
| 2004/0050458 A1 | 3/2004 | Hays |
| 2004/0083799 A1 | 5/2004 | Markakis et al. |
| 2004/0145824 A1 | 7/2004 | Lee |
| 2004/0154367 A1 | 8/2004 | Oumi et al. |
| 2004/0163471 A1 | 8/2004 | Frey et al. |
| 2004/0209376 A1 | 10/2004 | Natan et al. |
| 2004/0210289 A1 | 10/2004 | Wang et al. |
| 2004/0214177 A1 | 10/2004 | Bension |
| 2004/0216517 A1 | 11/2004 | Xi et al. |
| 2004/0239283 A1 | 12/2004 | Galburt et al. |
| 2004/0239911 A1 | 12/2004 | Carter et al. |
| 2004/0245462 A1 | 12/2004 | Binnig et al. |
| 2004/0246569 A1 | 12/2004 | Feillens et al. |
| 2004/0246570 A1 | 12/2004 | Feillens et al. |
| 2004/0254419 A1 | 12/2004 | Wang et al. |
| 2004/0255651 A1 | 12/2004 | Adderton et al. |
| 2005/0013455 A1 | 1/2005 | Loeb et al. |
| 2005/0017598 A1 | 1/2005 | Zettl et al. |
| 2005/0024808 A1 | 2/2005 | Kawasaki et al. |
| 2005/0025797 A1 | 2/2005 | Wang et al. |
| 2005/0032226 A1 | 2/2005 | Natan |
| 2005/0034200 A1 | 2/2005 | Montemagno et al. |
| 2005/0050947 A1 | 3/2005 | Kitajima et al. |
| 2005/0066714 A1 | 3/2005 | Adderton et al. |
| 2005/0077915 A1 | 4/2005 | Pelz et al. |
| 2005/0079132 A1 | 4/2005 | Wang et al. |
| 2005/0081610 A1 | 4/2005 | Struckmeier et al. |
| 2005/0089890 A1 | 4/2005 | Cubicciotti |
| 2005/0092929 A1 | 5/2005 | Schneiker |
| 2005/0107870 A1 | 5/2005 | Wang et al. |
| 2005/0130360 A1 | 6/2005 | Zhan et al. |
| 2005/0164299 A1 | 7/2005 | Stewart |
| 2005/0172704 A1 | 8/2005 | Mirkin et al. |
| 2005/0181132 A1 | 8/2005 | Mirkin et al. |
| 2005/0199180 A1 | 9/2005 | Yono et al. |
| 2005/0200830 A1 | 9/2005 | Carter et al. |
| 2005/0204817 A1 | 9/2005 | Boletis et al. |
| 2005/0212529 A1 | 9/2005 | Huang et al. |
| 2005/0217354 A1 | 10/2005 | Honma |
| 2005/0236566 A1 | 10/2005 | Liu |
| 2005/0241394 A1 | 11/2005 | Clark |
| 2006/0023195 A1 | 2/2006 | Carter et al. |
| 2006/0026054 A1 | 2/2006 | Barel et al. |
| 2006/0027709 A1 | 2/2006 | Pinto |
| 2006/0037379 A1 | 2/2006 | Mancevski et al. |
| 2006/0042314 A1 | 3/2006 | Abbott et al. |
| 2006/0056076 A1 | 3/2006 | Araki et al. |
| 2006/0064826 A1 | 3/2006 | Kimball |
| 2006/0073395 A1 | 4/2006 | Phillips |
| 2006/0098267 A1 | 5/2006 | Togawa |
| 2006/0113472 A1 | 6/2006 | Shigeno et al. |
| 2006/0131997 A1 | 6/2006 | Kim et al. |
| 2006/0158998 A1 | 7/2006 | Rinerson et al. |
| 2006/0177147 A1 | 8/2006 | Asahi et al. |
| 2006/0185424 A1 | 8/2006 | Muckenhirn |
| 2006/0191329 A1 | 8/2006 | Adderton et al. |
| 2006/0203417 A1 | 9/2006 | Kawasaki et al. |
| 2006/0205095 A1 | 9/2006 | Yono et al. |
| 2006/0225164 A1 | 10/2006 | Williams et al. |
| 2006/0260388 A1 | 11/2006 | Su et al. |
| 2006/0283240 A1 | 12/2006 | Struckmeier et al. |
| 2006/0283338 A1 | 12/2006 | Degertekin |
| 2007/0007393 A1 | 1/2007 | Pinto |
| 2007/0010702 A1 | 1/2007 | Wang et al. |
| 2007/0012093 A1 | 1/2007 | Kwon et al. |
| 2007/0012094 A1 | 1/2007 | Degertekin et al. |
| 2007/0023851 A1 | 2/2007 | Hartzell et al. |
| 2007/0024295 A1 | 2/2007 | Humphris et al. |
| 2007/0033682 A1 | 2/2007 | Sretavan et al. |
| 2007/0033991 A1 | 2/2007 | Rice et al. |
| 2007/0046397 A1 | 3/2007 | Bajaj et al. |
| 2007/0047744 A1 | 3/2007 | Harney et al. |
| 2007/0047746 A1 | 3/2007 | Weigold et al. |
| 2007/0062264 A1 | 3/2007 | Wang et al. |
| 2007/0064968 A1 | 3/2007 | Weigold |
| 2007/0066027 A1 | 3/2007 | Lin et al. |
| 2007/0067883 A1 | 3/2007 | Sretavan |
| 2007/0082459 A1 | 4/2007 | Faris |
| 2007/0087466 A1 | 4/2007 | Weigold et al. |
| 2007/0089496 A1 | 4/2007 | Degertekin |
| 2007/0089498 A1 | 4/2007 | Su et al. |
| 2007/0092983 A1 | 4/2007 | Weigold |
| 2007/0103697 A1 | 5/2007 | Degertekin |
| 2007/0107502 A1 | 5/2007 | Degertekin |
| 2007/0114880 A1 | 5/2007 | Zettl et al. |
| 2007/0121477 A1 | 5/2007 | Belov et al. |
| 2007/0145167 A1 | 6/2007 | Howe |
| 2007/0154354 A1 | 7/2007 | Faris |
| 2007/0163335 A1 | 7/2007 | Huang et al. |
| 2007/0165888 A1 | 7/2007 | Weigold |
| 2007/0165896 A1 | 7/2007 | Miles et al. |
| 2007/0176100 A1 | 8/2007 | Xi et al. |
| 2007/0180924 A1 | 8/2007 | Warren et al. |
| 2007/0188268 A1 | 8/2007 | Naito et al. |
| 2007/0190680 A1 | 8/2007 | Fukuda et al. |
| 2007/0192972 A9 | 8/2007 | Kimball |
| 2007/0245815 A1 | 10/2007 | Proksch |
| 2007/0247739 A1 | 10/2007 | Iida |
| 2007/0249059 A1 | 10/2007 | Stewart |
| 2007/0268808 A1 | 11/2007 | Culver et al. |
| 2007/0273860 A1 | 11/2007 | Tanaka |
| 2007/0274368 A1 | 11/2007 | Asahi et al. |
| 2007/0279638 A1 | 12/2007 | Choo et al. |
| 2007/0284682 A1 | 12/2007 | Laming et al. |
| 2007/0285843 A1 | 12/2007 | Tran |
| 2007/0287233 A1 | 12/2007 | Zhan et al. |
| 2007/0289369 A1 | 12/2007 | Wang et al. |
| 2007/0291623 A1 | 12/2007 | Belov et al. |
| 2007/0295064 A1 | 12/2007 | Degertekin et al. |
| 2007/0297631 A1 | 12/2007 | Miles |
| 2008/0022759 A1 | 1/2008 | Su et al. |
| 2008/0049590 A1 | 2/2008 | Bu et al. |
| 2008/0049953 A1 | 2/2008 | Harney et al. |
| 2008/0062853 A1 | 3/2008 | Bu et al. |
| 2008/0075306 A1 | 3/2008 | Poulsen et al. |
| 2008/0078229 A1 | 4/2008 | Mancevski et al. |
| 2008/0100175 A1 | 5/2008 | Clark |
| 2008/0101641 A1 | 5/2008 | Miles |
| 2008/0130158 A1 | 6/2008 | Binnig et al. |
| 2008/0135138 A1 | 6/2008 | Duan et al. |
| 2008/0149832 A1 | 6/2008 | Zorn |
| 2008/0152171 A1 | 6/2008 | Hovesten et al. |
| 2008/0204757 A1 | 8/2008 | Manning |
| 2008/0225575 A1 | 9/2008 | Mullner et al. |
| 2008/0235079 A1 | 9/2008 | Barel et al. |
| 2008/0237754 A1 | 10/2008 | Solomon |
| 2008/0242559 A1 | 10/2008 | Mirkin et al. |

(56) References Cited

U.S. PATENT DOCUMENTS

| | | |
|---|---|---|
| 2008/0247572 A1 | 10/2008 | Langereis et al. |
| 2008/0253269 A1 | 10/2008 | Koga et al. |
| 2008/0276695 A1 | 11/2008 | Prater et al. |
| 2008/0295583 A1 | 12/2008 | Giessibl |
| 2008/0304681 A1 | 12/2008 | Langlois et al. |
| 2008/0307865 A1 | 12/2008 | Degertekin |
| 2008/0316904 A1 | 12/2008 | Duerig et al. |
| 2009/0000363 A1 | 1/2009 | Brown et al. |
| 2009/0001845 A1* | 1/2009 | Ikehashi ............. H02N 1/008 327/512 |
| 2009/0013770 A1 | 1/2009 | Proksch et al. |
| 2009/0016550 A1 | 1/2009 | Qiao |
| 2009/0016557 A1 | 1/2009 | Miles |
| 2009/0029501 A1 | 1/2009 | Weigold |
| 2009/0041270 A1 | 2/2009 | Schrank et al. |
| 2009/0046883 A1 | 2/2009 | Ronald |
| 2009/0064772 A1 | 3/2009 | Wang |
| 2009/0067659 A1 | 3/2009 | Wang et al. |
| 2009/0074966 A1 | 3/2009 | Henderson et al. |
| 2009/0076294 A1 | 3/2009 | Agnes et al. |
| 2009/0112957 A1 | 4/2009 | Abramovitch et al. |
| 2009/0119905 A1 | 5/2009 | Miyashita et al. |
| 2009/0130783 A1 | 5/2009 | Miyashita et al. |
| 2009/0151182 A1 | 6/2009 | Chang et al. |
| 2009/0161894 A1 | 6/2009 | Kimura |
| 2009/0166772 A1 | 7/2009 | Hsieh et al. |
| 2009/0169035 A1 | 7/2009 | Rombach et al. |
| 2009/0179233 A1 | 7/2009 | Lee et al. |
| 2009/0180647 A1 | 7/2009 | Chen et al. |
| 2009/0185250 A1 | 7/2009 | Turner et al. |
| 2009/0193893 A1 | 8/2009 | Kandori et al. |
| 2009/0199997 A1 | 8/2009 | Koplow |
| 2009/0202089 A1 | 8/2009 | Zhang et al. |
| 2009/0227040 A1 | 9/2009 | Sahin et al. |
| 2009/0241719 A1 | 10/2009 | Fu et al. |
| 2009/0243426 A1 | 10/2009 | Sahin Nomaler et al. |
| 2009/0253589 A1 | 10/2009 | Muller et al. |
| 2009/0260113 A1 | 10/2009 | Rice et al. |
| 2009/0262958 A1 | 10/2009 | Miles |
| 2009/0278217 A1 | 11/2009 | Laming et al. |
| 2009/0285418 A1 | 11/2009 | Klinghult |
| 2009/0312980 A1 | 12/2009 | Kobayashi et al. |
| 2009/0322260 A1 | 12/2009 | Lee |
| 2010/0020991 A1 | 1/2010 | Chen |
| 2010/0043107 A1 | 2/2010 | Proksch |
| 2010/0054495 A1 | 3/2010 | Harney et al. |
| 2010/0058865 A1 | 3/2010 | Zhang et al. |
| 2010/0071100 A1 | 3/2010 | Faris |
| 2010/0072561 A1 | 3/2010 | Lee et al. |
| 2010/0107772 A1 | 5/2010 | Takizawa |
| 2010/0108567 A1 | 5/2010 | Medoff |
| 2010/0120023 A1 | 5/2010 | Sahin et al. |
| 2010/0122385 A1 | 5/2010 | Hu et al. |
| 2010/0124583 A1 | 5/2010 | Medoff |
| 2010/0133006 A1 | 6/2010 | Shakra et al. |
| 2010/0142744 A1 | 6/2010 | Rombach et al. |
| 2010/0155864 A1 | 6/2010 | Laming et al. |
| 2010/0158279 A1 | 6/2010 | Conti et al. |
| 2010/0158280 A1 | 6/2010 | Coronato et al. |
| 2010/0177480 A1 | 7/2010 | Koplow |
| 2010/0180354 A1 | 7/2010 | Degertekin |
| 2010/0186132 A1 | 7/2010 | Humphris et al. |
| 2010/0187948 A1 | 7/2010 | Sinha et al. |
| 2010/0189289 A1 | 7/2010 | Takeuchi |
| 2010/0205698 A1 | 8/2010 | Faucher et al. |
| 2010/0218286 A1 | 8/2010 | Lai et al. |
| 2010/0226765 A1 | 9/2010 | Yang et al. |
| 2010/0230629 A1 | 9/2010 | Yu et al. |
| 2010/0246859 A1 | 9/2010 | David et al. |
| 2010/0254549 A1 | 10/2010 | Onishi |
| 2010/0254561 A1 | 10/2010 | Kimura et al. |
| 2010/0276766 A1 | 11/2010 | Tang et al. |
| 2010/0276767 A1 | 11/2010 | Liu et al. |
| 2010/0277229 A1 | 11/2010 | Lee et al. |
| 2010/0278372 A1 | 11/2010 | Zhang |
| 2010/0283138 A1 | 11/2010 | Chen et al. |
| 2010/0284553 A1 | 11/2010 | Conti et al. |
| 2010/0289097 A1 | 11/2010 | Weigold et al. |
| 2010/0310096 A1 | 12/2010 | Josefsson et al. |
| 2010/0320548 A1 | 12/2010 | Tsau et al. |
| 2010/0330345 A1 | 12/2010 | Mirkin et al. |
| 2011/0005306 A1 | 1/2011 | Warren et al. |
| 2011/0026742 A1 | 2/2011 | Huang et al. |
| 2011/0030109 A1 | 2/2011 | Saito |
| 2011/0038492 A1 | 2/2011 | Ronald et al. |
| 2011/0040376 A1 | 2/2011 | Christie et al. |
| 2011/0045616 A1 | 2/2011 | Miyashita et al. |
| 2011/0055983 A1 | 3/2011 | Kawakatsu et al. |
| 2011/0057288 A1 | 3/2011 | Tan et al. |
| 2011/0061455 A1 | 3/2011 | Payton |
| 2011/0073859 A1 | 3/2011 | Chen et al. |
| 2011/0073967 A1 | 3/2011 | Chen et al. |
| 2011/0075865 A1 | 3/2011 | Yang et al. |
| 2011/0075866 A1 | 3/2011 | Zhang |
| 2011/0081335 A1 | 4/2011 | Medoff |
| 2011/0081336 A1 | 4/2011 | Medoff |
| 2011/0084344 A1 | 4/2011 | Huang et al. |
| 2011/0103011 A1 | 5/2011 | Koplow |
| 2011/0103622 A1 | 5/2011 | Weigold |
| 2011/0110139 A1 | 5/2011 | Mullner et al. |
| 2011/0115039 A1 | 5/2011 | Huang et al. |
| 2011/0131690 A1 | 6/2011 | Novak et al. |
| 2011/0138506 A1 | 6/2011 | Humphris |
| 2011/0138902 A1 | 6/2011 | White et al. |
| 2011/0142261 A1 | 6/2011 | Josefsson |
| 2011/0150260 A1 | 6/2011 | Miles |
| 2011/0154546 A1 | 6/2011 | Proksch et al. |
| 2011/0155559 A1 | 6/2011 | Medoff |
| 2011/0165720 A1 | 7/2011 | Weigold |
| 2011/0167524 A1 | 7/2011 | Hu et al. |
| 2011/0167525 A1 | 7/2011 | Humphris |
| 2011/0168549 A1 | 7/2011 | Roustaei et al. |
| 2011/0170108 A1 | 7/2011 | Degertekin |
| 2011/0183456 A1 | 7/2011 | Hsieh et al. |
| 2011/0187798 A1 | 8/2011 | Rogers et al. |
| 2011/0188687 A1 | 8/2011 | Song et al. |
| 2011/0189804 A1 | 8/2011 | Huang et al. |
| 2011/0214982 A1 | 9/2011 | Hagen |
| 2011/0239336 A1 | 9/2011 | Ruiter et al. |
| 2011/0241137 A1 | 10/2011 | Huang et al. |
| 2011/0247106 A1 | 10/2011 | Humphris |
| 2011/0248364 A1 | 10/2011 | Huang et al. |
| 2011/0286610 A1 | 11/2011 | Ronald |
| 2011/0296561 A1 | 12/2011 | Humphris et al. |
| 2011/0300659 A1 | 12/2011 | Hsieh et al. |
| 2011/0307980 A1 | 12/2011 | Park et al. |
| 2011/0311081 A1 | 12/2011 | Kim |
| 2011/0316100 A1 | 12/2011 | Kim et al. |
| 2012/0013224 A1 | 1/2012 | Sinha et al. |
| 2012/0030845 A1 | 2/2012 | Fukuma et al. |
| 2012/0045078 A1 | 2/2012 | Lander |
| 2012/0053580 A1 | 3/2012 | Sretavan |
| 2012/0062213 A1 | 3/2012 | Li et al. |
| 2012/0066799 A1 | 3/2012 | Esch et al. |
| 2012/0076329 A1 | 3/2012 | Miles |
| 2012/0077247 A1 | 3/2012 | Medoff |
| 2012/0079631 A1 | 3/2012 | Proksch et al. |
| 2012/0082325 A1 | 4/2012 | Sakurauchi et al. |
| 2012/0087521 A1 | 4/2012 | Delaus et al. |
| 2012/0091546 A1 | 4/2012 | Langereis et al. |
| 2012/0094355 A1 | 4/2012 | Medoff |
| 2012/0094358 A1 | 4/2012 | Medoff |
| 2012/0099753 A1 | 4/2012 | van der Avoort et al. |
| 2012/0112765 A1 | 5/2012 | Sparks et al. |
| 2012/0131702 A1 | 5/2012 | Shi et al. |
| 2012/0141562 A1 | 6/2012 | Achneck et al. |
| 2012/0153771 A1 | 6/2012 | Formosa et al. |
| 2012/0177229 A1 | 7/2012 | Lorenz et al. |
| 2012/0189144 A1 | 7/2012 | Delaus et al. |
| 2012/0189151 A1 | 7/2012 | Miles et al. |
| 2012/0195797 A1 | 8/2012 | Sparks et al. |
| 2012/0204296 A1 | 8/2012 | Prater et al. |
| 2012/0207324 A1 | 8/2012 | Harney et al. |
| 2012/0223726 A1 | 9/2012 | Zhang et al. |

(56) References Cited

U.S. PATENT DOCUMENTS

| | | |
|---|---|---|
| 2012/0240679 A1 | 9/2012 | Netzer et al. |
| 2012/0261775 A1 | 10/2012 | Wang et al. |
| 2012/0274183 A1 | 11/2012 | Sinha et al. |
| 2012/0282719 A1 | 11/2012 | Tang et al. |
| 2012/0295216 A1 | 11/2012 | Dykes et al. |
| 2012/0310338 A1 | 12/2012 | Christie et al. |
| 2012/0316376 A1 | 12/2012 | Medoff |
| 2012/0319174 A1 | 12/2012 | Wang |
| 2012/0331592 A1 | 12/2012 | Ohnesorge |
| 2013/0010989 A1 | 1/2013 | Zoellin et al. |
| 2013/0026969 A1 | 1/2013 | Kim et al. |
| 2013/0036521 A1 | 2/2013 | Prater et al. |
| 2013/0042375 A1 | 2/2013 | Humphris et al. |
| 2013/0044899 A1 | 2/2013 | Barber et al. |
| 2013/0047302 A1 | 2/2013 | Noel et al. |
| 2013/0047303 A1 | 2/2013 | King et al. |
| 2013/0049531 A1 | 2/2013 | Wang et al. |
| 2013/0056297 A1 | 3/2013 | Chen |
| 2013/0056841 A1 | 3/2013 | Hsieh et al. |
| 2013/0065343 A1 | 3/2013 | Yang et al. |
| 2013/0065344 A1 | 3/2013 | Weigold |
| 2013/0069179 A1 | 3/2013 | Ishimoto et al. |
| 2013/0080295 A1 | 3/2013 | Dykes et al. |
| 2013/0091642 A1 | 4/2013 | Dykes et al. |
| 2013/0101151 A1 | 4/2013 | Harney et al. |
| 2013/0103147 A1 | 4/2013 | Christie et al. |
| 2013/0104384 A1 | 5/2013 | Weigold |
| 2013/0108084 A1 | 5/2013 | Zhang |
| 2013/0117895 A1 | 5/2013 | Proksch et al. |
| 2013/0129118 A1 | 5/2013 | Mao et al. |
| 2013/0161702 A1 | 6/2013 | Chen |
| 2013/0164818 A9 | 6/2013 | Medoff |
| 2013/0174302 A1 | 7/2013 | Saito et al. |
| 2013/0177180 A1 | 7/2013 | Bharatan et al. |
| 2013/0183735 A9 | 7/2013 | Medoff |
| 2013/0208330 A1 | 8/2013 | Naono |
| 2013/0216520 A9 | 8/2013 | Medoff |
| 2013/0221457 A1 | 8/2013 | Conti et al. |
| 2013/0236036 A1 | 9/2013 | Weigold |
| 2013/0236037 A1 | 9/2013 | Weigold et al. |
| 2013/0255393 A1 | 10/2013 | Fukuzawa et al. |
| 2013/0260504 A1 | 10/2013 | Hsieh et al. |
| 2013/0261340 A1 | 10/2013 | Medoff |
| 2013/0264663 A1 | 10/2013 | Dehe et al. |
| 2013/0266556 A9 | 10/2013 | Medoff |
| 2013/0273612 A1 | 10/2013 | Medoff |
| 2013/0276175 A1 | 10/2013 | King et al. |
| 2013/0278937 A1 | 10/2013 | Degertekin |
| 2013/0279721 A1 | 10/2013 | David et al. |
| 2013/0288307 A1 | 10/2013 | Medoff |
| 2013/0288366 A1 | 10/2013 | Li et al. |
| 2013/0298294 A1 | 11/2013 | Kim |
| 2013/0300259 A1 | 11/2013 | Sinha et al. |
| 2013/0302933 A1 | 11/2013 | Tan et al. |
| 2013/0312142 A1 | 11/2013 | Kim |
| 2013/0312143 A1 | 11/2013 | Novak et al. |
| 2013/0313662 A1 | 11/2013 | Wang et al. |
| 2013/0327160 A1 | 12/2013 | Israelachvili |
| 2013/0327161 A1 | 12/2013 | Israelachvili |
| 2013/0333077 A1 | 12/2013 | Murdick et al. |
| 2013/0334627 A1 | 12/2013 | Conti et al. |
| 2013/0340126 A1 | 12/2013 | Proksch |
| 2013/0347147 A1 | 12/2013 | Zou et al. |
| 2014/0001577 A1 | 1/2014 | Liu et al. |
| 2014/0001581 A1 | 1/2014 | Liu |
| 2014/0003633 A1 | 1/2014 | Liu |
| 2014/0007309 A1 | 1/2014 | Plodinec et al. |
| 2014/0020556 A1 | 1/2014 | Yang |
| 2014/0026263 A1 | 1/2014 | Humphris |
| 2014/0030763 A1 | 1/2014 | Medoff |
| 2014/0030768 A1 | 1/2014 | Medoff |
| 2014/0038335 A1 | 2/2014 | Merassi et al. |
| 2014/0041084 A1 | 2/2014 | Proksch et al. |
| 2014/0045680 A1 | 2/2014 | Nakayama et al. |
| 2014/0053651 A1 | 2/2014 | Besling et al. |
| 2014/0061825 A1 | 3/2014 | Lee et al. |
| 2014/0070082 A1 | 3/2014 | Guo et al. |
| 2014/0072150 A1 | 3/2014 | Liu et al. |
| 2014/0072152 A1 | 3/2014 | Yang et al. |
| 2014/0084394 A1 | 3/2014 | Je |
| 2014/0084395 A1 | 3/2014 | Sparks et al. |
| 2014/0084748 A1 | 3/2014 | Wang et al. |
| 2014/0091406 A1 | 4/2014 | Harney et al. |
| 2014/0093102 A1 | 4/2014 | Josefsson et al. |
| 2014/0103464 A1 | 4/2014 | Bolognia et al. |
| 2014/0117272 A1 | 5/2014 | Yu et al. |
| 2014/0130213 A1 | 5/2014 | Gellineau et al. |
| 2014/0133685 A1 | 5/2014 | Liu et al. |
| 2014/0140533 A1 | 5/2014 | Malek et al. |
| 2014/0154749 A1 | 6/2014 | Medoff |
| 2014/0170624 A1 | 6/2014 | Boyd |
| 2014/0175572 A1 | 6/2014 | Hsu et al. |
| 2014/0177113 A1 | 6/2014 | Gueorguiev et al. |
| 2014/0202948 A1 | 7/2014 | Li |
| 2014/0205127 A1 | 7/2014 | Khenkin et al. |
| 2014/0210020 A1 | 7/2014 | Dehe |
| 2014/0211957 A1 | 7/2014 | Bolognia et al. |
| 2014/0217521 A1 | 8/2014 | Johari-Galle et al. |
| 2014/0220723 A1 | 8/2014 | Liu et al. |
| 2014/0223615 A1 | 8/2014 | Shi et al. |
| 2014/0225475 A1 | 8/2014 | Kim et al. |
| 2014/0226841 A1 | 8/2014 | Miles et al. |
| 2014/0230103 A1 | 8/2014 | Su et al. |
| 2014/0233782 A1 | 8/2014 | Bolognia et al. |
| 2014/0239352 A1 | 8/2014 | Wang |
| 2014/0246950 A1 | 9/2014 | Wang et al. |
| 2014/0246951 A1 | 9/2014 | Wang et al. |
| 2014/0254835 A1 | 9/2014 | Yakura |
| 2014/0256078 A1 | 9/2014 | Jin et al. |
| 2014/0256531 A1 | 9/2014 | Endo et al. |
| 2014/0264650 A1 | 9/2014 | Liu et al. |
| 2014/0265720 A1 | 9/2014 | El-Gamal et al. |
| 2014/0270273 A1 | 9/2014 | Muza et al. |
| 2014/0283229 A1 | 9/2014 | Hu et al. |
| 2014/0289912 A1 | 9/2014 | Andreev |
| 2014/0292138 A1 | 10/2014 | Wang et al. |
| 2014/0299949 A1 | 10/2014 | Conti et al. |
| 2014/0300248 A1 | 10/2014 | Wang et al. |
| 2014/0311243 A1 | 10/2014 | Geisberger et al. |
| 2014/0313141 A1 | 10/2014 | Park et al. |
| 2014/0321024 A1 | 10/2014 | Smoot |
| 2014/0331368 A1 | 11/2014 | Cannara et al. |
| 2014/0333177 A1 | 11/2014 | Guillou et al. |
| 2014/0338073 A1 | 11/2014 | Plodinec et al. |
| 2014/0338458 A1 | 11/2014 | Wang et al. |
| 2014/0339954 A1 | 11/2014 | Yamakawa et al. |
| 2014/0345007 A1 | 11/2014 | Williams et al. |
| 2014/0348982 A1 | 11/2014 | Medoff |
| 2014/0366228 A1 | 12/2014 | Williams et al. |
| 2014/0374237 A1 | 12/2014 | Medoff |
| 2014/0378805 A1 | 12/2014 | Ashton et al. |
| 2015/0001647 A1 | 1/2015 | Dehe et al. |
| 2015/0001653 A1 | 1/2015 | Schelling et al. |
| 2015/0001993 A1 | 1/2015 | Park et al. |
| 2015/0008540 A1 | 1/2015 | Chu et al. |
| 2015/0013037 A1 | 1/2015 | Proksch et al. |
| 2015/0023529 A1 | 1/2015 | Barzen et al. |
| 2015/0024536 A1 | 1/2015 | Dehe |
| 2015/0025627 A1 | 1/2015 | Christie et al. |
| 2015/0031160 A1 | 1/2015 | Wang |
| 2015/0035408 A1 | 2/2015 | Despesse et al. |
| 2015/0036797 A1 | 2/2015 | Nachaliel |
| 2015/0041929 A1 | 2/2015 | Bolognia |
| 2015/0044808 A1 | 2/2015 | Huang et al. |
| 2015/0047078 A1 | 2/2015 | Sarkar et al. |
| 2015/0047437 A1 | 2/2015 | Fukuzawa et al. |
| 2015/0060955 A1 | 3/2015 | Chen |
| 2015/0061048 A1 | 3/2015 | Escher-Poeppel et al. |
| 2015/0061464 A1 | 3/2015 | Park et al. |
| 2015/0074859 A1 | 3/2015 | Ruiter et al. |
| 2015/0122784 A1 | 5/2015 | Lee et al. |
| 2015/0125003 A1 | 5/2015 | Wiesbauer et al. |
| 2015/0125007 A1 | 5/2015 | Bolognia et al. |
| 2015/0125984 A1 | 5/2015 | Liu et al. |

(56) References Cited

U.S. PATENT DOCUMENTS

| | | |
|---|---|---|
| 2015/0126900 A1 | 5/2015 | Walraevens et al. |
| 2015/0129992 A1 | 5/2015 | Hur et al. |
| 2015/0146906 A1 | 5/2015 | Je et al. |
| 2015/0147841 A1 | 5/2015 | Hsieh et al. |
| 2015/0158722 A1 | 6/2015 | Lim et al. |
| 2015/0160259 A1 | 6/2015 | Liu et al. |
| 2015/0162523 A1 | 6/2015 | Umeda et al. |
| 2015/0195658 A1 | 7/2015 | Zhang |
| 2015/0215706 A1 | 7/2015 | Sparks et al. |
| 2015/0217260 A1 | 8/2015 | Medoff |
| 2015/0219622 A1 | 8/2015 | Hickman |
| 2015/0237448 A1 | 8/2015 | Loeppert |
| 2015/0238110 A1 | 8/2015 | Weinberg et al. |
| 2015/0241334 A1 | 8/2015 | Andreev |
| 2015/0242057 A1 | 8/2015 | Galela et al. |
| 2015/0251285 A1 | 9/2015 | Dehe et al. |
| 2015/0251899 A1 | 9/2015 | Dehe et al. |
| 2015/0253208 A1 | 9/2015 | Dehe et al. |
| 2015/0256913 A1 | 9/2015 | Dehe |
| 2015/0256940 A1 | 9/2015 | Dehe et al. |
| 2015/0264465 A1 | 9/2015 | Bharatan et al. |
| 2015/0271617 A1 | 9/2015 | Langlois et al. |
| 2015/0274506 A1 | 10/2015 | Feyh et al. |
| 2015/0276529 A1 | 10/2015 | Wiesbauer et al. |
| 2015/0290938 A1 | 10/2015 | Rogers et al. |
| 2015/0295101 A1 | 10/2015 | Potter |
| 2015/0301080 A1 | 10/2015 | Proksch et al. |
| 2015/0304777 A1 | 10/2015 | Xu et al. |
| 2015/0304787 A1 | 10/2015 | Harney et al. |
| 2015/0309071 A1 | 10/2015 | Proksch et al. |
| 2015/0316065 A1 | 11/2015 | Yang |
| 2015/0318800 A1 | 11/2015 | Zhang et al. |
| 2015/0338437 A1 | 11/2015 | Stan et al. |
| 2015/0342224 A1 | 12/2015 | Medoff |
| 2015/0344294 A1 | 12/2015 | Ghahremani et al. |
| 2015/0350790 A1 | 12/2015 | Miles et al. |
| 2015/0350792 A1 | 12/2015 | Grosh et al. |
| 2015/0353974 A1 | 12/2015 | Medoff |
| 2015/0362521 A1 | 12/2015 | Hurst et al. |
| 2015/0365747 A1 | 12/2015 | Aurongzeb et al. |
| 2015/0369838 A1 | 12/2015 | Lim et al. |
| 2015/0372620 A1 | 12/2015 | Zhang et al. |
| 2016/0003698 A1 | 1/2016 | Wiesbauer et al. |
| 2016/0003868 A1 | 1/2016 | Prater |
| 2016/0023438 A1 | 1/2016 | Johnson et al. |
| 2016/0028327 A1 | 1/2016 | Aliane |
| 2016/0028330 A1 | 1/2016 | Lee et al. |
| 2016/0029129 A1 | 1/2016 | Nicollini et al. |
| 2016/0031156 A1 | 2/2016 | Harkness et al. |
| 2016/0032341 A1 | 2/2016 | Medoff |
| 2016/0036351 A1 | 2/2016 | Kim et al. |
| 2016/0037265 A1 | 2/2016 | Khenkin |
| 2016/0038905 A1 | 2/2016 | Medoff |
| 2016/0040648 A1 | 2/2016 | Wang et al. |
| 2016/0043664 A1 | 2/2016 | Theuss et al. |
| 2016/0050499 A1 | 2/2016 | Bolognia et al. |
| 2016/0060101 A1 | 3/2016 | Loeppert |
| 2016/0065091 A1 | 3/2016 | Wang et al. |
| 2016/0066099 A1 | 3/2016 | Dehe et al. |
| 2016/0088389 A1 | 3/2016 | Khenkin et al. |
| 2016/0091378 A1 | 3/2016 | Tsai et al. |
| 2016/0096031 A1 | 4/2016 | Weinberg et al. |
| 2016/0096726 A1 | 4/2016 | Dehe et al. |
| 2016/0105538 A1 | 4/2016 | Olah et al. |
| 2016/0111954 A1 | 4/2016 | Bach et al. |
| 2016/0112803 A1 | 4/2016 | Scheben |
| 2016/0112807 A1 | 4/2016 | Yuan et al. |
| 2016/0127845 A1 | 5/2016 | Cagdaser et al. |
| 2016/0137486 A1 | 5/2016 | Bharatan |
| 2016/0145093 A1 | 5/2016 | Pan et al. |
| 2016/0149542 A1 | 5/2016 | Mucha et al. |
| 2016/0150324 A1 | 5/2016 | Yoo |
| 2016/0154022 A1 | 6/2016 | Humphris |
| 2016/0156282 A1 | 6/2016 | Kim et al. |
| 2016/0157025 A1 | 6/2016 | Miles et al. |
| 2016/0165331 A1 | 6/2016 | Liu et al. |
| 2016/0165926 A1 | 6/2016 | Medoff |
| 2016/0176704 A1 | 6/2016 | Cargill et al. |
| 2016/0192082 A1 | 6/2016 | Uchida et al. |
| 2016/0200567 A1 | 7/2016 | Dehe et al. |
| 2016/0209322 A1 | 7/2016 | Andreev |
| 2016/0214857 A1 | 7/2016 | Lin et al. |
| 2016/0218640 A1 | 7/2016 | Wang et al. |
| 2016/0223579 A1 | 8/2016 | Froemel et al. |
| 2016/0234592 A1 | 8/2016 | Bolognia et al. |
| 2016/0241022 A1 | 8/2016 | Gueorguiev et al. |
| 2016/0241965 A1 | 8/2016 | Chau |
| 2016/0241979 A1 | 8/2016 | Cho et al. |
| 2016/0242711 A1 | 8/2016 | Nachaliel |
| 2016/0252545 A1 | 9/2016 | Amponsah |
| 2016/0258979 A1 | 9/2016 | Shi et al. |
| 2016/0258980 A1 | 9/2016 | Proksch et al. |
| 2016/0274144 A1 | 9/2016 | Su et al. |
| 2016/0274146 A1 | 9/2016 | Novak et al. |
| 2016/0277846 A1 | 9/2016 | Lee |
| 2016/0280534 A1 | 9/2016 | Stahl et al. |
| 2016/0282384 A1 | 9/2016 | Proksch et al. |
| 2016/0284974 A1 | 9/2016 | Umeda et al. |
| 2016/0289577 A1 | 10/2016 | Medoff |
| 2016/0289704 A1 | 10/2016 | Medoff |
| 2016/0289705 A1 | 10/2016 | Medoff |
| 2016/0289706 A1 | 10/2016 | Medoff |
| 2016/0289709 A1 | 10/2016 | Medoff |
| 2016/0289710 A1 | 10/2016 | Medoff |
| 2016/0293990 A1 | 10/2016 | Medoff |
| 2016/0294305 A1 | 10/2016 | Kim et al. |
| 2016/0298141 A1 | 10/2016 | Medoff |
| 2016/0298147 A1 | 10/2016 | Medoff |
| 2016/0304336 A1 | 10/2016 | Schoen et al. |
| 2016/0304337 A1 | 10/2016 | Miao |
| 2016/0313367 A1 | 10/2016 | Hu et al. |
| 2016/0313369 A1 | 10/2016 | Proksch et al. |
| 2016/0315561 A1 | 10/2016 | Shin et al. |
| 2016/0341619 A1 | 11/2016 | Dehe et al. |
| 2016/0344308 A1 | 11/2016 | Wang et al. |
| 2016/0347627 A1 | 12/2016 | Li |
| 2016/0359429 A1 | 12/2016 | Byun et al. |
| 2016/0362811 A1 | 12/2016 | Lee et al. |
| 2016/0365808 A1 | 12/2016 | Kim et al. |
| 2016/0368811 A1 | 12/2016 | Eguchi |
| 2016/0373874 A1 | 12/2016 | Guo et al. |
| 2017/0003316 A1 | 1/2017 | Yang et al. |
| 2017/0022046 A1 | 1/2017 | Buck et al. |
| 2017/0025148 A1 | 1/2017 | Boyd |
| 2017/0025857 A1 | 1/2017 | Matthews |
| 2017/0028682 A9 | 2/2017 | Johnson et al. |
| 2017/0038410 A1 | 2/2017 | Serry |
| 2017/0052083 A1 | 2/2017 | Wiesbauer et al. |
| 2017/0052111 A1 | 2/2017 | Andreev et al. |
| 2017/0054308 A1 | 2/2017 | Olah et al. |
| 2017/0054389 A1 | 2/2017 | Boyd |
| 2017/0055081 A1 | 2/2017 | Zou et al. |
| 2017/0062180 A1 | 3/2017 | Budach et al. |
| 2017/0070164 A1 | 3/2017 | Taghavi et al. |
| 2017/0077838 A1 | 3/2017 | Wang et al. |
| 2017/0107097 A1 | 4/2017 | Cheng et al. |
| 2017/0127189 A1 | 5/2017 | Miles et al. |
| 2017/0130252 A1 | 5/2017 | Medoff |
| 2017/0131322 A1 | 5/2017 | Proksch et al. |
| 2017/0137282 A1 | 5/2017 | Sooriakumar et al. |
| 2017/0142524 A1 | 5/2017 | Sooriakumar et al. |
| 2017/0142525 A1 | 5/2017 | Glacer et al. |
| 2017/0143171 A1 | 5/2017 | Ophardt et al. |
| 2017/0143477 A1 | 5/2017 | Christie et al. |
| 2017/0150277 A1 | 5/2017 | Rombach |
| 2017/0152532 A1 | 6/2017 | Medoff |
| 2017/0166437 A1 | 6/2017 | Klein |
| 2017/0170752 A1 | 6/2017 | Wei |
| 2017/0180864 A1 | 6/2017 | Zhang et al. |
| 2017/0180870 A1 | 6/2017 | Hung et al. |
| 2017/0187307 A1 | 6/2017 | Wang et al. |
| 2017/0191894 A1 | 7/2017 | Wiesbauer et al. |
| 2017/0199219 A1 | 7/2017 | Zou et al. |
| 2017/0212145 A1 | 7/2017 | Lee et al. |

(56) References Cited

U.S. PATENT DOCUMENTS

| | | |
|---|---|---|
| 2017/0219391 A1 | 8/2017 | Lin et al. |
| 2017/0219622 A1 | 8/2017 | Yang et al. |
| 2017/0227577 A1 | 8/2017 | Liu et al. |
| 2017/0230757 A1 | 8/2017 | Kuntzman et al. |
| 2017/0230776 A1 | 8/2017 | Family et al. |
| 2017/0237365 A1 | 8/2017 | Kwon et al. |
| 2017/0237368 A1 | 8/2017 | Zhang et al. |
| 2017/0238107 A1 | 8/2017 | Walther et al. |
| 2017/0242052 A1 | 8/2017 | Hu et al. |
| 2017/0247244 A1 | 8/2017 | Dehe |
| 2017/0247246 A1 | 8/2017 | Schelling et al. |
| 2017/0260040 A1 | 9/2017 | Walther et al. |
| 2017/0260043 A1 | 9/2017 | Lin et al. |
| 2017/0260044 A1 | 9/2017 | Cargill et al. |
| 2017/0261532 A1 | 9/2017 | Pieper et al. |
| 2017/0272886 A1 | 9/2017 | Family et al. |
| 2017/0280263 A1 | 9/2017 | Guo et al. |
| 2017/0280265 A1 | 9/2017 | Po |
| 2017/0297895 A1 | 10/2017 | Kautzsch et al. |
| 2017/0299628 A1 | 10/2017 | Proksch et al. |
| 2017/0307668 A1 | 10/2017 | Buffa et al. |
| 2017/0311083 A1 | 10/2017 | Sun et al. |
| 2017/0311088 A1 | 10/2017 | Sun et al. |
| 2017/0311089 A1 | 10/2017 | Sun et al. |
| 2017/0313583 A1 | 11/2017 | Proksch et al. |
| 2017/0317609 A1 | 11/2017 | Kim et al. |
| 2017/0318385 A1 | 11/2017 | Harney et al. |
| 2017/0321233 A1 | 11/2017 | Medoff |
| 2017/0322094 A1 | 11/2017 | Kim et al. |
| 2017/0326522 A1 | 11/2017 | Burakowska-Meise et al. |
| 2017/0331396 A1 | 11/2017 | Byun et al. |
| 2017/0331397 A1 | 11/2017 | Kim et al. |
| 2017/0334714 A1 | 11/2017 | Gao et al. |
| 2017/0346416 A1 | 11/2017 | Rutgers et al. |
| 2017/0347185 A1 | 11/2017 | Kim et al. |
| 2017/0353043 A1 | 12/2017 | Olah et al. |
| 2017/0354945 A1 | 12/2017 | Burakowska-Meise et al. |
| 2017/0355591 A1 | 12/2017 | Hedenig et al. |
| 2017/0356810 A1 | 12/2017 | Fukuzawa et al. |
| 2017/0359648 A1 | 12/2017 | Park et al. |
| 2017/0367455 A1 | 12/2017 | Enrique |
| 2018/0002159 A1 | 1/2018 | Cargill et al. |
| 2018/0002160 A1 | 1/2018 | Piechocinski et al. |
| 2018/0002167 A1 | 1/2018 | Frischmuth et al. |
| 2018/0002168 A1 | 1/2018 | Cargill et al. |
| 2018/0009158 A1 | 1/2018 | Harkness et al. |
| 2018/0013358 A1 | 1/2018 | Turng et al. |
| 2018/0014099 A1 | 1/2018 | Loeppert |
| 2018/0022603 A1 | 1/2018 | Chu |
| 2018/0027337 A1 | 1/2018 | Hsu et al. |
| 2018/0029878 A1 | 2/2018 | Dehe et al. |
| 2018/0036939 A1 | 2/2018 | Sundaresan |
| 2018/0040806 A1 | 2/2018 | Gong et al. |
| 2018/0041139 A1 | 2/2018 | Shin et al. |
| 2018/0041842 A1 | 2/2018 | Zheng |
| 2018/0052186 A1 | 2/2018 | Su et al. |
| 2018/0056245 A1 | 3/2018 | Konradi et al. |
| 2018/0059137 A1 | 3/2018 | Prater |
| 2018/0062543 A1 | 3/2018 | Jung et al. |
| 2018/0068888 A1 | 3/2018 | Wang |
| 2018/0086624 A1 | 3/2018 | Cheng et al. |
| 2018/0091064 A1 | 3/2018 | Johnson et al. |
| 2018/0092557 A1 | 4/2018 | Bickford et al. |
| 2018/0099867 A1 | 4/2018 | Walther et al. |
| 2018/0106715 A1 | 4/2018 | Andreev et al. |
| 2018/0106830 A1 | 4/2018 | Fantner et al. |
| 2018/0106833 A1 | 4/2018 | Rath et al. |
| 2018/0111824 A1 | 4/2018 | Wu et al. |
| 2018/0113149 A1 | 4/2018 | Walter et al. |
| 2018/0115258 A1 | 4/2018 | Franklin et al. |
| 2018/0115836 A1 | 4/2018 | Hsieh et al. |
| 2018/0120344 A1 | 5/2018 | Prater et al. |
| 2018/0122356 A1 | 5/2018 | Yoo |
| 2018/0133431 A1 | 5/2018 | Malchano et al. |
| 2018/0133504 A1 | 5/2018 | Malchano et al. |
| 2018/0133507 A1 | 5/2018 | Malchano et al. |
| 2018/0136251 A1 | 5/2018 | Shi et al. |
| 2018/0138391 A1 | 5/2018 | Grosh et al. |
| 2018/0145613 A1 | 5/2018 | Shin et al. |
| 2018/0146272 A1 | 5/2018 | Hung et al. |
| 2018/0146296 A1 | 5/2018 | Meisel et al. |
| 2018/0152792 A1 | 5/2018 | Hoekstra et al. |
| 2018/0153450 A1 | 6/2018 | Routh et al. |
| 2018/0155183 A1 | 6/2018 | Sasaki et al. |
| 2018/0160911 A1 | 6/2018 | Fu et al. |
| 2018/0161749 A1 | 6/2018 | Medoff |
| 2018/0164342 A1 | 6/2018 | Humphris |
| 2018/0167730 A1 | 6/2018 | Parker |
| 2018/0180642 A1 | 6/2018 | Shetty et al. |
| 2018/0186623 A1 | 7/2018 | Vossough et al. |
| 2018/0191274 A1 | 7/2018 | Arulandu et al. |
| 2018/0192218 A1 | 7/2018 | Wu et al. |
| 2018/0194615 A1 | 7/2018 | Nawaz et al. |
| 2018/0203037 A1 | 7/2018 | Walter et al. |
| 2018/0203039 A1 | 7/2018 | Yang et al. |
| 2018/0205327 A1 | 7/2018 | Wu et al. |
| 2018/0214838 A1 | 8/2018 | Baumberg et al. |
| 2018/0216935 A1 | 8/2018 | Senkal et al. |
| 2018/0217181 A1 | 8/2018 | Friedman et al. |
| 2018/0254405 A1 | 9/2018 | Sprentall et al. |
| 2018/0255402 A1 | 9/2018 | Dehe |
| 2018/0259553 A1 | 9/2018 | Yang et al. |
| 2018/0262843 A1 | 9/2018 | Barzen |
| 2018/0262844 A1 | 9/2018 | Barzen |
| 2018/0263328 A1 | 9/2018 | Wang et al. |
| 2018/0267184 A1 | 9/2018 | Chen |
| 2018/0273372 A1 | 9/2018 | Piechocinski |
| 2018/0284175 A1 | 10/2018 | Bickford et al. |
| 2018/0287512 A1 | 10/2018 | Joye et al. |
| 2018/0288532 A1 | 10/2018 | Wu et al. |
| 2018/0292432 A1 | 10/2018 | Proksch et al. |
| 2018/0292470 A1 | 10/2018 | Bickford et al. |
| 2018/0294744 A1 | 10/2018 | Arulandu et al. |
| 2018/0294745 A1 | 10/2018 | Park et al. |
| 2018/0299479 A1 | 10/2018 | Liu et al. |
| 2018/0306837 A1 | 10/2018 | Sadeghian Marnani et al. |
| 2018/0316202 A1 | 11/2018 | Olah |
| 2018/0316281 A1 | 11/2018 | Lee |
| 2018/0332390 A1 | 11/2018 | Harney et al. |
| 2018/0332405 A1 | 11/2018 | Kim et al. |
| 2018/0352330 A1 | 12/2018 | Mucha et al. |
| 2018/0352341 A1 | 12/2018 | Reinmuth et al. |
| 2018/0353101 A1 | 12/2018 | Ouwerkerk et al. |
| 2018/0353756 A1 | 12/2018 | Walraevens et al. |
| 2018/0359571 A1 | 12/2018 | Zhan et al. |
| 2018/0370790 A1 | 12/2018 | Cheng et al. |
| 2018/0375443 A1 | 12/2018 | Arulandu et al. |
| 2019/0002309 A1 | 1/2019 | Cwiertny et al. |
| 2019/0006961 A1 | 1/2019 | Wu et al. |
| 2019/0011358 A1 | 1/2019 | Kjoller et al. |
| 2019/0013228 A1 | 1/2019 | Takata et al. |
| 2019/0018040 A1 | 1/2019 | Su et al. |
| 2019/0025340 A1 | 1/2019 | Sadeghian Marnani et al. |
| 2019/0028040 A1 | 1/2019 | Song et al. |
| 2019/0035601 A1 | 1/2019 | Budach et al. |
| 2019/0035957 A1 | 1/2019 | Pujari |
| 2019/0039882 A1 | 2/2019 | Theuss et al. |
| 2019/0047849 A1 | 2/2019 | Park et al. |
| 2019/0052976 A1 | 2/2019 | Sun |
| 2019/0055119 A1 | 2/2019 | Sooriakumar et al. |
| 2019/0056603 A1 | 2/2019 | Chien |
| 2019/0058419 A1 | 2/2019 | Gerhardt et al. |
| 2019/0061533 A1 | 2/2019 | Wang et al. |
| 2019/0062150 A1 | 2/2019 | Moitzi |
| 2019/0076812 A1 | 3/2019 | Burakowska-Meise et al. |
| 2019/0077654 A1 | 3/2019 | Reagan et al. |
| 2019/0082269 A1 | 3/2019 | Sun |
| 2019/0082270 A1 | 3/2019 | Sun |
| 2019/0082271 A1 | 3/2019 | Kim et al. |
| 2019/0087771 A1 | 3/2019 | Westphal et al. |
| 2019/0090048 A1 | 3/2019 | Kim et al. |
| 2019/0091650 A1 | 3/2019 | Medoff |
| 2019/0094265 A1 | 3/2019 | Sahin |
| 2019/0105011 A1 | 4/2019 | Kim et al. |

(56) References Cited

U.S. PATENT DOCUMENTS

| | | |
|---|---|---|
| 2019/0116429 A1 | 4/2019 | Meisel et al. |
| 2019/0119147 A1 | 4/2019 | Endo |
| 2019/0124452 A1 | 4/2019 | Hsieh et al. |
| 2019/0125523 A1 | 5/2019 | Barzilay |
| 2019/0127217 A1 | 5/2019 | Cargill et al. |
| 2019/0128919 A1 | 5/2019 | Amponsah |
| 2019/0131889 A1 | 5/2019 | Oliveira Ventura et al. |
| 2019/0150805 A1 | 5/2019 | Routh et al. |
| 2019/0150824 A1 | 5/2019 | Gerhardt et al. |
| 2019/0179136 A1 | 6/2019 | Menard et al. |
| 2019/0194013 A1 | 6/2019 | Chandrasekaran et al. |
| 2019/0195910 A1 | 6/2019 | Proksch et al. |
| 2019/0202358 A1 | 7/2019 | Arndt et al. |
| 2019/0210866 A1 | 7/2019 | Chen et al. |
| 2019/0222141 A1 | 7/2019 | Fearing et al. |
| 2019/0222941 A1 | 7/2019 | Hishinuma et al. |
| 2019/0230439 A1 | 7/2019 | Zhan et al. |
| 2019/0234993 A1 | 8/2019 | Friedman et al. |
| 2019/0239000 A1 | 8/2019 | Allegato et al. |
| 2019/0239817 A1 | 8/2019 | Ashton et al. |
| 2019/0245133 A1 | 8/2019 | Umeda et al. |
| 2019/0250185 A1 | 8/2019 | Baur |
| 2019/0255350 A1 | 8/2019 | Malchano et al. |
| 2019/0255669 A1 | 8/2019 | Dehe et al. |
| 2020/0244189 A1* | 7/2020 | Polesel-Maris .......... H02N 1/04 |

* cited by examiner

Proof Mass

ELECTRODYNAMICALLY LEVITATED ACTUATOR

CROSS REFERENCE TO RELATED APPLICATIONS

The present application is a Non-provisional of, and claims benefit of priority from, U.S. Provisional Patent Application No. 62/891,915, filed Aug. 26, 2019, the entirety of which is expressly incorporated herein by reference.

STATEMENT OF GOVERNMENT INTEREST

This invention was made with government support under ECCS 1608692IIP and CMMI 1919608 awarded by the National Science Foundation. The government has certain rights in the invention.

BACKGROUND OF THE INVENTION

Each reference cited herein is expressly incorporated herein by reference in its entirety. With increasing demand for high performance and technologically advanced electronic devices, more efficient and reliable sensors are needed to achieve the performance that has come to be expected of new technology. Sensors play a vital role in these devices by enabling them to interact with and acquire information from the user, their environment, and from themselves. Because of the demand for fast, simple, and energy efficient electronic devices, microelectromechanical systems (MEMS) are often used as sensors for their fast response time, low bulk fabrication costs, and low power consumption [1].

MEMS have a tremendous range of applications and can be used as sensors [2-4], switches [5,6], energy harvesters [7-11], signal filters [12-15], etc., or for multiple applications at once [16,17] (e.g. a sensor-switch). Many of these devices use electrostatic actuation because it can be easily fabricated, consumes minimal power, and can be integrated in electronic circuits without much difficulty [1]. Traditional electrostatic actuation utilizes a parallel plate capacitor configuration with electrostatic forces pulling a movable electrode (typically a beam or plate) towards a fixed one. This can cause the electrodes to collapse if the voltage potential between them is high enough (pull-in). For switches, this is desirable because it closes a circuit between the electrodes if the contacting faces are conductive. Therefore, a MEMS switch can be toggled to closed by applying the pull-in voltage between the electrodes. While pull-in is necessary for switches, it is usually undesirable for sensors, which in many cases need the ability to move freely.

Some effort has been made to eliminate the pull-in instability by exploiting electrostatic levitation [18-30]. This creates an effectively repulsive force between the two electrodes instead of an attractive one. Lee and Cho [18] first applied a similar concept to a MEMS device in 2001 where they demonstrated that two grounded electrodes would be pulled away from each other when in close proximity to a charged electrode on their side. He and Ben-Mrad flipped this design on its side to create out of plane actuation [21]. This configuration, shown in FIG. 1, has a beam placed above a fixed electrode, both of which are grounded. Two charged electrodes are placed on either side of the fixed electrode and generate a net electrostatic force on the beam away from the substrate. Because the electrostatic force is generated through the fringe field, a very large voltage is needed to actuate the beam. This requirement of high voltage can easily be satisfied by connecting the actuator to a triboelectric generator. See: U.S. Pat. Nos. 3,937,917; 3,955,426; 4,074,580; 4,521,854; 4,553,917; 4,929,400; 4,981,625; 5,015,528; 5,015,906; 5,162,969; 5,196,999; 5,206,504; 5,215,688; 5,247,144; 5,374,801; 5,653,175; 5,783,335; 5,789,843; 5,969,848; 5,992,233; 6,067,858; 6,250,156; 6,276,147; 6,286,323; 6,296,779; 6,369,006; 6,469,825; 6,484,539; 6,490,081; 6,541,892; 6,549,703; 6,592,689; 6,601,888; 6,626,039; 6,679,118; 6,681,094; 6,686,299; 6,721,093; 6,781,750; 6,841,917; 6,856,067; 6,858,184; 6,900,440; 6,906,789; 6,906,855; 6,950,175; 6,972,896; 7,061,964; 7,070,665; 7,200,493; 7,225,674; 7,252,001; 7,260,959; 7,359,037; 7,372,548; 7,447,250; 7,456,859; 7,544,245; 7,551,265; 7,564,559; 7,599,143; 7,726,035; 7,794,553; 7,815,484; 7,864,829; 7,940,150; 8,028,541; 8,030,823; 8,146,425; 8,221,098; 8,222,795; 8,228,675; 8,336,380; 8,370,105; 8,485,027; 8,487,511; 8,545,942; 8,915,790; 8,939,029; 8,940,361; 8,988,881; 9,005,281; 9,040,439; 9,132,420; 9,207,023; 9,254,496; 9,309,162; 9,316,665; 9,371,173; 9,381,528; 9,427,679; 9,492,272; 9,498,934; 9,625,075; 9,735,338; 9,908,288; 9,963,763; 9,975,064; 10,033,307; 10,155,179; 10,166,740; 10,233,561; 10,244,901; 10,351,464; 20020027664; 20020053375; 20020093251; 20020106314; 20020130524; 20020140533; 20020187618; 20030015807; 20030049642; 20030068179; 20030086154; 20030112499; 20030141453; 20030150268; 20040050458; 20040163471; 20040239283; 20040239911; 20040246569; 20040246570; 20050024808; 20050034200; 20050199180; 20050200830; 20050204817; 20050241394; 20060023195; 20060027709; 20060042314; 20060073395; 20060177147; 20060203417; 20060205095; 20070007393; 20070247739; 20070274368; 20070279638; 20080100175; 20080135138; 20090076294; 20090151182; 20090193893; 20090199997; 20090241719; 20090243426; 20090312980; 20100058865; 20100177480; 20100187948; 20100226765; 20110040376; 20110061455; 20110103011; 20110214982; 20120013224; 20120223726; 20120240679; 20120274183; 20120310338; 20130103147; 20130300259; 20140020556; 20140045680; 20140256531; 20140311243; 20140321024; 20140333177; 20140339954; 20150025627; 20150122784; 20150316065; 20160023438; 20160028330; 20160031156; 20160362811; 20160368811; 20170028682; 20170143171; 20170143477; 20180009158; 20180092557; 20180216935; 20180267184; 20180284175; 20180292470; 20190013228; 20190119147; 20190179136; and 20190222141.

Triboelectricity has been investigated in recent years as a possible transduction mechanism for converting mechanical energy to electrical energy because of its high energy conversion efficiency and large voltage output [31-39]. Triboelectric charging occurs when two materials with different affinities to gain or lose electrons are brought into contact with each other. Electrons are passed from one material to another at the contact area to equalize the potential at the interface. These materials retain their charge even after the materials have been separated. Despite its large voltage, the current produced is on the order of nanoamps. However, the repulsive force electrode configuration from [21] acts as a completely open circuit between the side electrodes and beam/center electrode, requiring no current. This means the high output voltage of a tribolelectric generator can be exploited for this purpose without the downside of a low power output. Triboelectric MEMs are shown in [42, 59].

The working principle of a triboelectric generator (TEG) is based on coupling between triboelectrification and electrostatic induction [40]. A 3D model of the generator can be seen in FIGS. 2A and 2B. The TEG consists of two aluminum electrodes (one fixed, one free) and a PDMS insulator. The PDMS is mounted on the fixed electrode with the exposed face machined to increase surface area. The free electrode is also machined on one side with a reverse pattern and mounted above the PDMS with a set of springs or a clamped-clamped beam. When the generator receives an impact, the free electrode comes into contact with the PDMS and triboelectric charges are created. After the impact, the layers separate because of the springs and a potential difference is generated between the two electrodes. If the two electrodes are connected, the current will be induced through the wire to equalize the voltage potential. If the electrodes are disconnected, the PDMS retain its triboelectric charges, which allows the electrodes to stay charged for a short period of time, such as in the case of FIGS. 2A and 2B. See: U.S. Pat. Nos. 4,990,813; 7,621,471; 8,179,278; 8,519,596; 8,536,760; 9,178,446; 9,287,487; 9,351,690; 9,394,875; 9,444,031; 9,453,774; 9,484,842; 9,490,306; 9,491,271; 9,543,860; 9,569,055; 9,571,009; 9,595,894; 9,625,330; 9,700,266; 9,748,868; 9,762,151; 9,790,928; 9,812,993; 9,825,558; 9,837,933; 9,837,934; 9,843,275; 9,847,659; 9,874,679; 9,887,644; 9,899,939; 9,921,678; 9,985,554; 10,006,819; 10,008,867; 10,011,222; 10,014,799; 10,027,187; 10,034,633; 10,042,446; 10,0425,04; 10,075,100; 10,103,649; 10,108,305; 10,193,472; 10,199,958; 10,211,758; 10,256,381; 10,265,025; 10,318,090; 10,367,431; 20060064826; 20070145167; 20070192972; 20100133006; 20130049531; 20140084748; 20140202948; 20140225475; 20140246950; 20140246951; 20140292138; 20140300248; 20140313141; 20140338458; 20140378805; 20150001993; 20150035408; 20150036797; 20150061464; 20150238110; 20150242057; 20150295101; 20150318800; 20150372620; 20160028327; 20160036351; 20160040648; 20160065091; 20160096031; 20160105538; 20160156282; 20160218640; 20160242711; 20160294305; 20160315561; 20160344308; 20160347627; 20160359429; 20160365808; 20170025857; 20170054308; 20170070164; 20170077838; 20170170752; 20170187307; 20170219391; 20170237365; 20170237368; 20170317609; 20170322094; 20170331396; 20170331397; 20170346416; 20170353043; 20170367455; 20180013358; 20180040806; 20180041139; 20180062543; 20180091064; 20180115258; 20180145613; 20180153450; 20180160911; 20180191274; 20180205327; 20180254405; 20180263328; 20180287512; 20180294744; 20180294745; 20180316202; 20180316281; 20180353101; 20180375443; 20190006961; 20190028040; 20190035957; 20190056603; 20190058419; 20190061533; 20190087771; 20190125523; 20190131889; 20190150805; 20190150824; and 20190239817.

Nonlinearity in electrostatic microelectromechanical systems (MEMS) presents a challenging obstacle in the design of many MEMS sensors and actuators. Electrostatic MEMS convert electrical energy in the form of a voltage potential to kinetic and strain energy in a microstructure or vice versa. In most cases, MEMS are interfaced with electronic circuits to supply power or read the signal from a MEMS sensor. Ideally, sensors and actuators would have a linear relationship between voltage and the electrode position to simplify and miniaturize the electronic circuit. However, the electrostatic force is inherently nonlinear and typically has the relationship Force ~voltage$^2$/gap$^2$, where the gap is the distance between electrodes. Nonlinearity effectively causes the devices to behave differently at different voltage levels and gaps, so the working range of a device is normally limited to small motions where the force can be treated as effectively linear. However, a smaller range creates less actuation distance for actuators and a smaller signal-to-noise ratio in sensors.

The most common structure of an electrostatic MEMS device consists of two electrodes that act like parallel plates. One electrode is fixed and the other is movable, such as a micro-beam that deflects under the influence of an external force. Applying a voltage potential between the two electrodes creates an electric field that pulls them together. This is the most common method of actuation and sensing in commercial MEMS because it has low bulk fabrication costs, very fast response times, and can be easily integrated into an electronic circuit [45]. However, the electrostatic force is highly nonlinear and can create instability that leads to pull-in (when the two electrodes collapse together), stiction [46], and even chaos [47]. Alternative electrode arrangements have been proposed to avoid instability in electrostatic MEMS [48-51], but all are hampered by the nonlinearity associated with electrostatic forces.

U.S. Pat. No. 7,225,674, discusses a MEMS proof mass that is levitated without any anchoring points. It depends on two electrodes with the same charge repelling each other. The switch uses the attractive electrostatic force with opposite charges to pull two electrodes away from each other. The electric fringe field from the side electrodes pulls on the top of the beam more than the bottom as a result of the shielding that center fixed electrode provides to the bottom face of the beam, and induces a net force upwards. If the beam travels too far away from the center electrode then it would once again be pulled back down with an attractive force because the electric field starts pulling on the bottom face of the beam as it would with a parallel plate. However, the geometry is designed such that this cross over point does not happen until the beam reaches a substantially large deflection.

US20180262843 provides a system and method for a multi-electrode MEMS device, in which electrostatic repulsive forces may be used between the backplate and the membrane to prevent collapse or pull-in.

U.S. Pat. No. 8,963,659 provides electrostatic MEMS devices with high reliability.

Weimin Wang, Qiang Wang, Hao Ren, Wenying Ma, Chuankai Qiu, Zexiang Chen & Bin Fan, "Electrostatic repulsive out-of-plane actuator using conductive substrate", Scientific Reports volume 6, Article number: 35118 (2016), discloses an electrostatic actuator suspended above a ground plane, as shown in FIG. 33, with raised side electrodes also above the ground plane to drive its motion. This was originally proposed by He, S. & Ben Mrad, R. Large-stroke microelectrostatic actuators for vertical translation of micromirrors used in adaptive optics. IEEE Trans. Ind. Electron. 52, 974-983 (2005). This system does not add a bias voltage to combine the effects of the levitation force and that of a parallel plate. Therefore, there is no possibility of pull-in, which is the basis for the switching mechanism. In the switch embodiment, the levitation force can be strong enough to lift off a pulled-in microbeam, that would normally be permanently stuck to the center electrode in a pure parallel plate system.

Matthias Imboden, Jessica Morrison, Evan Lowell, Han Han, and David J. Bishop, "Controlling Levitation and Enhancing Displacement in Electrostatic Comb Drives of MEMS Actuators", IEEE J. Microelectromechanical Systems (2014) also provides levitation with respect to a set of raised electrodes. See also, Liao, Yunn-Shivan, Shiang-Woei Chyuan, and Jeng-Tzong Chen. "An alternatively efficient method (DBEM) for simulating the electrostatic field and levitating force of a MEMS combdrive." Journal of Micromechanics and Microengineering 14, no. 8 (2004): 1258, and U.S. Pub. App. 20090322260. FIGS. 34 and 35 shows clear distinctions from FIG. 12, and reflect that the field lines of FIGS. 34 and 35 from the stationary electrodes do not provide significant forces beneath the moveable finger, while in FIGS. 34 and 35, the field lines present forces on the moveable electrode from above and beneath. In FIGS. 34 and 35, the moveable finger is held at the same potential as the ground plane (no field lines between the moveable finger and the substrate), while in FIG. 12, these are at different potential. Note that in FIG. 34, the ground plane extends beneath the stationary electrodes, and in FIG. 35, the field lines from the lateral electrodes are shunted to the center electrode, while in FIG. 12, there are field lines between the middle electrode and the moving electrode. The force exerted by the stationary electrodes on the moving electride of Liao is non-linear, and is reflected by the formula F is $0.1504 \varepsilon V_p^2\ \mu m^{-1}$, that is, the levitating force is proportional to $V^2$, and the zero force position is at some distance above the substrate. See, also Chyuan, Shiang-Woei, Yunn-Shivan Liao, and Jeng-Tzong Chen. "Computational study of the effect of finger width and aspect ratios for the electrostatic levitating force of MEMS combdrive." Journal of Microelectromechanical Systems 14, no. 2 (2005): 305-312, and Chyuan, Shiang-Woei. "Computational simulation for MEMS combdrive levitation using FEM." Journal of Electrostatics 66, no. 7-8 (2008): 361-365.

Mark Pallay, Meysam Daeichin, and Shahrzad Towfighian, "Dynamic behavior of an electrostatic MEMS resonator with repulsive actuation", Nonlinear Dyn (2017) 89:1525-1538, DOI 10.1007/s11071-017-3532-z, discloses a repulsive force actuator similar to that shown in FIG. 1. However, the center electrode is held at the same potential as the moving electrode, as shown in FIGS. 36a-36f.

Liu, Zengtao, Myongseob Kim, Nick Shen, and Edwin C. Kan. "Novel electrostatic repulsion forces in MEMS applications by nonvolatile charge injection." In Technical Digest. MEMS 2002 IEEE International Conference. Fifteenth IEEE International Conference on Micro Electro Mechanical Systems (Cat. No. 02CH37266), pp. 598-601. IEEE, 2002 employ non-volatile charge injection to produce levitation actuation of a MEMS beam.

Suzuki, Yuji, Daigo Miki, Masato Edamoto, and Makoto Honzumi. "A MEMS electret generator with electrostatic levitation for vibration-driven energy-harvesting applications." Journal of Micromechanics and Microengineering 20, no. 10 (2010): 104002, utilizes the levitation force, for the purpose of energy harvesting. The design requires use of an electret.

MEMS microphones are well known. The pull-in problem is well-known, and therefore many configurations employ interdigital fingers with balanced forces in a plane of the diaphragm, to permit capacitive sensing. See, US 20170127189; 20160157025; 20150350790; 20140226841; 20120189151; 20120076329; 20110286610; 20110150260; 20110038492; 20090262958; 20090046883; 20090016557; 20080235079; 20080101641; 20070297631; 20070165896; 20060026054; U.S. Pat. Nos. 9,906,869; 9,554,213; 9,181,086; 9,113,249; 8,582,795; 8,548,178; 8,503,701; 8,374,371; 8,276,254; 8,214,999; 8,073,167; 8,019,640; 7,992,283; 7,903,835; 7,876,924; 7,826,629; 7,545,945; 6,963,653; 6,788,796; 6,859,542; 7,019,955; 7,253,488; 7,395,698; 7,425,749; 7,441,447; 7,449,356; 7,456,043; 7,461,543; 7,520,173; 7,538,401; 7,538,477; 7,552,625; 7,579,753; 7,586,659; 7,600,533; 7,637,149; 7,642,115; 7,707,873; 7,781,249; 7,785,912; 7,795,063; 7,795,695; 7,826,629; 7,855,095; 7,856,804; 7,885,423; 7,941,909; 7,951,636; 7,952,154; 7,961,897; 8,013,405; 8,030,112; 8,036,401; 8,041,064; 8,065,919; 8,081,782; 8,093,087; 8,094,839; 8,094,846; 8,103,027; 8,114,700; 8,130,979; 8,141,573; 8,158,492; 8,169,042; 8,188,557; 8,208,671; 8,220,318; 8,243,962; 8,258,591; 8,258,678; 8,261,602; 8,270,634; 8,276,254; 8,295,528; 8,309,386; 8,330,239; 8,338,898; 8,345,895; 8,345,910; 8,351,632; 8,356,521; 8,358,793; 8,363,860; 8,368,153; 8,374,363; 8,416,970; 8,422,703; 8,428,281; 8,433,084; 8,455,288; 8,460,961; 8,461,657; 8,477,983; 8,488,812; 8,502,329; 8,503,701; 8,507,306; 8,524,519; 8,525,389; 8,542,850; 8,553,911; 8,565,452; 8,587,078; 8,590,136; 8,593,155; 8,625,809; 8,641,919; 8,643,129; 8,664,733; 8,673,732; 8,710,601; 8,755,541; 8,783,113; 8,787,600; 8,818,007; 8,828,773; 8,831,246; 8,833,171; 8,836,111; 8,837,754; 8,841,737; 8,841,738; 8,842,859; 8,847,289; 8,860,154; 8,865,500; 8,897,470; 8,901,683; 8,921,956; 8,934,648; 8,940,639; 8,942,394; 8,946,831; 8,948,419; 8,952,468; 8,955,212; 8,962,368; 8,965,027; 8,973,446; 8,995,693; 9,002,036; 9,002,039; 9,029,179; 9,029,963; 9,039,976; 9,042,581; 9,055,372; 9,061,889; 9,078,068; 9,078,069; 9,096,424; 9,133,016; 9,143,870; 9,150,403; 9,150,407; 9,154,886; 9,157,856; 9,173,024; 9,179,221; 9,181,080; 9,181,086; 9,212,052; 9,219,963; 9,226,052; 9,227,843; 9,237,402; 9,249,008; 9,264,814; 9,266,716; 9,302,904; 9,309,105; 9,309,109; 9,321,635; 9,329,610; 9,332,332; 9,332,345; 9,338,538; 9,340,413; 9,343,455; 9,344,809; 9,346,667; 9,357,296; 9,359,188; 9,372,111; 9,386,379; 9,407,997; 9,409,763; 9,419,562; 9,438,979; 9,448,126; 9,451,359; 9,462,395; 9,462,402; 9,484,524; 9,488,541; 9,494,477; 9,498,312; 9,505,614; 9,510,107; 9,510,121; 9,544,678; 9,554,213; 9,571,931; 9,580,299; 9,584,889; 9,596,547; 9,611,135; 9,621,975; 9,626,981; 9,628,101; 9,628,920; 9,631,996; 9,641,950; 9,656,854; 9,670,059; 9,674,618; 9,674,619; 9,676,614; 9,676,615; 9,681,234; 9,681,242; 9,681,243; 9,695,038; 9,695,040; 9,701,534; 9,724,001; 9,725,300; 9,749,752; 9,758,369; 9,759,618; 9,769,562; 9,773,141; 9,787,320; 9,809,444; 9,809,448; 9,816,881; 9,828,237; 9,836,633; 9,856,134; 9,860,620; 9,872,112; 9,900,677; 9,906,869; 9,914,636; 9,919,913; 9,924,288; 9,930,453; 9,938,133; 9,945,746; 9,945,884; 9,949,037; 9,961,450; 9,986,344; 9,994,440; 9,998,828; 9,999,770; RE40781; 10,000,374; 10,006,824; 10,011,479; 10,045,121; 10,045,126; 10,065,851; 10,065,852; 10,074,000; 10,081,537; 10,082,430; 10,087,071; 10,104,478; 10,104,490; 10,111,021; 10,118,817; 10,129,651; 10,129,676; 10,131,541; 10,138,115; 10,155,656; 10,158,949; 10,158,952; 10,170,685; 10,171,916; 10,177,027; 10,189,699; 10,206,023; 10,223,567; 10,228,387; 10,237,650; 10,250,963; 10,250,998; 10,257,609; 10,276,147; 10,279,192; 10,293,177; 10,301,174; 10,307,611; 10,312,427; 10,315,912; 10,322,481; 10,343,898; 10,343,901; 10,349,170; 10,349,187; 10,349,188; 10,351,419; 10,362,408; 10,370,242; 10,375,475; 20020181725; 20050013455; 20050130360; 20060283338; 20070012094; 20070023851; 20070047744; 20070047746; 20070064968; 20070066027; 20070087466; 20070089496; 20070092983; 20070103697; 20070107502; 20070165888; 20070165896; 20070190680; 20070284682; 20070287233; 20070295064; 20080049953; 20080075306; 20080152171; 20080204757; 20080247572; 20080304681; 20080307865; 20090016550; 20090029501; 20090041270; 20090067659; 20090119905; 20090130783; 20090161894; 20090166772; 20090169035; 20090179233; 20090180647; 20090185250; 20090202089; 20090278217; 20090285418; 20100020991; 20100054495; 20100072561; 20100107772; 20100142744; 20100155864; 20100158279; 20100158280;

20100180354; 20100189289; 20100230629; 20100246859; 20100254549; 20100254561; 20100276766; 20100276767; 20100277229; 20100278372; 20100283138; 20100284553; 20100289097; 20100310096; 20100320548; 20110026742; 20110038492; 20110045616; 20110057288; 20110073859; 20110073967; 20110075865; 20110075866; 20110084344; 20110103622; 20110115039; 20110138902; 20110142261; 20110165720; 20110170108; 20110183456; 20110188687; 20110189804; 20110241137; 20110248364; 20110300659; 20110311081; 20110316100; 20120045078; 20120082325; 20120087521; 20120091546; 20120099753; 20120112765; 20120153771; 20120177229; 20120189144; 20120195797; 20120207324; 20120261775; 20120282719; 20120295216; 20120319174; 20130010989; 20130044899; 20130056297; 20130056841; 20130065343; 20130065344; 20130069179; 20130080295; 20130091642; 20130101151; 20130104384; 20130108084; 20130129118; 20130161702; 20130177180; 20130221457; 20130236036; 20130236037; 20130255393; 20130260504; 20130264663; 20130278937; 20130279721; 20130302933; 20130313662; 20130334627; 20140001577; 20140001581; 20140003633; 20140038335; 20140053651; 20140061825; 20140070082; 20140072150; 20140072152; 20140084394; 20140084395; 20140091406; 20140093102; 20140103464; 20140117272; 20140133685; 20140140533; 20140175572; 20140177113; 20140205127; 20140210020; 20140211957; 20140217521; 20140220723; 20140233782; 20140239352; 20140254835; 20140264650; 20140265720; 20140270273; 20140299949; 20150001647; 20150001653; 20150008540; 20150023529; 20150024536; 20150031160; 20150041929; 20150044808; 20150047437; 20150060955; 20150061048; 20150125003; 20150125007; 20150125984; 20150126900; 20150129992; 20150146906; 20150147841; 20150158722; 20150162523; 20150195658; 20150215706; 20150237448; 20150251285; 20150251899; 20150253208; 20150256913; 20150256940; 20150264465; 20150271617; 20150274506; 20150276529; 20150304777; 20150304787; 20150344294; 20150350792; 20150362521; 20150365747; 20160003698; 20160029129; 20160037265; 20160043664; 20160050499; 20160060101; 20160066099; 20160088389; 20160091378; 20160096726; 20160111954; 20160112803; 20160112807; 20160127845; 20160137486; 20160145093; 20160149542; 20160150324; 20160157025; 20160165331; 20160176704; 20160192082; 20160200567; 20160214857; 20160223579; 20160234592; 20160241022; 20160241965; 20160241979; 20160277846; 20160280534; 20160284974; 20160304336; 20160304337; 20160341619; 20160373874; 20170022046; 20170052083; 20170055081; 20170107097; 20170127189; 20170137282; 20170142524; 20170142525; 20170150277; 20170166437; 20170180864; 20170180870; 20170191894; 20170230757; 20170230776; 20170238107; 20170247244; 20170247246; 20170260040; 20170260043; 20170260044; 20170272886; 20170280263; 20170280265; 20170297895; 20170307668; 20170311083; 20170311088; 20170311089; 20170318385; 20170334714; 20170347185; 20170355591; 20170356810; 20170359648; 20180002159; 20180002160; 20180002167; 20180002168; 20180014099; 20180022603; 20180027337; 20180029878; 20180041842; 20180068888; 20180086624; 20180099867; 20180111824; 20180115836; 20180122356; 20180133431; 20180133504; 20180133507; 20180138391; 20180146272; 20180146296; 20180152792; 20180167730; 20180186623; 20180192218; 20180194615; 20180255402; 20180262844; 20180273372; 20180288532; 20180332390; 20180332405; 20180352330; 20180352341; 20180353756; 20180359571; 20180370790; 20190039882; 20190047849; 20190052976; 20190055119; 20190062150; 20190077654; 20190082269; 20190082270; 20190082271; 20190090048; 20190105011; 20190116429; 20190124452; 20190127217; 20190194013; 20190202358; 20190210866; 20190222941; 20190230439; 20190239000; 20190245133; 20190255350; 20190255669;

Scanning probe microscopes and related devices are well known. Many designs employ a probe which is driven into a surface, and its height of contact measured. One way to measure the height is to propel the probe with a known and dynamically stable motion profile into the surface, and record the timing of contact. Other techniques employ optical sensing, piezoelectric sensing, etc. See, U.S. Pat. Nos. 5,136,162; 5,150,392; 5,166,516; 5,168,159; 5,216,631; 5,231,286; 5,245,863; 5,274,230; 5,289,004; 5,298,975; 5,307,311; 5,331,275; 5,336,887; 5,338,932; 5,394,741; 5,436,448; 5,461,605; 5,464,977; 5,467,642; 5,481,528; 5,515,719; 5,517,027; 5,565,987; 5,583,446; 5,585,722; 5,610,898; 5,633,455; 5,675,154; 5,729,026; 5,744,704; 5,804,709; 5,804,710; 5,822,285; 5,854,487; 5,856,617; 5,856,672; 5,866,021; 5,866,807; 5,880,360; 5,923,637; 6,004,444; 6,057,546; 6,066,265; 6,076,397; 6,100,524; 6,101,164; 6,172,506; 6,189,374; 6,228,248; 6,242,736; 6,287,765; 6,291,822; 6,310,342; 6,383,823; 6,452,170; 6,470,738; 6,489,611; 6,530,266; 6,547,940; 6,642,517; 6,672,144; 6,677,697; 6,684,676; 6,762,025; 6,810,720; 6,827,979; 6,828,786; 6,851,301; 6,856,145; 6,862,924; 6,880,388; 6,904,791; 6,923,044; 6,935,167; 6,955,078; 6,986,280; 7,010,949; 7,013,717; 7,017,398; 7,023,220; 7,036,357; 7,044,007; 7,053,520; 7,066,015; 7,076,996; 7,081,624; 7,137,292; 7,155,964; 7,163,658; 7,179,356; 7,204,131; 7,242,129; 7,253,407; 7,262,984; 7,279,686; 7,280,290; 7,281,419; 7,297,946; 7,328,446; 7,344,756; 7,373,806; 7,387,035; 7,393,699; 7,395,698; 7,420,106; 7,441,447; 7,446,324; 7,451,638; 7,453,183; 7,456,400; 7,461,543; 7,489,211; 7,493,794; 7,513,142; 7,523,650; 7,524,534; 7,545,592; 7,552,625; 7,555,940; 7,596,989; 7,603,891; 7,637,149; 7,658,097; 7,665,350; 7,696,653; 7,701,834; 7,707,873; 7,710,766; 7,757,544; 7,765,607; 7,794,657; 7,798,011; 7,852,739; 7,895,885; 7,908,908; 7,928,343; 7,931,784; 7,958,776; 7,979,916; 7,989,164; 7,996,860; 8,020,216; 8,023,393; 8,024,963; 8,029,503; 8,067,169; 8,091,143; 8,151,368; 8,187,673; 8,205,487; 8,220,318; 8,233,314; 8,261,602; 8,266,718; 8,296,856; 8,322,220; 8,341,760; 8,371,182; 8,384,372; 8,387,443; 8,405,138; 8,443,461; 8,448,501; 8,453,498; 8,454,803; 8,479,310; 8,490,209; 8,524,613; 8,528,110; 8,533,861; 8,555,711; 8,583,403; 8,609,409; 8,637,284; 8,646,109; 8,646,344; 8,646,345; 8,650,660; 8,677,809; 8,680,467; 8,719,960; 8,726,409; 8,728,779; 8,732,861; 8,739,309; 8,747,624; 8,756,711; 8,764,948; 8,771,480; 8,793,811; 8,835,142; 8,841,101; 8,852,896; 8,869,310; 8,875,311; 8,877,472; 8,910,311; 8,914,911; 8,921,473; 8,931,950; 8,943,611; 8,950,010; 8,955,161; 8,973,161; 8,980,602; 8,997,260; 8,997,261; 9,023,183; 9,052,337; 9,052,339; 9,061,494; 9,069,007; 9,078,461; 9,091,705; 9,110,092; 9,116,168; 9,134,341; 9,138,715; 9,140,720; 9,186,646; 9,207,167; 9,213,047; 9,244,095; 9,259,590; 9,267,962; 9,267,963; 9,274,139; 9,281,206; 9,291,640; 9,297,827; 9,309,545; 9,318,031; 9,322,842; 9,352,294; 9,354,249; 9,372,154; 9,383,388; 9,409,140; 9,453,857; 9,487,002; 9,500,670; 9,517,444; 9,518,956; 9,535,085; 9,557,347; 9,562,897; 9,575,090; 9,587,258; 9,588,136; 9,599,636; 9,604,846; 9,605,287; 9,605,288; 9,658,247; 9,691,500; 9,691,873; 9,696,342; 9,700,868; 9,709,598; 9,719,916; 9,745,604; 9,745,609; 9,778,282; 9,803,222; 9,810,282; 9,841,436; 9,891,246; 9,902,818; 9,910,064; 9,919,282; 9,921,242; 9,939,460; 9,969,970; 9,970,039; 9,972,354; 9,995,764; 9,995,765; 10,041,970; 10,047,384; 10,068,747; 10,082,523; 10,092,512; 10,092,890; 10,106,401;

10,177,690; 10,191,081; 10,191,082; 10,197,596; 10,201,795; 10,215,773; 10,228,388; 10,241,131; 10,274,513; 10,289,799; 10,302,673; 10,307,723; 10,330,581; 10,330,632; 10,330,698; 10,343,893; 10,352,964; 10,384,238; 20010017054; 20010023024; 20020034757; 20020062572; 20020062684; 20020063212; 20020066307; 20020068304; 20020104963; 20020121131; 20020173033; 20020174715; 20020189330; 20030033863; 20030049381; 20030068446; 20030094036; 20030110844; 20030157254; 20030158474; 20030168594; 20030218132; 20030233870; 20040008042; 20040020774; 20040037959; 20040083799; 20040145824; 20040154367; 20040209376; 20040210289; 20040214177; 20040216517; 20040245462; 20040254419; 20040255651; 20050017598; 20050025797; 20050032226; 20050050947; 20050066714; 20050077915; 20050079132; 20050081610; 20050089890; 20050092929; 20050107870; 20050164299; 20050172704; 20050181132; 20050212529; 20050217354; 20050236566; 20060037379; 20060056076; 20060098267; 20060113472; 20060131997; 20060158998; 20060185424; 20060191329; 20060225164; 20060260388; 20060283240; 20060283338; 20070010702; 20070012093; 20070012094; 20070024295; 20070033682; 20070033991; 20070046397; 20070062264; 20070067883; 20070082459; 20070089496; 20070089498; 20070103697; 20070107502; 20070114880; 20070121477; 20070154354; 20070163335; 20070176100; 20070180924; 20070188268; 20070245815; 20070249059; 20070268808; 20070273860; 20070285843; 20070289369; 20070291623; 20070295064; 20080022759; 20080049590; 20080062853; 20080078229; 20080130158; 20080149832; 20080225575; 20080237754; 20080242559; 20080253269; 20080276695; 20080295583; 20080307865; 20080316904; 20090000363; 20090013770; 20090064772; 20090074966; 20090112957; 20090227040; 20090253589; 20090260113; 20090322260; 20100043107; 20100071100; 20100108567; 20100120023; 20100122385; 20100124583; 20100180354; 20100186132; 20100205698; 20100218286; 20100330345; 20110005306; 20110030109; 20110055983; 20110081335; 20110081336; 20110110139; 20110131690; 20110138506; 20110154546; 20110155559; 20110167524; 20110167525; 20110168549; 20110170108; 20110187798; 20110239336; 20110247106; 20110296561; 20110307980; 20120030845; 20120053580; 20120062213; 20120066799; 20120077247; 20120079631; 20120094355; 20120094358; 20120131702; 20120141562; 20120204296; 20120316376; 20120331592; 20130026969; 20130036521; 20130042375; 20130047302; 20130047303; 20130117895; 20130164818; 20130174302; 20130183735; 20130208330; 20130216520; 20130261340; 20130266556; 20130273612; 20130276175; 20130278937; 20130288307; 20130288366; 20130298294; 20130312142; 20130312143; 20130327160; 20130327161; 20130333077; 20130340126; 20130347147; 20140007309; 20140026263; 20140030763; 20140030768; 20140041084; 20140130213; 20140154749; 20140170624; 20140223615; 20140230103; 20140256078; 20140283229; 20140289912; 20140331368; 20140338073; 20140345007; 20140348982; 20140366228; 20140374237; 20150013037; 20150047078; 20150074859; 20150160259; 20150217260; 20150219622; 20150241334; 20150290938; 20150301080; 20150309071; 20150338437; 20150342224; 20150353974; 20150369838; 20160003868; 20160032341; 20160038905; 20160154022; 20160165926; 20160209322; 20160252545; 20160258979; 20160258980; 20160274144; 20160274146; 20160282384; 20160289577; 20160289704; 20160289705; 20160289706; 20160289709; 20160289710; 20160293990; 20160298141; 20160298147; 20160313367; 20160313369; 20170003316; 20170025148; 20170038410; 20170052111; 20170054389; 20170062180; 20170130252; 20170131322; 20170152532; 20170199219; 20170212145; 20170219622; 20170227577; 20170242052; 20170261532; 20170299628; 20170313583; 20170321233; 20170326522; 20170354945; 20180036939; 20180052186; 20180056245; 20180059137; 20180106715; 20180106830; 20180106833; 20180113149; 20180120344; 20180136251; 20180155183; 20180161749; 20180164342; 20180180642; 20180203037; 20180203039; 20180214838; 20180217181; 20180259553; 20180292432; 20180299479; 20180306837; 20190002309; 20190011358; 20190018040; 20190025340; 20190035601; 20190076812; 20190091650; 20190094265; 20190128919; 20190195910; 20190234993; 20190250185

SUMMARY OF THE INVENTION

The present technology relates to an electrostatic levitation MEMS device, which may be used as an actuator, or sensor, for example a switch or accelerometer. In an actuator embodiment, the device is compatible with use of a triboelectric generator to provide actuation. The MEMS device is, for example, a MEMS cantilever/beam, which does not employ a traditional parallel plate electrode configuration and thus avoids the typical pull-in susceptibility which is caused by applying a voltage above a pull-in threshold.

In a typical embodiment, an electrode is fixed to a substrate on each side of a beam, with a conductive plate below the beam, which is held at a controlled potential with respect to the moving electrode, to allow electrostatic levitation and enabling bi-directional actuation.

Advantageously, triboelectricity addresses the voltage requirement to generate an electrostatic levitation force, and may be used to toggle the beam/switch from closed to open. The triboelectric layers of a generator may generate a large enough voltage (~200 V) between center and side electrodes that creates levitation. The beam tip of a 500 µm bean is capable of, for example a 25 µm deflection.

A threshold shock sensor-switch is provided which consists of a triboelectric generator connected to a MEMS cantilever with a repulsive-force electrode configuration. A small bias voltage is applied between the beam and center electrode to initiate pull-in. The generator is connected between the side and center electrodes and creates a large voltage potential between them when the generator receives an impact. The amount of voltage the generator produces is a function of the impact force magnitude, with a larger impact generating more voltage. This creates a large repulsive force that pulls the beam off of the substrate and opens the switch if the impact force is large enough. Dimples may be placed on the underside of the beam to reduce contact forces, and prevent the beam from sticking to the substrate.

Over the course of a few minutes after actuation, the charge on the generator electrodes decays, which reduces the repulsive force until the switch pulls back in and closes itself. The sensor-switch can be designed such that when the impact force passes a threshold level, the switch is triggered and the beam is released from its pulled-in position. The repulsive-force electrode configuration allows for a very large dynamic range and can be exploited to eliminate the pull-in instability in electrostatic sensors. The triboelectric generator is capable of overcoming the large threshold voltage to actuate the beam via the electrostatic fringe field, and the multi-electrode repulsive-force sensor allows the generator to remain completely open circuit, eliminating the issue with low power output. This opens the possibility for a wide range of novel sensors with increased performance and functionality.

In one embodiment, the center electrode is given a small bias voltage to initiate pull-in and bring the center electrode and cantilever beam into contact with each other, which acts as a closed switch. The side electrodes are then supplied with a voltage relative to the center electrodes, which creates an electric field that pulls the cantilever upwards, employing electrostatic levitation. When the side voltage passes a threshold value, the beam releases from its pulled in position and settles to a stable equilibrium position above the center electrode.

Because the contact or non-contact is a binary condition, the combination of the triboelectric generator and the electrostatic levitation MEMS device provides a shock sensor, since the peak voltage of the triboelectric generator is dependent on the force the triboelectric generator receives. Thus, a lower force generates a lower peak, which may be sub-threshold for changing the state of the electrostatic levitation MEMS device, while a sufficiently larger force will cause a change in state. Further, the triboelectric generator naturally produces a sufficient voltage for actuation, thus presenting a simple configuration without requirement for level shifting, amplification, or other electronic devices. Of course, in other configurations, additional electronics may be provided.

The switch is inherently miniaturized and could easily fit in a miniature electronic device, such as a cell phone.

Alternates to the triboelectric generator are piezoelectric, pyroelectric, and other types of electrically responsive materials. Typically, the electrostatic levitation MEMS device requires voltages in excess of those which typical logic-signal integrated circuits may supply, though various technologies are available which may supply the necessary voltages from a logic circuit. Further, the voltage may also be supplied by inductive or switch capacitor converters.

By driving the potential between the underlying center electrode and the moving electrode, the system is tunable, and may be used as a switch, since a pull-in state is provided. The side electrodes enable a lift-off force, allowing switching between on/off states more readily than electrostatic beams with pull-in forces but no repulsive forces, without failure. This overcomes collapse of the two parallel plate electrodes, and alleviates being stuck in alternating pulled-in positions of a sandwiched beam technique. Further, the design does not add another layer in the fabrication process, and the side electrodes are not in the path of motion of the beam.

The system operates at relatively high voltages, e.g., on the order of 100V, permitting direct use in applications with high voltages present, such as triboelectric, piezoelectric, pyroelectric, and line current.

Advantageously, the use of triboelectric generation/transduction permits a robust and simple design to generate operative conditions for the actuator, and addresses the high voltage requirement of electrostatic levitation by coupling the systems and the contact pressure between the triboelectric layers.

Levitation-based MEMS avoid limiting issues involving pull-in, and draw no current, which allows the triboelectric generator to remain a completely open circuit, and maintain high voltage, which enables synergy between the generation and usage of the voltage.

The system may be used in various electrostatic devices that operate directly from mechanical vibration or shock (i.e., cell phones & safety switches in air bag deployment devices), within safety helmets to provide information on the severity of impacts, to detect severe weather to trigger an immediate response such as shutting off power lines and sounding alarms. For example, the electrostatic levitation may operate from meteorological electrical potentials.

The system may provide a MEMS switch which is normally closed, i.e., pulled-in, which is released (circuit opened) when a sufficient voltage is applied to the side electrodes.

The system may also provide a MEMS sensor, allows the device to move in response to the quantity is sensing, with the possibility of a threshold limit that triggers an action when the sensed quantity exceeds a certain value. The large range of movement of the moving electrode permits application as a sensor, such as an accelerometer, microphone, atomic force microscope probe, force sensor, displacement sensor, or the like. The output may be capacitive, between the moving electrode and the substrate, or the moving electrode may be servo driven to a desired position, and the drive voltage to maintain the position used as a basis for an output, for example.

The moving electrode will typically oscillate, and for many applications, the resonant frequency may be above the sensing frequency. On the other hand, when driven in resonance, modulation of the oscillations may be used as an input or output. While in an oscillatory regime of operation, pull-in may be undesirable, there are cases where this is a desired outcome, and the state which allows pull-in may be tuned by the operative parameters and external conditions, such as inertial forces.

A scanning microscope probe, e.g., atomic force microscope, scanning-tunneling microscope, etc., may be implemented using the repulsive actuator. See, 10,048,289, expressly incorporated herein by reference. The device may have multiple tips, and integrated electronics, e.g., integrated JFETs (junction field effect transistors) as preamplifiers. The JFET device may be monolithically integrated into the MEMS apparatus to reduce the effect of parasitic circuit elements, signals and mismatches. The JFETs also provide on-chip gain and impedance transformation for low noise operation.

A nano-probe tip whose position is freely movable with respect to a substrate (i.e., the nano-probe tip is not attached to the substrate) is coupled to JFET electrodes through electrostatic energy sustaining gaps, and can be sensed by the JFET in two ways. First, the electrostatic force on the JFET induces a strain in the channel which tends to modify the channel carrier mobility of the JFET. Second, the coupled charges across the probe beam of a nano-probe apparatus generate a floating potential on one of the gates of a JFET, which modulates the transistor channel current as a signal that can be measured. The tip is driven repulsively, and the repulsive drive may be displaced from the sensing electrodes. The nano-probe tip position may be coupled to JFET electrodes through a meander spring so that a JFET and a meander spring together may be regarded as a motion sensor with respect to a freely movable nano-probe tip position and movement.

A particular probing method in accordance with the embodiments includes positioning with respect to a sample at least one movable probe tip within a probe apparatus comprising: a substrate; at least one movable probe tip located over the substrate, the at least one movable probe tip being movable with respect to the substrate; at least one motion sensor located over the substrate, the at least one motion sensor comprising at least one pressure sensitive component and at least one spring, the at least one motion sensor being operatively coupled with the at least one movable probe tip, and a repulsive electrostatic drive to displace the probe tip. This particular probing method also includes moving the at least one movable probe tip with respect to the sample while measuring a signal output at the at least one motion sensor.

The MEMS Sensors may be used in gyroscopes, accelerometers, pressure sensors, in smartphones, wearable devices, cars, and various medical devices.

The levitation actuator may act as a sensor by sensing contact, such as by passage of an electric current, an optical sensing of the beam displacement, a resonant frequency change, a beam damping change, an amplitude change (static or dynamic), or other known means. In addition, the large voltage ratio between displacement and side-electrode voltage, a closed loop feedback between the side electrodes (driven) and a displacement error, from a null position, provides a high-level output. The displacement error may be sensed electrostatically, optically, magnetically, or by other means. When the actuator is in resonance, the dynamic mechanical response of the actuator may vary depending on environmental conditions, such as inertia, chemical absorption, etc. For example, a secondary set of electrodes may be provided to measure a motion parameter. Further, the electrostatic potential of a conductive portion of the actuator will vary depending on the repulsive field and the reaction to that field. Thus, for example, a current flowing through the conductor, or a voltage fluctuation through an impedance, may be measured.

One alternative to parallel-plate actuation is electrostatic levitation [52-56]. The electrode configuration shown in FIG. 12 creates an electric field that pushes electrodes apart instead of pulling them together. In this configuration, three electrodes (central, and two lateral) are modelled as being fixed to the substrate, and a beam is suspended above the center. The side electrodes are given a voltage relative to the common voltage of the center electrodes (i.e., the central electrode on the substrate and the actuator, which is generally held at the same potential and disposed above it), which creates an electric field that wraps around and pulls on the top of the movable beam electrode more than the bottom, producing a net upward force.

Much effort has been spent characterizing this system, and it has been shown to eliminate the pull-in instability and increase travel ranges by more than an order of magnitude. However, this comes at the expense of requiring a large actuation voltage because the levitation force is relatively weak compared to the attractive force between a pair of parallel plates.

This system can act as a switch by applying a bias voltage to the center electrode [57]. This allows the switch to toggle to and from the pulled-in position for the purpose of creating a more durable switch.

The present technology relates to a repulsive-force actuated electrodynamic microelectromechanical element, which may be used, for example, as a switch, accelerometer, or atomic force microscopy probe.

A key feature of one implementation of the design is that a cantilever beam is suspended over a base plate, held at approximately equipotential with the beam, and is actuated by laterally located electrodes which induce a repulsive force between the beam and the base plate electrode. The system is laterally symmetric, so the net force on the beam is normal to the baseplate.

This approach takes advantage of a fringe electrostatic field to generate a repulsive force that pushes the cantilever beam, or other movable structure, away from the substrate, which essentially eliminates the possibility of pull-in. Because the movable electrode has about the same voltage as the substrate, the possibility of micro-welding is reduced or eliminated. This failure mode happens when two microstructures with different voltages contact each other [43].

The electrostatic force on the moving element differs considerably from that found in conventional parallel-plate electrode designs, and cannot be estimated using simple analytical expressions. The dynamics of the system are nonlinear. However, the combined system can provide a linear relationship with the side electrode voltage for the static response and first natural frequency. See, M. Pallay, R. Miles, S. Towfighian (2019) Merging parallel-plate and levitation actuators to enable linearity and tunability in electrostatic MEMS, Journal of Applied Physics, 126 (1), 014501. This addresses the issues with the nonlinearity of electrostatic systems and can aid in the creation of highly tunable, linear, electrostatic MEMS with large travel ranges.

It is therefore an object to provide a microelectromechanical actuator, comprising: a substrate, having a surface; a beam having a conductive portion, freely suspended over the substrate, and having a long axis parallel to a surface of the substrate, and being displaceable along an axis normal to the surface of the substrate; a center electrode, provided on the substrate under the beam; a pair of side electrodes, axisymmetric with respect to the beam, provided on the substrate; wherein: the pair of side electrodes are configured, when charged, to exert an electrostatic force normal to the surface of the substrate on the beam, that repulses the beam from the substrate, and exerts a balanced electrostatic force on the beam in a plane of the surface of the substrate, the center conductive electrode is configured to shield the beam from electrostatic forces induced by the side electrodes from beneath the beam, and the center electrode is configured to have a voltage different from a voltage on the beam, to thereby induce an attractive electrostatic force on the beam.

The beam may have a first state in which the beam is pulled in to the center electrode by the attractive electrostatic force on the beam, and a second state in which the attractive electrostatic force on the beam by the center electrode is overcome by the repulsive electrostatic force exerted by the side electrodes.

The microelectromechanical actuator may further comprise a triboelectric generator, configured to induce an electrostatic voltage on the pair of side electrodes with respect to the beam, to thereby selectively overcome the attractive electrostatic force on the beam induced by the center electrode.

The beam may have an inertial mass, subject to displacement by inertial forces, and wherein a voltage on at least one of the center electrode and the side electrodes with respect to the beam is adjusted to control an inertial state which triggers pull-in of the beam to the center electrode.

It is a further object to provide a microelectromechanical actuator, comprising: a substrate, having a surface; an electrostatically displaceable conductive element, suspended over the substrate; a center electrode, provided on the substrate under the electrostatically displaceable conductive element; and a peripheral electrode provided on the substrate; wherein: the center electrode is larger than a projection of the electrostatically displaceable conductive element on the substrate, and is configured to shield the electrostatically displaceable conductive element from electrostatic forces induced by the peripheral electrode from beneath the electrostatically displaceable conductive element, the peripheral electrode is configured to exert an electrostatic force normal to the surface of the substrate on the electrostatically displaceable conductive element that repulses the electrostatically displaceable conductive element from the substrate, and the center electrode is configured to have a voltage different from a voltage on the electrostatically displaceable conductive element, to thereby induce an attractive electrostatic force on the beam.

The electrostatically displaceable conductive element may comprise a beam having a conductive portion, freely suspended over the substrate, and having a long axis parallel to the surface of the substrate, and being displaceable along an axis normal to the surface of the substrate; the peripheral electrode may comprise a pair of side electrodes, axisymmetric with respect to the beam, provided on the substrate, configured to exert an electrostatic force normal to the surface of the substrate on the beam, that repulses the beam from the substrate, and to exert a balanced electrostatic force on the beam in a plane of the surface of the substrate, and the center electrode may be provided on the substrate under the beam, configured to shield the beam from electrostatic forces induced by the side electrodes from beneath the beam, and to have a voltage different from a voltage on the beam, to thereby induce an attractive electrostatic force on the beam.

A triboelectric generator may be provided, configured to induce an electrostatic voltage on the peripheral electrode with respect to the center electrode, to thereby selectively overcome the attractive electrostatic force on the electrostatically displaceable conductive element induced by the center electrode, wherein the electrostatically displaceable conductive element has a first state in which the electrostatically displaceable conductive element is pulled in to the center electrode by the attractive electrostatic force on the electrostatically displaceable conductive element, and a second state in which the attractive electrostatic force on the electrostatically displaceable conductive element by the center electrode is overcome by the repulsive electrostatic force exerted by the peripheral electrode from activation of the triboelectric generator.

The electrostatically displaceable conductive element may have an inertial mass, subject to displacement by inertial forces, wherein a voltage on at least one of the center electrode and the peripheral electrode with respect to the electrostatically displaceable conductive element may be adjusted to control an inertial state which triggers pull-in of the electrostatically displaceable conductive element to the center electrode.

It is a further object to provide a method of actuating a microelectromechanical actuator, comprising: providing the microelectromechanical actuator comprising: a substrate having a surface, a conductive element, suspended over the substrate, and being electrostatically displaceable normal to the surface of the substrate, a center electrode, provided on the substrate under the conductive element, and a peripheral electrode, provided on the substrate outside the center electrode, wherein the center electrode is larger than a projection of the conductive element on the substrate, and is configured to selectively shield the conductive element from electrostatic forces induced by the peripheral electrode from beneath the conductive element, and to permit electrostatic forces induced by the peripheral electrode to interact with the conductive element from above the conductive element; applying an electric potential between the conductive element and the center electrode; and repulsing the conductive element from the substrate by applying an electric potential between the conductive element and the peripheral electrode. The conductive beam may comprise a beam having a conductive portion, freely suspended over the substrate, and having a long axis parallel to the surface of the substrate, and being displaceable along an axis normal to the surface of the substrate; the center electrode is provided on the substrate under the beam; the peripheral electrode may comprise a pair of side electrodes, disposed on either side of the center electrode, axisymmetric with respect to the beam and configured to produce an axisymmetric electrostatic force on beam; the center conductive electrode may be configured to selectively shield the beam from electrostatic forces induced by the side electrodes from beneath the beam, and not to shield the beam from electrostatic forces induced by the side electrodes from above the beam; the electric potential between the beam and the center electrode may be sufficient to cause pull-in; and the electrostatic force on the beam induced by the pair of side electrodes may repulse the beam from the substrate.

It is also an object to provide a method of actuating an microelectromechanical actuator, comprising: providing the microelectromechanical actuator comprising a substrate, having a surface, a beam having a conductive portion, freely suspended over the substrate, and having a long axis parallel to a surface of the substrate, and being displaceable along an axis normal to the surface of the substrate, a center electrode, provided on the substrate under the beam, and a pair of side electrodes, axisymmetric with respect to the beam, wherein the center conductive electrode is configured to shield the beam from electrostatic forces induced by the side electrodes from beneath the beam provided on the substrate; applying an electric potential between the beam and the center electrode to cause an electrostatic attraction sufficient to cause a pull-in; and inducing an axisymmetric electrostatic force on the pulled-in beam by the pair of side electrodes, normal to the surface of the substrate on the beam, that repulses the beam from the substrate, to release the beam from a pulled-in position contacting the substrate to a suspended position displaced from the substrate.

It is a further object to provide a method, comprising: providing an electrostatically-repositionable tip of an actuator beam; displacing the actuator beam away from a supporting substrate of the actuator beam, by applying a bias voltage potential with respect to an actuator beam potential between a bias electrode on the supporting substrate beneath the actuator beam, and a side voltage potential between a pair of laterally located electrodes on the supporting substrate and the actuator beam, wherein the side voltage potential produces a force to levitate the actuator beam away from the supporting substrate, toward the surface; and detecting a displacement of the actuator beam. The pair of laterally located electrodes on the supporting substrate may exert a laterally balanced force on the actuator beam in response to the side voltage potential. The actuator beam may be displaced to contact a surface.

The surface contact may be detected by electrical conduction between the actuator beam than the surface. The tip of the actuator beam may be displaced to contact the surface a plurality of times at a plurality of relative positions, further comprising determining a surface profile of a surface. The tip may be scanned over a portion of the surface, and the detected displacement of the actuator beam determined for a plurality of scan positions, to map a surface profile of the surface.

Contact of the tip with the surface may be determined by a piezoelectric transducer.

The side voltage potential may be increased, to thereby increase an actuator beam deflection, until the tip contacts the surface, and the deflection determined based on the voltage potential at a time of tip contact.

The side voltage potential may be oscillatory, and temporal characteristics of the actuator beam determined.

The bias voltage may be tuned to control a response of the actuator beam to the side voltage.

The side voltage may be generated by a triboelectric generator.

The displacement of the actuator beam may be oscillatory, and a dynamic displacement of the actuator beam detected.

It is a further object to provide a method of determining a surface profile of a surface, comprising: providing an electrostatically-repositionable tip of an actuator beam; displacing the actuator beam away from a supporting substrate of the actuator beam, by applying a bias voltage potential with respect to an actuator beam potential between a bias electrode on the supporting substrate beneath the actuator beam, and a side voltage potential between a pair of laterally located electrodes on the supporting substrate and the actuator beam, wherein the side voltage potential produces a laterally balanced force to levitate the actuator beam away from the supporting substrate, toward the surface; and detecting a displacement of the actuator beam at which the tip contacts the surface.

The tip may be scanned over a portion of the surface, and the detected displacement of the actuator beam is determined for a plurality of scan positions, to map a surface profile of the surface.

A contact of the tip may be determined by a piezoelectric transducer.

The side voltage potential may be increased, to thereby increase an actuator beam deflection, until the tip contacts the surface, and the deflection determined based on the voltage potential at a time of tip contact.

The side voltage potential may be oscillatory (AC), and temporal characteristics of contact of the tip and the surfaced may be determined.

The bias voltage may be further tuned to control a response of the actuator beam to the side voltage.

The side voltage may be generated by a triboelectric generator.

It is another object to provide a method of determining an inertial state of a mass, comprising: providing an electrostatically-repositionable actuator; controlling a force on the actuator with respect to a supporting substrate of the actuator, by applying a bias voltage potential with respect to an actuator potential between a bias electrode on the supporting substrate beneath a beam portion of the actuator, and a side voltage potential between a pair of laterally located electrodes on the supporting substrate and the beam portion of the actuator, wherein the side voltage potential produces a laterally balanced force tending to levitate the beam portion of the actuator away from the supporting substrate; detecting a displacement of the actuator; and controlling at least the side voltage potential, wherein a side potential voltage required to maintain a position of the actuator is responsive to the inertial state of the mass.

The inertial mass may be supported by a plurality of beam portions, each having a respective bias electrode and a pair of respective side electrodes.

The inertial mass may be configured to detect an acceleration, a rotation, and/or a shock, for example.

It is a further object to provide a method of determining an inertial state of a mass, comprising: providing an electrostatically-repositionable actuator; controlling a force on the actuator with respect to a supporting substrate of the actuator, by applying a bias voltage potential with respect to an actuator potential between a bias electrode on the supporting substrate beneath a beam portion of the actuator, and a side voltage potential between a pair of laterally located electrodes on the supporting substrate and the beam portion of the actuator, wherein the side voltage potential produces a laterally balanced force tending to levitate the beam portion of the actuator away from the supporting substrate; and detecting a displacement of the actuator while subject to the controlled force.

The detected displacement may comprise a contract between the actuator and the bias electrode.

The method may further comprise levitating the actuator away from the bias electrode by increasing the side voltage.

A force between the bias electrode and the actuator may be an attractive force toward the substrate, and a force between the side electrodes and the actuator may be a repulsive force away from the substrate.

The actuator may be subject to pull-in to the bias electrode, and the side electrodes may have a range of operation which produces a sufficient force to overcome the pull-in and release the actuator from the bias electrode.

The side electrodes may have a voltage dependent on a force, such that the actuator and bias electrode form a force-activated switch.

The side electrodes may have a voltage dependent on a force impulse, such that the actuator and bias electrode form a force-impulse activated switch.

The side electrodes may have a voltage dependent on a shock, such that the actuator and bias electrode form a shock-activated switch.

BRIEF DESCRIPTION OF THE FIGURES

(FIG. 21b) A closer view of the configuration of the electrodes. (FIG. 21c) Asymmetric fringing electric field exerts an upward force on the moving electrode (FIG. 21d) Side view of accelerometer and substrate when $V_{dc}$=0 (FIG. 21e) when $V_{dc}\neq 0$ but there is no mechanical load and (FIG. 21f) When $V_{dc}\neq 0$ and a mechanical load is applied.

(FIGS. 23b and 23c) Insulation layers growth and deposition. (FIG. 23d) First polysilicon deposition. (FIG. 23e RIE etch of polysilicon. (FIG. 23f) Sacrificial layer deposition and CMP processing. (FIG. 23g) Anchor etch on a sacrificial layer. (FIG. 23h) Second polysilicon deposition. (FIG. 23i) Polysilicon etch and gold deposition on the pads. (FIG. 23j) Release in HF:HCl solution and CPD.

(FIG. 24b) Closer view of the device anchor point. (FIG. 24c) Moving and fixed electrode configuration.

DETAILED DESCRIPTION OF THE PREFERRED EMBODIMENTS

Example 1—Actuator Embodiment

Figure 1:
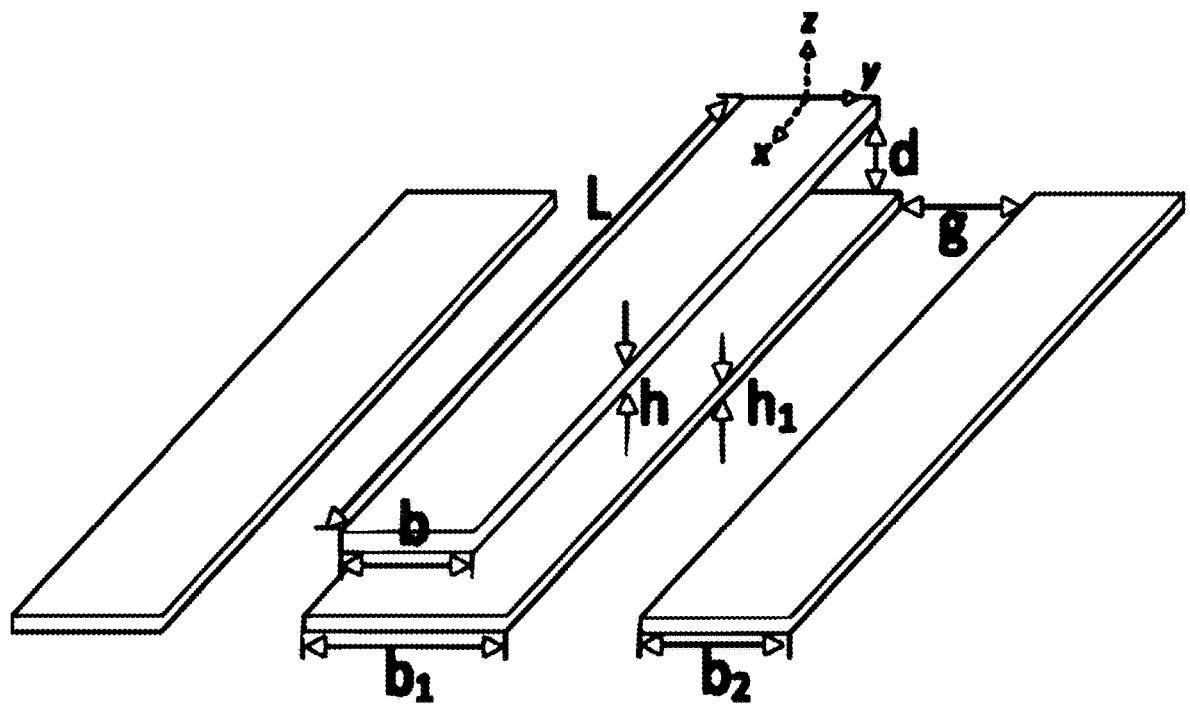
FIG. 1 shows repulsive force electrode configuration with cantilever beam (black), fixed middle electrode (green) and fixed side electrodes (red). The side electrodes are connected together and treated as a single, third electrode.

FIG. 1 shows repulsive force electrode configuration with cantilever beam (black), fixed middle electrode (green) and fixed side electrodes (red). The side electrodes are connected together and treated as a single, third electrode.

Figure 2A:
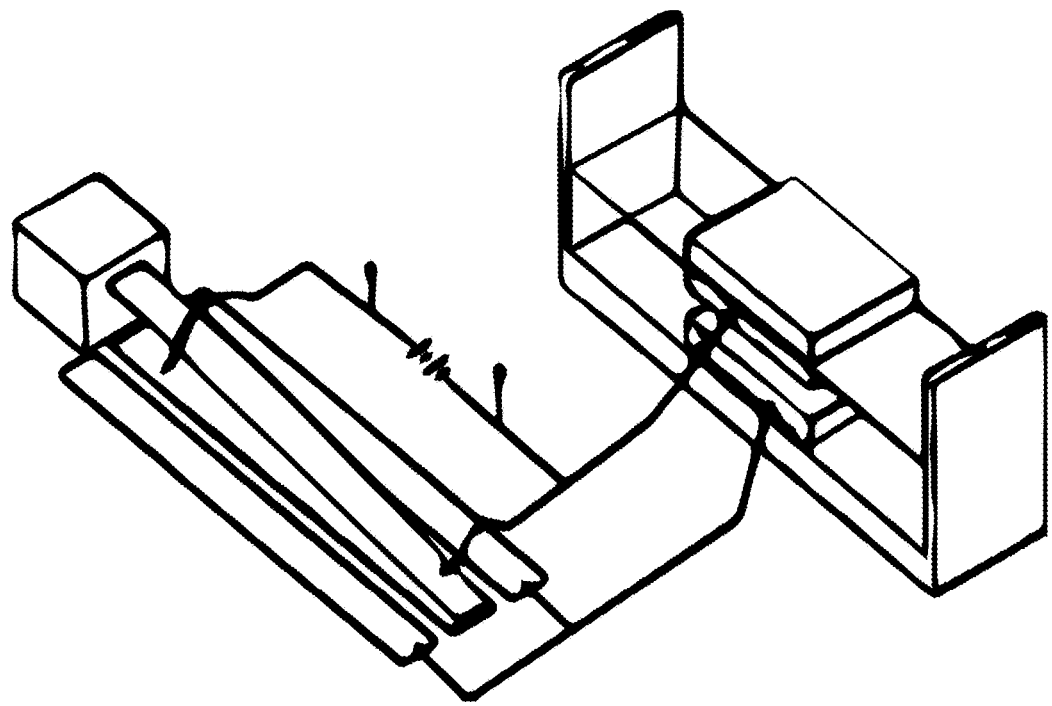
FIGS. 2A and 2B show the layout of the impact sensor. Top shows sensor in the initial close state prior to impact. Bottom shows sensor during impact as the switch is opened.
Figure 2B:
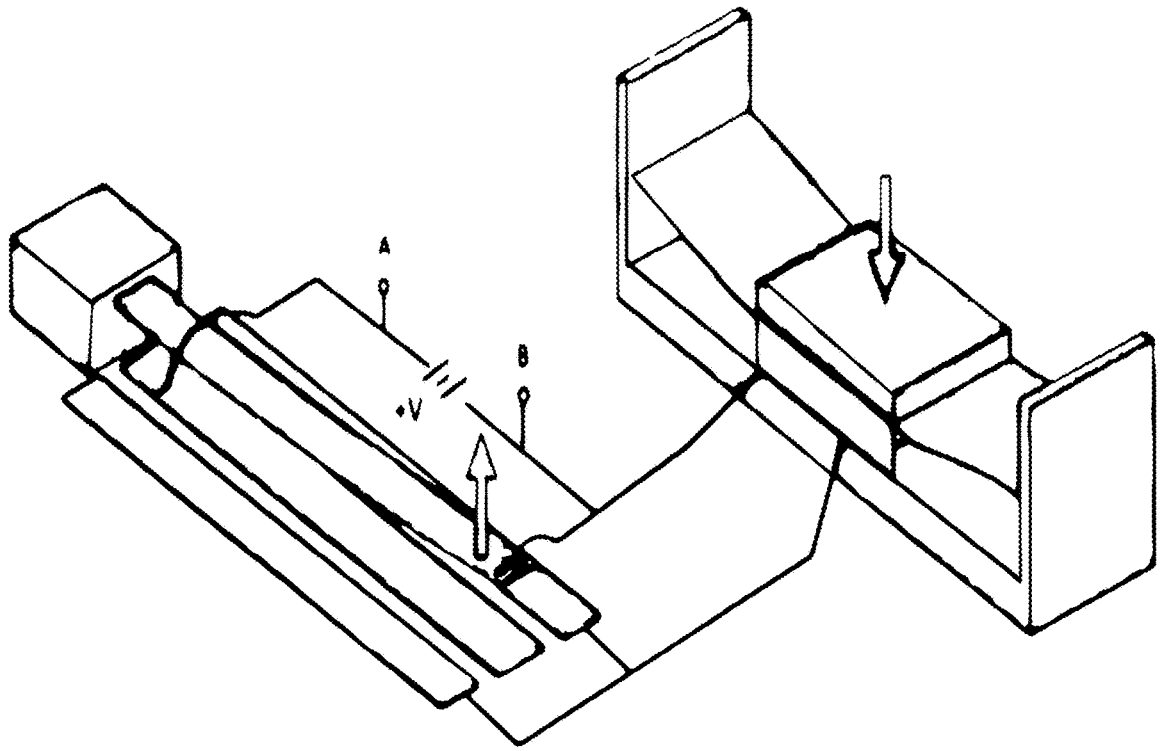

FIGS. 2*a* and 2*b* show the layout of the impact sensor. Top shows sensor in the initial close state prior to impact. Bottom shows sensor during impact as the switch is opened.

Figures 2C, 2D:
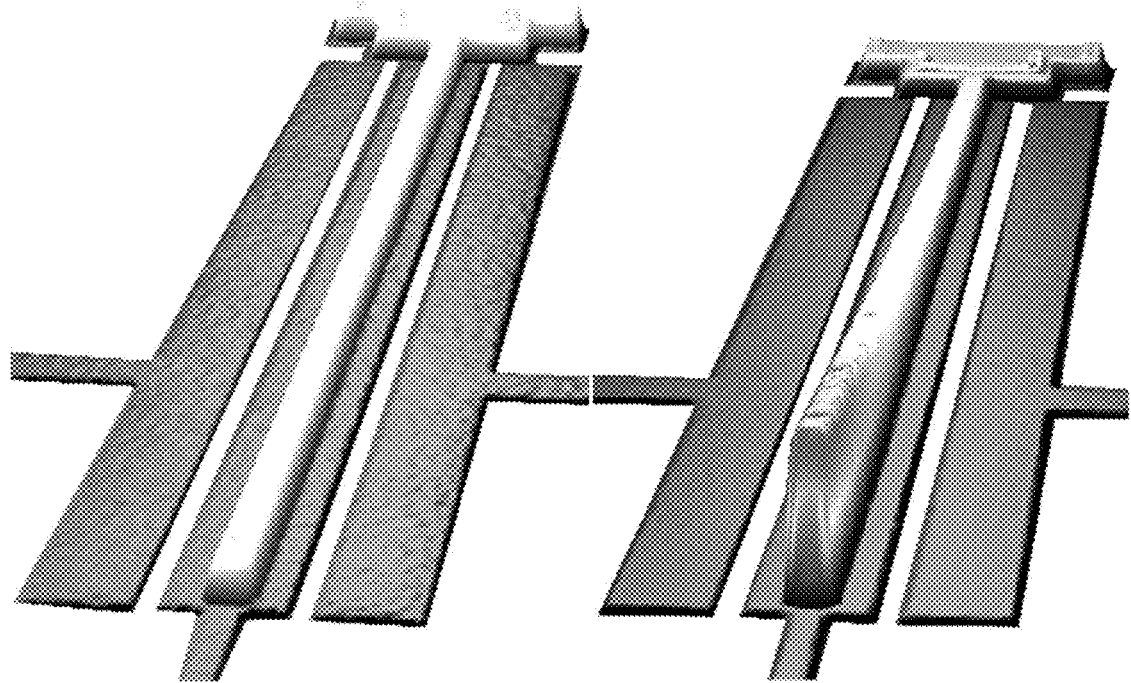
FIG. 2C shows an optical profiler image of the beam in the neutral state and FIG. 2D shows an optical profiler image of the beam in the levitated state. The images show beam showing pull-in (left) at 2 $V_{bias}$ and 0 $V_{side}$ and release (right) at 2 $V_{bias}$ and 120 $V_{side}$. The images were captured with a Wyko NT1100 Optical Profiler.

FIG. 2*c* shows an optical profiler image of the beam in the neutral state and FIG. 2*d* shows an optical profiler image of the beam in the levitated state. The images show beam showing pull-in (left) at 2 $V_{bias}$ and 0 $V_{side}$ and release (right) at 2 $V_{bias}$ and 120 $V_{side}$. The images were captured with a Wyko NT1100 Optical Profiler.

Figure 3A:
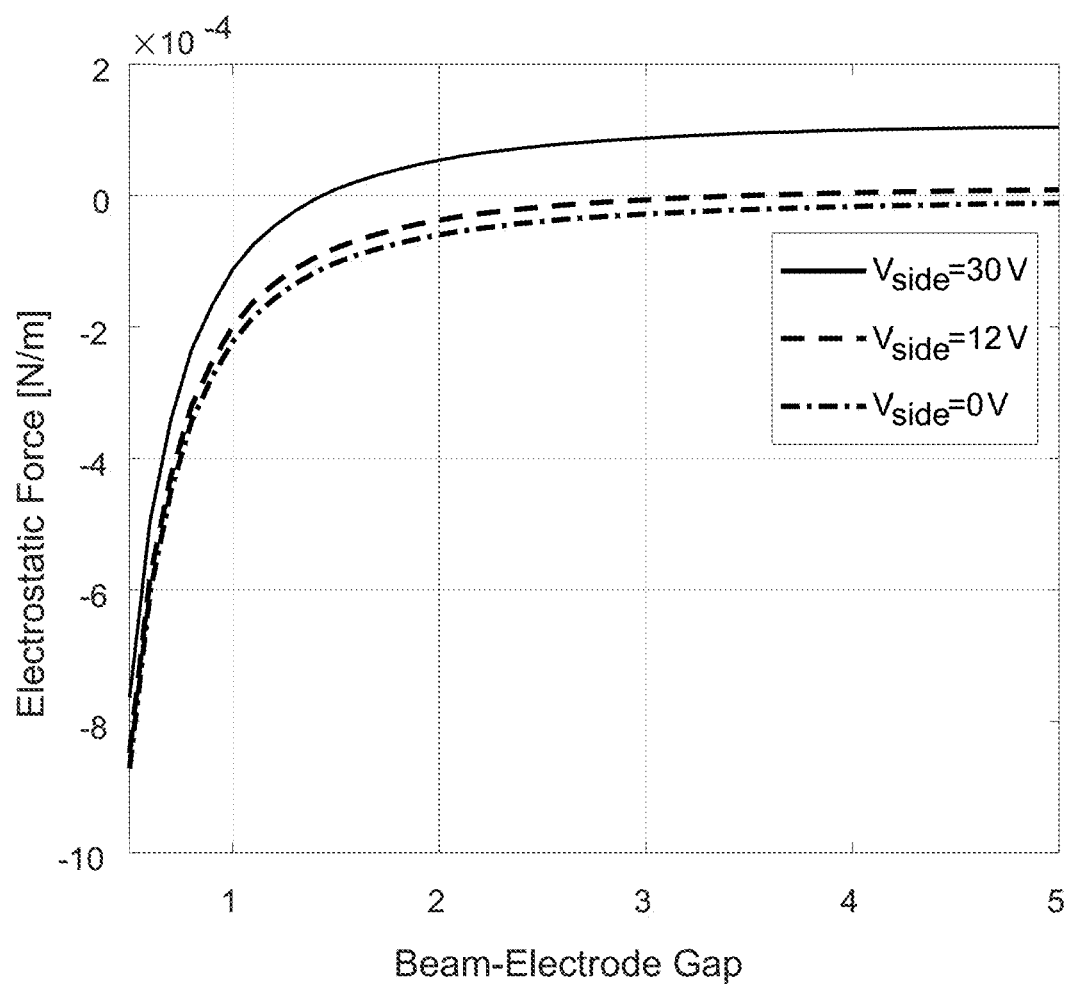
FIG. 3A shows the electrostatic force as the gap between electrodes (d) varies at a 2.2 $V_{bias}$ and 0, 12, and 30 $V_{side}$. The green line indicates the rest position of the beam. The results are obtained from Comsol simulations.

FIG. 3*a* shows the electrostatic force as the gap between electrodes (d) varies at a 2.2 $V_{bias}$ and 0, 12, and 30 $V_{side}$. The green line indicates the rest position of the beam. The results are obtained from Comsol simulations.

Figure 3B:
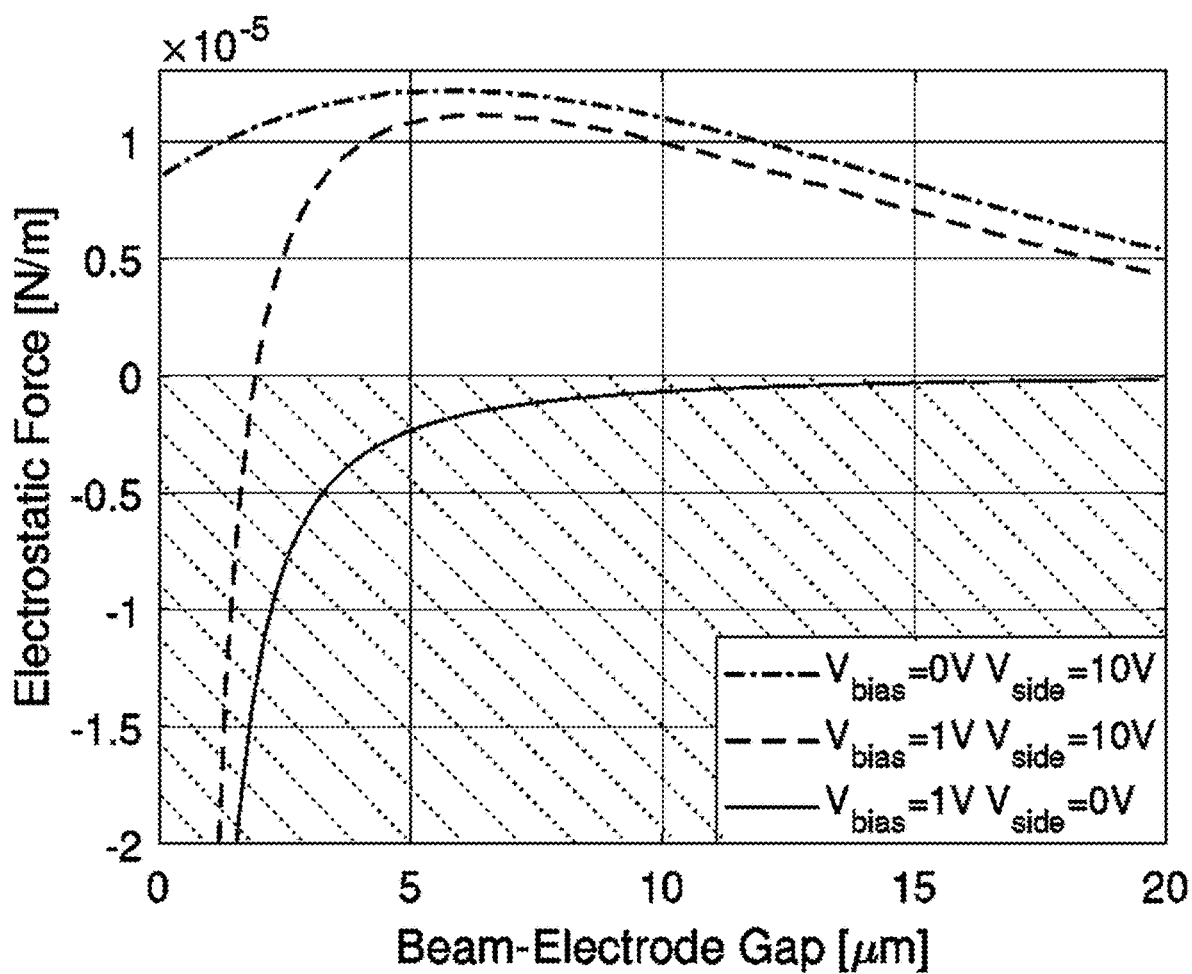
FIG. 3B shows a calculated electrostatic force (N/m) vs. beam-electrode gap (μm) for 0 $V_{bias}$, 10 $V_{side}$; 1 $V_{bias}$, 10 $V_{side}$; and 1 $V_{bias}$, 0 $V_{side}$. Electrostatic force on the beam versus the gap distance simulated in COMSOL. The dashed area shows the attractive regime, and the rest is the repulsive regime. The combined force with bias and side voltages behaves similar to the attractive force at low gaps and the repulsive force at large gaps. Applying 10 V on the side electrodes can change the force from attractive to repulsive outside of very small gaps.

FIG. 3*b* shows a calculated electrostatic force (N/m) vs. beam-electrode gap (μm) for 0 $V_{bias}$, 10 $V_{side}$; 1 $V_{bias}$, 10 $V_{side}$; and 1 $V_{bias}$, 0 $V_{side}$. Electrostatic force on the beam versus the gap distance simulated in COMSOL. The dashed area shows the attractive regime, and the rest is the repulsive regime. The combined force with bias and side voltages behaves similar to the attractive force at low gaps and the repulsive force at large gaps. Applying 10 V on the side electrodes can change the force from attractive to repulsive outside of very small gaps.

Figure 3C:
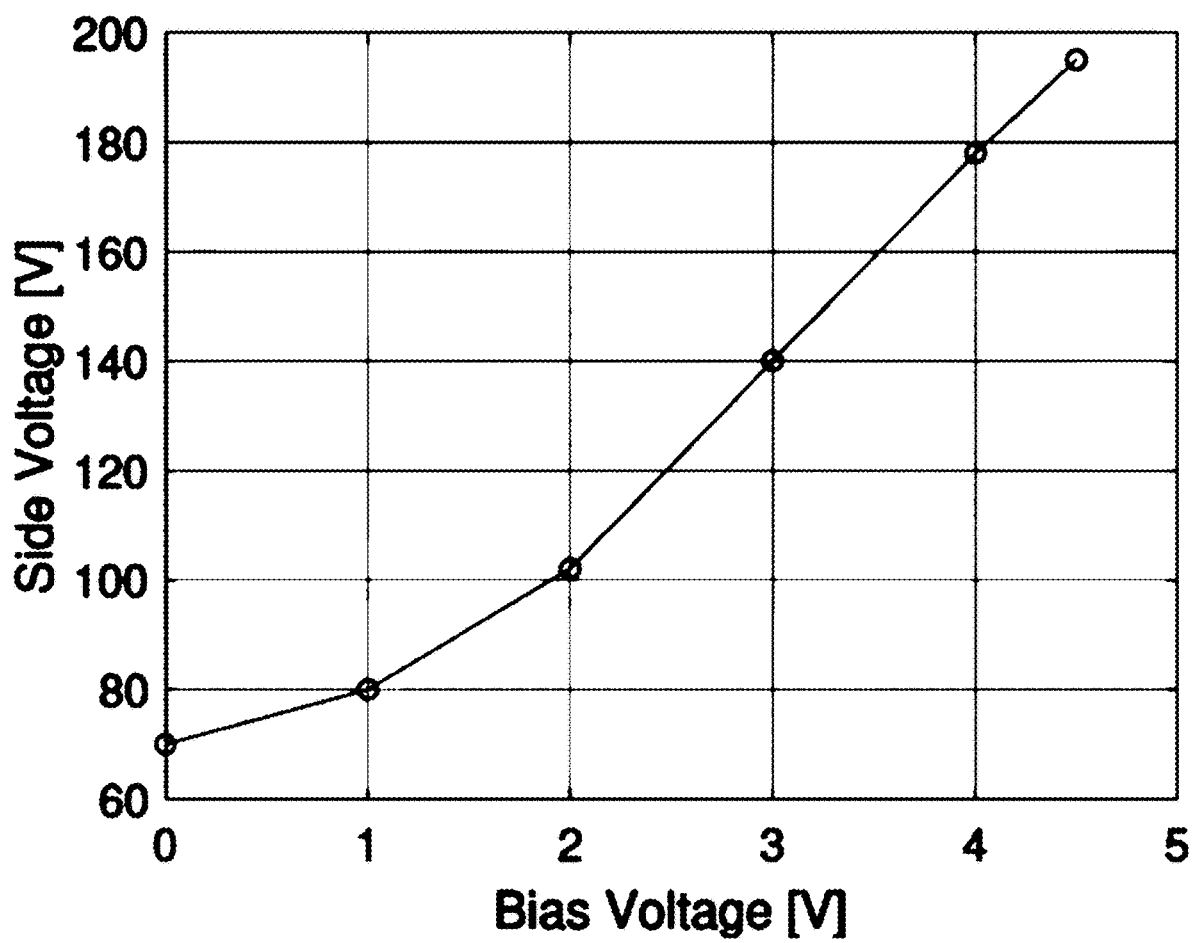
FIG. 3C shows the bias voltage vs. the side voltage at release of pull-in, over a range of bias voltages from 0-4.5V.

FIG. 3*c* shows the bias voltage vs. the side voltage at release of pull-in, over a range of bias voltages from 0-4.5V.

To model the actuator, the system can be treated as an Euler-Bernoulli beam with the governing equation of motion defined as, $$\rho A \frac{\partial^2 \hat{w}}{\partial \hat{t}^2} + \hat{c}\frac{\partial \hat{w}}{\partial \hat{t}} + EI\frac{\partial^4 \hat{w}}{\partial \hat{x}^4} = \hat{f}_e(\hat{w}, \vec{V}) \quad (1)$$

where $\hat{v}$ is the transverse beam deflection (z-direction beam displacement) that depends on the position along the length x of the beam, and time t, I is the moment of inertia, and $\hat{f}_e(\hat{w}, \vec{V})$ is the electrostatic force, which depends on the transverse deflection and applied voltages. Because there are multiple electrodes with different voltages, V is a vector of voltages that are applied to the beam, side electrodes, and center electrode.

The out of plane deflection governing equation of motion for a clamped-clamped beam is:

$$\rho A \frac{\partial^2 \hat{w}}{\partial \hat{t}^2} + \hat{c}\frac{\partial \hat{w}}{\partial \hat{t}} + \gamma\frac{EA}{2L}\frac{\partial^2 \hat{w}}{\partial \hat{t}^2}\int_0^L \left(\frac{\partial \hat{w}}{\partial \hat{t}}\right)^2 dx + EI\frac{\partial^4 \hat{w}}{\partial \hat{x}^4} + \hat{f}_e(\hat{w})V^2 = 0 \quad (1A)$$

where γ indicates the mid-plane stretching effect. γ is −1 for the clamped-clamped beam and 0 for the cantilever. Because of the small scale of the beams, a nondimensional form of Eq. (1A) may be used. The nondimensional substitutions and parameters are shown below, and the nondimensional equation of motion is given as:

$$\frac{\partial^2 w}{\partial t^2} + c\frac{\partial w}{\partial t} + \gamma r_1 \frac{\partial^2 w}{\partial t^2}\int_0^1 \left(\frac{\partial w}{\partial t}\right)^2 dx + \frac{\partial^4 w}{\partial x^4} + r_2 V^2 \sum_{j=0}^5 p_j h^i w^j = 0 \quad (1B)$$

| Parameter | Substitution |
| --- | --- |
| x-direction position | x = $\hat{x}$/L |
| y-direction position | w = $\hat{w}$/h |
| Time | t = $\hat{t}$/T |
| Damping | c = $\hat{c}L^4$/EIT |
| Time constant | T = $\sqrt{\rho A L^4 / EI}$ |
| Mid-plane stretching constant | $r_1$ = $Ah^2$/2IL |
| Force constant | $r_2$ = $L^4$/EIh | where $p_j$ are constants from the 5th-order polynomial forcing profile fit. In Table II and Eq. (1B), the nonaccented variables refer to the non-dimensional quantities. Equation (1B) is then discretized using Galerkin's method. The deflection of the beam is approximated as:

$$w(x, t) \approx \sum_{i=1}^n q_i(t)\phi_i(x) \quad (1C)$$

where $\varphi_i(x)$ are the linear mode shapes of the beam, $q_i(t)$ are the time-dependent generalized coordinates, and n is the number of degrees of freedom (DOF) to be considered. In our case, the mode shapes for a cantilever (CL) and clamped-clamped (CC) microbeam are well known and are of the form $\varphi_i(x)$=cos h($\alpha_i$ x)−cos($\alpha_i$ x)−$\sigma_i$ (sin h($\alpha_i$ x)−sin ($\alpha_i$ x)), where $\alpha_i$ are the square roots of the non-dimensional natural frequencies, and $\sigma_i$ are constants determined from the boundary conditions and mode to be considered. Values of $\alpha_i$ and $\sigma_i$ for the first four modes are obtained from [39]. Once the mode shapes are known, Eq. (1B) becomes a coupled set of ordinary differential equations (ODE) in time for $q_i(t)$. Multiplying through by $\varphi_k$ and integrating between 0 and 1 decouples the linear terms because of the orthogonality of the mode shapes and results in a set of ODEs, coupled through the nonlinear forcing terms. See, Pallay, Mark, Meysam Daeichin, and Shahrzad Towfighian. "Dynamic behavior of an electrostatic MEMS resonator with repulsive actuation." Nonlinear Dynamics 89, no. 2 (2017): 1525-1538.

For a classic electrostatic beam with a parallel-plate electrode configuration, $\hat{f}_e$ can be represented analytically with an inverse polynomial of order two that has a singularity when the gap between electrodes goes to zero. However, in the system examined here, the simple analytical expression for the electrostatic force is not valid because of the different electrode arrangement, and the force must be calculated numerically. One way this can be achieved is to calculate the potential energy of the beam at each position, then take the derivative with respect to the direction of motion ($\hat{w}$). In this case, the potential energy is calculated from the voltage vector and capacitance matrix, the latter of which is simulated with a 2D finite-element analysis in COMSOL. The potential energy can be represented by, $$U = \frac{1}{2}[V_{side} V_{bias} V_{beam}] \begin{bmatrix} \hat{c}_{11} & \hat{c}_{12} & \hat{c}_{12} \\ \hat{c}_{21} & \hat{c}_{22} & \hat{c}_{23} \\ \hat{c}_{31} & \hat{c}_{32} & \hat{c}_{33} \end{bmatrix} \begin{bmatrix} V_{side} \\ V_{bias} \\ V_{beam} \end{bmatrix} \quad (2)$$

where $\hat{c}_{ij}$ are the capacitances between each pair of electrodes, and $V_{side}$, $V_{bias}$, and $V_{beam}$, are the voltages on the side electrodes (1), center electrode (2), and beam (3) respectively. The capacitance matrix is symmetric with $c_{ij}=c_{ji}$, which results in 6 independent capacitances in the system. Expanding Equation (2), setting $V_{beam}=0$ because the beam is assumed to be the reference ground voltage level, and taking the derivative with respect to the transverse beam deflection, yields, $$\hat{f}_e(\hat{w}, \vec{V}) = \frac{1}{2}\left(V_{side}^2 \frac{\partial c_{11}}{\partial \hat{w}} + 2V_{side}V_{bias}\frac{\partial c_{12}}{\partial \hat{w}} + V_{bias}^2 \frac{\partial c_{22}}{\partial \hat{w}}\right) \quad (3)$$

In Equation (3), the derivatives of the COMSOL simulated capacitance, $\hat{c}_{ij}$, can be estimated with a simple central difference method.

$$\frac{\partial \hat{c}_{11}}{\partial \hat{w}} \text{ and } \frac{\partial \hat{c}_{12}}{\partial \hat{w}}$$

can be fit with 9th order polynomials to create an analytical representation of the numerical data that can be used in Equation (1)

$$\frac{\partial \hat{c}_{22}}{\partial \hat{w}},$$

however, would require upward of a 20th order polynomial for an adequate fit, and therefore requires more consideration regarding its representation in Equation (1).

Figure 13A:
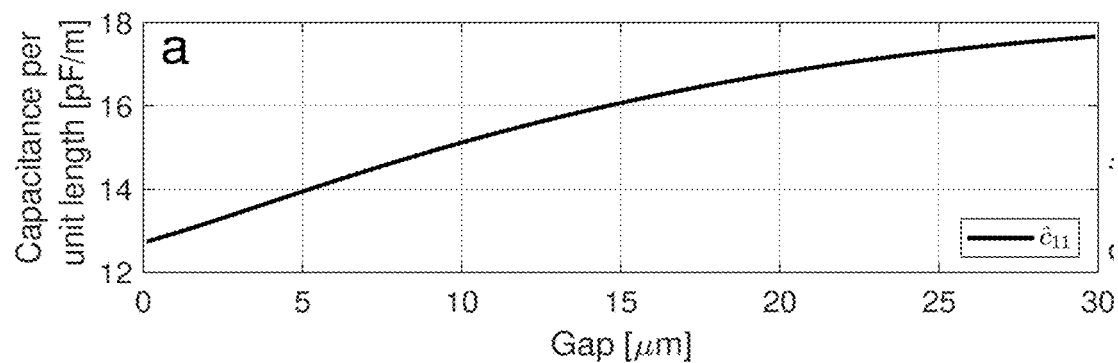
FIGS. 13a-13c show the capacitance per unit length of $\hat{c}_{11}$, $\hat{c}_{12}$, and $\hat{c}_{22}$ as calculated in COMSOL.
Figure 13B:
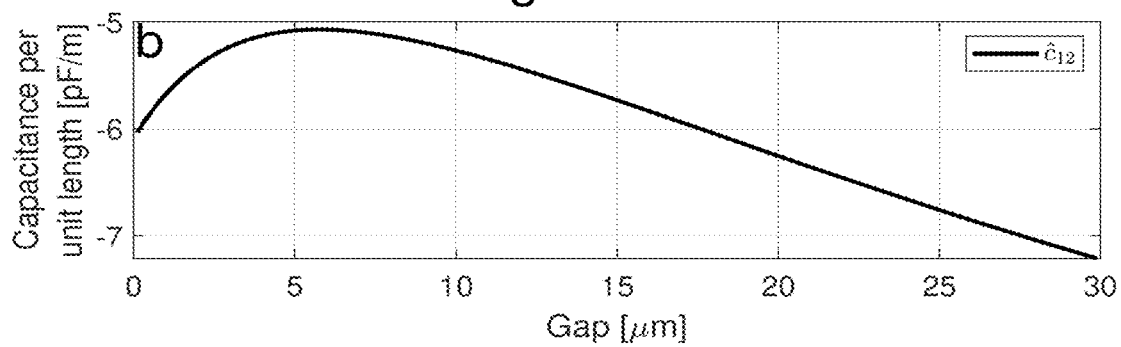
Figure 13C:
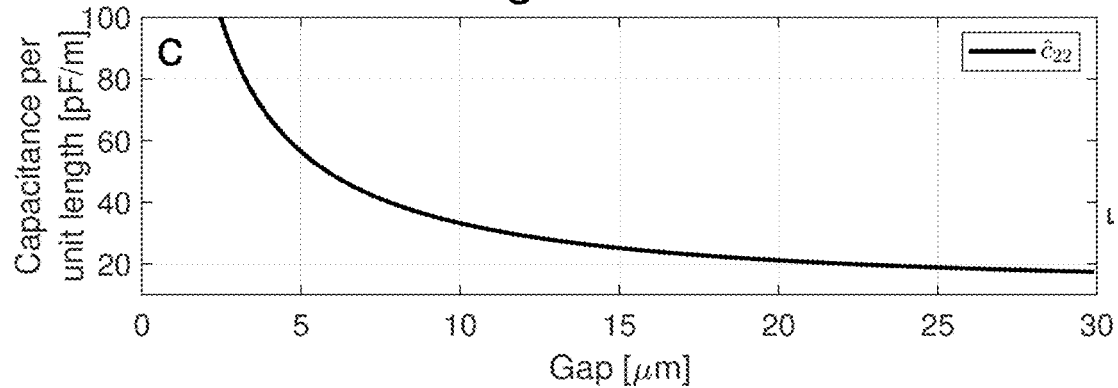
Figure 13D:
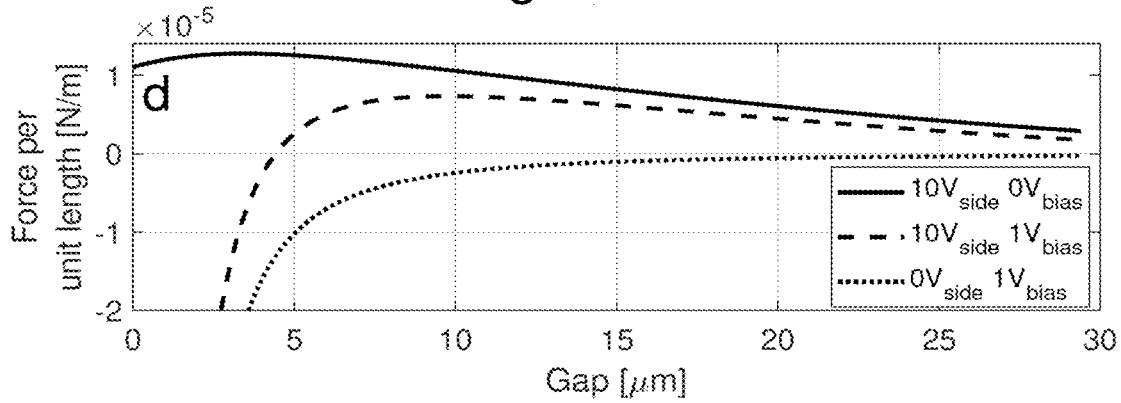
FIG. 13d shows the electrostatic force at various voltages showing the comparison between the pure attractive, pure repulsive, and combined forcing cases.

FIGS. 13a-13c show the three capacitances from the finite element solution (COMSOL) and the electrostatic force at various side and bias voltages. From Equation (3), when the bias voltage is set to zero, the only remaining force component is $$\frac{\partial \hat{c}_{11}}{\partial \hat{w}},$$

which represents the electrostatic levitation force. Conversely, if the side voltage is set to zero, only $$\frac{\partial \hat{c}_{22}}{\partial \hat{w}}$$

remains and the system acts as a parallel-plate. By observing the $c_{11}$ and $c_{22}$ capacitances, it is clear that $c_{22}$ has a much larger nominal capacitance and the magnitude of the slope is greater, especially at small gaps. This shows the parallel-plate force from the bias voltage is by far the dominant force component in this system. To counter this, much larger side voltages are needed to overcome the effect of the bias voltage. FIG. 13d shows the calculated force for several voltage cases. At large gaps, the force is dominated by the levitation force, but as the gap decreases, the total force becomes strongly negative as the behavior is dominated by the attractive parallel-plate force, despite the side voltage being an order of magnitude larger than the bias voltage.

TABLE I

Figure 12:
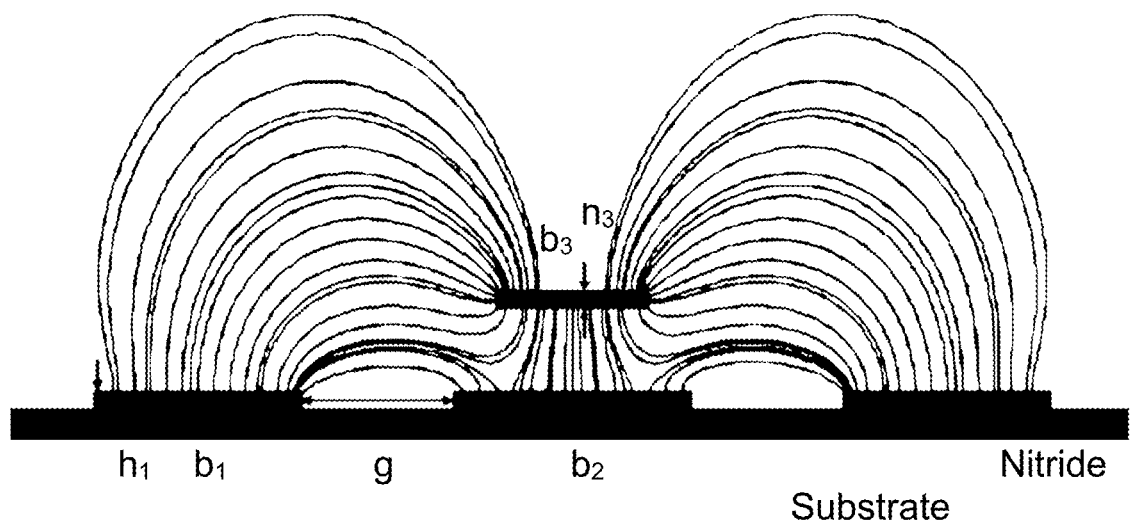
FIG. 12 shows an electrode layout to create electrostatic levitation with electric field lines. The side electrodes (red) are denoted as electrode 1, the middle electrode (green) is denoted as electrode 2, and the beam (blue) is denoted as electrode 3. The geometric parameters (hl, bl, g, etc.) are defined in Table II.

Beam parameters as shown in FIG. 12

| Parameter | Variable | Value |
| --- | --- | --- |
| Beam Length | L | 505 μm |
| Beam Width | $b_3$ | 20.5 μm |
| Beam Thickness | $h_3$ | 2 μm |
| Beam Anchor Height | D | 2 μm |
| Side Electrode Gap | G | 20.75 μm |
| Middle Electrode Width | $b_2$ | 32 μm |
| Side Electrode Width | $b_1$ | 28 μm |
| Electrode Thickness | $h_1$ | 0.5 μm |
| Dimple Length | $L_d$ | 0.75 μm |
| Elastic Modulus | E | 160 GPa |
| Density | P | 2330 kg/m$^3$ |
| Poisson's Ratio | V | 0.22 |

TABLE II

Nondimensional substitutions and forcing coefficients for the governing differential equation

| Parameter | Substitution |
| --- | --- |
| x-direction position | x = $\hat{x}$/L |
| z-direction position | w = $\hat{w}$/$h_3$ |
| Time | t = $\hat{t}$/T |
| Capacitance | $c_{22} = c_{22}/c_n$ |
| Time constant | T = $\sqrt{\rho A L^4/EI}$ |
| Damping Constant | $c^* = \hat{c}/EIT$ |
| Capacitance Constant | $\rho A L h_3^2/L^4 T^2$ |
| Force Constant 1 | $A_i = \alpha_i h_3^{i-1} L^4/2EI$ |
| Force Constant 2 | $B_i = \beta_i h_3^{i-1} L^4/EI$ |

After the force is calculated, Equation (3) is plugged into Equation (1) yielding the dimensionalized equation of motion for the cantilever, $$\rho A \frac{\partial^2 \hat{w}}{\partial \hat{t}^2} + \hat{c}\frac{\partial \hat{w}}{\partial \hat{t}} + EI\frac{\partial^4 \hat{w}}{\partial \hat{x}^4} = \quad (4)$$

$$\frac{1}{2}V_{side}^2 \sum_{i=0}^{9} \alpha_i \hat{w}^i + V_{side}V_{bias}\sum_{i=0}^{9} \beta_i \hat{w}^i + \frac{1}{2}V_{bias}^2 \frac{\partial c_{22}}{\partial \hat{w}}$$

where $\alpha_i$ and $\beta_i$ are fitting coefficients for the $c_{11}$ and $c_{12}$ terms respectively. Equation (4) is then nondimensionalized with the substitutions shown in Table II, which yields the final nondimensional equation of motion shown in Equation (5).

$$\frac{\partial^2 w}{\partial t^2} + c^*\frac{\partial w}{\partial t} + \frac{\partial^4 w}{\partial x^4} = V_{side}^2\sum_{i=0}^{9} A_i w^i + V_{side}V_{bias}\sum_{i=0}^{9} B_i w^i + \frac{1}{2}V_{bias}^2 \frac{\partial c_{22}}{\partial w} \quad (5)$$

When the time-derivative terms in Equation (5) are set to zero, it becomes a fourth-order ordinary differential equation, with x being the only independent variable. Despite the complicated forcing term, this equation can be solved directly as a boundary value problem. First, however, a form for $$\frac{\partial \hat{c}_{22}}{\partial \hat{w}}$$

must be determined. Because this force component behaves similarly to the parallel-plate force, a fitting function with a similar form can be used. Because this force component behaves similarly to the parallel-plate force, a fitting function with a similar form can be used.

$$\frac{\partial \hat{c}_{22}}{\partial \hat{w}}$$

is fit with the function shown in Equation (6).

$$\frac{\partial c_{22}}{\partial w} = \frac{-0.9252}{\left(w + \frac{d}{h_3}\right)^{2.15}} \quad (6)$$

Plugging this into Equation (5) after dropping the time derivatives gives the static equation of motion that can be solved with the boundary value solver, bvp4c, in MATLAB.

$$\frac{\partial^4 c_{22}}{\partial w^4} = V_{side}^2 \sum_{i=0}^{9} A_i w^i + V_{side} V_{bias} \sum_{i=0}^{9} B_i w^i - V_{bias}^2 \frac{0.4626}{\left(w + \frac{d}{h_3}\right)^{2.15}} \quad (7)$$

Figure 14:
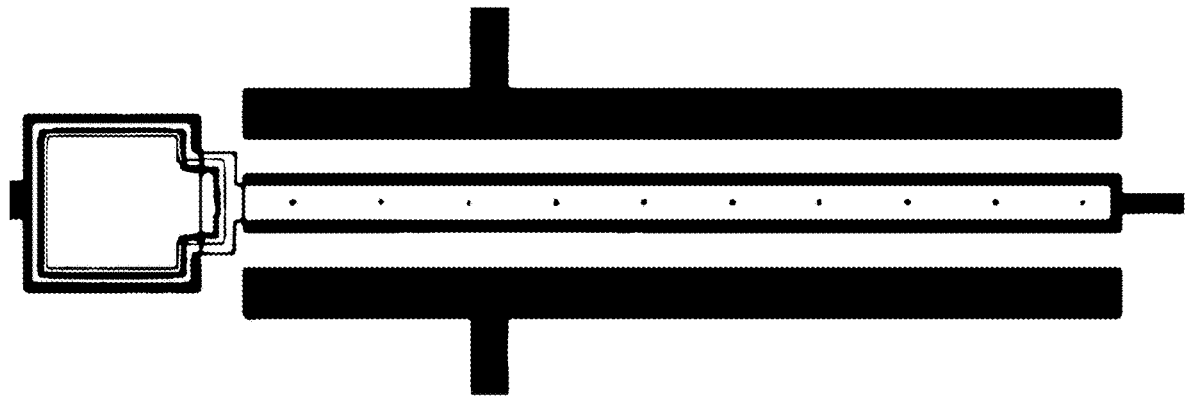
FIG. 14 shows an optical image of a fabricated beam.

Cantilevers with the electrode arrangement in FIG. 12 may be fabricated with the PolyMUMPs service by MEMSCAP [58] to the dimensions given in Table I. An image of a fabricated beam is shown in FIG. 14. Beam tip displacement may be measured with a Polytec MSA-500 Laser vibrometer. A USB-6366 National Instruments Data Acquisition (DAQ) interfaced with MATLAB supplies the bias and side voltage and records the displacement data from the laser. Because the voltage limitation of the DAQ is +/−10V, the side voltage is fed into a Krohn-Hite 7600 Wideband Power Amplifier and stepped up 20× to reach the desired 200V maximum voltage to the side electrodes. To measure the side voltage, the output of the amplifier is also fed into a resistive voltage divider to drop the voltage back down under 10V and is fed back into the DAQ. The actual voltage on the side electrodes can be calculated with the simvoltage to the center electrode and a quasi-static ramp function from 0V to approximately 190V to the side electrodes. The ramp duration is one second, which is four orders of magnitude longer than the natural frequency of the beam to ensure the beam response is quasi-static.

FIGS. 16a-16d show that the model agrees very well with the experiment, especially at higher bias voltages. To account for support compliance at the fixed end of the cantilever, a corrected length of 505 μm is used. The tip displacement reaches almost 14 μm at 190V, despite the anchor height of just 2 μm. These large travel ranges are not possible in conventional parallel plate actuators and are a distinct advantage of electrostatic levitation. For 4V and 6V bias, the beam pulls in if the side voltage is too low. For example, the beam pulled in below a side voltage of approximately 50V for 4V bias, and 80V for a 6V bias. However, when pull-in occurs, the side voltage can be ramped up to release the beam from its pulled-in position, overcoming both the bias voltage and stiction forces [56]. The model could reach slightly lower voltages before becoming unstable, though this is most likely because the model does not account for the dimples on the underside of the beam. The dimples create an effectively smaller gap between the beam and center electrode, thus increasing the effect of the force from bias voltage, which dominates when the gap is small.

Another interesting result is the linear relationship between tip deflection and side voltage, especially at higher bias voltages. The slope is approximately 90 nm per volt on the side electrodes. This linear relationship is maintained for more than 10 μm of static displacement. (Because high voltages cannot be applied in devices created using the PolyMUMPs fabrication procedure, 190V was not exceeded.) The tip displacement shows no signs of saturating near 190V and the linear voltage relationship most likely extends much further. When there is no bias voltage, an approximately linear relationship exists for deflections above around 4 μm. However, when 4V bias is added to the center electrode, the linearity extends all the way down to 0 μm. If the bias voltage is too large, such as at 6V, pull-in will occur at small gaps. Therefore, there exists an optimal bias voltage, 4V for the dimensions shown in Table I, that yields a linear response over the entire static range.

Figure 17A:
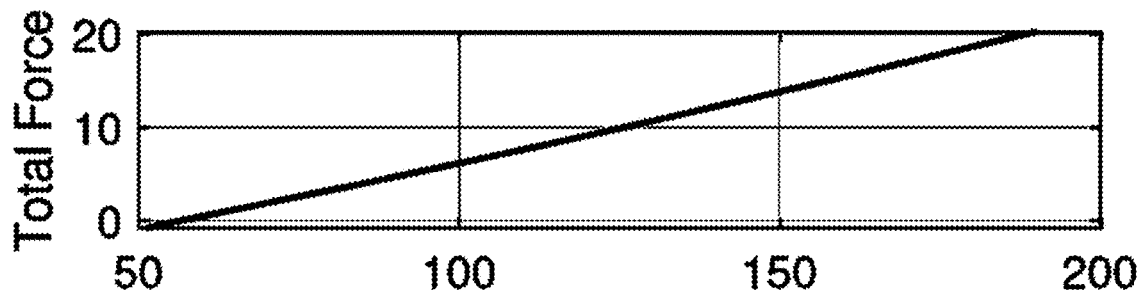
FIGS. 17a-17d show the nondimensional force at 6 V bias as a function of side voltage when evaluated at the static equilibrium position for a) the total force, b) $c_{11}$ component, c) $c_{12}$ component, and d) $c_{22}$ component. Each component is scaled with its associated voltages as denoted in Equation (22).
Figure 17B:
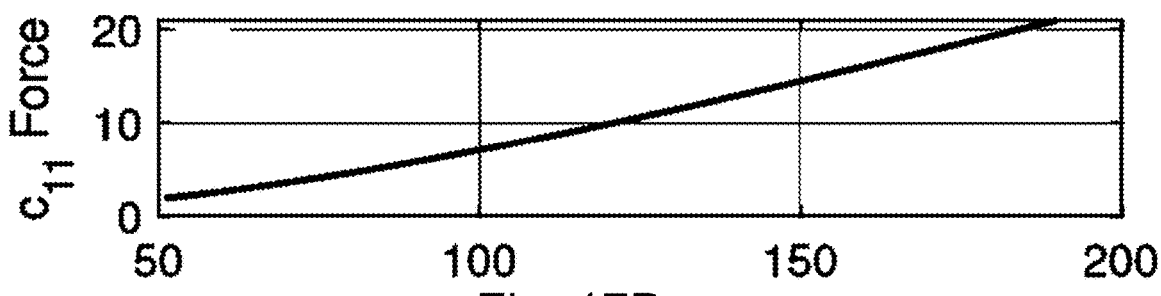
Figure 17C:
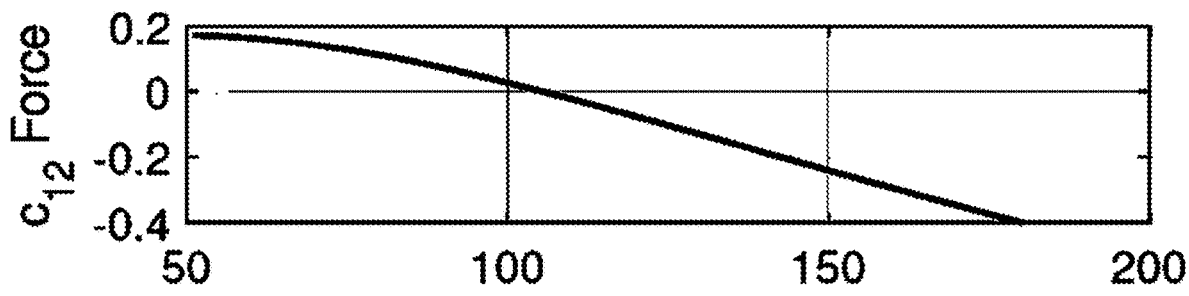
Figure 17D:
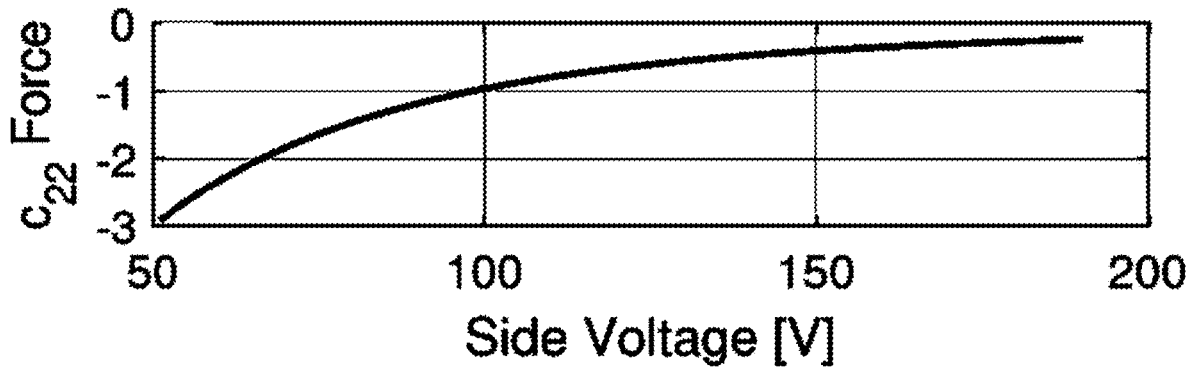
Figure 18A:
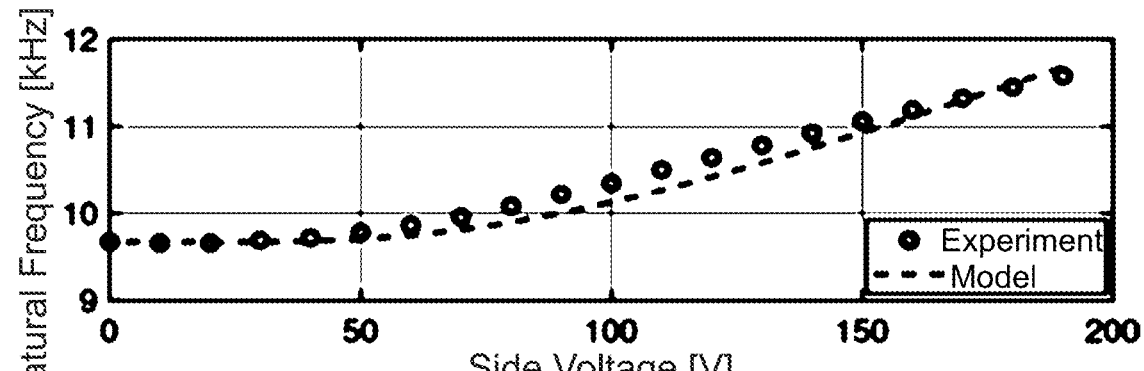
FIGS. 18a-18d shows the natural frequency results for a) 0V, b) 2V, c) 4V, and d) 6V bias as a function of side voltage.
Figure 18B:
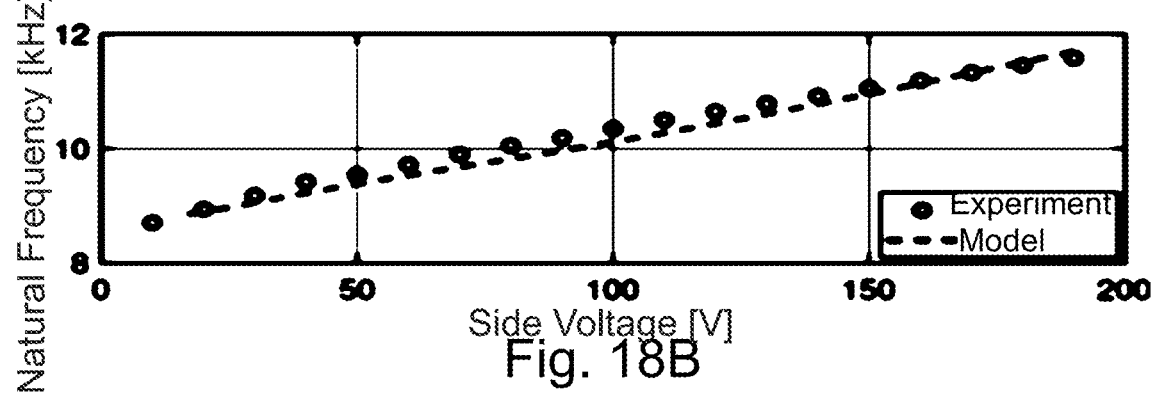
Figure 18C:
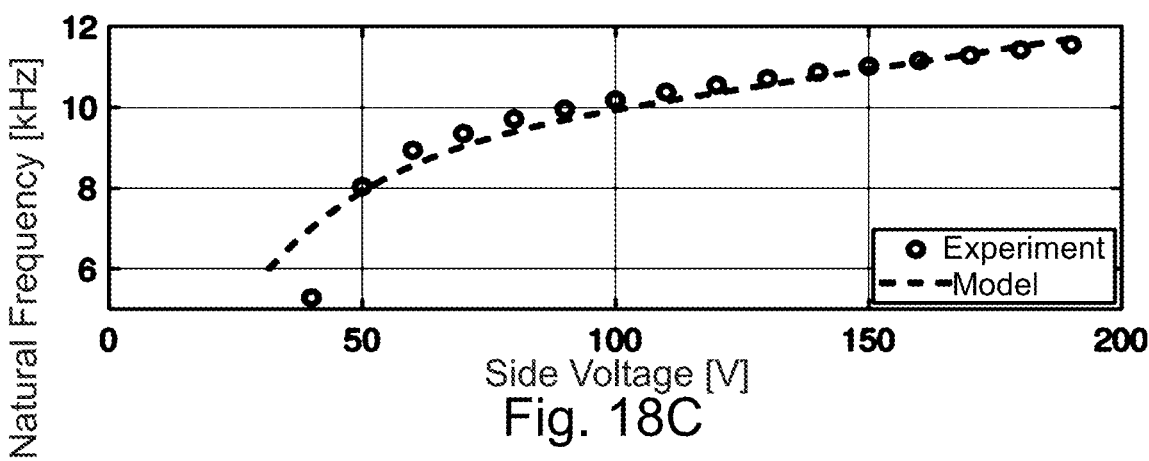
Figure 18D:
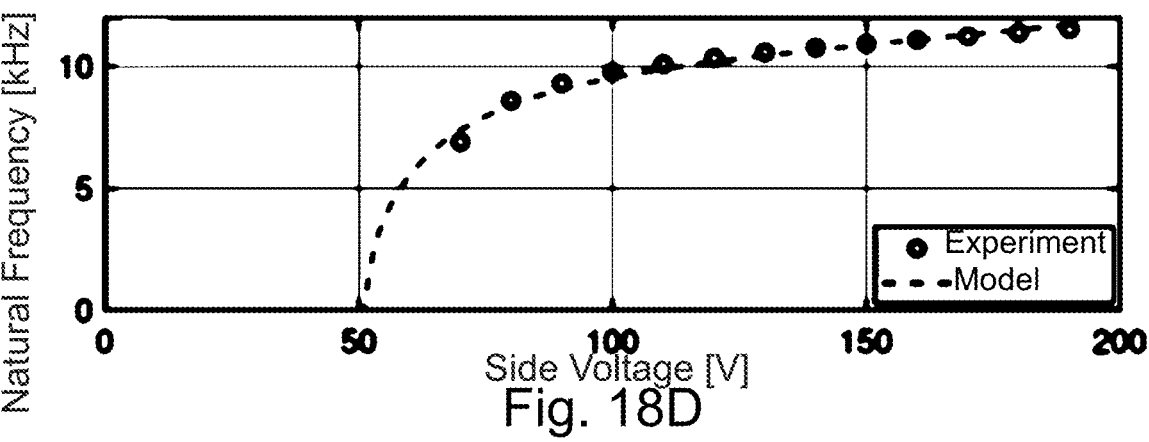

The reason for the linearization between side voltage and tip displacement can be seen by analyzing the force and its associated components. FIGS. 17a-17d shows the nondimensional forcing components at 6V bias as a function of side voltage when evaluated at the static equilibrium points in FIG. 16d. As shown in FIG. 17a, the total force, which is the sum of each forcing component in FIGS. 17b-d, scales linearly with side voltage. Despite Equation (3) showing the force scaling with the square of the side voltage, when considering the increasing gap, the relationship turns out to be linear. Because the force is now effectively a linear function of side voltage, the solution to Equation (7) will also be a linear function of side voltage.

Figure 16A:
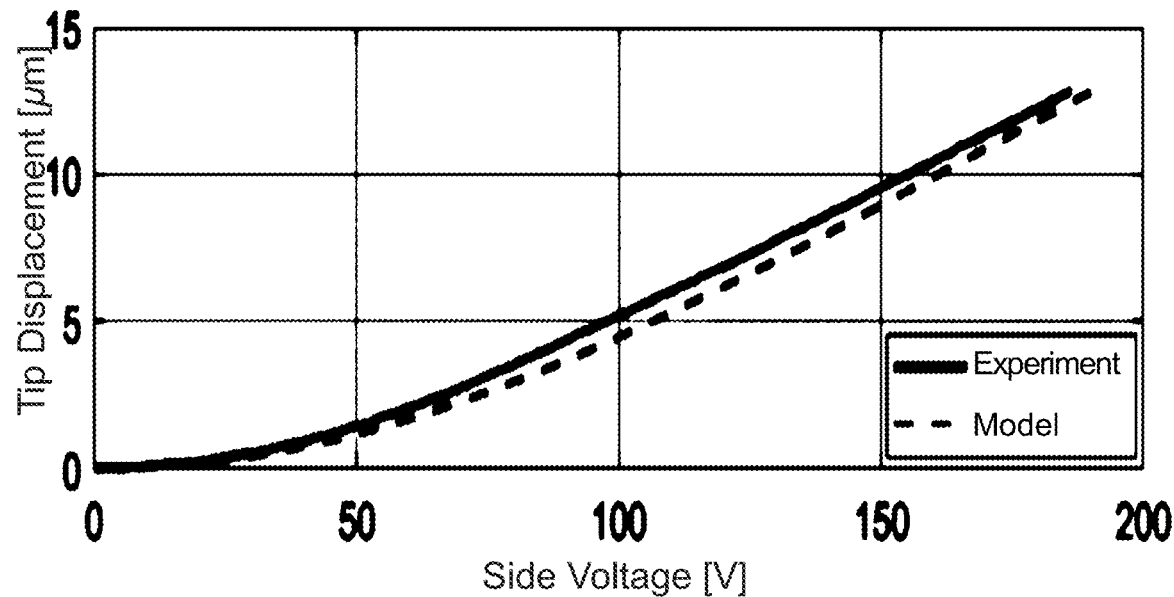
FIGS. 16a-16d show a comparison of predicted and measured static results for (FIG. 16a) 0V, (FIG. 16b) 2V, (FIG. 16c) 4V, and (FIG. 16d) 6V bias as a function of side voltage. The results are in very close agreement.
Figure 16B:
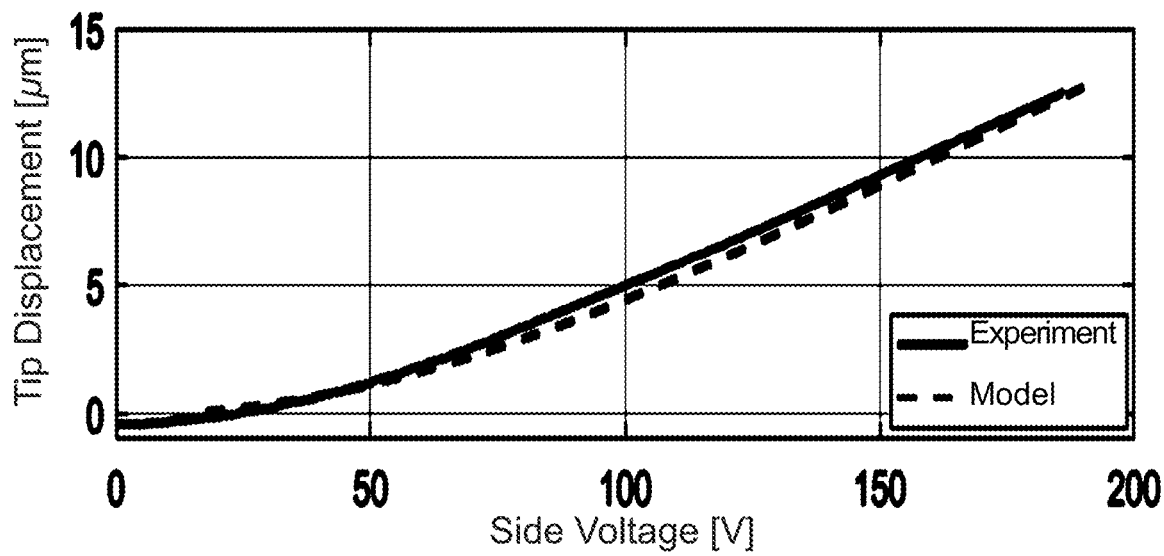
Figure 16C:
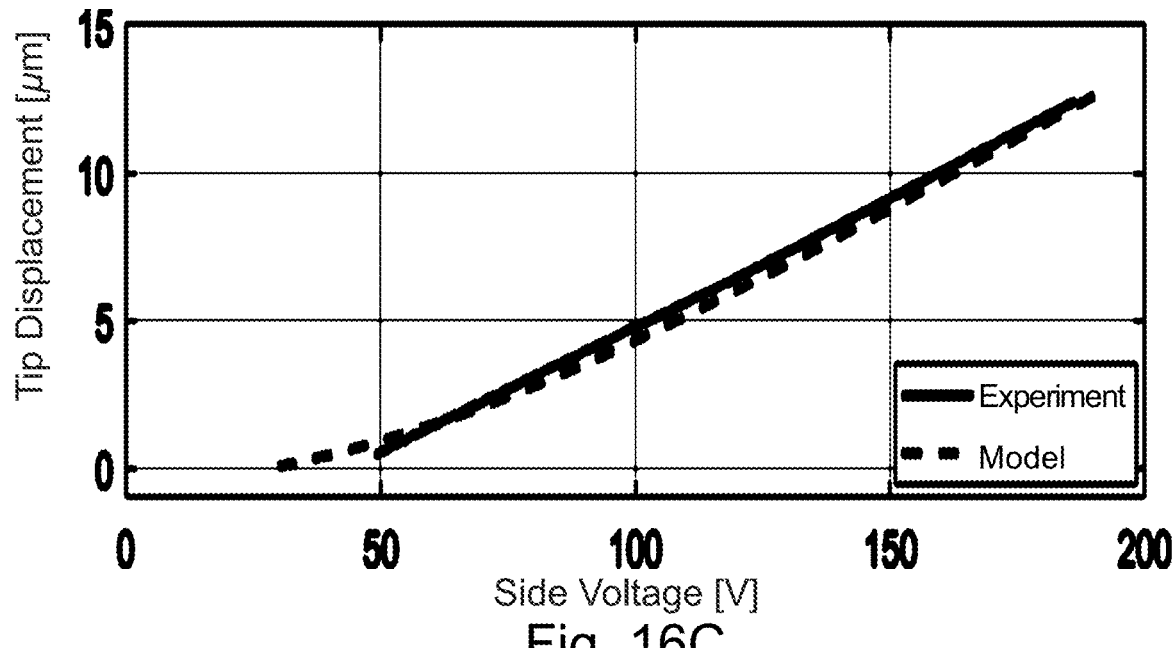
Figure 16D:
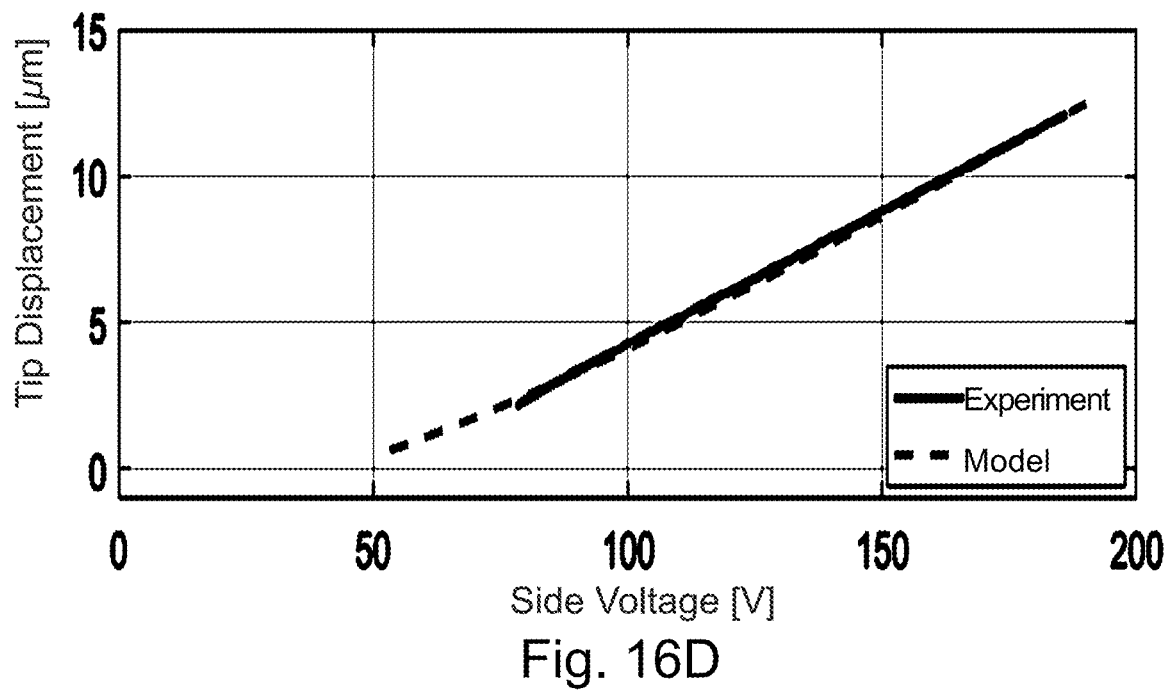

The reason for the linearization of the force is different when at larger voltages as opposed to smaller voltages. When the side voltage is above 80V, the $c_{11}$ and $c_{22}$ are negligible compared to the $c_{11}$ component. In this case, the system acts like as if there was just a pure levitation force with no bias voltage. When the side voltage is increased, the upward electrostatic force on the beam also increases. If the beam was completely rigid, this force would scale with the square of the side voltage. But the beam is not rigid and deflects upwards when the side voltage is increased. This deflection increases the gap between the beam and fixed electrodes, which in turn causes the upward electrostatic force to decrease. When the side voltage is large, the decrease in the upward electrostatic force from increasing the gap counteracts the nonlinearly increasing force with voltage and the result is an effectively linear scaling of the total force with side voltage. This can be seen in the static position in FIG. 16a, which has no bias voltage, but still shows the linear increase with side voltage. However, when the voltage drops below 80V, FIG. 16a shows a nonlinear relationship with side voltage. This is because the levitation force is inherently weak, and unless the voltage is very large, the force is too low to deflect the beam enough for the increasing gap to counteract the scaling of the force with the square of the side voltage.

To achieve linearity at low side voltages, a bias voltage on the center electrode must be used. Comparing the upward levitation ($c_{11}$) and downward parallel-plate ($c_{22}$) components of the force in FIGS. 17b and d shows why. As the side voltage decreases, the levitation $c_{11}$ component starts to flatten out around zero. This decrease in total force brings the beam closer to the center electrode and increases the influence of the bias voltage, which pulls the beam downward. The parallel-plate $c_{22}$ component is inversely related to the gap (Equation (6)) and therefore the downward force gets stronger as the gap decreases. When combining the forcing terms, the downward bending of the force from the parallel-plate component counteracts the flattening of the force from the levitation component. Because the parallel-plate force scales with the square of the bias voltage, by choosing the appropriate bias, 4V, the two nonlinear effects cancel each other and the result is a nearly linear force that decreases all the way to zero. If the bias voltage is too large the downward bending from the parallel-plate force overcomes the flattening of the levitation force and the system becomes nonlinear in the negative direction before the force can reach zero and the beam becomes unstable. This is the case for 6V bias, where the beam pulls in during the experiment before it can return to its undeflected position. The linearity with side voltage is extraordinarily useful for any actuator that is negatively affected by nonlinearity and requires a large actuating range. Possible applications include micro-mirrors and micro-fluidic devices.

Natural frequency is an important property of oscillators and sensors that determines their resolution and sensitivity. To calculate the natural frequency, we must return to the dynamic partial differential equation from Equation (5). Now w becomes a function of time and position so it must be reduced to an ordinary differential equation in time before we can calculate the natural frequency. This can be achieved by performing Galerkin's method, which is a modal analysis using separation of variables and integration over x to get a set of second-order ordinary differential equations that are coupled through nonlinear terms. If just a single mode is to be considered, this will yield a single ordinary differential equation that can be used to calculate the natural frequency.

First, the transverse deflection of the beam is assumed to have separate spatial and time-dependent functions as shown in Equation (8).

$$w(x,t) = \varphi(x)q(t) \quad (8)$$

The mode shapes, $\varphi(x)$, can be solved from the eigenvalue problem, which depends on the boundary conditions. The mode shapes for a simple cantilever are well known and can be expressed by, $$\varphi_i(x) = \cos h(\lambda_i x) - \cos(\lambda_i x) - \sigma_i(\sin h(\lambda_i x) - \sin(\lambda_i x)) \quad (9)$$

where $\lambda_i$ is the square root of the $i^{th}$ nondimensional natural frequency, and $\sigma_i$ is a constant. For the first mode, $\varphi_1$ (herein referred to as $\varphi$), $\sigma_i$ and $\lambda_1$ are 0.7341 and 1.875 respectively. However, to account for fabrication imperfections the natural frequency may be identified from an experiment and nondimensionalized to use with Equation (9).

After separation of variables, the governing equation is multiplied by $\varphi$ and integrated over x to yield Equation (10), which is a second-order ordinary differential equation that depends only on the time-dependent component of the solution, q, $$m\frac{d^2q}{dt^2} + c\frac{dq}{dt} + kq = V_{side}^2 \sum_{i=0}^{9} A_i \Phi_i q^i + V_{side} V_{bias} \sum_{i=0}^{9} B_i \Phi_i q^i + \frac{1}{2} V_{bias}^2 \int_0^1 \phi \frac{\partial c_{22}}{\partial(\phi q)} dx \quad (10)$$

where $$m = \int_0^1 \phi^2 dx \quad c = c*m \quad (11)$$

$$k = \lambda_1^4 m \quad \Phi_i = \int_0^1 \phi^{i+1} dx$$

The last term in Equation (10) can be problematic if it is not dealt with appropriately. For the static problem, this term could be fitted with the function given in Equation (6). However, the integration on x from the modal analysis will create a singularity at x=0, which will make the differential equation impossible to solve. A standard parallel-plate has a similar problem; however, it can be mitigated by multiplying the entire equation by the denominator, expanding the polynomial, and then performing Galerkin's method. In this case, two complications prevent that from working. First, the order of the polynomial in the denominator of Equation (6) is not an integer, so it cannot be expanded. Second, multiplying the two 9th order polynomials by a noninteger polynomial will be extraordinarily difficult and tedious later in the problem when solving for the natural frequency. Therefore, this term can be treated numerically as a list of numbers, where linear interpolation is used to estimate the values between data points. This is more computationally expensive, but computation time is not an issue for the natural frequency calculation. Before that can be done, the integration on x must be performed.

The derivative, $$\frac{\partial c_{22}}{\partial(\phi q)}$$

can be rewritten using the relationship, $$\frac{\partial c_{22}}{\partial q} = \frac{\partial c_{22}}{\partial w}\frac{\partial w}{\partial q} = \frac{\partial c_{22}}{\partial(\phi q)}\frac{\partial(\phi q)}{\partial q} = \frac{\partial c_{22}}{\partial(\phi q)}\phi\frac{\partial q}{\partial q} \quad (12)$$

which yields, $$\frac{\partial c_{22}}{\partial(\phi q)} = \frac{1}{\phi}\frac{\partial c_{22}}{\partial q} \quad (13)$$

When substituting Equation (13) into Equation (10), the $\varphi$s cancel and the integration becomes 1. Now that x has been integrated out of the equation, q represents the deflection of the beam instead of w. The derivative of the numerical $c_{22}$ data from COMSOL with respect to the deflection can be substituted in for $$\frac{\partial c_{22}}{\partial q}.$$

The final equation becomes, $$m\frac{d^2q}{dt^2} + c\frac{dq}{dt} + kl = \quad (14)$$

$$V_{side}^2 \sum_{i=0}^{9} A_j \Phi_i q^i + V_{side}V_{bias} \sum_{i=0}^{9} B_i \Phi_i q^i + \frac{1}{2}V_{bias}^2 \frac{\partial c_{22}}{\partial q}$$

To find the natural frequency, the eigenvalues of the Jacobian matrix can be calculated by decomposing Equation (14) to two first-order ODEs with $y_1 = q$ and $$y_2 = \frac{dq}{dt},$$

setting the damping coefficient to zero, and plugging the equations into the relationship, $$J = \begin{bmatrix} \frac{\partial \dot{y}_1}{\partial y_1} & \frac{\partial \dot{y}_1}{\partial y_2} \\ \frac{\partial \dot{y}_2}{\partial y_1} & \frac{\partial \dot{y}_2}{\partial y_2} \end{bmatrix} \quad (15)$$

which is the Jacobian matrix. The eigenvalues of Equation (15) are, $$\Lambda = \quad (16)$$

$$\sqrt{\frac{V_{side}^2}{m}\sum_{i=0}^{9} iA_i\Phi_i y_1^{i-1} + \frac{V_{side}V_{bias}}{m}\sum_{i=0}^{9} iA_i\Phi_i y_1^{i-1} + \frac{1}{2m}V_{bias}^2 \frac{\partial^2 c_{22}}{\partial y_1^2} - \lambda_1^4}$$

where the natural frequency is the imaginary part of the eigenvalue. The only variable that is unknown in this equation is $y_1$, which is the beam deflection. The value of $y_1$ at each voltage level can be determined from the static model results at the given side and bias voltage, after which the natural frequency can be calculated.

In order to experimentally measure the values, white noise was superimposed on the DC side voltage while holding the bias voltage constant, and the beam tip velocity was recorded with the laser vibrometer. A fast-Fourier transform (FFT) was performed on the velocity signal to extract the natural frequency. Unlike the static case, the side voltage was not swept up continuously to 190V. Instead, the side and bias voltage were kept constant and the natural frequency was extracted at 10-volt intervals. FIGS. 18a-18d show the natural frequency results for the experiment and the model.

The model agrees well with the natural frequency experiment. The square root of the natural frequency, $\lambda_1$, was 1.7998. The curling of the beam tip in the fabricated beam needs to be incorporated into the model to obtain a better fit with the experiment. Because the beams are very long, residual stress from fabrication causes them to curl upward when released. This increases the gap between the beam and center electrodes and reduces the total electrostatic force. In this case, the beam tip was curled up approximately 2 μm out of plane. Ideally, this would be incorporated into both q and the mode shapes. However, the easiest way of addressing this problem is to simply add 2 μm of deflection to q.

When no bias voltage is applied, FIGS. 18a-18d shows that the natural frequency is relatively constant for side voltages under approximately 50V. However, at higher bias voltages the natural frequency starts to bend down at low side voltages until the system becomes unstable. This agrees with the initial assessment that the bias voltage is dominant at low gaps because a parallel-plate electrostatic force is correlated with a decrease in natural frequency, while electrostatic levitation increases the natural frequency with higher voltage. In the case of 4V and 6V bias, the natural frequency can be tuned from less than 6 kHz up to almost 12 kHz. This is an increase of almost 100%, which gives the beam a tremendous amount of tunability to control where the first resonant peak is located. Many devices, such as sensors, operate near their natural frequency to boost the signal-to-noise ratio. This electrostatic tunability enables accounting for any fabrication imperfection or environment operation changes to ensure a large signal-to-noise ratio and resolution.

The system can therefore be tuned to capture a wide range of frequencies, which is highly desirable in many sensors.

At an optimum value of the bias voltage, the highest linearity of natural frequency and the side voltage is achieved. If the bias voltage is set to approximately 2V, the downward bending of the natural frequency curve at low side voltage reaches a point where it matches the slope at higher side voltages. This creates a linear shift in natural frequency with side voltage. Unlike the static solution, the natural frequency is related to the slope of the force at the equilibrium position instead of the magnitude. The slope of the force is the linear stiffness, which is related to the natural frequency through the relationship, $$\omega_n = \sqrt{\frac{k_{eff}}{m}} \quad (17)$$

where $\omega_n$ is the natural frequency, m is the mass, and $k_{eff}$ is the effective stiffness, which is the sum of the mechanical stiffness of the beam ($k_{mech}$) and the added stiffness from the electrostatic force ($k_{elec}$), where $k_{elec}$ is much larger than $k_{mech}$. Because m and $k_{elec}$ are constant, $k_{elec}$ must be related to the side voltage. If $\omega_n$ is linearly related to side voltage, then $k_{elec}$ must be related to the square of the side voltage. This is confirmed to be true by analyzing the slope of the force at each static equilibrium position. The linear relationship in frequency is approximately 16 Hz per volt and is maintained for more than 2.9 kHz of frequency shift. The combination of parallel-plate and electrostatic levitation enables a wider range of capabilities that is not possible with each mechanism on its own.

To obtain the model frequency response, the dynamic equation of motion must be solved. Much of the procedure for calculating the natural frequency of Equation (5) can be used for the frequency response as well. Equation (14) can be integrated directly using linear interpolation to determine $$\frac{\partial c_{22}}{\partial q}.$$

However, the computation expense of using linear interpolation becomes problematic and creates very long solve times. To reduce the integration time, $$\frac{\partial c_{22}}{\partial q}$$

can be fit with the inverse non-integer polynomial in Equation (6) with q replacing w. This is not problematic, because the substitution is occurring after the modal analysis, which is where the problems were occurring initially. This significantly reduces the computation time so that the frequency response can be calculated. The final dynamic equation is given in Equation (18).

$$m\frac{d^2q}{dt^2} + c\frac{dq}{dt} + kq = \tag{18}$$

$$V_{side}^2 \sum_{i=0}^{9} A_i \Phi_i q^i + V_{side} V_{bias} \sum_{i=0}^{9} B_i \Phi_i q^i - V_{bias}^2 \frac{0.4626}{\left(q + \frac{d}{h_3}\right)^{2.15}}$$

The damping coefficient is estimated from the experiment, which was conducted at approximately 300 mTorr, which correlates to a quality factor of 500. The quality factor is used in Equation (18) by the relationship $c=\lambda_1^2/Q$.

To conduct the experiment, the side voltage is given an AC voltage on top of the DC offset. The DAQ supplies the AC voltage, and the DC offset function of the Krohn-Hite amplifier applies the DC side voltage. The bias was held constant at the same 0V, 2V, 4V, and 6V values used in the static and natural frequency tests. For the frequency response, the tip velocity was measured with the vibrometer. FIGS. 19*a*-19*d* show the frequency response around the first natural frequency at 0V, 2V, 4V, and 6V bias, with 170 VDC and 0.5 VAC on the side electrodes.

As with the static and natural frequency results, the frequency response model agrees with the experiment. In the experiment, the backsweep branch continues to grow until it starts tapping on the center electrode and falls back down to the lower branch. If the bias voltage is high enough, instead of falling back down to the lower branch, it pulls in, as is the case at 6V bias. Before pull-in occurs, the backsweep branch becomes very flat and increases in size. This extension of higher branch oscillation is because of the quadratic nonlinearity that causes excessive softening from electrostatic levitation and parallel-plate schemes. With no bias, the backsweep branch ends around 11 kHz, but with 6V bias the branch travels back to 10 kHz before pulling in. The high amplitude vibration could be useful for the development of high-resolution oscillators. The triggering of dynamic pull-in near the resonant peak can help create combined systems that act as a sensor and a switch, which triggers when the sensed quantity increases past a threshold. The levitation force can be used to release the pulled-in structure and reuse the device.

Figure 20:
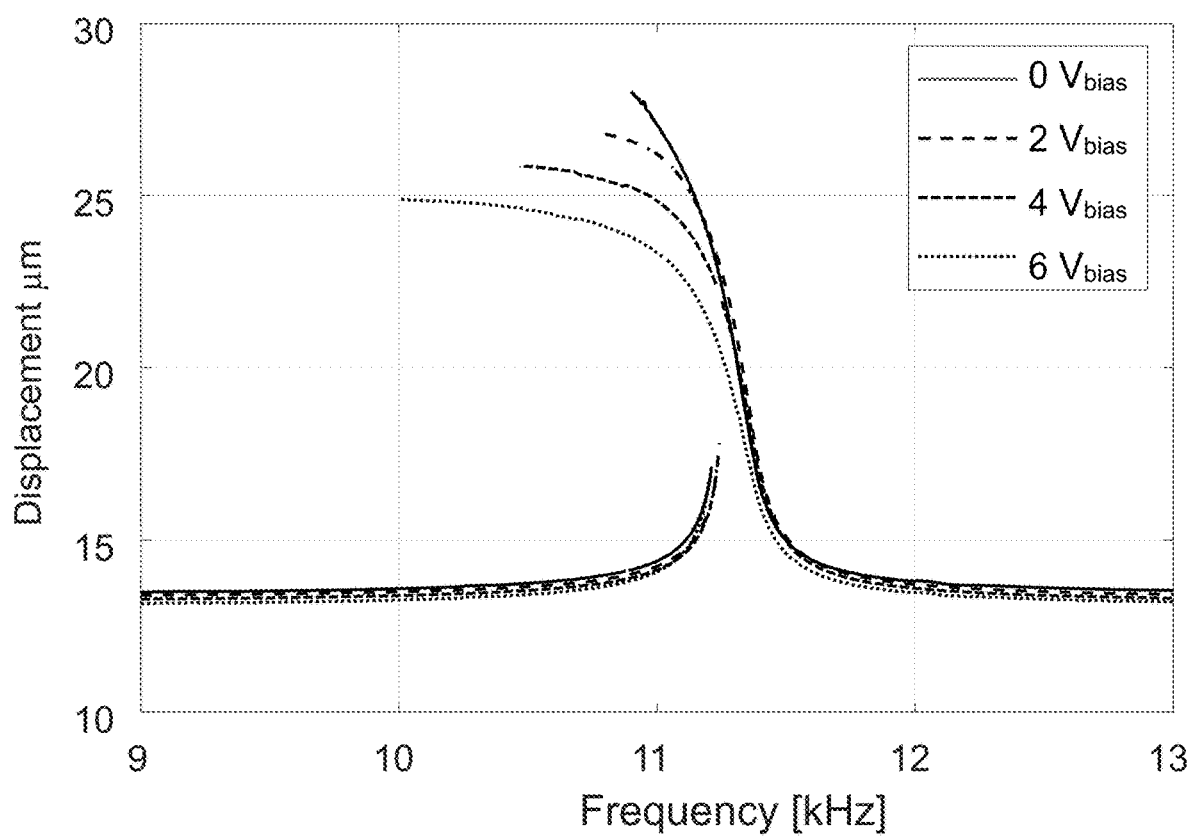
FIG. 20 shows the model displacement frequency response around the first natural frequency for 0V, 2V, 4V, and 6V bias at 170 VDC and 0.5 VAC on the side electrodes.
Figure 21A:
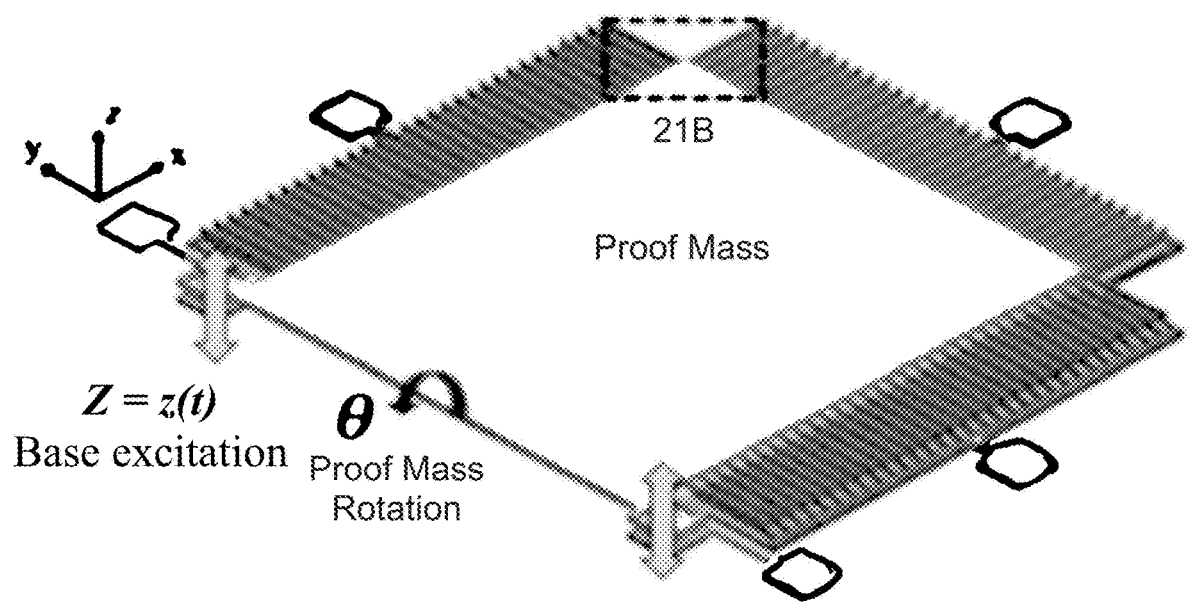
FIGS. 21a-21f shows (FIG. 21a) The general schematic of the accelerometer. Base excitation (shown by yellow bi-directional arrows) will be transferred to the microstructure through its supports causing the plate to rotate.
Figure 21B:
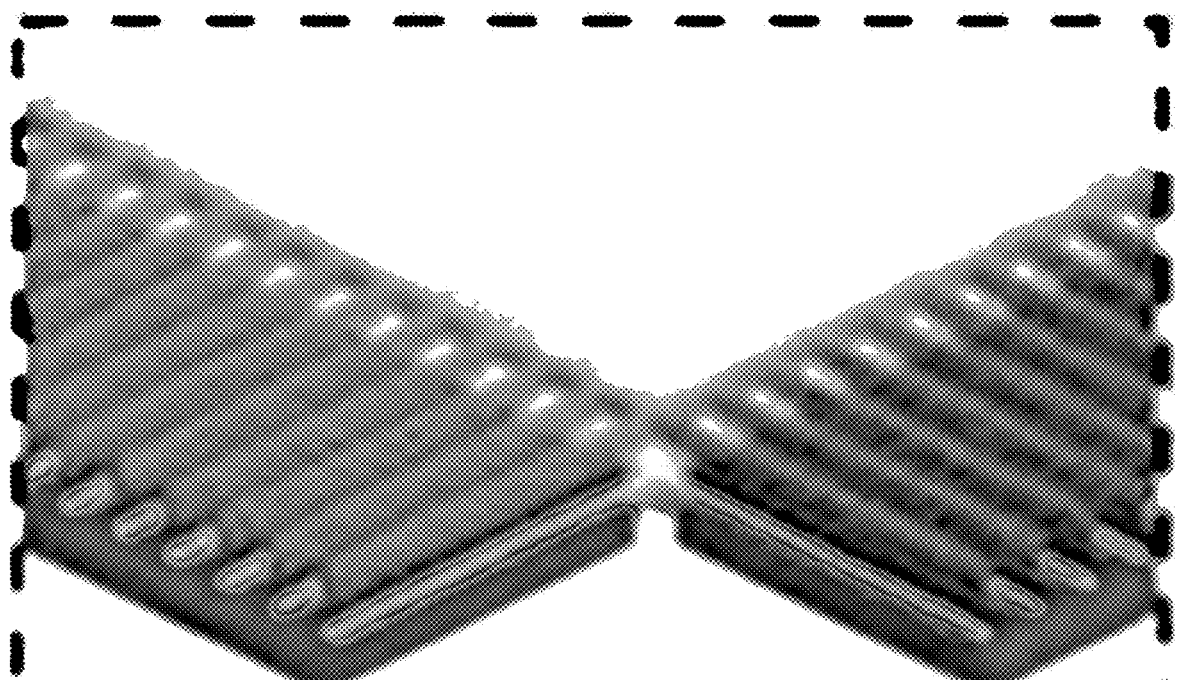
Figure 21C:
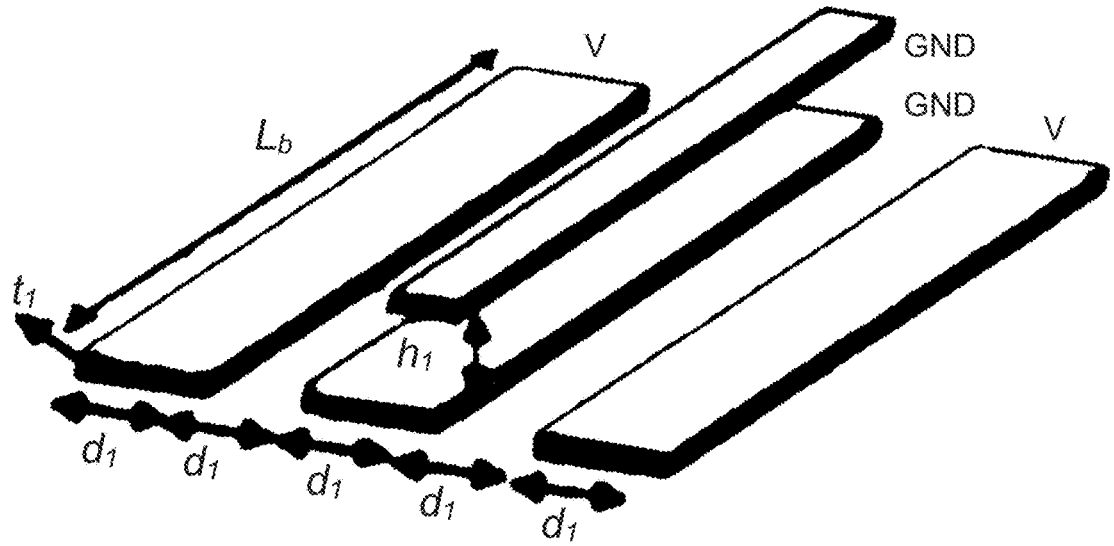
Figure 21D:
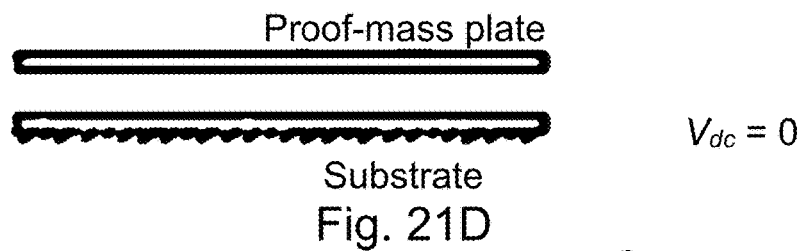
Figure 21E:
Figure 21F:
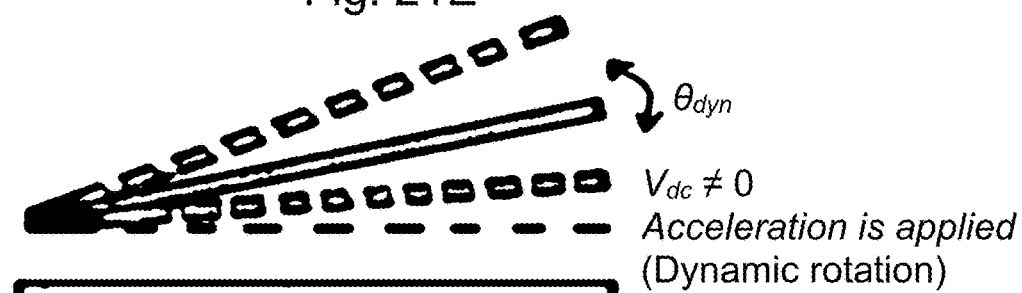

To get more insight into the motion of the beam, the model displacement was calculated and is shown in FIG. 20. This dynamic displacement reaches upward of 28 µm with no bias voltage. Increasing the bias bends the peak down and to the left, which drops the peak amplitude by about 3 µm for 6V bias. Unlike static and natural frequency, the addition of the bias voltage always increases the nonlinearity of the system. This is because levitation and parallel-plate electrostatic forces create softening in the frequency response, therefore the combination of the two yields more softening. Therefore, MEMS oscillators and resonators that require a linear frequency response would not particularly benefit from this method.

Figure 19A:
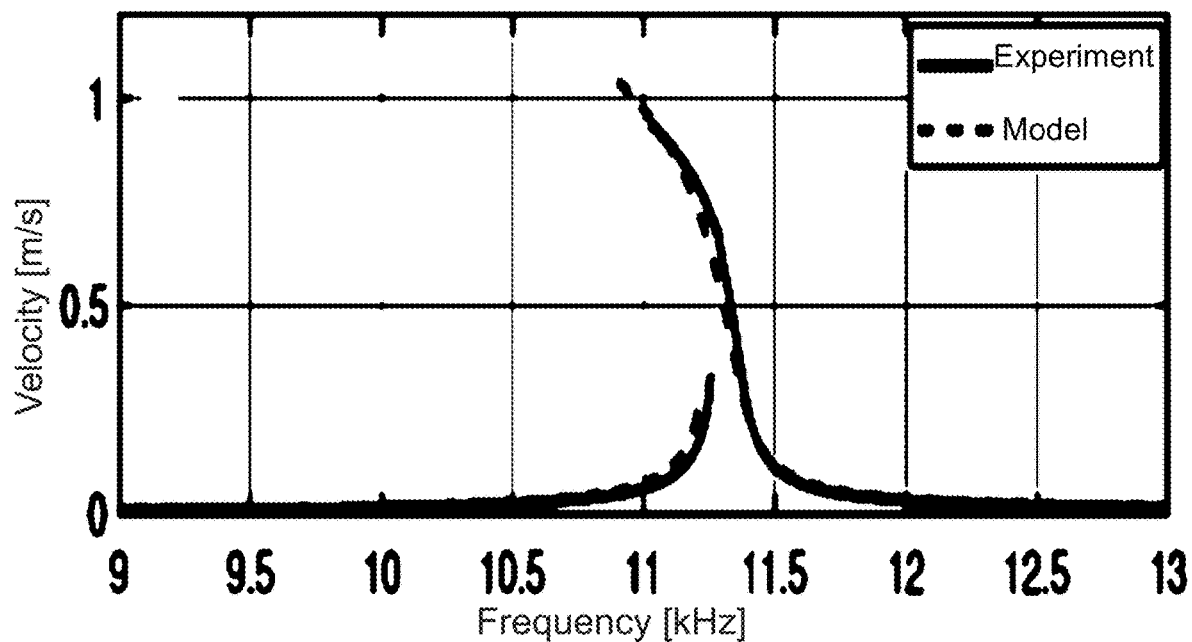
FIGS. 19a-19d show the frequency response around the first natural frequency for (FIG. 19a) 0V, (FIG. 19b) 2V, (FIG. 19c) 4V, and (FIG. 19d) 6V bias at 170 VDC and 0.5 VAC
Figure 19B:
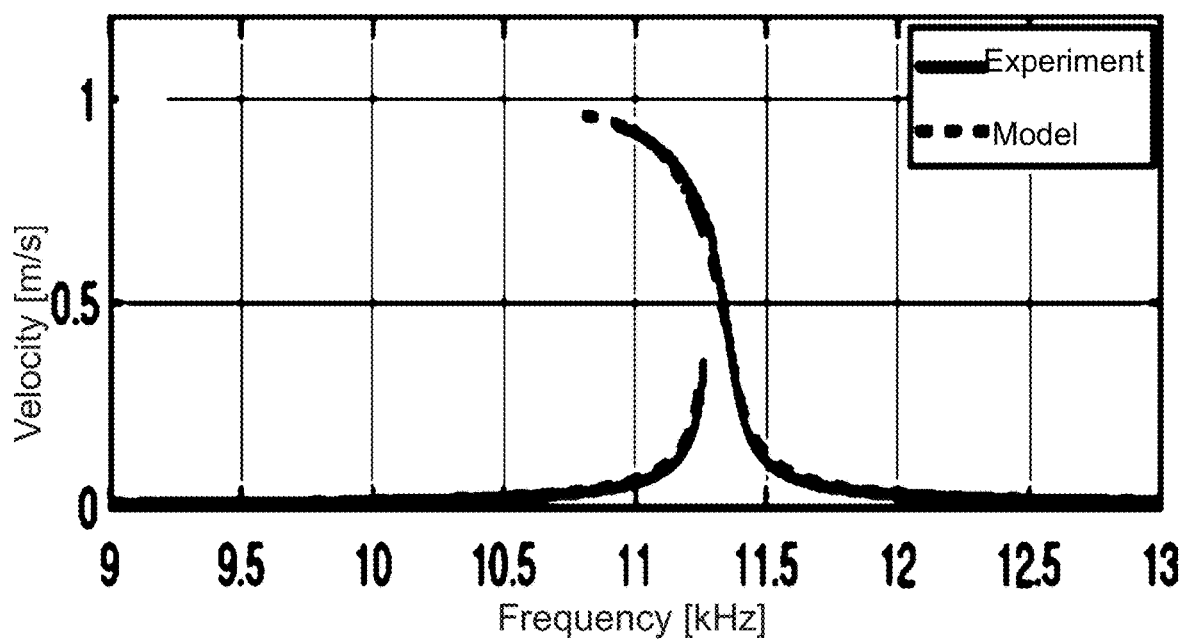
Figure 19C:
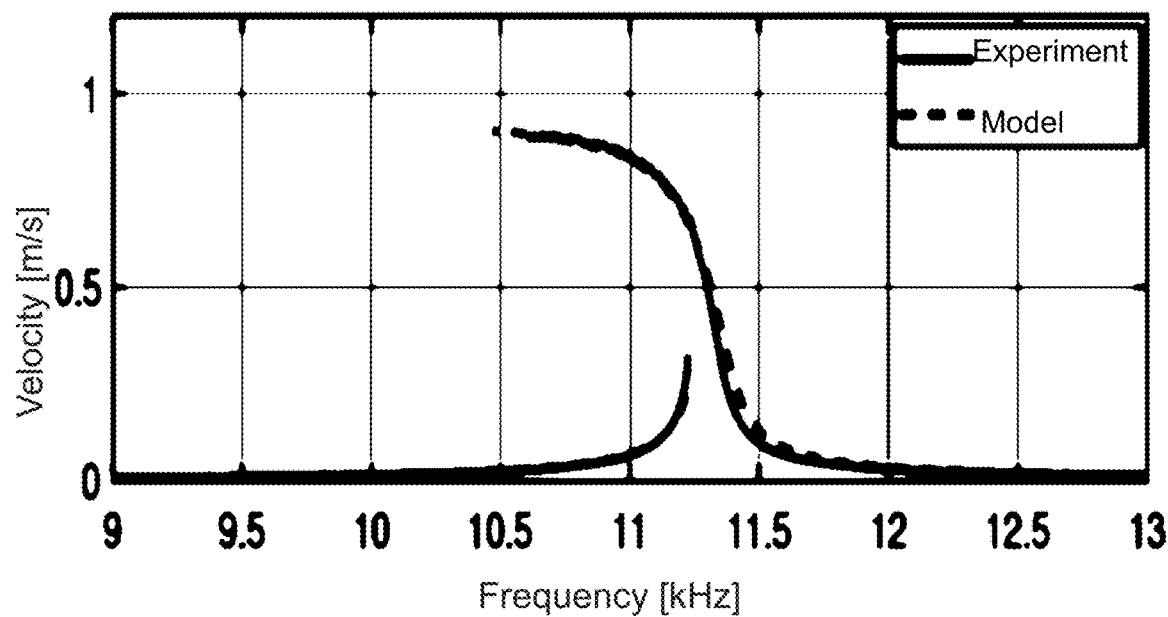
Figure 19D:
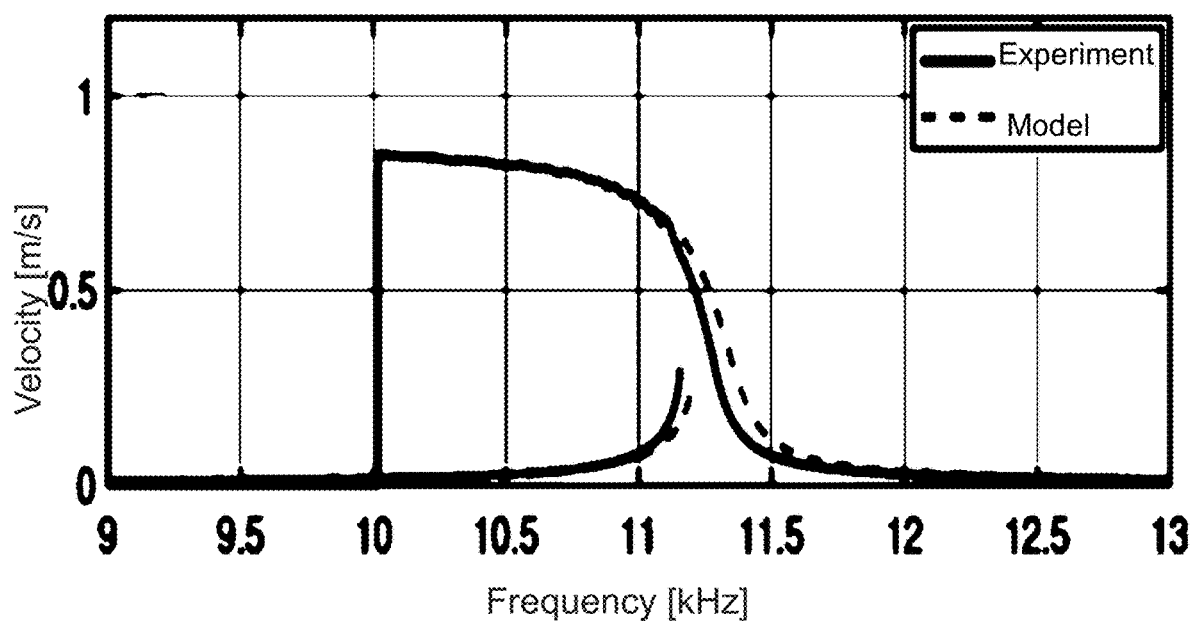

However, other applications that are less hindered by the nonlinear frequency response may be able to exploit other behaviors of the combined system, such as dynamic pull-in shown in FIG. 19*d*. One possible application could be a pressure sensor that triggers dynamic pull-in at the resonant peak when the pressure drops below a threshold value. As reported in [55], the resonance region of the levitation actuator is heavily dependent on the ambient pressure because the oscillation amplitude is very large and squeeze film damping effects are significant. The voltage at which dynamic pull-in occurs could be related to the ambient pressure to create a threshold pressure sensor that utilized the switching mechanism proposed in [57].

The relationship between static tip displacement and natural frequency with side voltage can be linearized by choosing an appropriate bias voltage, which can greatly simplify and minimize the electronic circuitry for processing information from sensors and controlling actuator motion. The natural frequency for the design according to Table I can be tuned from 6 kHz up to 12 kHz, increasing tunability, which gives sensors a larger spectrum of detectable frequencies with large signal-to-noise ratios. The softening branch of the frequency response can be flattened and extended by adding a larger bias voltage. The larger bias also triggers dynamic pull-in near the resonant peak, which permits use of the technology for combined sensors and switches that use pull-in to close a circuit. The levitation force enables the system to release from its pulled-in position, allowing the combined sensor and switch system to be reused many times without failure.

Example 2—Accelerometer Embodiment

MEMS sensors and actuators have replaced their macro counterparts in many applications including, for example, pressure sensors, inertial navigation systems, and adaptive optic systems [61-63]. They have enabled consumer electronic products like smartphones, laptops, virtual reality headsets, and health monitoring wearable devices to deliver more enriched functionality. Their reliable performance, low cost, low power consumption, and more importantly, their compatibility with semiconductor fabrication technology have made MEMS technology popular.

Electrostatic actuation and detection is the most common transduction method in MEMS [64], and almost all the current commercially available electrostatic MEMS devices are based on parallel-plate [65] or interdigitated comb drive configurations [66]. In a parallel-plate configuration, the electrostatic force attracts a movable electrode to the substrate or bottom electrode. One can apply a specific voltage to move an electrode to a desired position in the case of an actuator (like micromirrors), or exert an excitation and sense change in the capacitance between two electrodes in the case of a sensor (like accelerometers).

The main drawback of this electrostatic force is pull-in instability. Pull-in happens when the restoring force of the microstructure is no longer able to overcome the attractive electrostatic force and as a result, the microstructure collapses to its substrate. Capacitive MEMS transducers are designed to operate far from the pull-in region and this limits the device operation range; for example, it limits the travel range in micro-mirrors [67]. This issue is a significant constraint that needs to be considered in designing the microstructure geometry. Particularly, the initial gap between the movable electrode and the substrate is affected by this design limitation. This initial gap plays a crucial role in squeeze film damping [64] and the magnitude of the electrostatic force. As a result, it has a significant effect on the device sensitivity and performance in general.

As a new design paradigm, the repulsive capacitive sensing configuration is an alternative to parallel-plate or comb-drive configurations [68-70]. This approach takes advantage of the fringe electrostatic field to generate a repulsive force that pushes the movable structure away from the substrate, which essentially eliminates the possibility of pull-in (FIGS. 21a-21f). This design approach opens a new door to build MEMS sensors and actuators without the limitation on performance imposed by dynamical instability from pull-in. Furthermore, because the movable electrode has the same voltage as the substrate (grounded), the possibility of micro-welding is eliminated. This failure mode happens when two microstructures with different voltages contact each other [71].

Lee et al. first introduced the repulsive approach [72]. A new generation of repulsive actuators was developed by He and Ben Mrad [73,74,68,69]. The nonlinear dynamics of microstructures under a repulsive force has also been investigated [75-77].

The repulsive approach is exploited to build a capacitive accelerometer. There are numerous applications for accelerometers. They are main components of inertial navigation systems used in cars, airplanes, smartphones, etc. For example, they are used to deploy airbags in automobiles in an accident [78] or, as a part of wearable health monitoring technologies, to detect the sudden fall of elderly people [79] to provide them with necessary medical attention as soon as possible. For a comprehensive study on accelerometer sensors based on the parallel-plate scheme, see [80].

The electrostatic force on the moving element in the system examined here differs considerably from that found in conventional parallel-plate electrode designs and cannot be estimated using simple analytical expressions. This, along with the large amplitude vibration of the proof-mass, makes the dynamics of the system fully nonlinear and complicated.

The general schematic of the structure under base excitation is shown in FIGS. 21a-21f. There are four elements that comprise this design. The first element is the square plate that is attached to its anchors through two torsional beams. The two beams undergo torsional deflection as the proof mass rotates because of applied acceleration and electrostatic forces. The second part is the 200 μm long micro-beams that are attached to three sides of the proof mass. The proof-mass and fingers attached to it are all electrically grounded. Under these fingers, there are sets of grounded fingers fixed on the substrate as the third element of the sensor. The fourth part is the sets of electrodes adjacent to the grounded fingers. These fingers carry electrical voltage, the electric field of which exerts electrostatic forces on the beams connected to the proof mass.

The dimensions of all these beams and their electrostatic field are illustrated in FIGS. 21a-21f. The fringe electrostatic field exerts different forces on the top and bottom surfaces of the moving fingers. The resultant force is an upward force that pushes the fingers and the proof mass away from the substrate. Beyond a certain distance, the electrostatic force becomes attractive and tends to bring the microstructure back into the repulsive region. Therefore, there is an equilibrium point where the electrostatic force on the structure becomes zero. Once a voltage is applied on the side electrodes, the accelerometer plate rotates away from the substrate to an equilibrium position where the electrostatic force is equal to the restoring force of the torsional springs. This equilibrium point can be tuned by changing the voltage on the side electrodes. As will be discussed below, this is advantageous when we want to set the threshold acceleration that the sensor can detect.

When the base of the plate accelerates, the plate tends to stay at rest because of its inertia and this leads to a relative displacement between the base and the plate. Because of this displacement, the capacitance between the electrodes will change as well. This change in capacitance can be measured and related to the relative motion of the plate. If the load is large enough, the fingers can hit the bottom electrodes. However, because of the repulsive nature of the force, they will bounce back and will remain free to move. This collision can be detected with the aid of an electrical circuit.

A simple single degree of freedom model [76] may be used as a very powerful tool to predict the response of the system and capture the inherent nonlinearity caused by the electrostatic force. A lumped parameter oscillator is considered:

$$I\ddot{\hat{\theta}} + c\dot{\hat{\theta}} + k\hat{\theta} = M_{es}(\hat{\theta}) + M_{sh} \tag{19}$$

in which $\hat{\theta}$ is the rotation of the proof-mass plate about its anchors' axis, I, c and k are the moment of inertia, torsional damping, and torsional stiffness coefficients, respectively. On the right-hand side, $M_{es}$ and $M_{sh}$ represent the electrostatic moment and inertial moment because of the base excitation, respectively.

Figure 22:
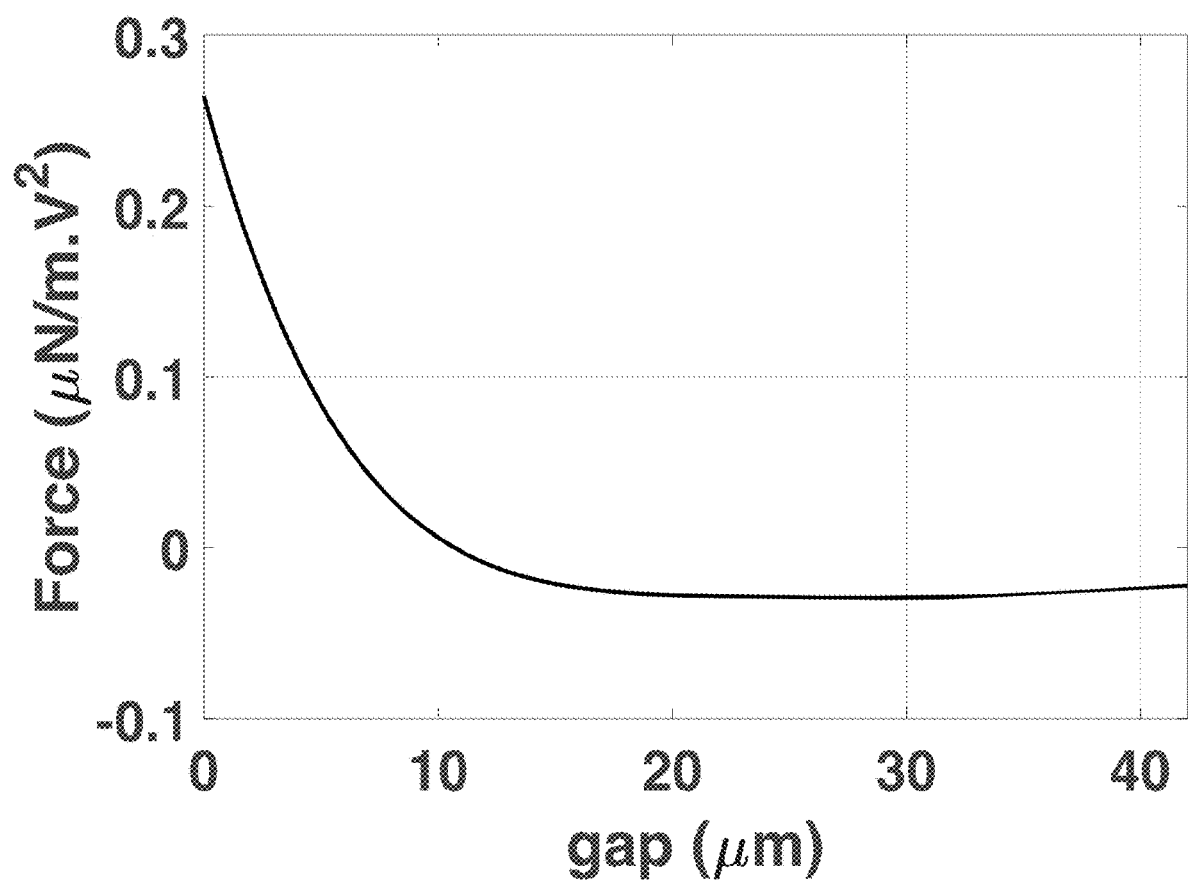
FIG. 22 shows the electrostatic force profile obtained from COMSOL for the two-dimensional unit cell of the sensor.

The electrostatic force has a nonlinear dependence on the position of the moving fingers in the electric field. To obtain an expression for the electrostatic moment, first we calculate the force profile for a unit-cell using a 2D finite element analysis in COMSOL. Such a unit cell consists of the moving electrode, bottom electrode and two side electrodes as shown in FIG. 1. The force profile is shown in FIG. 22. Using a curve fitting technique, the force profile (FIG. 22) can be approximated as a 9th-degree polynomial, in terms of the deflection, z.

$$F_{es} = V_{dc}^2 \sum_{i=0}^{9} (A_i z^i) \tag{20}$$

where z is the gap between the bottom electrode and moving fingers in each cross section. In order to write the electrostatic force as a function of θ, we use the following trigonometric equation.

$$\sin\theta = \frac{z}{x} \tag{21}$$

which yields $$F_{es\text{-}mov\text{-}fing}(x, \theta) = V_{dc}^2 \sum_{i=0}^{9} A_i (x \cdot \sin\theta)^i \tag{22}$$

where z is the gap between the bottom electrode and moving electrode. In order to write the electrostatic force as a function of θ, we use the following trigonometric equation.

TABLE III

Dimensions for the MEMS accelerometer in FIGS. 21a-21f

| Parameter | Symbol | Value | Unit |
|---|---|---|---|
| Density | $\rho$ | 2330 | kg/m$^3$ |
| Proof mass length | $L_s$ | 990 | Mm |
| Proof mass width | $L_w$ | 1000 | Mm |
| Finger length | $L_b$ | 100 | Mm |
| Number tip fingers | $N_t$ | 31 | Mm |
| Number side fingers | $N_s$ | 25 | μm |
| Voltage fixed finger width | $d_1$ | 8 | μm |
| Gap between fixed fingers | $d_1$ | 8 | μm |
| Moving finger width | $d_2$ | 4 | μm |
| Ground fixed finger width | $d_1$ | 8 | μm |
| Electrodes and proof mass thickness | $t_1$ | 2 | μm |
| Initial gap | $h_1$ | 2 | μm |
| Natural frequency | $\omega_n$ | 2 × π × 1740 | rad/s |
| Damping ratio (Vdc = 40) | $\xi_0$ | 0.016 | 0 |
| Damping ratio (Vdc = 40) | $\xi_1$ | 0.033 | |
| Damping ratio (Vdc = 50) | $\xi_0$ | 0.016 | 1 |
| Damping ratio (Vdc = 40) | $\xi_1$ | 0.038 | |
| Damping ratio (Vdc = 60) | $\xi_0$ | 0.017 | 0 |
| Damping ratio (Vdc = 60) | $\xi_1$ | 0.055 | |
| Force constant | $A_0$ | 3.4079 × 10$^{-7}$ | N/m |
| Force constant | $A_1$ | -6.7113 × 10$^{-2}$ | N/m$^2$ |
| Force constant | $A_2$ | 7.5644 × 10$^3$ | N/m$^3$ |
| Force constant | $A_3$ | -8.8555 × 10$^8$ | N/m$^4$ |
| Force constant | $A_4$ | 8.1341 × 10$^{13}$ | N/m$^5$ |
| Force constant | $A_5$ | -4.6766 × 10$^{18}$ | N/m$^6$ |
| Force constant | $A_6$ | 1.6139 × 10$^{23}$ | N/m$^7$ |
| Force constant | $A_7$ | -3.2602 × 10$^{27}$ | N/m$^8$ |
| Force constant | $A_8$ | 3.5560 × 10$^{31}$ | N/m$^9$ |
| Force constant | $A_9$ | -1.6175 × 10$^{35}$ | N/m$^{10}$ |
| Moment of inertia | I | 1.7954 × 10$^{-15}$ | kg m$^2$ |

Integrating Eq. (22) over the beam (finger) length results in the total electrostatic force on each beam.

$$F_{es-tip}(\theta) = \int_{L_s}^{L_s+L_b} F_{es-mov-fing} dx \quad (23)$$

$$\int_{L_s}^{L_s+L_b} V_{dc}^2 \left(\sum_{i=0}^{9} A_i(x \cdot \sin\theta)^i\right) dx =$$

$$V_{dc}^2 \sum_{i=0}^{9} \frac{A_i(x \cdot \sin\theta)^i}{i+1} \cdot ((L_s+L_b)^{i+1} - L_s^{i+1})$$

where the parameters are given in Table III. To calculate the corresponding moment caused by this force, the distance between the acting point of the resultant force and the axis of rotation ($x_c$) is needed, which can be calculated as follows:

$$x_c = \frac{\int_{L_s}^{L_s+L_b} x \cdot F_{es-fing} dx}{\int_{L_s}^{L_s+L_b} F_{es-fing} dx} \quad (24)$$

Therefore, the moment of electrostatic force on the tip fingers about the axis of rotation can be written as $$M_{es-tip} = \quad (25)$$

$$N_t \cdot F_{es-tip}(\theta) \cdot x_c = N_t V_{dc}^2 \sum_{i=0}^{9} \frac{A_i(\sin\theta)^i}{i+2} \cdot ((L_s+L_b)^{i+2} - L_s^{i+2})$$

where $N_t$ is the number of fingers on the tip side of the proof mass. Following a similar approach and assuming that the electrostatic force on the fingers on the sides of the proof-mass does not change over the finger length, we can calculate the moment of the electrostatic force on these fingers as follows:

$$M_{es-side} = V_{dc}^2 \cdot \sum_{j=0}^{N_s} \sum_{i=0}^{9} (A_i(u_j \cdot \sin\theta)^i \cdot L_b) \cdot u_j \quad (26)$$

where $u_j$ is the distance of the $j^{th}$ side finger from the axis of rotation and $N_s$ is the number of fingers on each side. So, the total electrostatic moment in Eq. (19) can be written as:

$$M_{es}(\hat{\theta}) M_{es-tip} + 2 \cdot M_{es-side} \quad (27)$$

The factor 2 in Eq. (27) accounts for the fact that there are two sets of side fingers, one on each side of the proof-mass. The moment from acceleration ($M_{sh}$) also can be written as:

$$M_{sh} = \left[m_p \cdot a(t) \cdot \frac{L_s}{2}\right] + \quad (28)$$

$$\left[N_t \cdot m_b \cdot a(t) \cdot \left(L_s + \frac{L_b}{2}\right)\right] + \left[2 \cdot \left(\sum_{j=1}^{N_s} m_b \cdot a(t) \cdot u_j\right)\right]$$

where the first bracket is the moment caused by proof mass acceleration, the second shows the moment caused by the tip fingers acceleration, and the third is for the side fingers. In Eq. (28), $m_p$, $m_b$, and a(t) are the mass of the rotational plate, mass of the moving electrode, and the acceleration load that is exerted on the microstructure through base excitation. This mechanical load can be modeled as a harmonic base excitation or as a shock load. There are different shock profiles commonly used for modeling shock loads such as square, saw-tooth, half-sine or full-sine shock profiles. The most commonly used shock load is the half-sine with the profile given in Eq. (29), which will be used in the following description of the experiment on the fabricated device, $$a(t) = A\sin(\omega t) \cdot u\left(\frac{\pi}{\omega} - t\right) \quad (29)$$

where $$u\left(\frac{\pi}{\omega} - t\right)$$

is the step function. Dividing Eq. (19) by I and using Eqs. (27) and (28) and following non-dimensional parameters (Eq. (30), we can rewrite the governing equation of motion in nondimensional format (Eq. (31)).

$$\theta = \frac{\hat{\theta}}{\theta_0}, t = \frac{\hat{t}}{T}, T = \frac{1}{\omega_n}, \omega_n = \sqrt{\frac{k}{I}} \quad (30)$$

$$\ddot{\theta} + 2\xi\omega_n\dot{\theta} + \omega_n^2\theta = \frac{T^2}{I\theta_0} \cdot (M_{es}(\theta) + M_{sh}) \quad (31)$$

By applying a DC voltage on the side electrodes, the proof-mass rotates around its anchors' axis and goes to an equilibrium point away from the substrate. To obtain this static rotation, all the time derivative terms in Eq. (31) are set to zero and then the equation is solved for static rotation ($\theta_{st}$). The static rotation can be used to solve for the dynamic solution ($\theta_{dyn}$) of Eq. (31) in the presence of any time-varying load using the following change of variable.

$$\theta = \theta_{st} + \theta_{dyn} \quad (32)$$

The moment of inertia, I, in Eq. (31) can be calculated as $$I = \frac{1}{3}m_pL_s^2 + Nt \cdot \left(\frac{1}{12}m_bL_b^2 + m_b\left(\frac{L_b}{2} + L_s\right)^2\right) + \sum_{j=1}^{N_s}\left(\frac{1}{12}m_bb^2 + m_bu_j^2\right) \quad (33)$$

The natural frequency of the first mode, $\omega_n$ is obtained from the ANSYS finite element package. The first mode is a rotational mode as expected. The corresponding natural frequency for this mode is predicted to be 1320 Hz. After examining subsequent experimental data, this value can be modified for the natural frequency to account for all the fabrication imperfections, residual stresses and mathematical simplification in this 1 DOF model.

Eq. (31) can be solved numerically using the Runge-Kutta method for various damping conditions. However, it is likely that a simple linear damping does not capture the physics of energy dissipation in this problem. In general, modeling energy dissipation in the repulsive scheme is more challenging compared to the attractive scheme because of two reasons. First, the amplitude of vibration can get very large compared to the initial fabrication gap because the initial static deflection of the structure (from $V_{dc}$) moves the structure away from the substrate, providing more space for vibration. Therefore, those damping models available in the literature [81-83] that are based on Reynolds' equation are not valid because the underlying assumptions such as negligible pressure change across the fluid film or small gap to lateral dimension ratio are not valid here. Second, because there is no limitation from pull-in, the device can get very close to the substrate while having a large amplitude vibration. So, in each cycle of vibration, when the moving part is far away from the substrate the dominant damping mechanism is the drag force in free air. However, when the structure gets close to the substrate, the squeeze film damping mechanism starts to play a significant role in energy dissipation. Thus, the damping force is likely to be quite nonlinear.

TABLE IV

Air flow regimes for characteristic length H = 2 μm.

| Pressure (Torr) | Regime |
|---|---|
| P > 2200 | Continuum |
| 1000 < P < 2200 | Slip flow |
| 10 < P < 1000 | Transient |
| P < 10 | Molecular |

Another challenge in modeling damping in this problem is that the continuity assumption for the air breaks down when the microstructure gets very close to the substrate, especially at low pressures. In this situation, the characteristic length of the problem is even smaller than the initial fabrication gap, and the characteristic length of the problem becomes comparable with the mean free path of air molecules. The Knudson number is the parameter to check to see if the continuity assumption is valid (Eq. (34)). This number is defined as the ratio of the mean free path of air (gas) molecules to the characteristic length of the problem, which is usually the gap between moving and stationary parts of the microstructure. The mean free path of air molecules depends on the air temperature and pressure. Assuming the room temperature condition (25° C.), the dependence of the molecules' mean free path on pressure can be written as in Eq. (34)

$$K_n = \frac{\lambda}{H}, \lambda = \frac{P_0}{P}\lambda_0 \quad (34)$$

Using the Knudsen number, the flow is divided into four regimes: continuum flow, slip flow, transitional flow and free molecular flow. Assuming the characteristic length to be equal to the initial gap and using Eqs. (34) we can categorize the flow according to pressure (Table IV). As the experiment is performed at very low pressure on the device (P<350 mTorr), the flow regime would be in the free molecular regime. Also, as the microstructure gets very close to the substrate, the characteristic length of the problem becomes even smaller than 2 μm, which leads to higher threshold pressure for the molecular region. The modular damping depends on the ratio of vibration amplitude to the initial gap (initial fabrication gap+static deflection caused by DC voltage). When the vibration amplitude is small compared to the initial gap, the damping is dominated by linear viscous damping. However, as the vibration amplitude becomes comparable with the initial gap, the squeeze film damping increases as the air molecules are trapped between the proof mass and substrate. The equation accounting for this variable damping that modulates itself with the amplitude-gap ratio is given in Eq. (35) [76]. I $$\xi = \xi_0 + \xi_1\left(\frac{\theta_{dyn}}{\theta_{initial}}\right) \quad (35)$$

With the description of damping above, all the parameters in Eq. (31) have been defined.

TABLE V

Information related to the thin film depositions.

| Film | Temp. (° C.) | Thickness (m) | Dep. rate (Å/min) |
|---|---|---|---|
| SiO$_2$ | 1100 | 1 | 74 |
| Si$_3$N$_4$ | 800 | 0.2 | 25 |
| HTO | 800 | 4 | 12.7 |
| a-Si | 570 | 2 | 11.7 |
| Annealing | 1000 | — | — |

Figure 23:
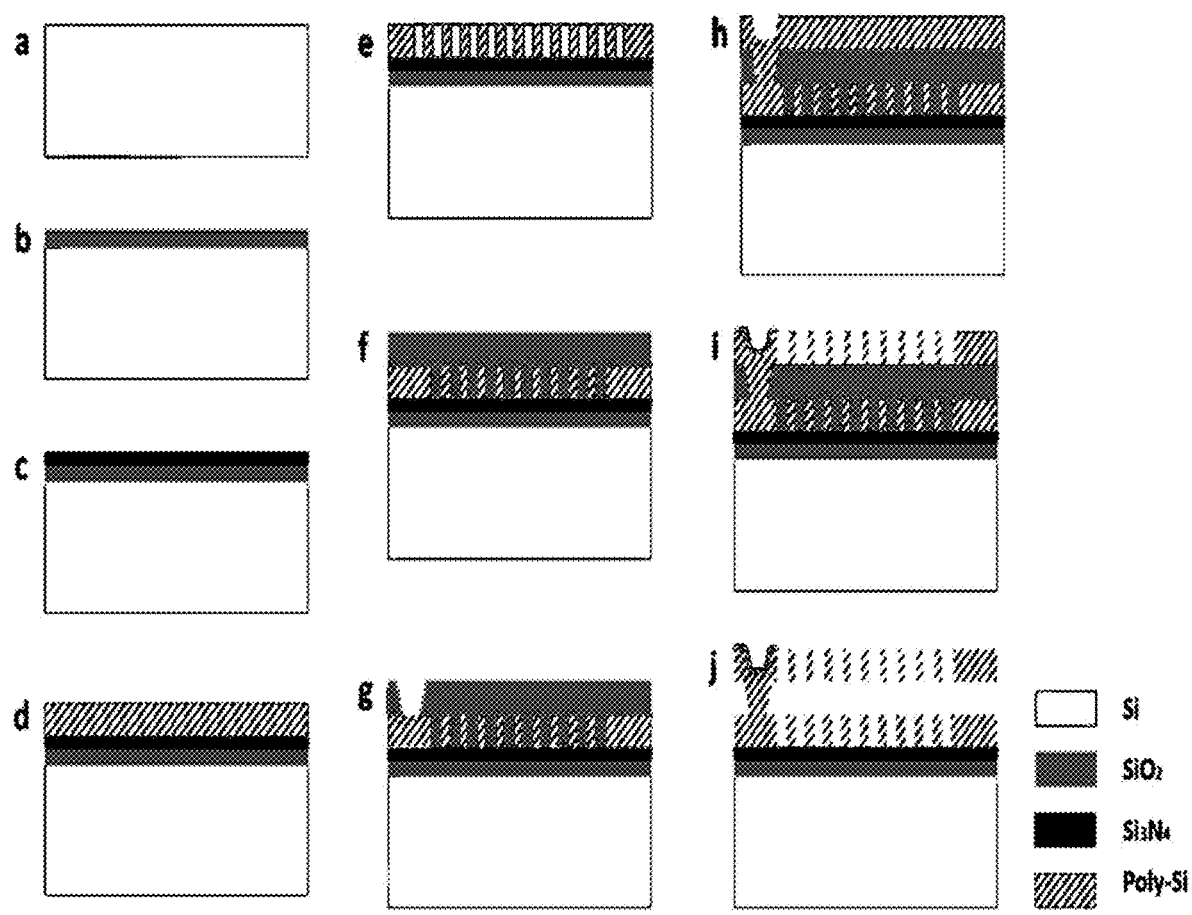
FIGS. 23a-23j show the fabrication process (FIG. 23a) 4-inch, 525 m thick bare Si wafer.
Figure 24A:
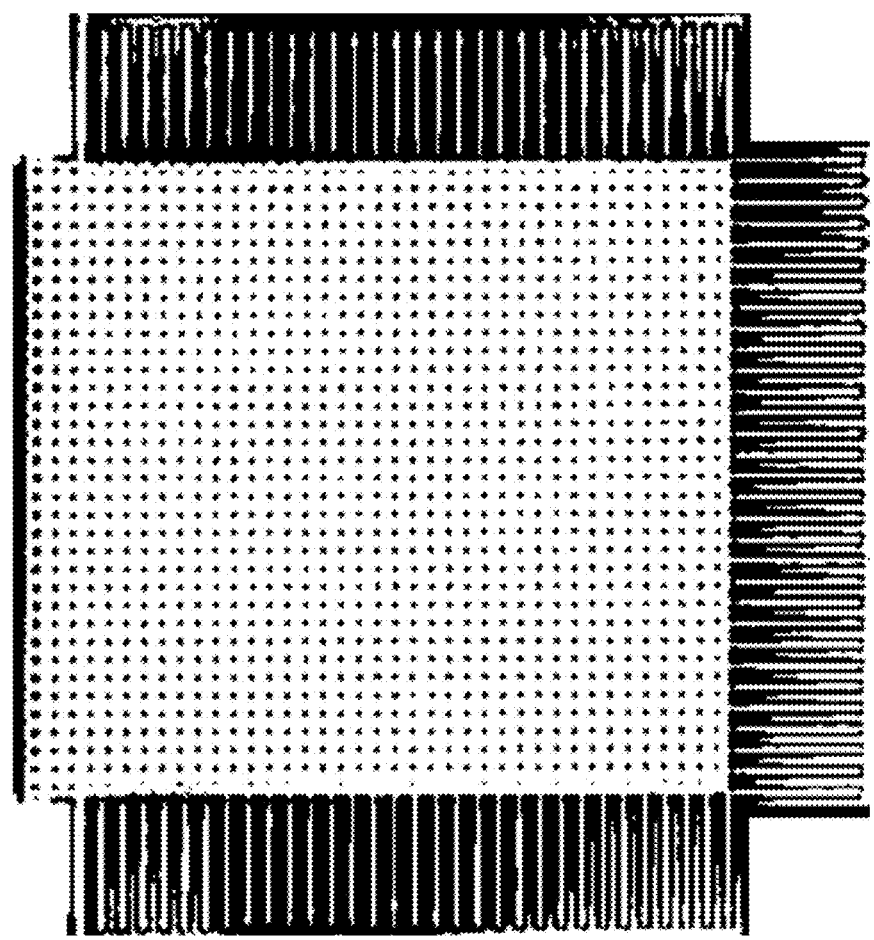
FIGS. 24a-24c show (FIG. 24a) SEM image of the device from top.
Figure 24B:
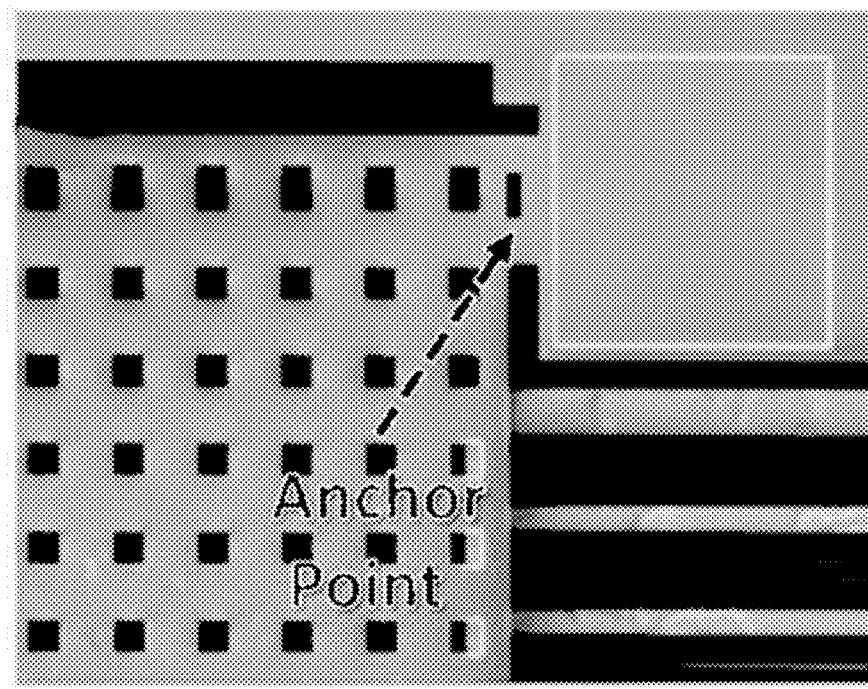
Figure 24C:
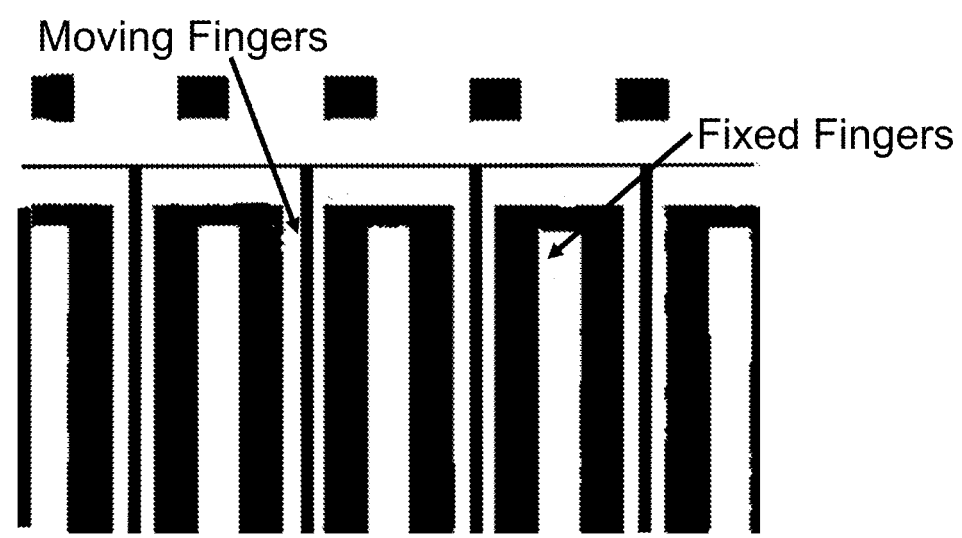

The process flow of the device fabrication is depicted in FIGS. 23a-21j. It starts with 4-inch standard silicon wafers which are dipped into base and acid baths (RCA Cleaning). This process removes residues such as organic particles and the native oxide on the wafer surface. After the cleaning, we grew 1 m thick oxide as an insulation layer using a low-pressure chemical vapor deposition (LPCVD) furnace. On top of this layer, we deposited 0.2 µm thick low-stress nitride. The oxide and nitride layers isolate the device from the substrate. On top of the nitride layer, a 2 µm thick phosphorus-doped amorphous silicon (N+a-Si) was deposited in a LPCVD furnace. The deposition rates and the deposition temperatures of the LPCVD films are presented in Table III. This amorphous layer was then formed to polycrystalline silicon (poly-Si) by an annealing process [84,85]. Following the annealing, a 2 µm thick positive photoresist was spun, and exposed with an i-line stepper. Exposed wafers were baked at 115° C. for 90 s and developed with 726 MIF developer for 60 s. After the developing step, the first layer of fingers was created via the Bosch etching process. The chamber conditions of the etching process are presented in Table VI. On top of the fixed fingers, a 4 µm thick high-temperature oxide (HTO) film was deposited as a sacrificial layer. This layer provides a vertical gap between the first and second poly-Si films which are the fixed and the moving fingers, respectively. Following the deposition process, 2 µm of the oxide was planarized using a chemical mechanical polisher (CMP). This process removes the step difference between the proof mass and the fixed fingers. Later, using inductively coupled plasma reactive ion etching (ICP-RIE), the sacrificial oxide was etched to open vias between first and second poly-Si. The chamber condition of this process is presented in Table VI. Upon etching the vias, another layer of 2 µm thick phosphorus-doped a-Si was deposited, which is also annealed to form poly-Si as done before. This layer is etched to form the moving fingers that are attached to the rectangular shaped proof mass. After the etching, 20 nm Cr and 150 nm of Au are deposited on the pads using an e-beam evaporation tool. Then the wafers are diced and released in HF:HCl solution. Following the release, the chips are critical point dried (CPD) to avoid stiction. The scanning electron microscope (SEM) images of the fabricated device are presented in FIGS. 24a-24c. The chip is mounted on a printed circuit board and wire-bonded using an aluminum wire wedge-bonder.

TABLE VI

Chamber conditions for dry etching. Etch rates for silicon and oxide are measured around 2 µm/min and 150 nm/min, respectively.

| Bosch process for silicon etching | | | | | | | |
|---|---|---|---|---|---|---|---|
| Process | Pressure (mTorr) | C$_4$F$_8$ (sccm) | SF$_6$ (sccm) | Ar (sccm) | RIE | ICP | Duration |
| Light | 13 | 35 | 2 | 40 | 40 | 850 | 8 |
| Passivation | 24 | 60 | 2 | 40 | 0.1 | 850 | 4 |
| Etch 1 | 23 | 2 | 70 | 40 | 8 | 850 | 2 |
| Etch 2 | 23 | 2 | 100 | 40 | 8 | 850 | 6 |
| (ICP process for oxide etching) | | | | | | | |
| Process | Pressure (mTorr) | CHF$_3$ (sccm) | O$_2$ (sccm) | Ar (sccm) | RIE | ICP | Duration |
| Etch | 5 | 52 | 2 | — | 15 | 2500 | — |

Experiments were conducted on the fabricated sensor to investigate the accelerometer dynamical performance and verify the mathematical model described above. The sensor was subjected to two different mechanical loads, harmonic excitations and shock loads. For harmonic loading, the dynamic response of the microstructure in the resonance region is considered that sheds light on the effects of inherent nonlinearities in the electrostatic force. Also, the mechanical sensitivity of the accelerometer is obtained, which is an important parameter with a significant contribution to the overall sensitivity of the sensor. This mechanical sensitivity is obtained from the frequency response before reaching the resonance region, because accelerometers are always used at frequencies below their resonance range. The robustness of the accelerometer against mechanical shocks is another important parameter to be analyzed.

Figure 5:
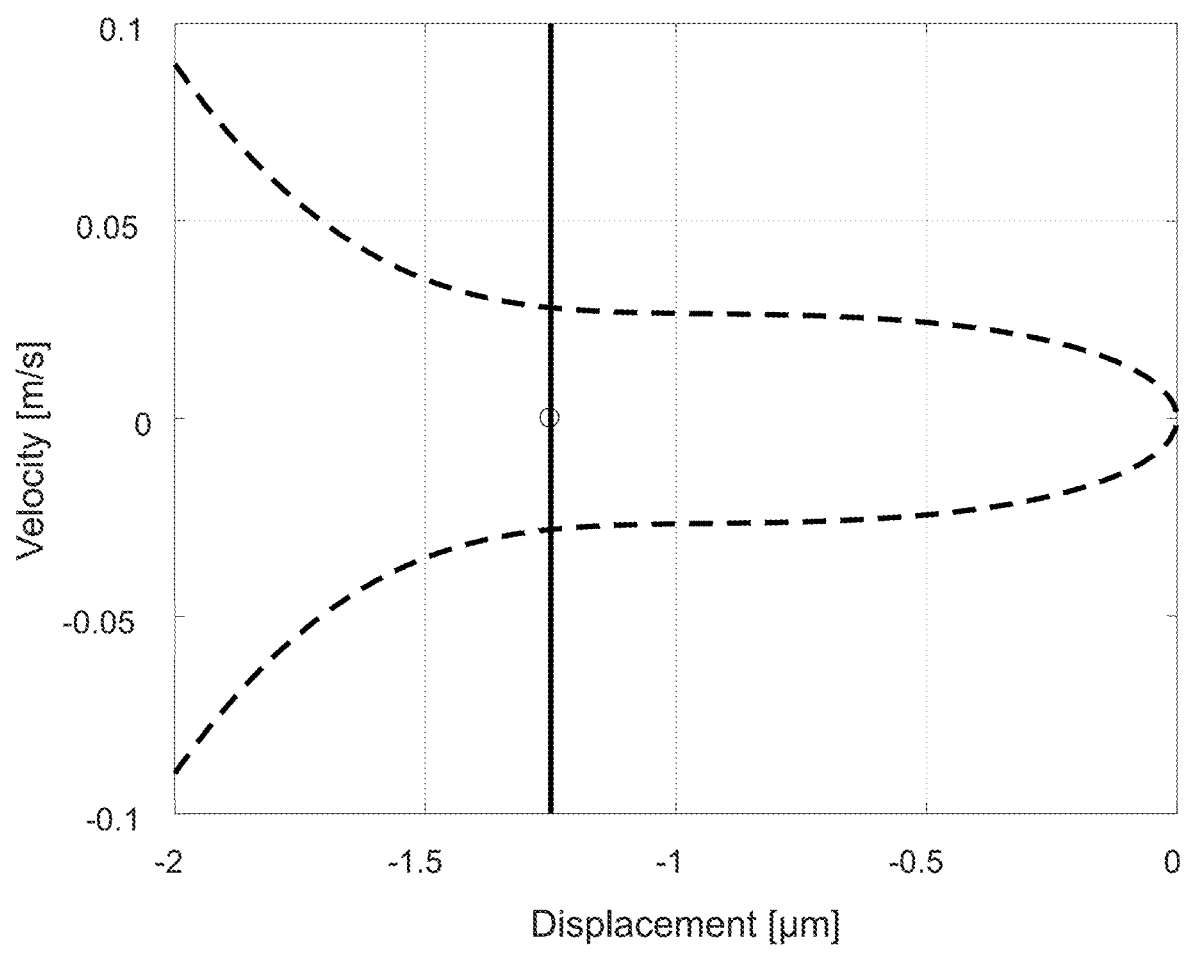
FIG. 5 shows the phase portrait at $V_{bias}$=2.2 V and $V_{side}$=0V. The red line indicates the smallest possible gap. The marker shows the pulled in position of the beam at −1.25 μm and zero velocity

The printed circuit board containing the MEMS chip is mounted to the head of the shaker and placed inside the vacuum chamber at 200 mTorr. A laser vibrometer (Polytec MSA-500) is used to monitor the time-response of the sensor. This set up is shown in FIG. 5. The next part addresses how the shaker acceleration is kept constant while sweeping the frequency.

The output acceleration of the shaker depends on the amplitude and frequency of the voltage signal given to the shaker. To conduct a frequency sweep on the microstructure, the shaker needs to provide a base acceleration with a constant amplitude at different frequencies. Usually, a closed loop system is used with the shaker where the output acceleration of the shaker is constantly monitored so acceleration amplitude can be kept constant by modifying the amplitude of the voltage signal. Here, the shaker is used in an open loop mode. To identify the required voltage needed to send to the shaker at each frequency (f), the shaker is characterized in a separate setup where a laser vibrometer is used to measure the shaker velocity. For example, if a harmonic base acceleration with 1 g amplitude at 3000 Hz from the shaker is required, voltages with 3000 Hz frequency and different amplitudes are sent to the shaker until a voltage amplitude that results in 1 g±1% acceleration is found. Then, the same procedure is repeated for the next frequency step (3010 Hz). To characterize the shaker for half-sine shock excitations with different time duration, the shaker response is measured with a commercial accelerometer (PCB-352A24). If the shock amplitude is within ±1% range of the desired amplitude, the voltage will be recorded to be used for the shock experiment.

After the shaker characterization, the device is tested by applying harmonic base excitation and performing a frequency sweep. Such an analysis is helpful to investigate the accelerometer dynamical performance and verify the mathematical model described above.

The motion of the sensor proof-mass relative to the substrate is obtained by subtracting the substrate response from the device response for each excitation frequency (f). As the motion of the substrate does not depend on the electrical voltage on the device, for each mechanical loading scenario, the substrate motion was measured by reading its velocity with the laser vibrometer. The device response, on the other hand, depends on the mechanical load and electrical voltage on the side electrodes. For each loading case, the proof-mass response was measured again by reading its velocity using the laser vibrometer. Then, the velocity of the substrate for each mechanical load was subtracted from the device response for the corresponding mechanical load to obtain the relative velocity of the proof-mass. Subsequently, the fast Fourier transform (FFT) of this relative velocity signal was calculated to extract the velocity amplitude in the steady-state region. Dividing this velocity amplitude by $2\pi f$ results in the displacement amplitude for the corresponding frequency.

Figure 25A:
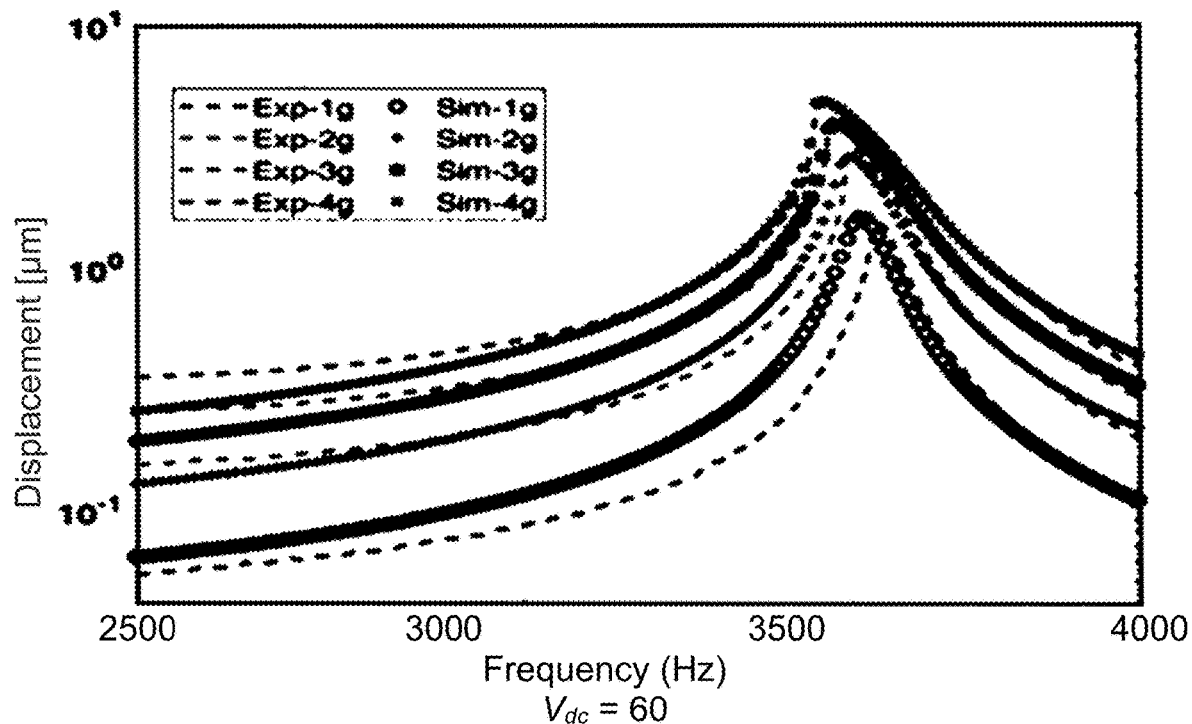
FIGS. 25a-25c show the frequency response to harmonic excitation for $V_{dc}$=60 V, 50 V, and 40 V and acceleration amplitude of 1-4 g.
Figure 25B:
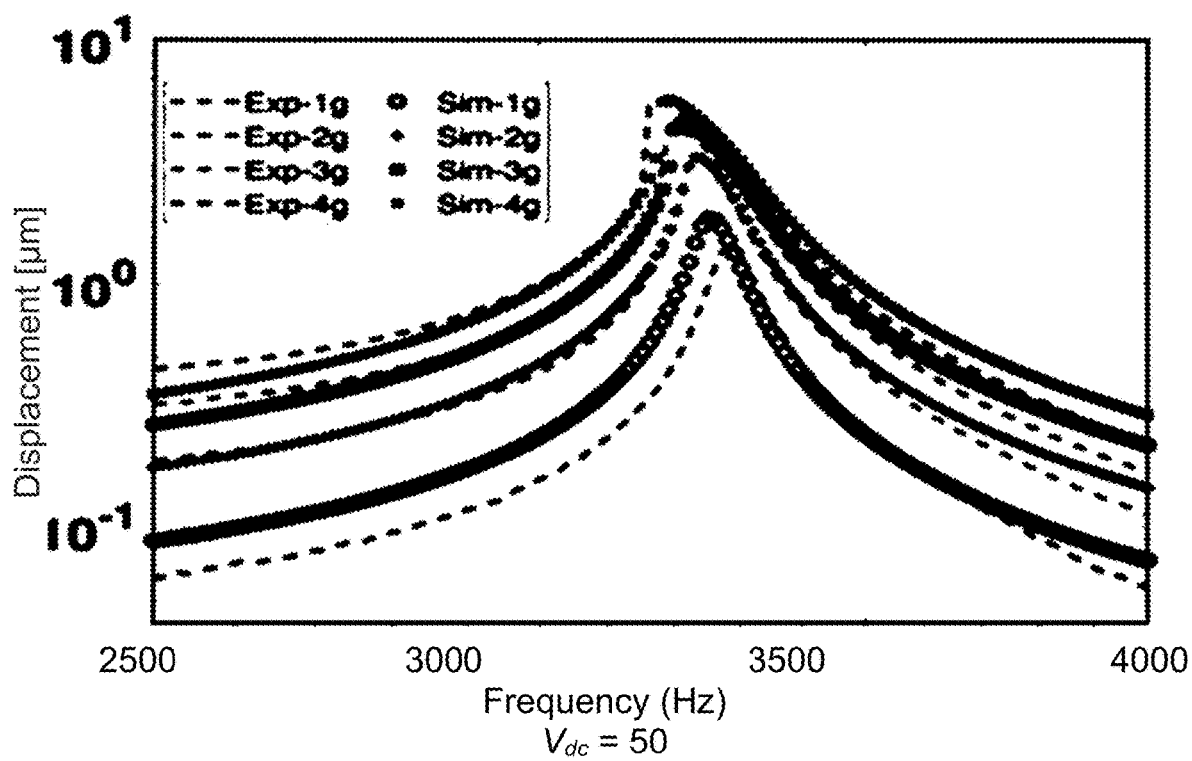
Figure 25C:
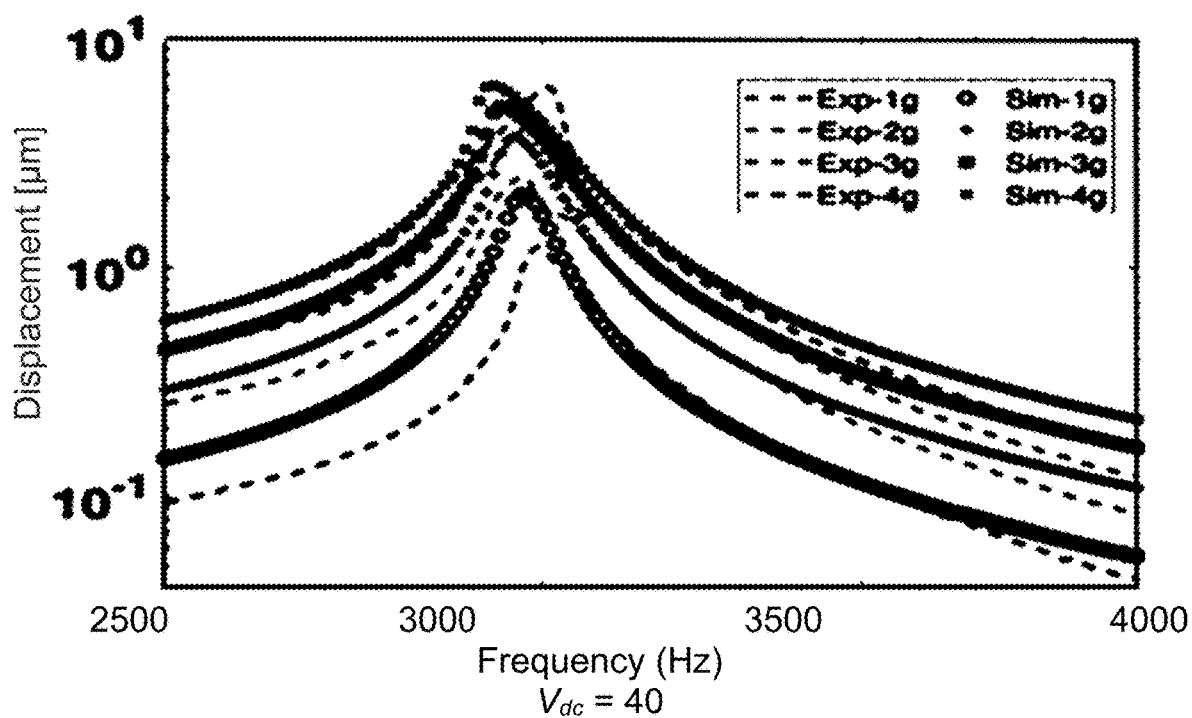

FIGS. 25a-25c show the device response for different voltages on the side electrodes. For each voltage, different harmonic excitations with different amplitudes are applied. These figures show that the resonance frequency increases as the bias DC voltage increases on the side electrode. Furthermore, for DC voltages of 50V and 60V, as the amplitude of vibration increases, a nonlinear softening behavior appears in the response. These two phenomena can be explained by looking at nonlinear terms in the electrostatic force. According to Table III, $A_1$ (coefficient of x in electrostatic force) is negative, when it is on the right-hand side of Eq. (19). This means that linear stiffness caused by electrostatic force will add to the linear mechanical stiffness of microstructure, which leads to an increase in stiffness and resonance frequency as DC voltage increases. This property of the microstructure can be beneficial to increase the robustness of the sensor against severe mechanical loads. By increasing the DC voltage, the proof-mass plate gets further pushed away from the substrate, hence the maximum mechanical load that is required for the proof-mass to hit the substrate is increased. This means that the voltage on the side electrodes can be increased and the sensor used for more harsh environments in terms of mechanical loads such as mechanical shocks. This is the opposite of what happens to conventional shock sensors that are based on the attractive scheme where an increase in the bias voltage results in early pull-in [80]. Also, one can tune the DC voltage on the side electrodes to obtain the frequency ranges of interest for different applications.

Figure 26:
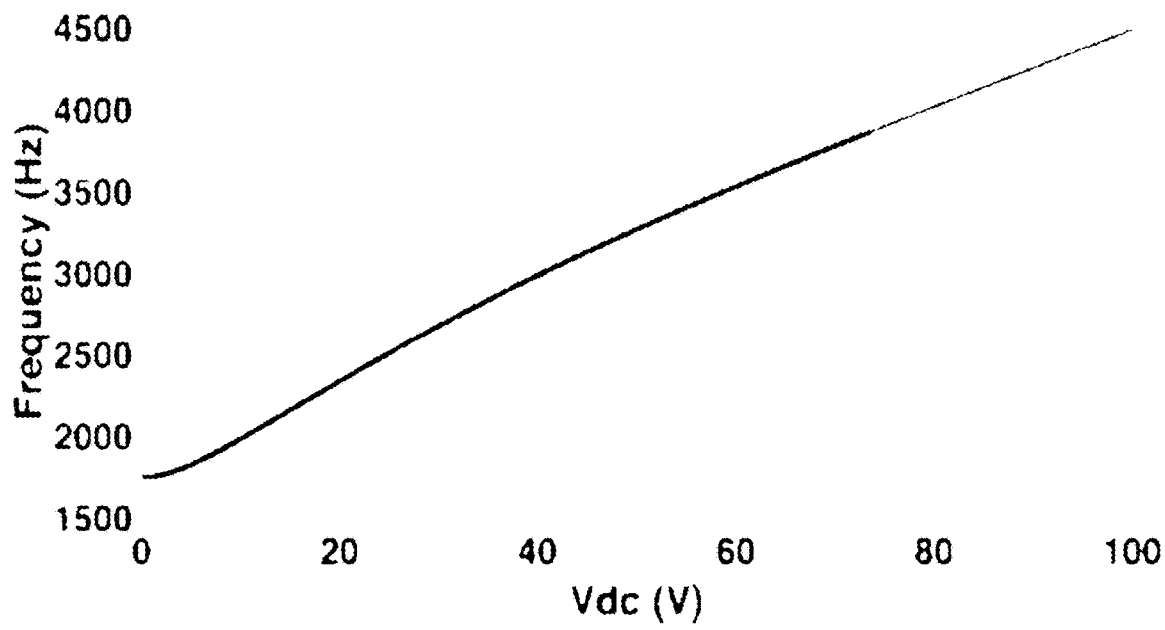
FIG. 26 shows simulation results for linearized natural frequency for different DC voltages on side electrodes.
Figure 27:
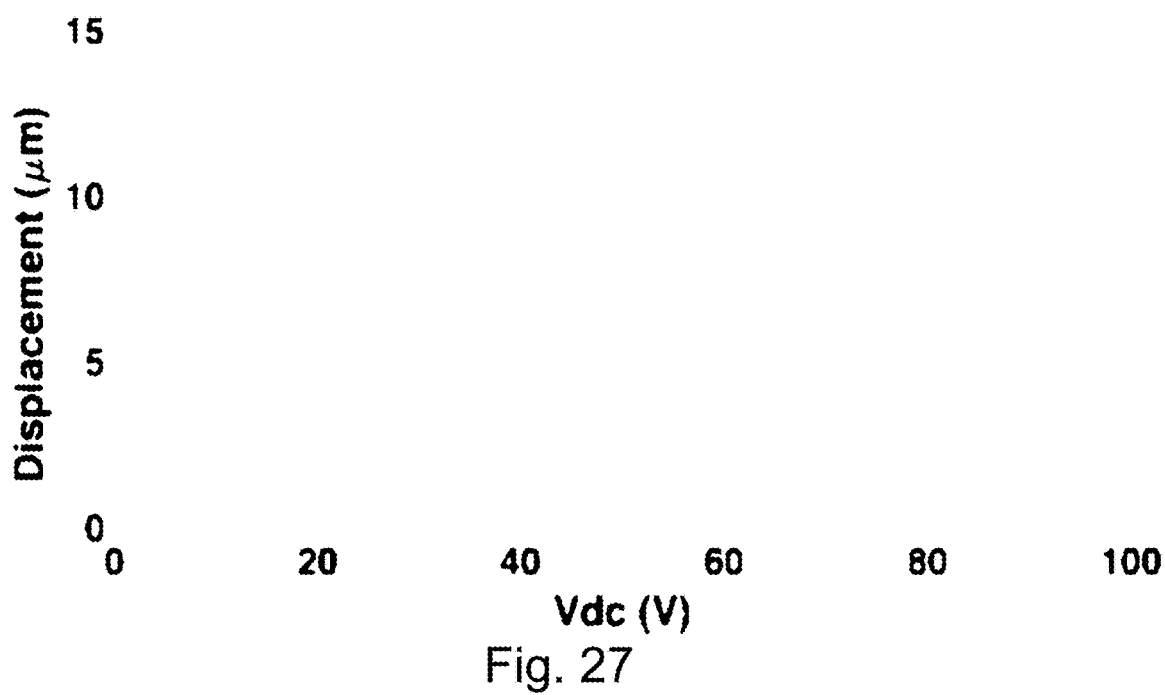
FIG. 27 shows simulation results for static displacement at the edge of the proof-mass plate for different DC voltages.

The softening behavior in the frequency response at a high voltage of 50V and 60V can be explained by the even-order terms in electrostatic force ($A_2$, $A_4$, $A_6$, $A_8$). Simulation results are presented in FIGS. 25a-25c. These results are obtained when the linear natural frequency of the structure is set to be the measured value of 1740 Hz in the governing equation of motion (Eq. (31)). This value is 30% different from what is obtained from finite element analysis (FEA). This discrepancy can be explained by the imperfections in the fabrication process that are not considered in the FEA. These include a slight bending of the plate that happens because of thermal stresses. The residual stress on the supports plays a significant role on the structural stiffness of the sensor. This residual in-plane stress was measured to be approximately 50 MPa in the fabrication process, which causes a slight curvature in the proof mass plate. The deflection due to residual stress was measured to be approximately 6 μm per 1 mm length of the plate. Because a static FEA predicted approximately the same deflection as the measured result, we conclude that this deflection is due to in-plane stress only and the variation of residual stress along the thickness may considered to be negligible. Once the estimated linear frequency for the fabricated device is considered in the lumped model, the model captures the experimental results with good accuracy. The slight difference between the simulation results and experimental data, especially at low frequencies, is also attributed to these inevitable fabrication imperfections and residual stresses as well as limitation of approximating a continuous system with a discrete (lumped) model. The damping ratios are adjusted slightly to match the experimental results for each voltage scenario. It is worth mentioning that the squeeze film damping is dependent on the resonance frequency. The resonance frequency changes by varying the DC voltage as shown in FIG. 26. Therefore, the damping coefficients will slightly vary with the DC voltage. For the frequency sweep, the lumped model is solved for the dynamic solution ($\theta_{dyn}$) using the shooting method [26]. The static rotation caused by DC voltage is calculated and shown in FIG. 27 as a function of DC voltage.

The nonlinearity in the device response when the bias voltage is 40V is slightly hardening while the lumped model predicts softening. This discrepancy between the simulation results and experimental data can be reconciled by introducing a cubic nonlinear term for mechanical stiffness for this specific voltage but such a nonlinearity makes the response hardening for higher voltages which does not match the experimental data. Also, because the vibration amplitudes with different voltages for the same mechanical loads are very close to each other (for example, the resonance amplitudes for 40V and 50V when the acceleration amplitude is 3 g), this difference in behavior cannot be attributed to the nonlinearities in the electrostatic force or stiffness caused by air in squeeze film regime.

Although the model does not catch the nonlinear behavior of the microstructure in the resonance region for low voltages, it matches the experimental data away from this region with good accuracy. Because inertial sensors are generally operated in frequency ranges away from their natural frequency the model still could be used to simulate the device response at low frequencies.

Figure 28:
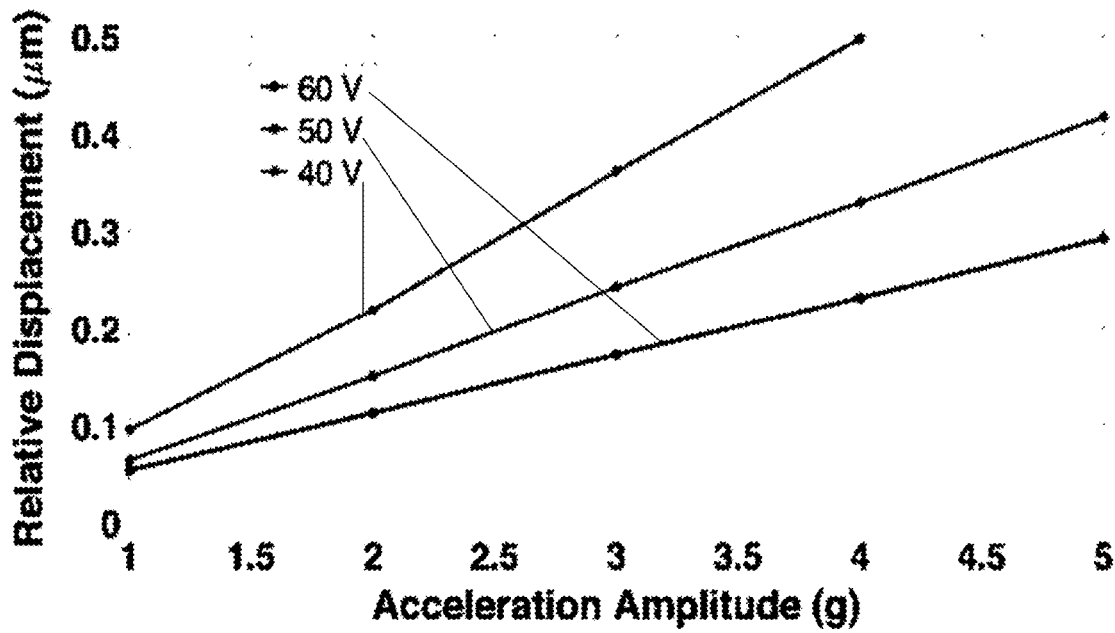
FIG. 28 shows mechanical sensitivity of the sensor for different DC voltages on the side electrodes obtained from experimental results.

The sensitivity of the device for different voltages is shown in FIG. 28. The relative displacement of the proof-mass for harmonic base excitations with different amplitudes at 2500 Hz is recorded and shown in FIG. 28. The slopes of these lines give the mechanical sensitivity for each voltage. The sensitivity for lower voltages is higher because the contribution of electrical stiffness in the total stiffness of the sensor (structural and electrical) is smaller. For example, the sensitivity of the accelerometer at 40V is about 0.1 μm/g. This is extremely superior to the numbers found in the literature, which are generally in the range of nanometer to femtometer per g [87,88]. In the next step, half-sine shocks will be considered as the mechanical load on the microstructure.

TABLE VII

Threshold shock amplitude that results in proof-mass hitting the substrate (shock duration = 90% of natural period of microstructure for each voltage) and comparing resonance frequencies obtained from experiments (at low g (1 g)) with linearized natural frequencies derived from Jacobian matrix.

| $V_{dc}$ (V) | Threshold shock (g) | Resonance freq. (Hz) (exp.) | Resonance freq. (Hz) (sim.) | Error (%) |
|---|---|---|---|---|
| 40 | 200 | 3000 | 2981 | 0.64 |
| 50 | 300 | 3280 | 3262 | 0.55 |
| 60 | 410 | 3540 | 3523 | 0.67 |

Figure 29:
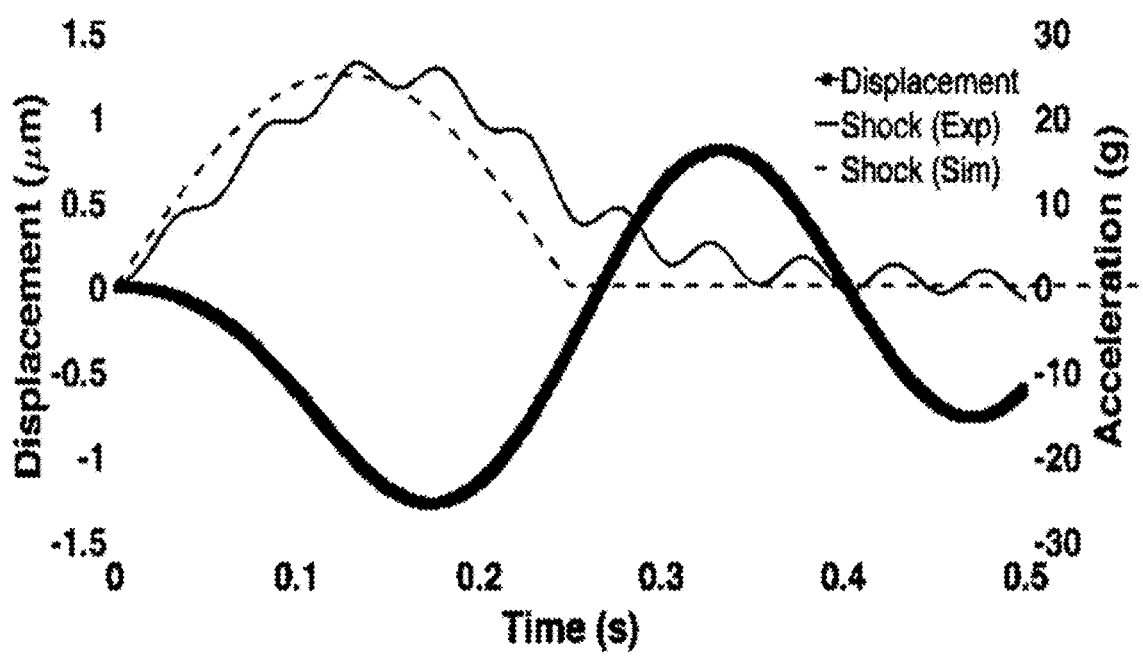
FIG. 29 shows the actual shock in the experiment (25 g and 0.25 ms), simulated shock profile in the mathematical model and relative displacement at the proof-mass edge for the corresponding shock ($V_{dc}$=60).
Figure 30A:
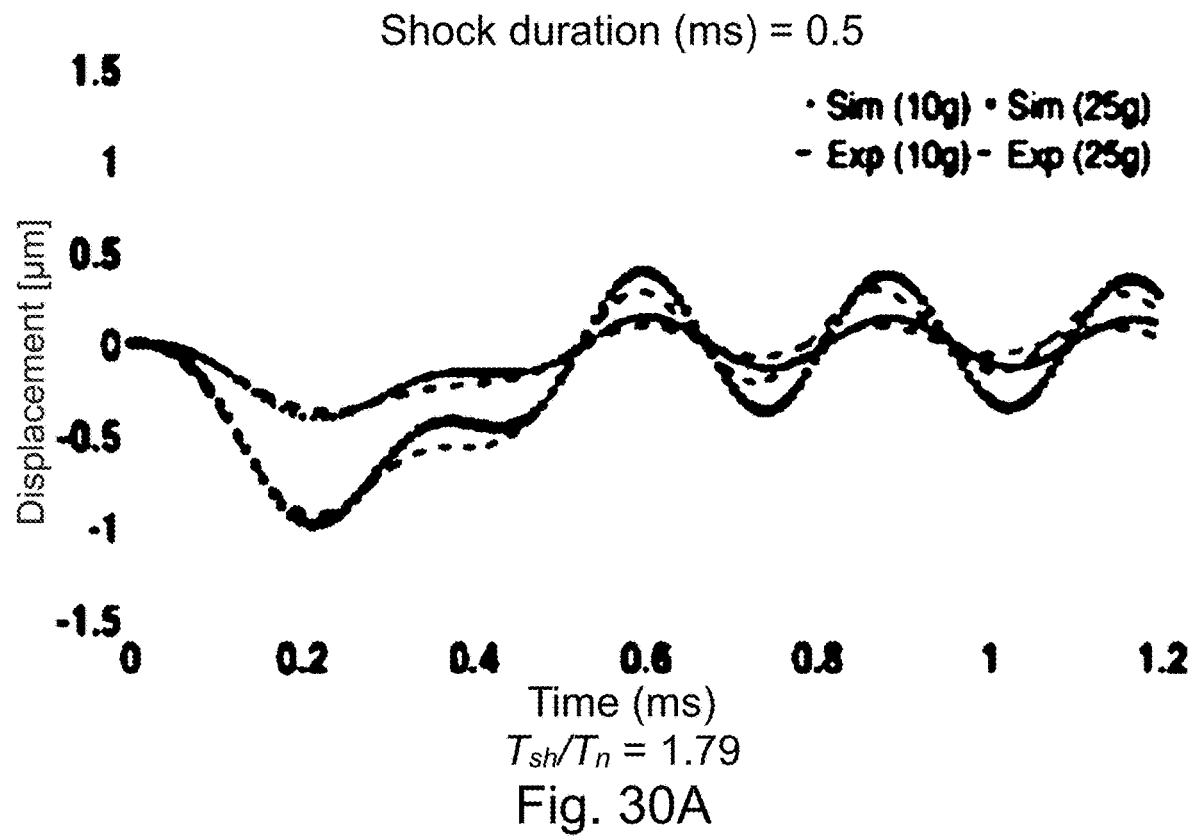
FIGS. 30a-30d show both simulation and experimental time responses for half sine shocks with different time duration at 60 V bias voltages. (a) $T_{sh}/T_n$=1.79, (b) $T_{sh}/T_n$=1.18, (c) $T_{sh}/T_n$=0.89, (d) $T_{sh}/T_n$=0.61.
Figure 30B:
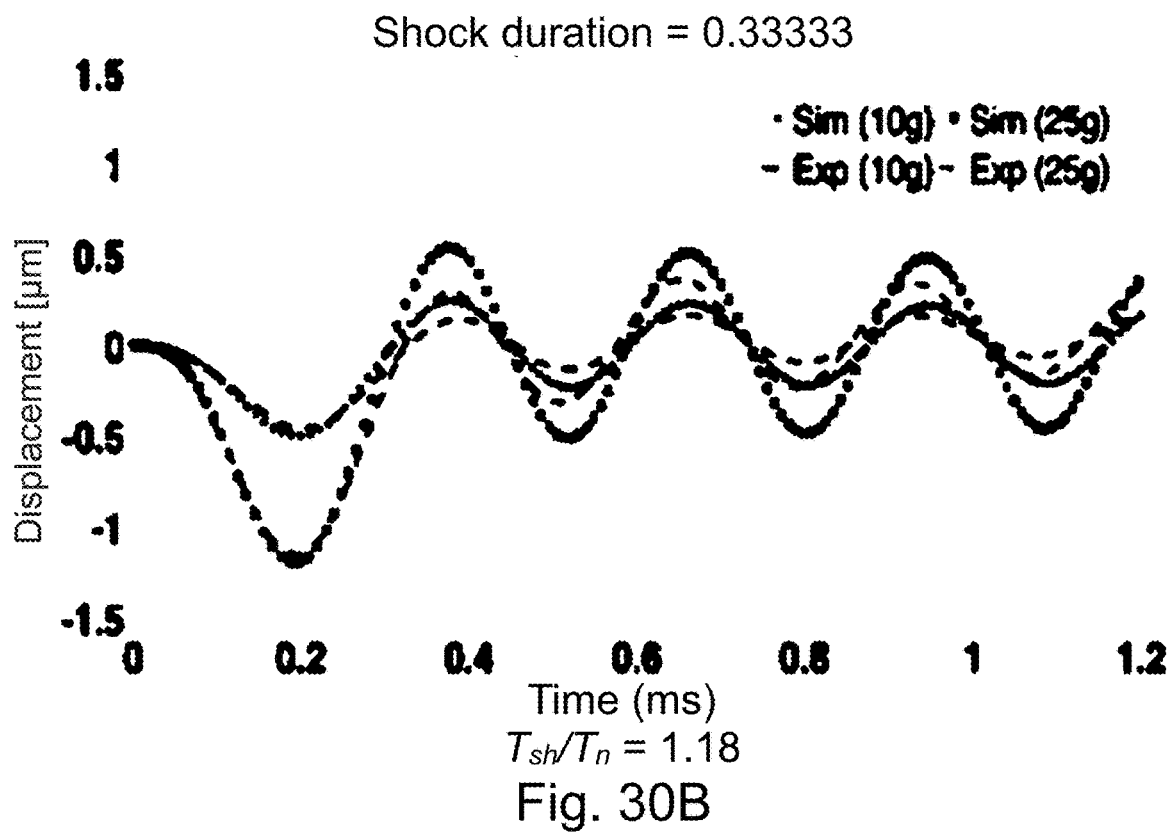
Figure 30C:
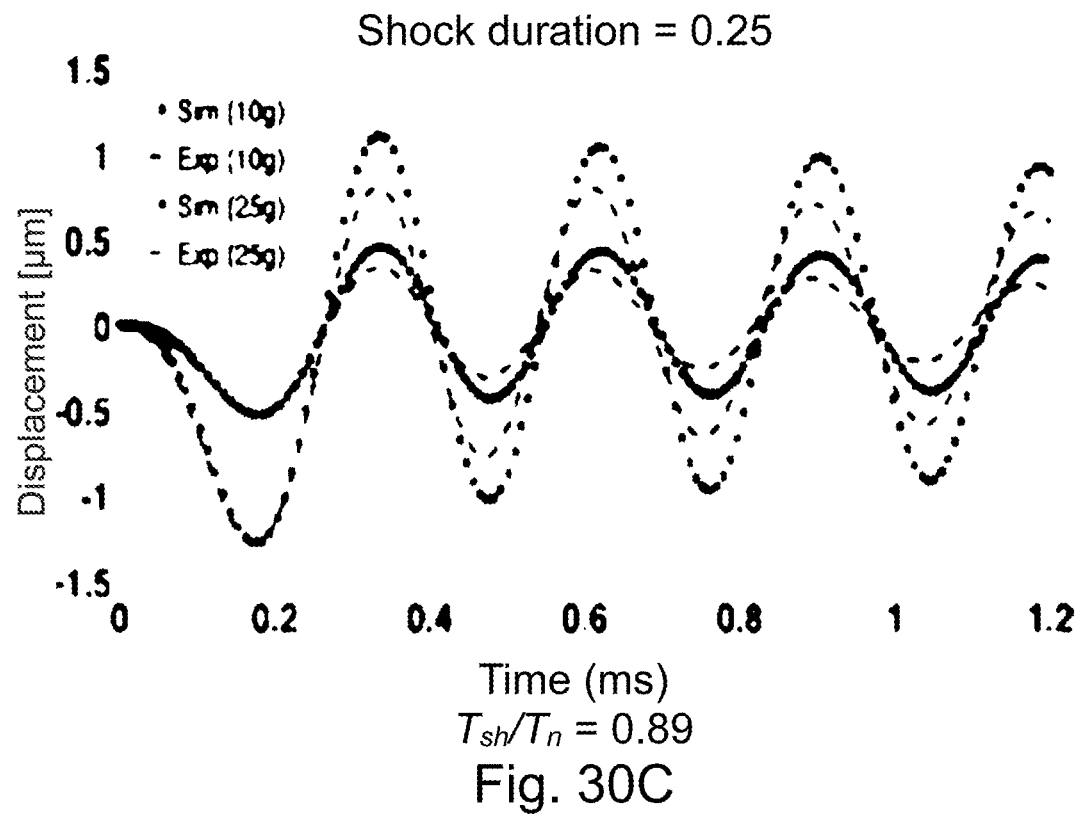
Figure 30D:
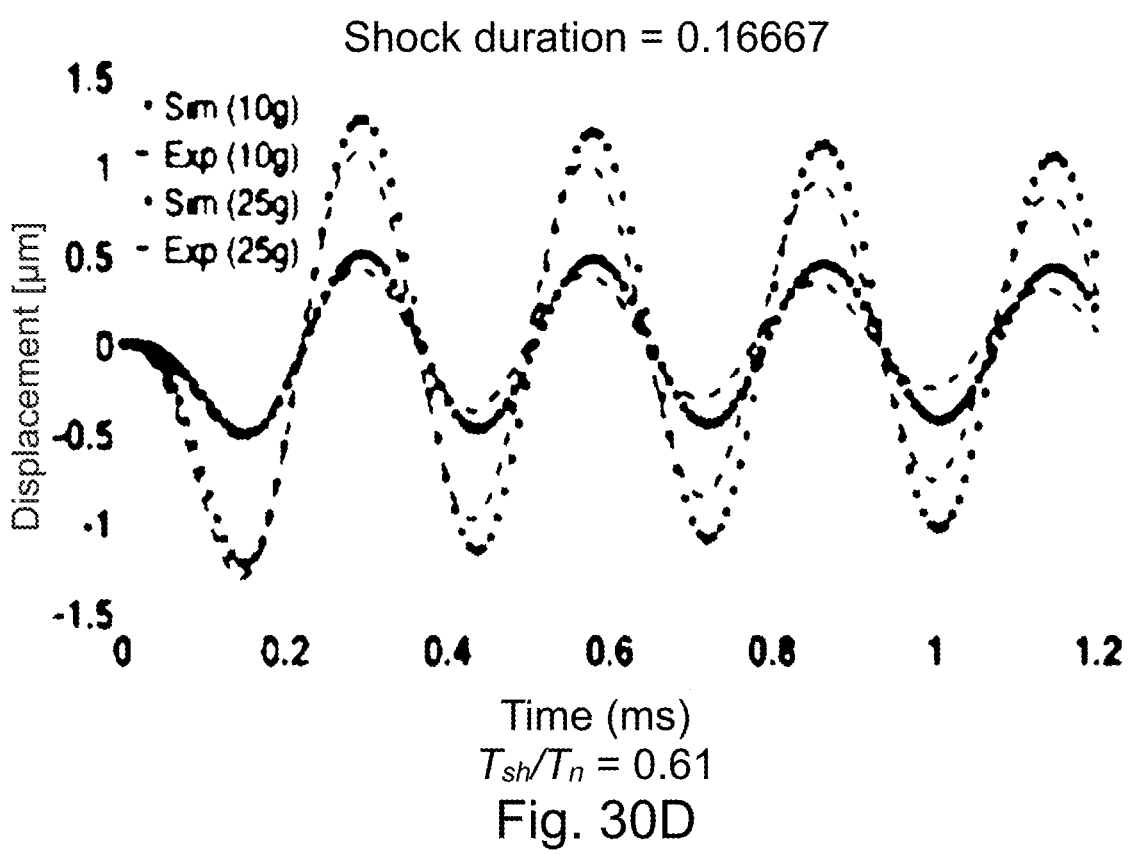

Robustness of accelerometers against mechanical shocks is an important parameter. Under mechanical shocks, a force is transmitted to the microstructure through its anchors during a short period of time compared to the natural period of the microstructure. These loads are usually characterized by the induced acceleration on the affected structure with three parameters: maximum acceleration (amplitude), time duration, and pulse shape, also called shock profile. Here, half-sine shock loads are used with different amplitudes and time durations to investigate the response of microstructure to a shock load. The actual output of the shaker is measured with the PCB accelerometer, which is mounted on the shaker. FIG. 29 shows this measured acceleration as well as the device response, which is obtained by integrating the velocity of the microstructure measured by the laser vibrometer.

Figure 31:
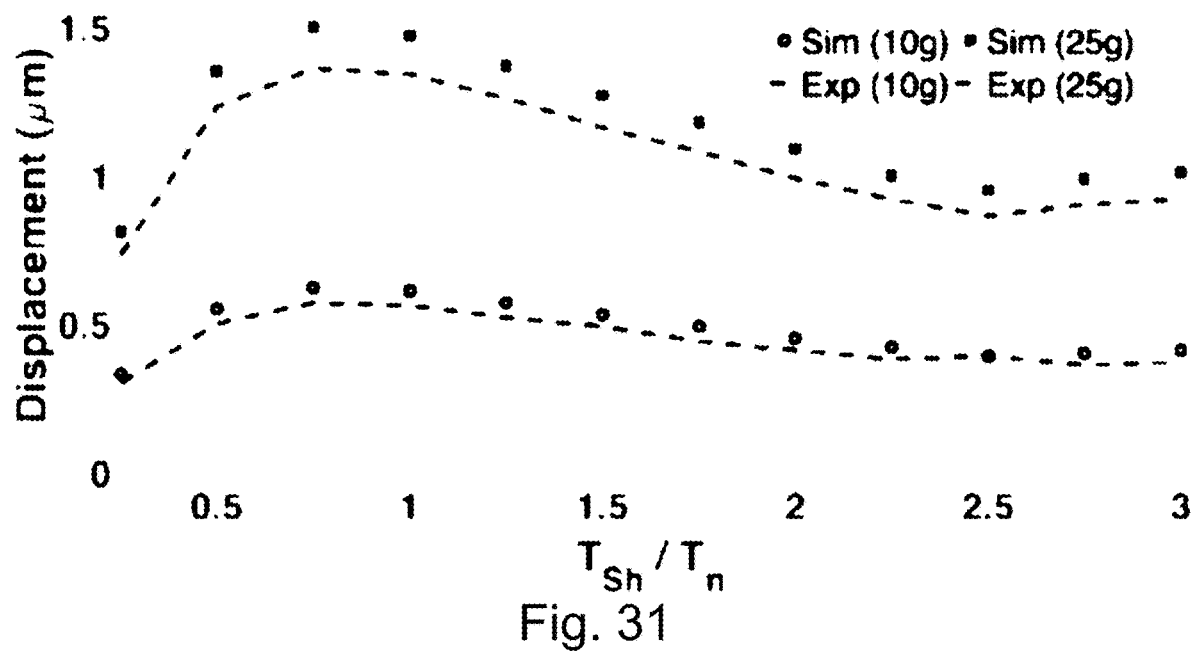
FIG. 31 shows both simulation and experimental maximum of the time responses for half sine shocks with time duration ($T_{sh}$) equal to 25-300% of the natural period of the microstructure ($T_n$) at 50 V bias voltages.

The time responses of the microstructure for 60 V bias voltage on the side electrode to shock loads with different time durations and amplitudes are given in FIGS. 30a-30d. Similar experiments were conducted for 50V on the side electrodes to obtain the larger displacements of the proof-mass (FIG. 31). These shock experiments are done for shock loads that have time durations close to the natural period of the microstructure. The linearized natural frequency of the microstructure for each voltage (FIG. 26) is obtained from stability and eigenvalue analysis on the Jacobian matrix for Eq. (31). The linearized natural frequency of the microstructure can be extracted from harmonic experiments at low g levels (Table VII). Because of the stiffness of the microstructure and hence, the natural period of the microstructure, would change with the DC voltage, the maximum dynamical displacement of the accelerometer would be a function of the voltage.

Figure 32:
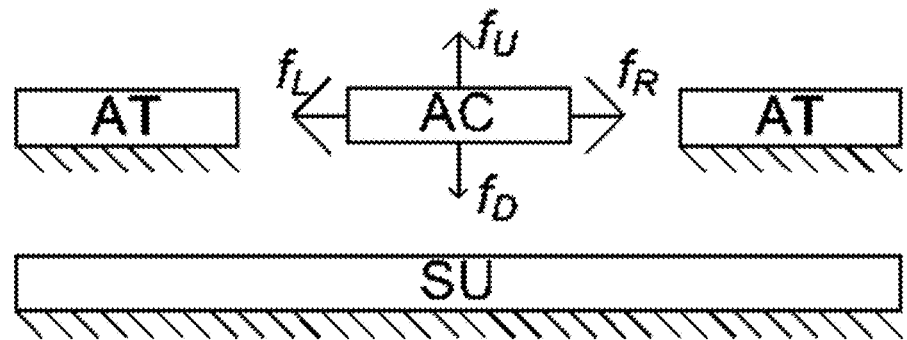
FIG. 32 shows a prior art electrode configuration of Weimin Wang, Qiang Wang, Hao Ren, Wenying Ma, Chuankai Qiu, Zexiang Chen & Bin Fan, "Electrostatic repulsive out-of-plane actuator using conductive substrate", Scientific Reports volume 6, Article number: 35118 (2016), FIG. 1c.

The simulation results are in good agreement with the shock-experiment outcomes as shown in FIGS. 31 and 32. The small discrepancies can be attributed to the error in the numerical integration of the velocity signal and the fact that the shock that is actually applied on the device is not a perfect half-sine shock considered in the mathematical model. It should also be mentioned the same damping coefficients that were used for harmonic simulation at 50V and 60V are used for simulating the shock responses. The close agreements of the results show that the damping model can accurately capture the energy dissipation.

The mechanical sensitivity to shock is an important factor in the performance of shock sensors. According to FIGS. 30a-30d at 60V, the maximum displacement at the proof-mass edge is less than 1.2 μm when the shock amplitude is 25 g. If we consider the collision of the microstructure with its substrate as a failure mode or a limit to define the maximum allowable shock load, this 1.2 μm is 10% of the initial gap between the proof-mass edge and the substrate (2 μm fabrication gap+10 μm static gap caused by 60V applied on the side electrodes). However, as discussed above, because there is no pull-in with this repulsive approach, even if the proof-mass hits the substrate, it could bounce off safely. In fact, if this impact could be detected electrically, the device could be employed as a tunable threshold shock sensor. As opposed to conventional parallel-plate shock sensors, the threshold shock could be tuned by applying voltage on the side electrodes. This capability is enabled in the repulsive configuration because of the additional two electrodes on the sides.

Because of the limitation on the shock amplitudes that could be generated by the shaker, the device could not be tested under more severe shocks. However, the model may be used to predict the threshold shock at different voltages. These threshold shock amplitudes are given in Table VII for different voltages on side electrodes. The sensor resilience against mechanical shock could be improved by increasing the voltage on the side electrodes. This also means the threshold shock the sensor can detect can be tuned by varying the DC voltage on the side electrodes.

A capacitive electrode system is provided that achieves a repulsive electrostatic force for acceleration-sensing. A single degree of freedom lumped parameter model is described that captures the nonlinear dynamics of the system. As the presented accelerometer does not suffer from pull-in, the DC voltage can be increased to increase the fundamental natural frequency. This capability enables the accelerometer to become tunable. That means the detection range of the accelerometers, which is often below one third of their natural frequency, can be tuned by changing the DC voltage of the side electrodes. This is superior to current commercial accelerometers that often have a fixed resonance frequency, which limits their performance. Here, because the resonance frequency of the accelerometer can be tuned, it has the potential to be used in a wider range of applications. Furthermore, the initial gap between the proof-mass and the substrate is increased by increasing the voltage on the side electrodes, which improves the accelerometer robustness against mechanical shocks without sacrificing its stability. This device also has the potential to be designed and used as a shock sensor. By changing the voltage difference between the side and bottom electrodes, the threshold shock amplitude needed to collide the structure with the substrate can be tuned. Also, the natural period of the sensor can be tuned to use the sensor for shock loads with different time duration.

A tunable MEMS electrostatic accelerometer is provided that uses a repulsive electrode configuration so that the design is not hampered by capacitive pull-in instability. The repulsive force configuration enables the increase of DC bias voltage without suffering from the pull-in failure mode. This flexibility in increasing voltage can be employed as a tuning parameter to widen the working frequency range and to improve the robustness of the accelerometer.

A lumped parameter model was developed to simulate the response of the microstructure under a combination of electrostatic and dynamic mechanical loading. The electrostatic force is estimated using a finite element simulation. The nonlinear equations of motion are solved for harmonic base excitations and half-sine shock loads using the shooting and the long-time integration methods, respectively. To validate the model, a sensor is fabricated and characterized under harmonic base excitation and mechanical shocks. A mechanical sensitivity of 0.1 μm/g is achieved when the bias voltage is 40 V. The experimental data are in good agreement with the simulation results.

Figure 33:
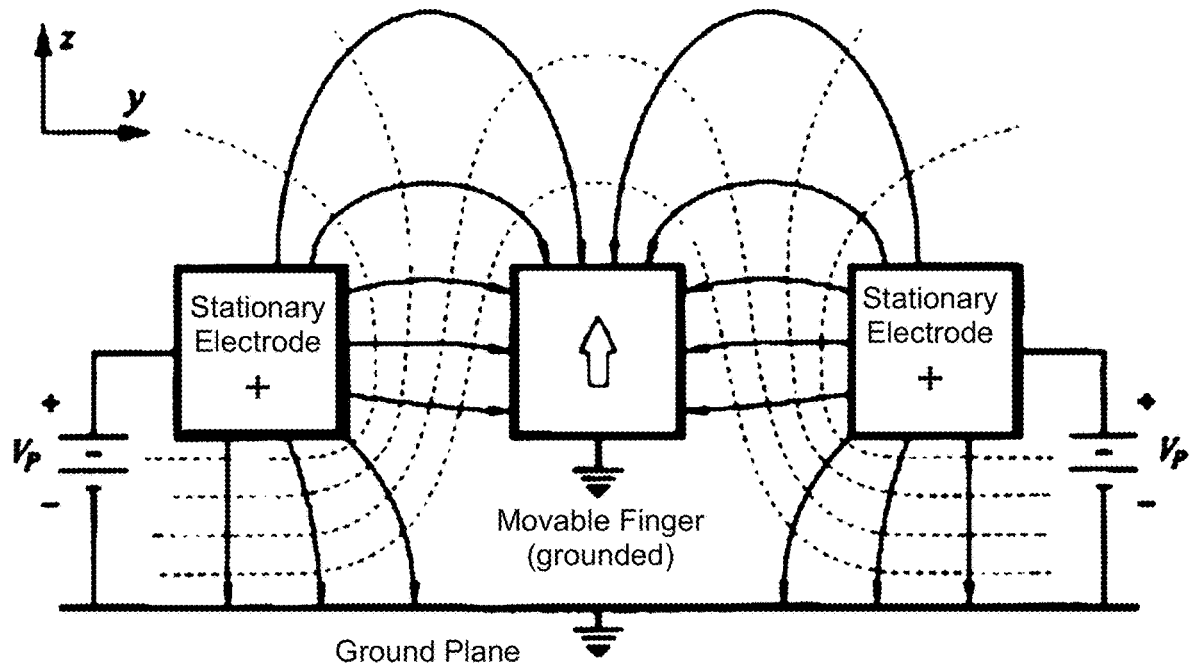
FIG. 33 shows a prior art diagram of a levitating actuator with a uniform ground plane, i.e., FIG. 6 of Liao et al (2004).
Figure 34:
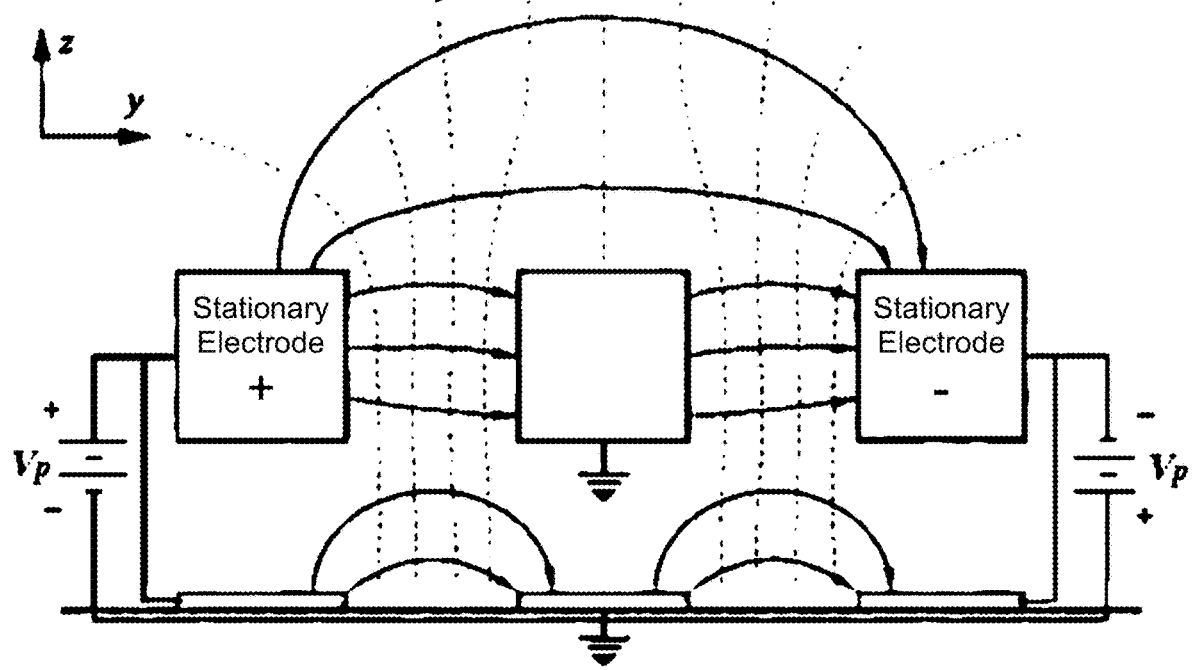
FIG. 34 shows a prior art diagram of a levitating actuator with a central ground plane conductor and two lateral conductors on the substrate, with suspended stationary electrodes, i.e., FIG. 18 of Liao et al (2004).
Figure 35:
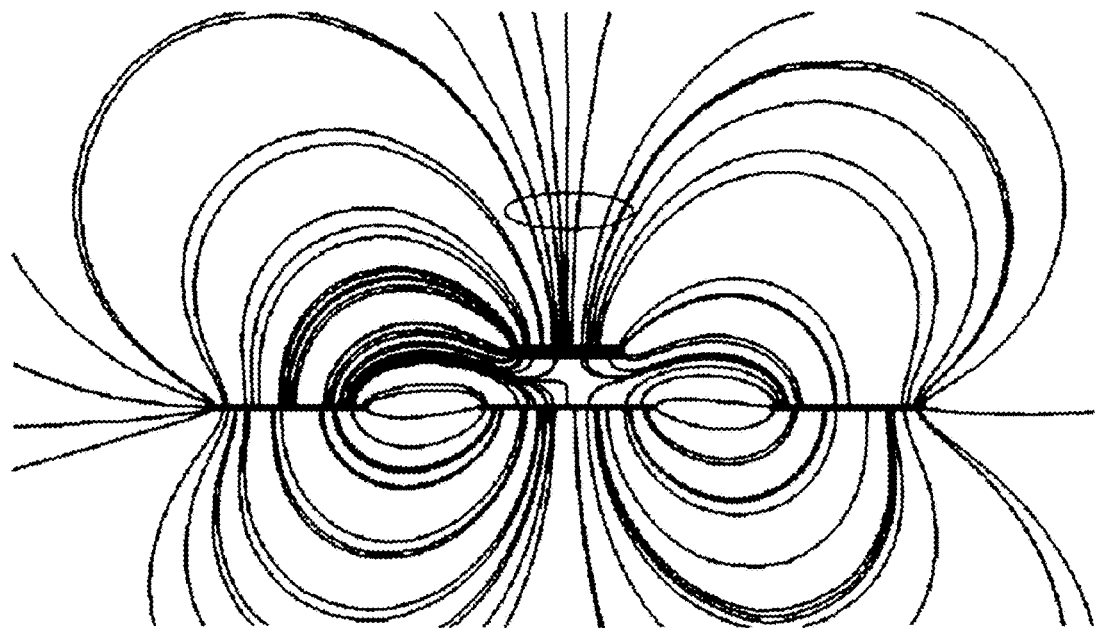
FIG. 35 shows a levitating actuator design according to Pallay et al. (2017) with equipotential center electrode and moving electrode.
Figure 36A:
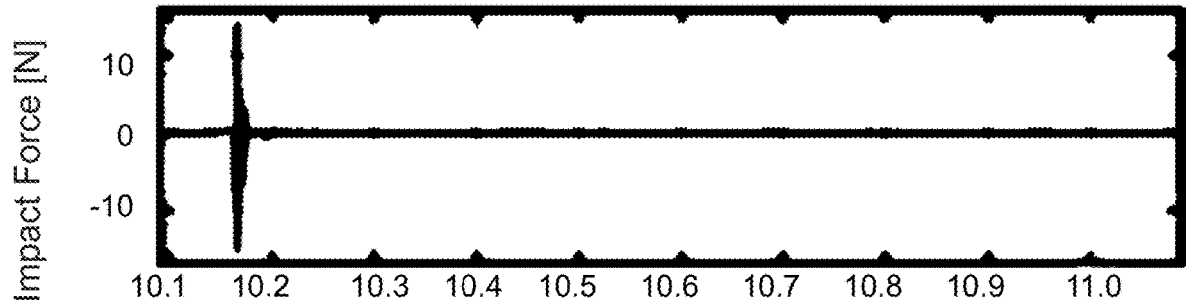
FIGS. 36a-36f shows measurements of (FIG. 36a) impact force (FIG. 36b) generator voltage (FIG. 36c) beam velocity using laser vibrometer after the drop of a one-pound weight and (FIG. 36d) impact force (FIG. 36e) generator voltage (FIG. 36f) beam velocity using laser vibrometer after the generator electrodes are shorted. In all cases, the side electrodes are connected to the generator while the beam and the center bottom electrodes are grounded.
Figure 36B:
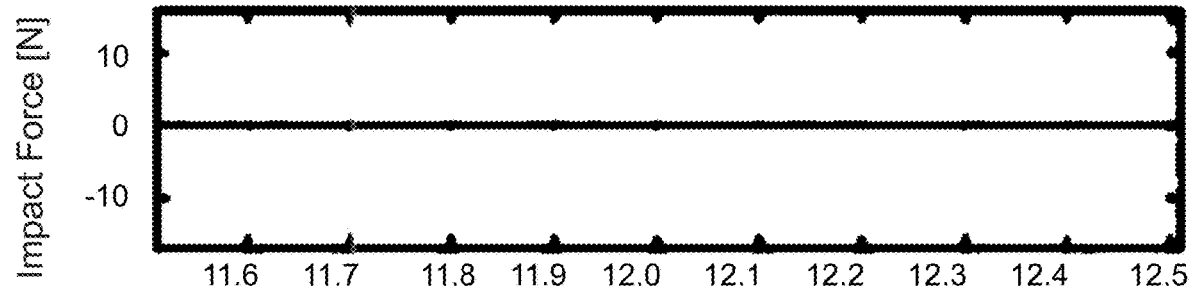
Figure 36C:
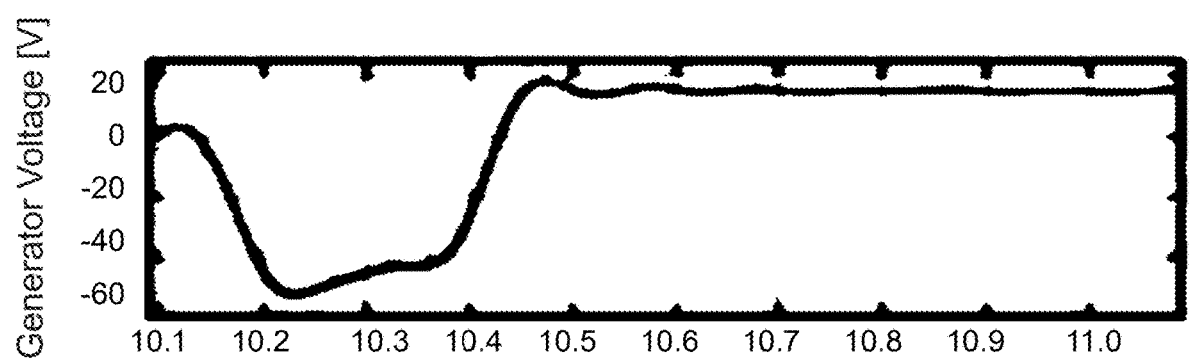
Figure 36D:
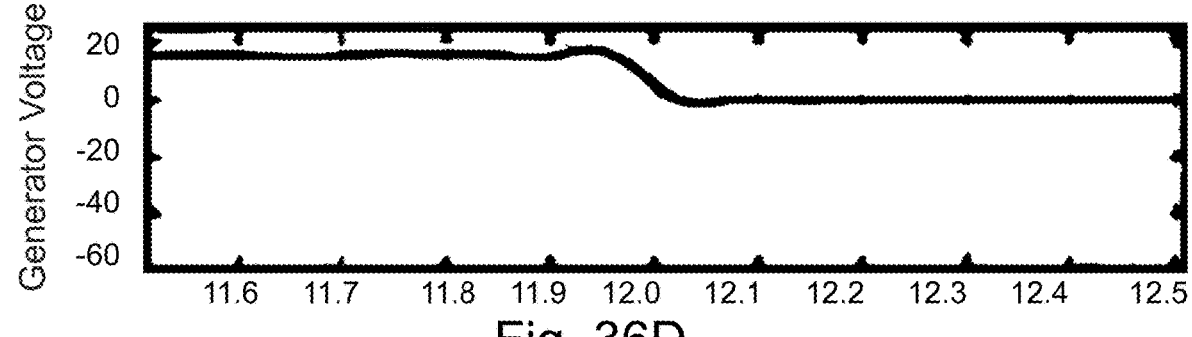
Figure 36E:
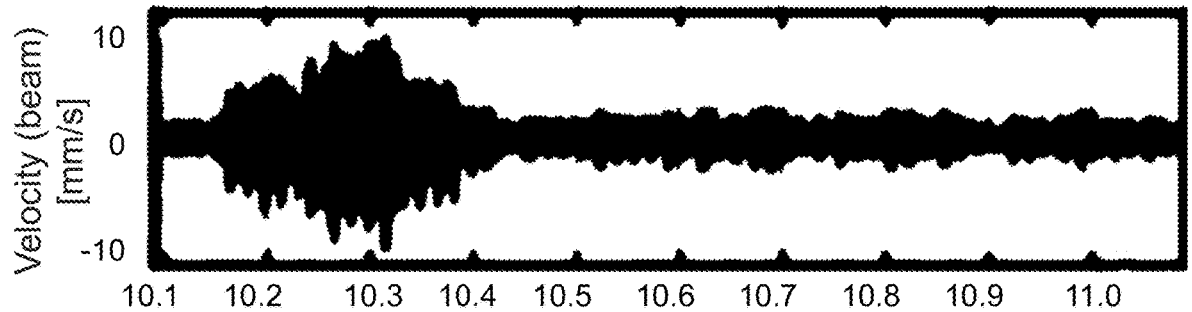
Figure 36F:
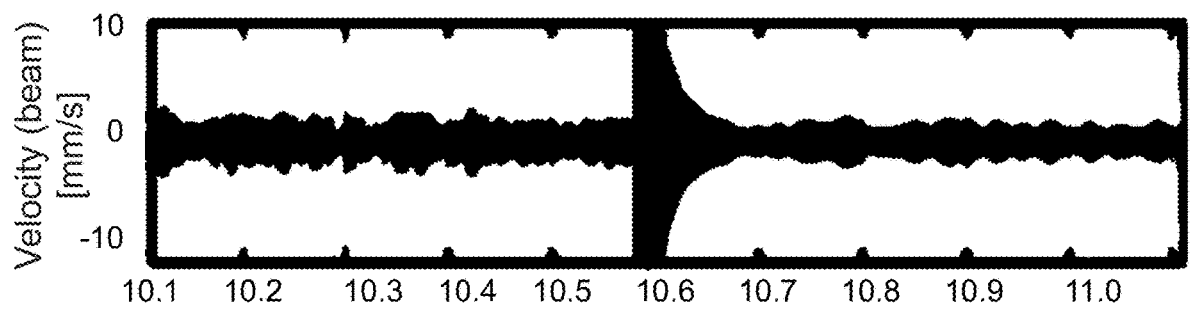

Another flavor of the described accelerometer is an accelerometer with translational degree of freedom. A fabricated MEMS accelerometer with translational degree of freedom is depicted in FIG. 32. The mechanical response of this microstructure to different base excitation at different voltage on side electrodes is shown in FIG. 33. FIG. 33. Shows the frequency response of the microstructuer when the frequency is swept backward. The motion of the proof mass in this accelerometer leads to a change in capacitance. This change in capacitance has been read electrically for the first time for the accelerometer based on levitation electrostatic force. FIG. 34 shows the frequency response of electrical voltage that is read with an electronic circuit. FIG. 35. Shows one of the time responses at a particular frequency while the voltage on side electrode is 78V and the base excitation amplitude is 3 g.

Example 3—Switch Characterization

First, the pull-in voltage for the cantilever is calculated, per Pallay, Mark, Alwathiqbellah I. Ibrahim, and Shahrzad Towfighian. "A MEMS Threshold Acceleration Switch Powered by a Triboelectric Generator." In ASME 2018 International Design Engineering Technical Conferences and Computers and Information in Engineering Conference, pp. V004T08A010-V004T08A010. American Society of Mechanical Engineers, 2018. This is the minimum required voltage for the switch to start in the closed state. Since the cantilever and center electrode act as a simple parallel plate actuator, the pull-in voltage can be calculated with the relationship shown in Equation (36).

$$V_{pull} \sqrt{\frac{8k_1 d^3}{27 \varepsilon A}} \qquad (36)$$

where $\varepsilon$ is the permittivity of air and A is the area of the underside of the beam. From Equation (36), the pull-in voltage should be approximately 1.9 V. Therefore 2.2 V ($V_{bias}$) is applied between the beam and center electrode so that the starting position of the switch is in the closed state. A voltage slightly higher than the pull-in voltage is necessary for the switch to stay closed because the dimples (0.75 μm long) do not allow the beam to travel the entire 2 μm gap. If the voltage is too low the beam will start to pull-in, but the force will be too weak to hold it in the pulled in position of −1.25 μm.

Next, the threshold generator voltage to open the switch when given an initial bias of 2.2 V is calculated. This can be estimated by calculating the potential energy and phase portrait. If the voltage is too low the beam should have an unstable trajectory in the phase plane. However, when the voltage exceeds a threshold it becomes stable and wants to settle to an equilibrium position somewhere above the substrate. The phase portrait will then show a periodic orbit about the equilibrium point.

To calculate the potential energy, Equation (37) is integrated. The damping has a small effect on the stability and is set to zero.

$$m_1 \ddot{q}_1 + c_1 \dot{q}_1 + k_1 q_1 + \sum_{j=0}^{9} f_j q_1^j = 0 \qquad (37)$$

-continued $$m_1 \frac{\dot{q}_1^2}{2} + k_1 \frac{q_1^2}{2} + \sum_{j=0}^{9} \frac{f_j}{j+1} q_1^{j+1} = H \qquad (38)$$

In Equation (38) the first term is the kinetic energy, while the second two terms are the potential energy. H is the total energy of the system, which can be varied to view various trajectories in the phase portrait.

Figure 4:
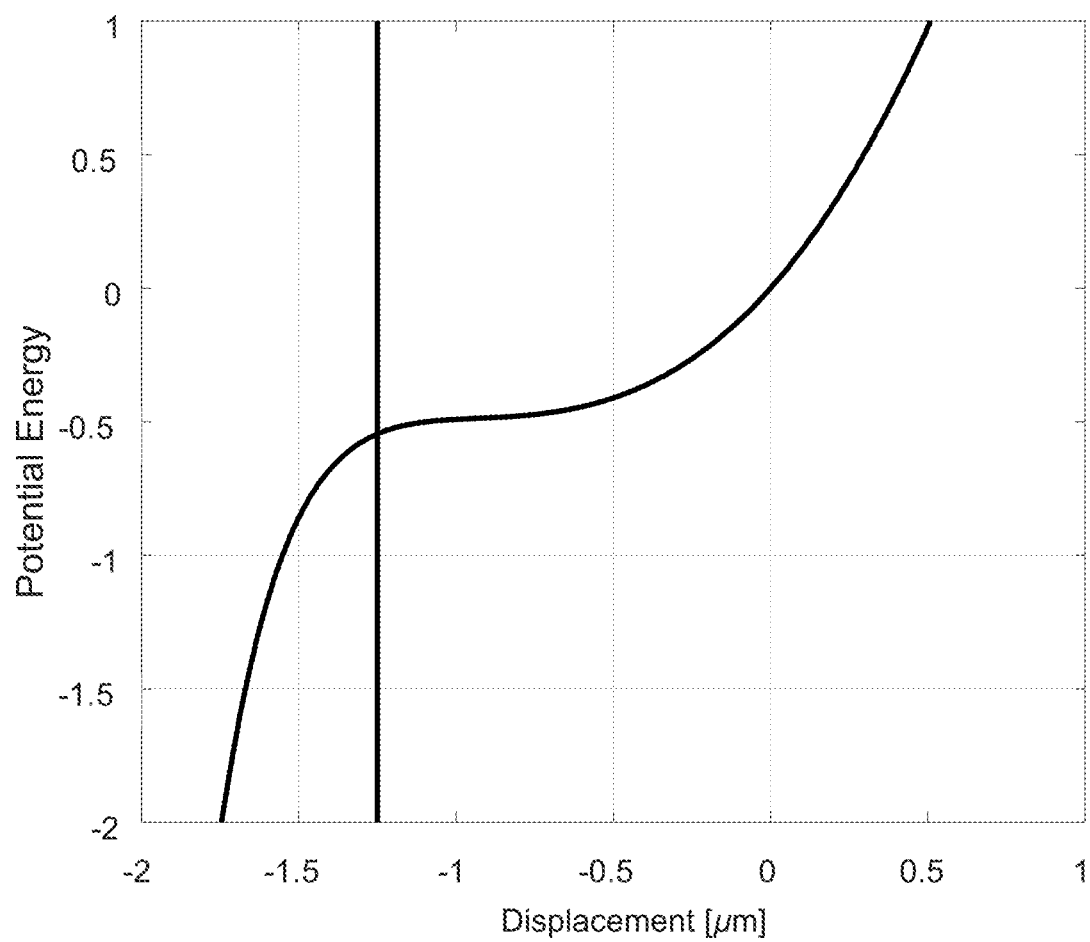
FIG. 4 shows the potential energy of the beam as a function of tip displacement at $V_{bias}$=2.2 V and $V_{side}$=0V. The red line indicates the smallest possible gap because of the dimples.

FIG. 4 shows the potential energy for the case of $V_{bias}$=2.2 V and $V_{side}$=0V, showing the system will pull in at this voltage. To calculate the phase portrait, Equation (38) is rearranged to solve for $\dot{q}_1^2$, which is a pair of nonlinear function of $q_1$. The separatrix can be calculated by setting H to be the potential energy (V) at a local peak (if one exists). For the case of FIG. 4, no such peak exists and the system remains unstable everywhere. FIG. 5 shows the phase plane trajectory of the beam starting at rest for a bias voltage of 2.2 V.

Figure 6:
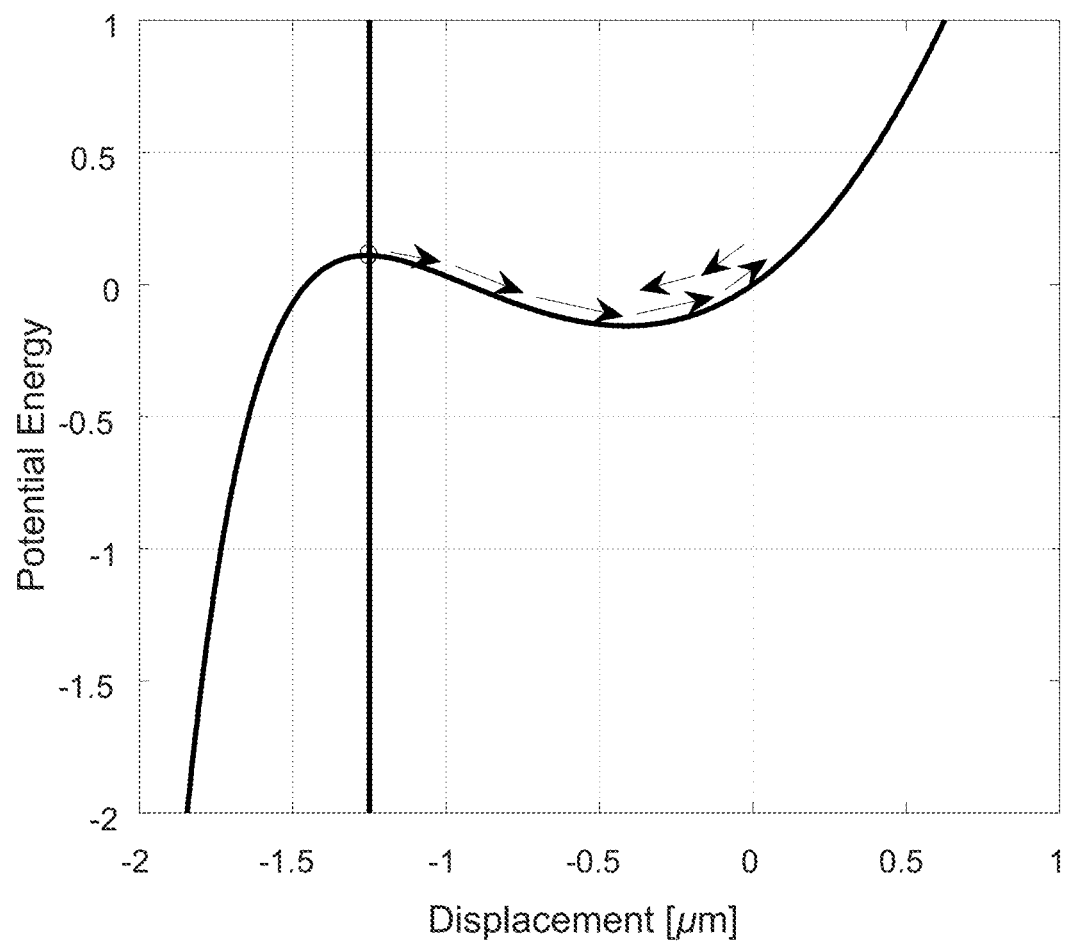
FIG. 6 shows the potential energy at $V_{bias}$=2.2 V and $V_{side}$=12V. The red line indicates the smallest possible gap. The pulled in position is the intersection of the red and blue line. The arrows show the beam settling to its new equilibrium position.
Figure 7:
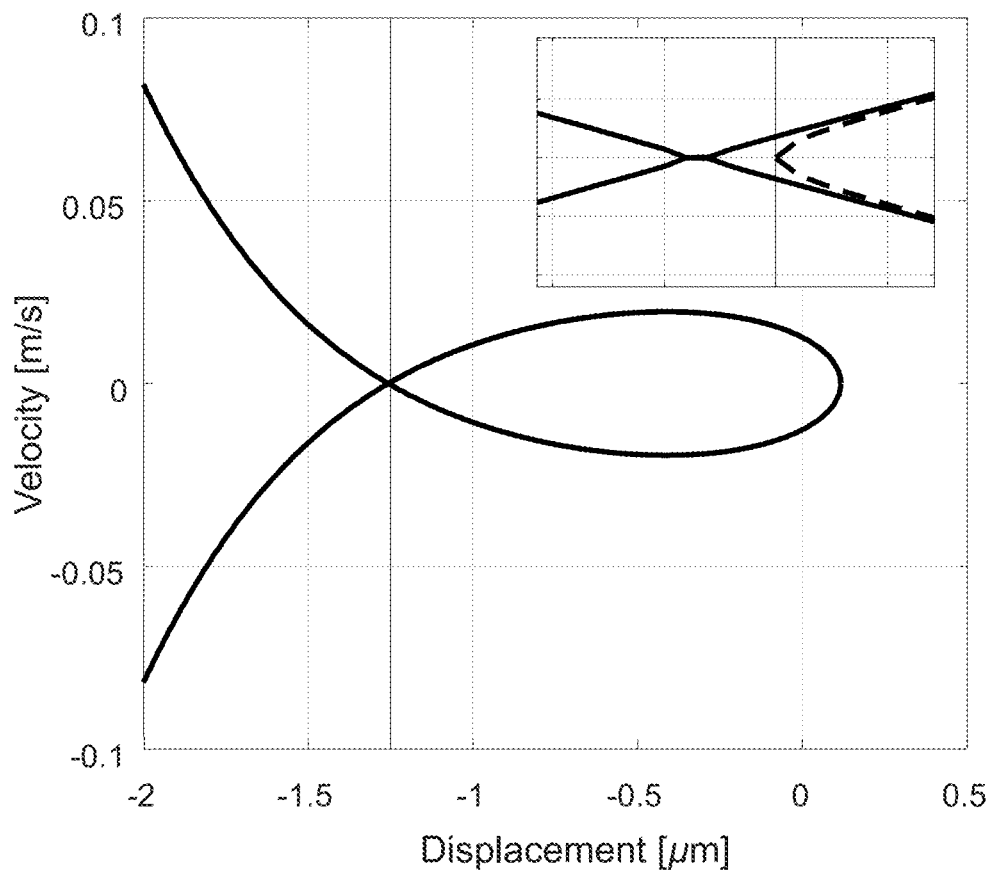
FIG. 7 shows the phase portrait at $V_{bias}$=2.2 V and $V_{side}$=12V. The inlet shows a zoomed in picture of the intersection at zero velocity and −1.25 μm.

Next, the side voltage is gradually increased until the system becomes stable again. This occurs when the pulled-in position of the beam (indicated in the phase portrait by the intersection of the red line and zero velocity axis) moves inside of a closed loop in the phase portrait. A loop in the phase portrait occurs when a local minimum appears in the potential energy plot. If the side electrode voltage is increased past a threshold, the potential well will grow large enough to allow the beam to oscillate in a stable orbit and the beam will release. FIGS. 6 and 7 show the potential energy and phase portrait respectively when the side electrode voltage is increased to 12 V.

As can be seen in the phase portrait (FIG. 7), at side voltage of 12 V, the pulled-in position of the beam exists inside a closed loop indicating the beam is now stable. This means, neglecting stiction forces, only 12 V is necessary to open the switch. Contact forces holding the beam in the pulled-in position will inevitably increase this threshold, however it can be difficult to estimate theoretically but its influence may be determined through an experiment. The triboelectric generator is capable of producing voltages over an order of magnitude above the calculated threshold. This allows the bias voltage to be increased significantly to tune the sensitivity of the sensor. It also opens the possibility of miniaturizing the generator to the millimeter or even smaller scale, which is very attractive for MEMS sensors. Both threshold voltages to close and open the switch have been verified through integration of Equation (37).

Figure 8:
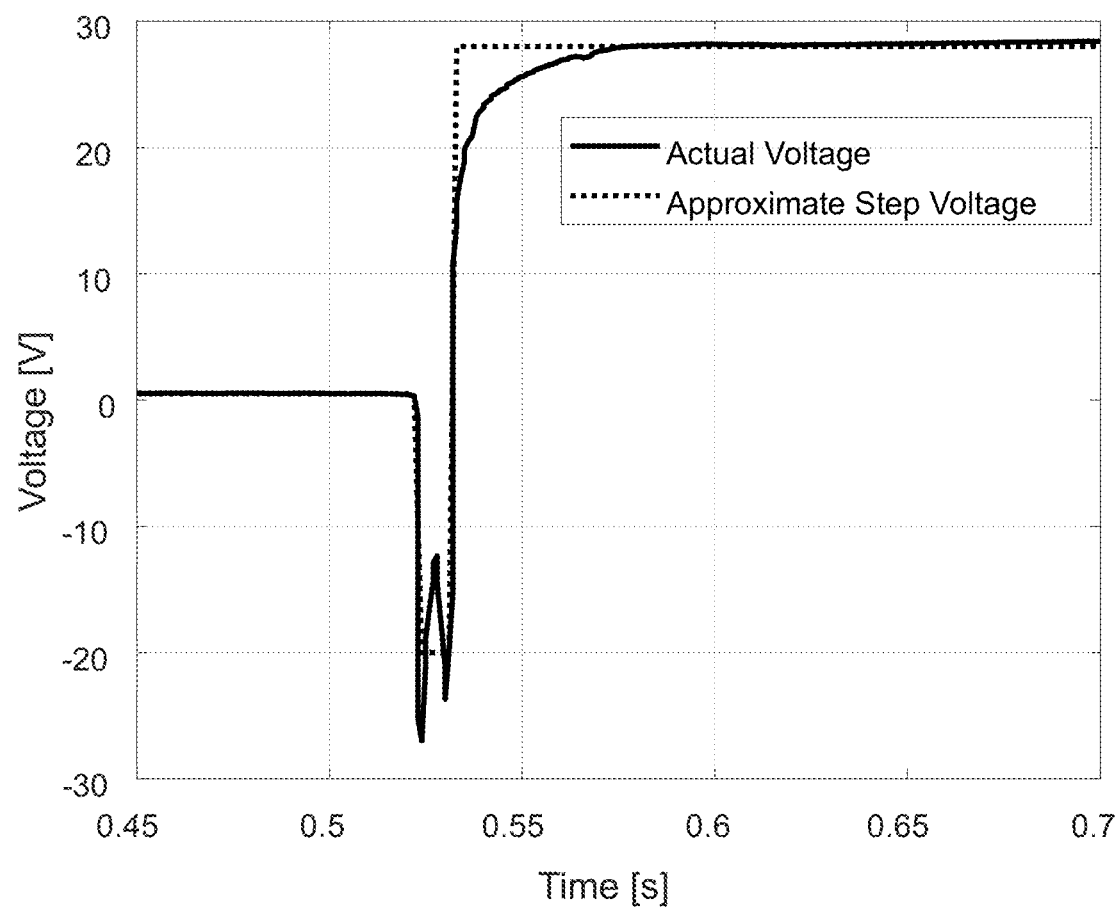
FIG. 8 shows the open circuit generator voltage resulting from a single light impact. The voltage is measured with a Keithley 6514 electrometer. The voltage output can be estimated as a series of step inputs.
Figure 9:
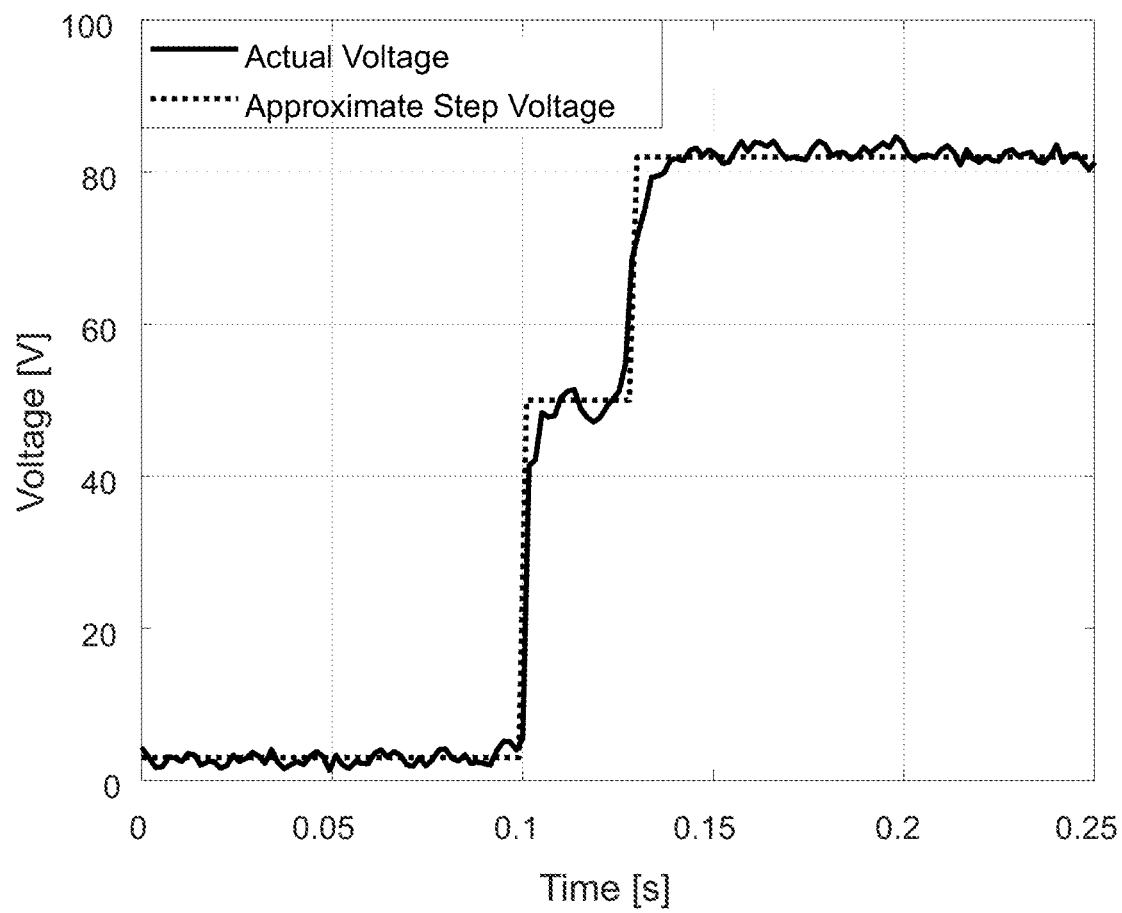
FIG. 9 shows the open circuit generator voltage resulting from a single harder impact. The harder impact results in a higher output voltage. The voltage is measured with a Keithley 6514 electrometer. The voltage output can be estimated as a series of step inputs.

Next, the generator output was experimentally extracted using a prototype triboelectric generator from [40]. The generator was struck with a 1 lb. weight to see the open circuit voltage produced from a single impact. FIGS. 8 and 9 show the voltage plots for two separate impact tests.

In FIGS. 8 and 9 the voltage responds in two steps during the impact. For the smaller impact (FIG. 8) the first step is a negative voltage, while for the larger impact (FIG. 9) the first step is a positive voltage. This difference does not significantly affect the operation of the device. The delay between steps is relatively short at 10 ms and 25 ms respectively. However, the beam response period is less than 0.1 ms and therefore the short delay cannot be ignored. In both cases, the voltage jump occurs in much less than 2 ms (the sample rate of the electrometer) and is modeled as a step input.

Both cases produced a voltage that was large enough to open the switch. This is a result of the generator size, which has approximately 20 cm² of contact area between triboelectric layers. This means that even a light impact will produce enough voltage to open the switch. To tune the output voltage such that it is closer to the threshold voltage level, a new, smaller generator should be made so that lower level impacts will produce small voltages that will not open the switch.

The voltage from FIGS. 8 and 9 decayed slowly back to approximately zero over the course of a few minutes. This is because the PDMS layer in the generator is an insulator and becomes charged during the impact. The consequence of this is that the switch will stay in the open position for a few minutes until the voltage decays enough for the beam to pull back into the closed state. In this case the charge decay can be beneficial because it allows the sensor to reset itself after being triggered.

Figure 10:
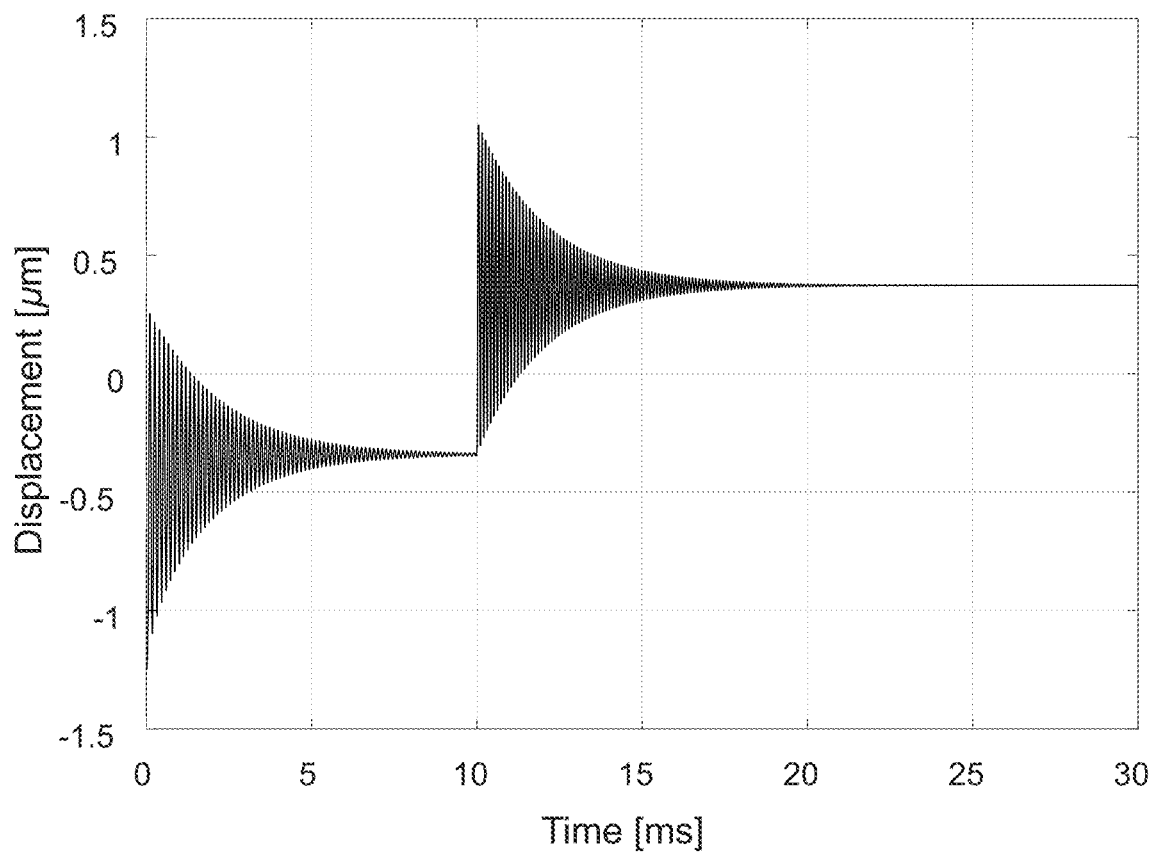
FIG. 10 shows the beam tip displacement for a side voltage corresponding to the step voltage shown in FIG. 8. The first Voltage step is at time zero and the second voltage step is after 10 ms. The generator voltage is above the threshold and therefore the switch is operating in the open state.

FIG. 10 shows the beam tip displacement for a side voltage corresponding to the step voltage shown in FIG. 8. The first Voltage step is at time zero and the second voltage step is after 10 ms. The generator voltage is above the threshold and therefore the switch is operating in the open state.

Figure 11:
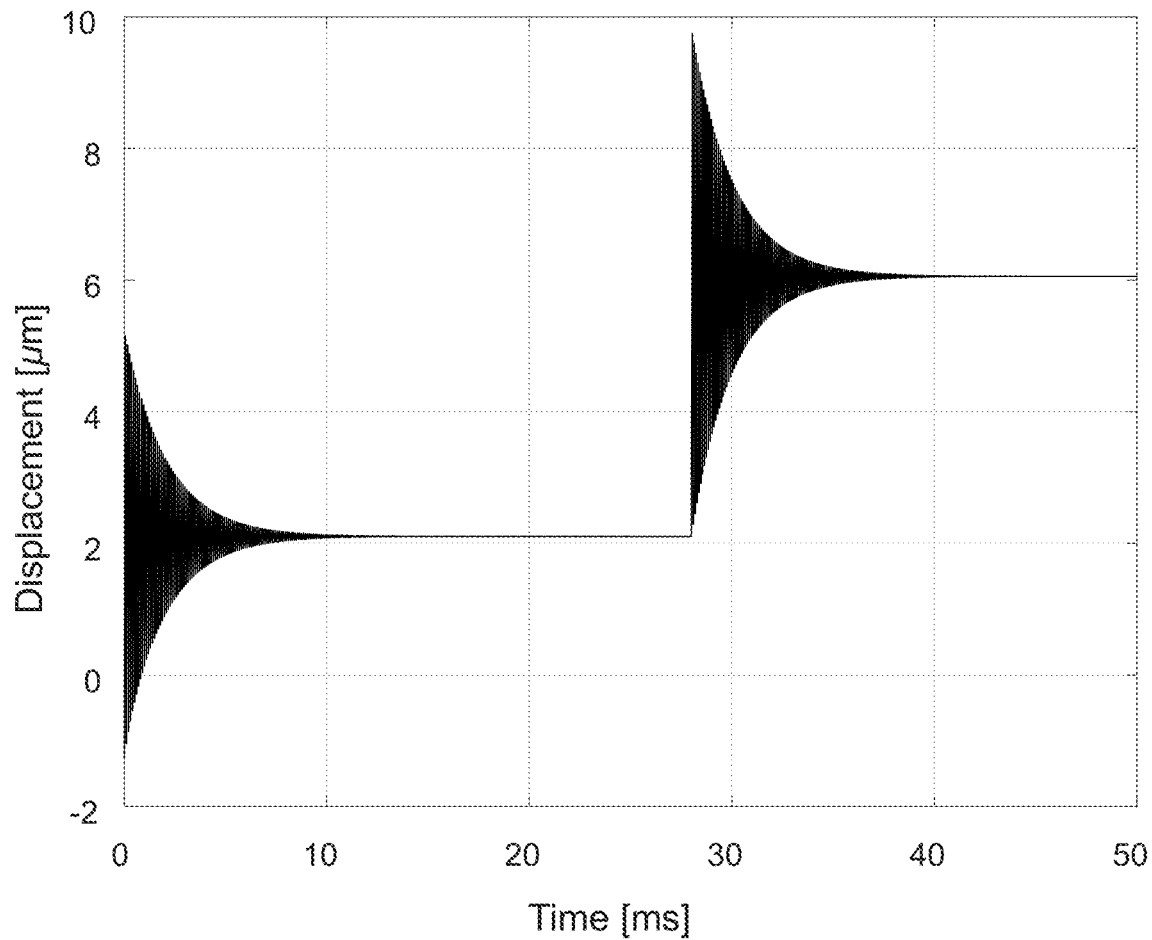
FIG. 11 shows the beam tip displacement for a side voltage corresponding to the step voltage shown in FIG. 9. The first voltage step is at time zero and the second voltage step is after 28 ms. The generator voltage is above the threshold and therefore the switch is operating in the open state.

The simplified step voltages are then applied to Equation (37) to see the beam response. The generator output is not applied directly to Equation (37) because the electrostatic force does not scale with the square of the generator voltage. The voltage is approximated as a series of two steps so that the electrostatic force only needs to be simulated at three voltage levels for each plot. If the voltage is assumed to start at 0 V, then only two simulations are necessary to achieve the stepped voltage response. The electrostatic force coefficients in Equation (37)), $p_i$, become piecewise functions that change suddenly at each jump in FIGS. 8 and 9. For the dynamic beam analysis, the beam will start at its pulled-in position and experience a jump in voltage at time zero corresponding to the first step in FIGS. 8 and 9. Then it will receive a second step to the final voltage after a short delay. The beam responses are shown in FIGS. 10 and 11. In both cases, the beam is released from its initial pulled-in position showing the switch opens from the shock the generator experiences.

For the smaller impact (FIGS. 8 and 10) the beam first begins to settle around −0.34 µm from the first voltage spike, then jumps up to 0.37 µm after the second spike, which is its final equilibrium position. The larger impact (FIG. 11) moves the beam to approximately 2 µm above the substrate from the first spike, and to over 6 µm from the second spike. Because the force is effectively repulsive, there is no voltage limitation on the sensor. This means the sensor should remain mechanically undamaged from a very large voltage spike, which could occur from an unexpectedly large impact.

Because the delay between each voltage step is much longer than the response period, the beam has time to settle to its static position between the two voltage spikes. If the device is operated at very low pressure, this may not be the case. However, for a quality factor of 70, the beam settles to its equilibrium point in about 10 ms, which is roughly the time between voltage steps in FIG. 8. If the beam does not have time to settle to its equilibrium position prior to the second spike, the operation of the device should not be affected in most cases.

The sensor uses a triboelectric generator to convert mechanical energy from an impact to an electrical signal that opens a switch when the impact passes a threshold value. The switch consists of a MEMS cantilever beam with a multi-electrode configuration that can generate both attractive and repulsive forces on the beam. The center electrode is given a small bias voltage to initiate pull-in, and the side electrodes receive voltage from the generator. If the impact is large enough, the repulsive force from the side electrodes releases the beam from pull-in and opens the switch. After a few minutes, the charge on the generator decays and the switch resets to its closed state.

The levitation force is capable of balancing the parallel plate electrostatic force when the beam is in its pulled-in position without tremendously high voltage levels. It has also been experimentally demonstrated that a triboelectric transducer can generate voltages well above this threshold level and will not immediately discharge when the generator electrodes are left as an open circuit.

Example 4—Mems Switch

A microelectromechanical system (MEMS) beam is experimentally released from pull-in using electrostatic levitation. A MEMS cantilever with a parallel plate electrode configuration is pulled-in by applying a voltage above the pull-in threshold. An electrode is fixed to the substrate on each side of the beam to allow electrostatic levitation. Large voltage pulses upwards of 100 V are applied to the side electrodes to release the pulled-in beam. A large voltage is needed to overcome the strong parallel plate electrostatic force and stiction forces, which hold the beam in its pulled-in position. See, Pallay, Mark, and Shahrzad Towfighian. "A reliable MEMS switch using electrostatic levitation." Applied Physics Letters 113, no. 21 (2018): 213102.

One common undesirable phenomenon associated with electrostatic actuation is the pull-in instability. Pull-in failure occurs when the electrostatic force pulling the two electrodes together overcomes the mechanical forces separating them and the structure collapses. In many cases, pull-in results in permanent damage to the device as the electrodes become stuck together and cannot be separated even if the voltage is removed. Stiction forces such as van der Waals become much more significant at the micro-scale, and the parallel plate electrostatic force is only capable of pulling objects together, so release is often impossible. Stiction can be mitigated by placing dimples on the bottom face of the beam or movable plate, thus reducing the contact area and minimizing the force holding the plates together. However, even beams with dimples can frequently become stuck after pull-in, and therefore, many electrostatic devices are designed to avoid pull-in entirely.

Much effort has been placed in creating electrostatic MEMS designs that do not experience pull-in at all. One method actuates a structure with electrostatic levitation. Electrostatic levitation involves a slightly different electrode configuration than the standard parallel plate design, with two extra electrodes that help induce an effectively repulsive force instead of an attractive one.

The beam and the fixed middle electrode are kept at similar voltage level, while the fixed side electrodes are supplied with a large voltage. When the beam is close enough to the middle electrode, the electrostatic fringe-field produced by the side electrodes pulls on the top of the beam more than the bottom, resulting in a net force upwards. It is not the case of a purely repulsive force that would occur between two positively charged particles but rather an attractive force that acts in the opposite direction of the substrate and is commonly referred to as repulsive to differentiate it from the attractive parallel plate force. The middle electrode acts as a shield protecting the bottom face of the beam from the electric field and associated electrostatic force. As shown in FIG. 12, some of the electric field lines that would have normally pulled on the bottom face of the beam are now moved to the middle electrode instead. The electric field at the top of the beam is relatively unaffected by the presence of the middle electrode, and therefore, the direction of the net force on the beam becomes upward instead of downward when the beam-electrode gap is small.

If the beam is held to just one degree of freedom, which is common for thin, wide beams, it will not pull-in at all because the side electrodes are not in the beams' path of motion. The middle electrode will not create attractive electrostatic forces on the beam because they are both at the same voltage potential, and thus, pull-in will not occur.

A major drawback to electrostatic levitation is that it requires a very high voltage potential because it utilizes the weak fringe fields. To generate an electrostatic levitation force comparable to the one generated by a standard parallel plate configuration, the voltage must be more than an order of magnitude larger than the parallel plate voltage. Voltages upwards of 150 V may be applied to achieve around 10 µm of static tip deflection for a 500 µm long beam. However, the large voltage potential and elimination of the pull-in instability allow repulsive actuators to move more than an order of magnitude farther than their initial gap, as opposed to parallel plate actuators, which are typically limited to one-third of the initial gap because of pull-in.

Another advantage of electrostatic levitation is that it can be easily combined with parallel plate electrodes to enable bi-directional actuation. Applying a bias to the middle electrode, along with the voltage on the side electrodes, creates attractive and repulsive forces on the beam. The beam and middle electrode act as parallel plates, while the side electrodes produce the levitation force. As with other bidirectional devices, such as double-sided parallel plates, bidirectional actuation requires multiple voltage inputs with each controlling the magnitude of the force in a single direction.

According to the present technology, a MEMS beam may be toggled between its pulled-in and released positions using a combination of parallel plate actuation and electrostatic levitation. A bias voltage is applied to the middle electrode to induce pull-in, and release the beam from its pulled-in state. The repulsive force is capable of overcoming the stiction forces holding the beam to the substrate. The capability of recovering from what was once permanent pull-in failure of a MEMS structure is a great advancement and addresses a fundamental issue that has existed since the inception of electrostatically actuated MEMS. This feature can make MEMS devices more reliable and reusable. It also opens the possibility of new applications for electrostatic MEMS by allowing them to use the pulled-in state as a functional element of the device, rather than a limitation. Almost all electrostatic MEMS are designed around pull-in, and by using a combination of attractive and repulsive forcing, this limitation can be relaxed or removed entirely. This attribute has great potential for MEMS switches that will be normally closed, as opposed to current MEMS switches, which are normally open. It also has a promising application in micromechanical memories to read and erase bits as it can switch back and forth between two functional states: pulled-in and released.

MEMS cantilevers are fabricated using PolyMUMPs standard fabrication by MEMSCAP. Dimples are placed on the bottom of the beam to reduce the contact area and the associated stiction forces. While dimples can aid with release, the beams still suffer from stiction when pulled-in. The cantilevers have the electrode layout shown in FIG. 1.

The beam can be modeled as an Euler-Bernoulli beam with electrostatic forcing, which can be calculated numerically with a 2D COMSOL simulation. A comparison of pure repulsive, pure attractive, and combined repulsive and attractive forces can be seen in FIG. 3B.

Figure 15A:
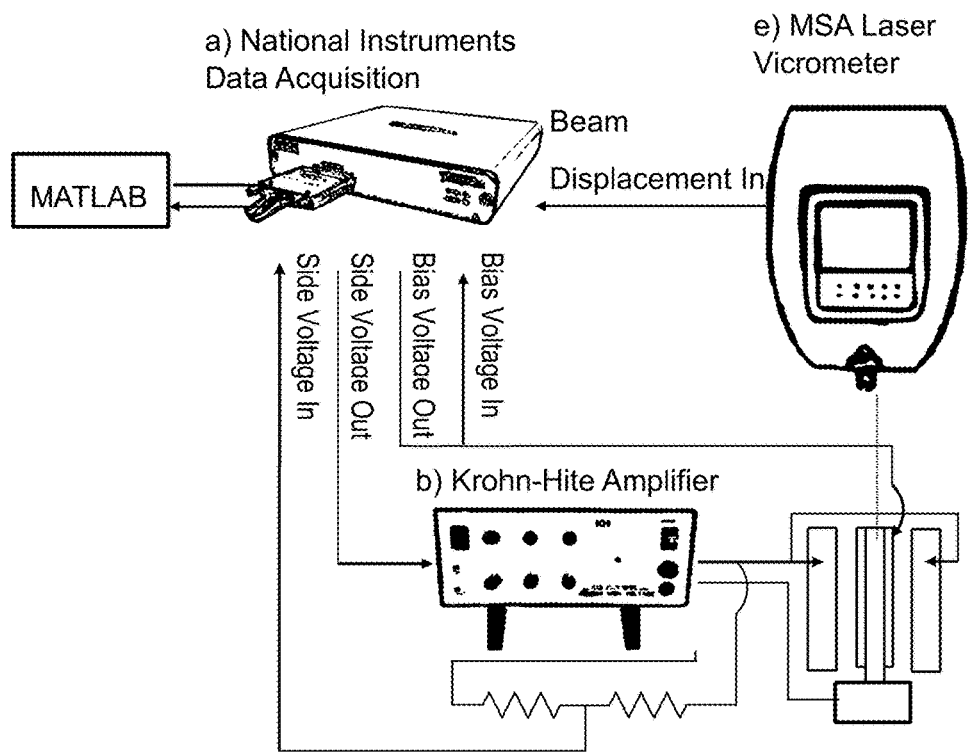
FIG. 15a shows a first experimental setup.
Figure 15B:
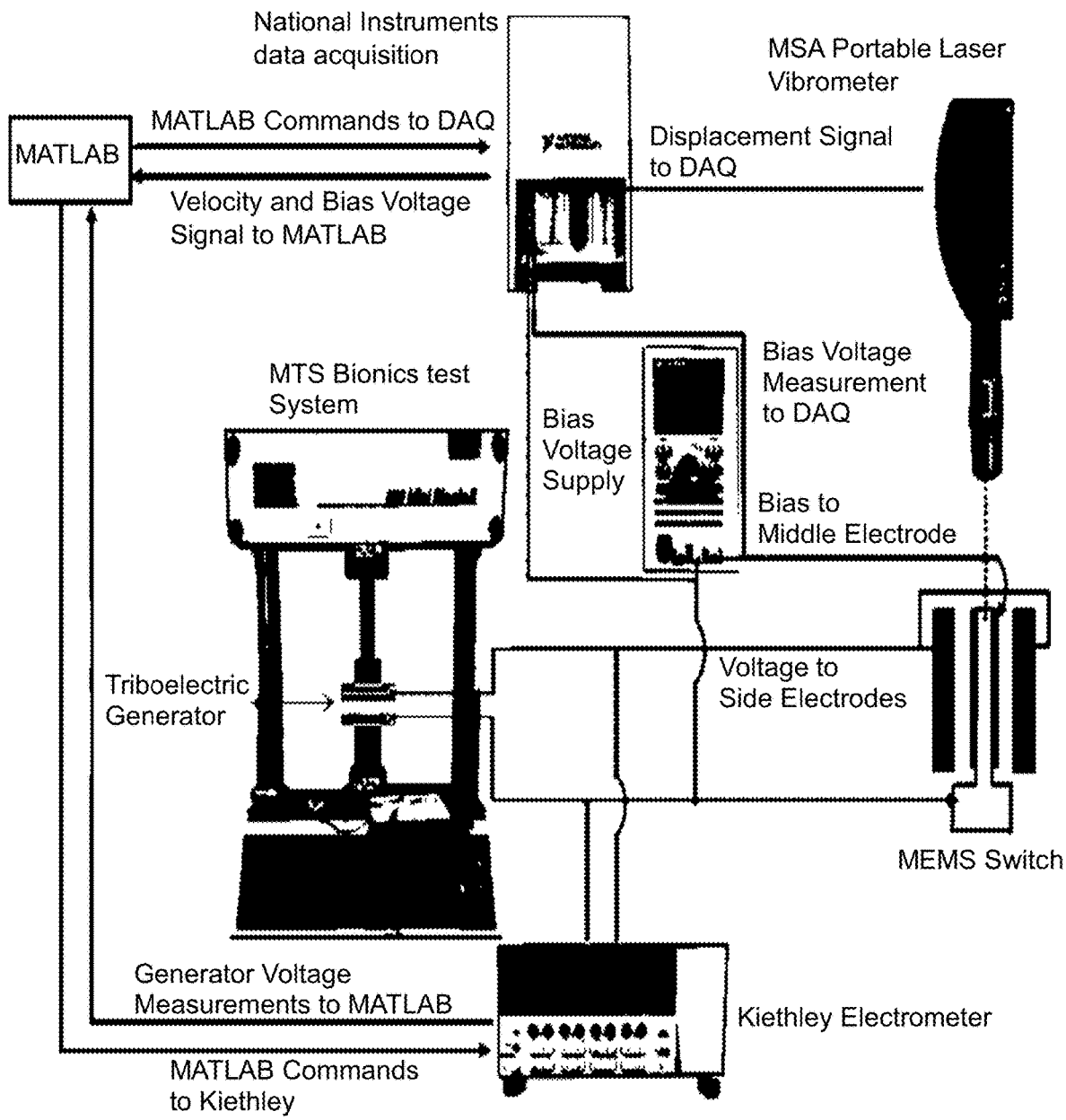
FIG. 15b shows a second experimental setup.

A schematic for the experimental setup is shown in FIG. 15a. An alternate setup is shown in FIG. 15b. The cantilevers are placed in air, and the tip displacement is measured with a Polytec MSA-500 Laser Vibrometer interfaced with MATLAB through a National Instruments USB 6366 Data Acquisition (DAQ). A B&K Precision 9110 power supply and a Krohn-Hite 7600 Wideband Power Amplifier supply the bias and side electrode voltage, respectively. The bias voltage is measured directly with the DAQ; however, the side voltage is well over the 10 V limitation of the DAQ and is measured with a Keithley 6514 electrometer, which is also controlled with MATLAB.

In the experiment, a bias voltage is applied to the middle electrode to start the beam in its pulled-in position. The bias is then adjusted to a specified level and held constant before a series of short, high voltage pulses are applied to the side electrodes. The beam displacement is observed to determine whether the beam was released during the voltage pulses. A relationship between bias voltage and release side voltage is obtained to demonstrate the working principle of the repulsive switch.

Figure 15C:
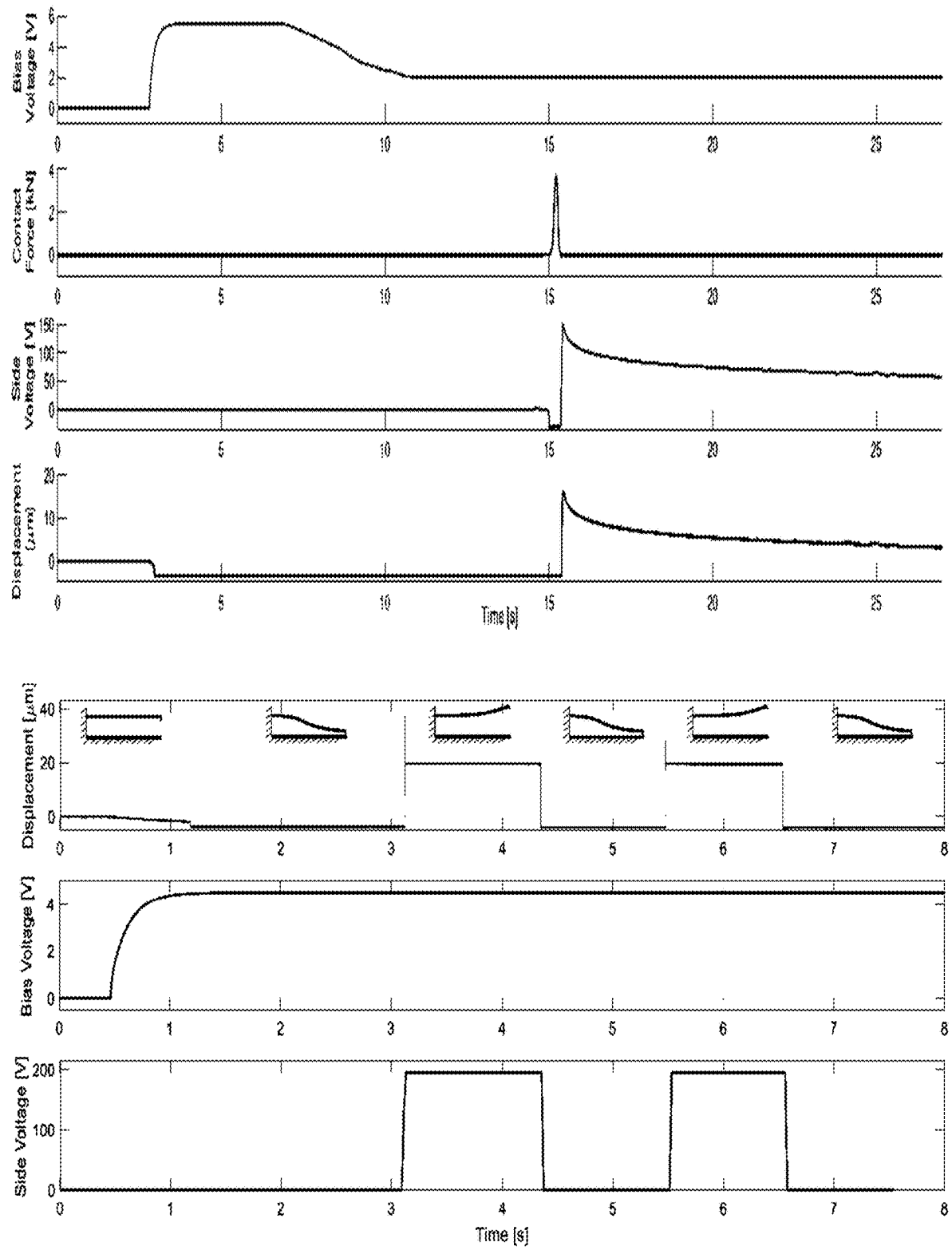
FIG. 15c shows experimental data derived from the second experimental setup.

FIG. 15c shows the recorded switch motion and applied voltages. The bias voltage is initially set at 0 V, increased to the pull-in voltage of 4.5 V, and then held constant. As the bias voltage ramps up, the beam is pulled down slightly before suddenly becoming unstable and collapsing, which can be observed at approximately 1.2 s. Two pulses of 195 V are applied to the sides after the beam is in the pulled-in position. The cantilever releases during both pulses, which can be observed jumping 20 µm in the displacement signal. When the side voltage drops to zero, the beam immediately pulls back in and sticks to the substrate. The beam can be toggled to and from pull-in many times without failure or causing noticeable damage to the device by applying and removing a voltage on the side electrodes. The bias voltage determines the minimum side voltage needed to open the switch.

FIG. 3B shows the electrostatic force on the beam versus the gap distance simulated in COMSOL. The dashed area shows the attractive regime, and the rest is the repulsive regime. The combined force with bias and side voltages behaves similar to the attractive force at low gaps and the repulsive force at large gaps. Applying 10 V on the side electrodes can change the force from attractive to repulsive outside of very small gaps.

FIG. 15a shows the experimental setup with (a) Krohn-Hite 7600 Wideband Power Amplifier, (b) Keithley 6514 Electrometer, (c) B&K Precision 9110 Power Supply, (d) Polytec MSA-500 Laser Vibrometer, (e) NI USB 6366 Data Acquisition, and (f) the MEMS repulsive switch. The DAQ and electrometer are interfaced with MATLAB.

The experiment was repeated by adjusting the bias voltage and determining the associated release voltage. FIG. 3C shows the release voltage for various bias levels. For biases that are less than the 4.5 V pull-in voltage, first pull-in is initiated at 4.5 V, and then, the bias is reduced to the specified level. When the bias voltage is removed completely, the beam continues to stick to the middle electrode, and 70 V is required to release the beam. At the pull-in voltage, 195 V is needed for release. Because of limitations with the PolyMUMPs chips, voltages above 200 V were not applied.

FIG. 3C demonstrates that the release voltage can be adjusted by changing the bias voltage. This is useful for a MEMS switch, which can be tuned to open at different threshold voltage levels. If paired with a transducer that is converting mechanical energy to electrical energy, the entire system can be designed to trigger the opening of a switch when the input passes a threshold.24 In addition to the tunability, it also can act as a normally closed switch, which is not possible with a standard two-electrode parallel plate configuration.

FIG. 15c bottom, shows measured beam-tip displacement, bias voltage, and side voltage versus time. The beam pulls in as the bias voltage ramps up to 4.5 V and is released by supplying 195 V on the side. The illustrations at the top of the displacement signal roughly show the profile of the beam during each phase of the experiment.

A MEMS cantilever is experimentally released from its pulled-in position using electrostatic levitation. This method provides a safe and effective way of releasing and reusing pulled-in MEMS beams, which would have otherwise been permanently stuck to the substrate, rendering them unusable.

Example 5—Triboelectric Generator

Several types of transducers have been used to convert mechanical energy to electrical energy including electromagnetic, piezoelectric, electrostatic and triboelectric generators. Recent advances in triboelectric generation show energy conversion efficiency of ~60% and higher energy densities compared with other transducers. The prefix "tribo" comes from the Greek word for "rub" and more friction generates more electricity. That triboelectricity is contact-induced electrification and has been known for thousands of years, but just recently with the development of micro-patterned surfaces, it has been employed to convert wasted mechanical energy into electrical energy. Despite plenty of research on triboelectric material, there is little research that models the correlation of vibration and triboelectric mechanism. Our team was among the first who discovered the coupled characteristics of triboelectricity and mechanical vibrations. These generators have the advantages of low-cost, high energy density, and flexibility. Two recent studies proposed a triboelectric accelerometer for monitoring the health of railways, in-plane sliding acceleration and motion tracking of a ball.

The triboelectric generators produce surface charges when two materials with opposite electron affinities contact each other. Although the contacting materials can be two polymers, the system works best when contacting materials consists of a polymer and a conductor. The high output energy density of triboelectric generators is attributed to several factors including: (i) the use of surface patterning to increase contacting areas of the polymer and conductor and to generate more surface charges; (ii) the use of a deformable polymer as one of the triboelectric materials to ensure conformal contact. Continuous contact and separation simultaneously create contact electrification and electrostatic induction, which creates a large potential difference or open circuit voltage.

The contact surfaces can be made of a polymer, e.g. polydimethylsiloxane (PDMS) layer and a conductor, e.g. aluminum. Another Al layer covers the back of the PDMS layer. The charge generated on the surfaces is directly proportional to the area of the contact. The key to generating more charges is to make micro-textured surfaces. This leads to a larger contact area, more friction at the microsurfaces and consequently more charges and larger output voltage.

Upon applied mechanical pressure, the Al layer is pressed against the PDMS surface. Because of its flexibility, the PDMS layer fills the gaps between the patterns. The micro-textured surface penetration causes equal but opposite charges to accumulate on both surfaces as electrons are injected into the PDMS from the top Al layer. The triboelectric effect here is not due to macroscopic sliding, but mostly from macroscopic compression, which leads to microscopic sliding. Upon release, the load is removed, and the layers separate as the top surface comes back to its initial position because of the restoring force of an external spring. There will be a large electrical potential difference between the two Al conductors that can directly be used to drive an electrostatic actuator.

Despite the high voltage that triboelectric generators produce, the current generated by these generators is very low in the nano and micro-amp ranges (high impedance generator). This drawback makes powering an electrical circuit difficult. The high voltage creates a strong electrostatic field that could be useful for running electrostatic devices.

To overcome the limitations of the typical two-electrode parallel-plate configuration, electrostatic levitation may be employed, where there are four electrodes: a beam above a center electrode and two side electrodes (FIG. 1). The beam and center electrodes are often grounded or have similar voltages, and the side electrodes have voltages. The electrostatic field of the side electrodes on the beam electrode is asymmetric. That means the top of the beam experiences a stronger electrostatic field than the bottom of the beam (FIG. 12). This property creates a force on the beam pushing it away from the substrate (levitation force). This levitation force is in the opposite direction of the substrate, unlike the conventional two parallel-plate electrodes where the electrostatic force is toward the substrate. This attribute eliminates the pull-in instability. Free of instability danger, the beam vibrates at distances away from the substrate, and is not limited to one-third of the capacitor gap, the common limitation of conventional parallel-plate capacitors. Beams with levitation actuation can vibrate up to 24 microns peak to peak despite the nominal capacitor gap of 2 microns. This is possible because when the beam is excited by DC and AC voltage, it can move to its equilibrium position corresponding to the DC voltage that is 12 microns above the substrate. If the AC voltage is adequately increased, the beam vibrates 24 microns peak to peak before hitting the substrate.

The dynamic behavior of levitation actuators is highly nonlinear.

The bias voltage on the bottom center electrode determines the minimum side voltage needed to open the switch. When the bias voltage is removed completely, the beam continues to stick to the middle electrode and a relatively low voltage of 70 V is required to release the beam (open the switch).

FIGS. 36a-36f shows measurements of (FIG. 36a) impact force (FIG. 36b) generator voltage (FIG. 36c) beam velocity using laser vibrometer after the drop of a one-pound weight and (FIG. 36d) impact force (FIG. 36e) generator voltage (FIG. 36f) beam velocity using laser vibrometer after the generator electrodes are shorted. In all cases, the side electrodes are connected to the generator while the beam and the center bottom electrodes are grounded.

The triboelectric generator controls the levitation actuator. Once the impact occurs, the voltage magnitude steps up quickly and the beam begins to move, see FIGS. 36a-36c. Once the voltage flattens out, the velocity dies down as the beam settles to its new equilibrium position. To verify the change of voltage has moved the beam to a new location, the generator is shorted at approximately 12 s, the voltage drops to zero and the beam experiences a sharp velocity spike corresponding to the beam falling back to its undeflected position, see FIGS. 36d-36f. Such controlling capability is a unique property of the electrostatic levitation and is not possible with conventional two parallel-plate electrodes. If such a voltage was connected to conventional parallel-plate electrodes, the actuator would always collapse from pull-in instability. The high voltage of the generator could permanently damage and burn the MEMS actuator. The levitation mechanism connected to the triboelectric generator enables a sensor to respond directly to impact, which significantly simplifies the sensing circuitry and saves costs.

Figure 37:
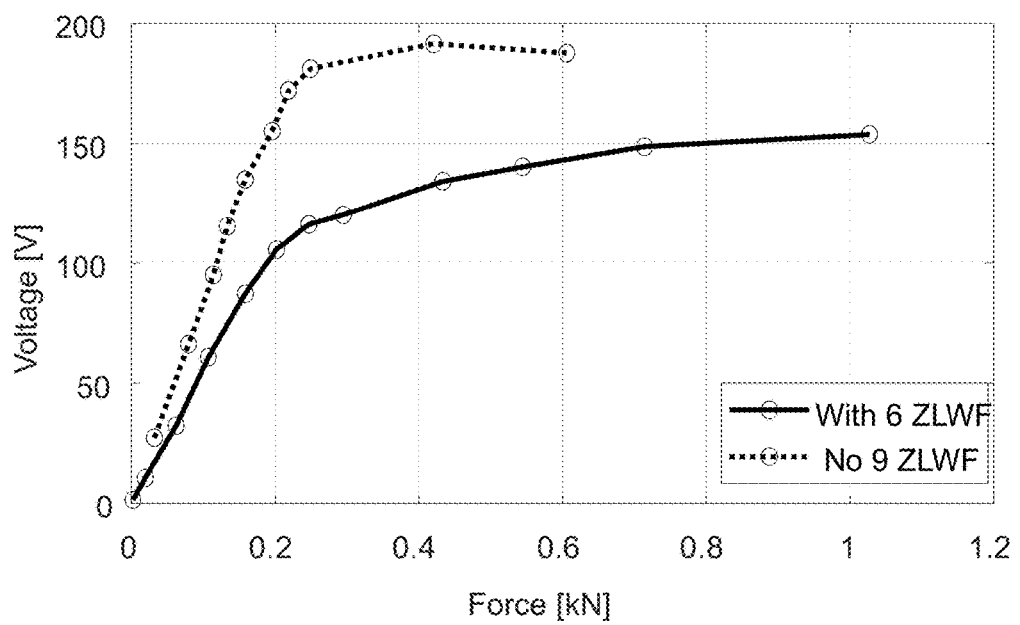
FIG. 37 shows the open circuit voltage profiles as the contact force varies are different when the switch is connected.

The output of the generator changes when connected to an actuator, although they are connected with an open circuit. As shown in FIG. 37, The generator is capable of outputting almost 200 V when disconnected from the beam. As the force increases up to approximately 200 N there is a linear relationship between force and voltage. After 200 N, the voltage begins to saturate. The voltage the generator produces is affected by the presence of the switch. When the switch is connected, the output voltage saturates around 150 V instead of 190 V. This difference changes the performance of the switch and is an important attribute of the gener-actuator because it defines at what impact force the switch opens. This difference may be the result of nonlinear coupling characteristics between the induced charge of the generator and the dynamics of the switch.

Further embodiments can be envisioned to one of ordinary skill in the art from the specification and figures. In other embodiments, combinations or sub-combinations of the above-disclosed invention can be advantageously made. The specification and drawings are, accordingly, to be regarded in an illustrative rather than a restrictive sense. It will, however, be evident that various modifications and changes may be made thereunto without departing from the broader spirit and scope of the invention as set forth in the claims.

REFERENCES

[1] Younis, M. I., 2011. MEMS Linear and Nonlinear Statics and Dynamics. Springer, New York.
[2] Miles, R. N., Robert, D., and Hoy, R. R., 1995. "Mechanically coupled ears for directional hearing in the parasitoid fly *Ormia ochracea*.". The Journal of the Acoustical Society of America, 98(6), pp. 3059-3070.
[3] Ibrahim, M. I., and Younis, M. I., 2009. "Enhancing the sensitivity of a resonant accelerometer". 2008 Proceedings of the ASME International Mechanical Engineering Congress and Exposition (11), pp. 241-247.
[4] Miles, R. N., Cui, W., Su, Q. T., and Homentcovschi, D., 2015. "A MEMS low-noise sound pressure gradient microphone with capacitive sensing". Journal of Microelectromechanical Systems, 24(1), pp. 241-248.
[5] Ramini, A., Younis, M., and Su, Q., 2013. "A low-g electrostatically actuated resonant switch". Smart Materials and Structures, 22(2), p. 025006 (13 pp.).
[6] Ouakad, H. M., and Younis, M. I., 2013. "Modeling the structural-thermal-electrical coupling in an electrostatically actuated mems switch and its impact on the switch stability". Mathematical Problems in Engineering, 2013.
[7] Jia, Y., Yan, J., Soga, K., and Seshia, A., 2013. "Parametrically excited MEMS vibration energy harvesters with design approaches to overcome the initiation threshold amplitude". Journal of Micromechanics and Microengineering, 23(11), p. 114007.
[8] Jia, Y., and Seshia, A. A., 2014. "An auto-parametrically excited vibration energy harvester". Sensors & Actuators: A. Physical, 220, pp. 69-75.
[9] Park, J. C., Park, J. Y., and Lee, Y. P., 2010. "Modeling and characterization of piezoelectric d33-Mode MEMS energy harvester". Journal of Microelectromechanical Systems, 19(5), pp. 1215-1222.
[10] Jamain, U. M., Ibrahim, N. H., and Rahim, R. A., 2014. "Performance analysis of zinc oxide piezoelectric MEMS energy harvester". IEEE International Conference on Semiconductor Electronics, Proceedings, ICSE(4), pp. 263-266.
[11] Saadon, S., and Wahab, Y., 2015. "From Ambient Vibrations To Green Energy Source: MEMS Piezoelectric Energy Harvester for Low Frequency Application". pp. 59-63.
[12] Huang, F., Fouladi, S., and Mansour, R., 2011. "A novel MEMS-based tunable dielectric resonator filter". IEEE MTT-S International Microwave Symposium Digest, pp. 2-5.
[13] Hammad, B. K., Abdel-Rahman, E. M., and Nayfeh, A. H., 2010. "Modeling and analysis of electrostatic MEMS filters". Nonlinear Dynamics, 60(3), pp. 385-401.
[14] Shen, S., and Young, S., 2002. "Design and fabrication of a MEMS filter bank for hearing aids applications". 2nd Annual International IEEE-EMBS Special Topic Conference on Microtechnologies in Medicine and Biology. Proceedings, pp. 352-355.
[15] Ahmadi, M., and Jullien, G. A., 2000. "Programmable mems". pp. 522-525.
[16] Bouchaala, A., Jaber, N., Shekhah, O., Chernikova, V., Eddaoudi, M., and Younis, M., 2016. "A smart microelectromechanical sensor and switch triggered by gas". Applied Physics Letters, 109(1), p. 013502 (4 pp.).
[17] Jaber, N., Ilyas, S., Shekhah, O., Eddaoudi, M., and Younis, M. I., 2018. "Resonant gas sensor and switch operating in air with metal-organic frameworks coating". Journal of Microelectromechanical Systems.
[18] Lee, K. B., and Cho, Y. H., 2001. "Laterally driven electrostatic repulsive-force microactuators using asymmetric field distribution". Journal of Microelectromechanical Systems, 10(1), pp. 128-136.
[19] Sugimoto, T., Nonaka, K., and Horenstein, M. N., 2005. "Bidirectional electrostatic actuator operated with charge control". Journal of Microelectromechanical Systems, 14(4), pp. 718-724.
[20] Liu, Zengtao, Myongseob Kim, Nick Shen, and Edwin C. Kan. "Novel electrostatic repulsion forces in MEMS applications by nonvolatile charge injection." In Technical Digest. MEMS 2002 IEEE International Conference. Fifteenth IEEE International Conference on Micro Electro Mechanical Systems (Cat. No. 02CH37266), pp. 598-601. IEEE, 2002.
[21] He, S., and Ben Mrad, R., 2005. "Large-stroke microelectrostatic actuators for vertical translation of micromirrors used in adaptive optics". IEEE Transactions on Industrial Electronics, 52(4), pp. 974-983.
[22] He, S., and Ben Mrad, R., 2008. "Design, modeling, and demonstration of a MEMS repulsive-force out-of-plane electrostatic micro actuator". Journal of Microelectromechanical Systems, 17(3), pp. 532-547.
[23] He, S., and Ben Mrad, R., 2009. "Development of a multilevel repulsive force out-of-plane micro electrostatic actuator". IECON Proceedings (Industrial Electronics Conference), pp. 4020-4023.

[24] Chong, J., He, S., and Ben Mrad, R., 2010. "Control of a surface micromachined repulsive-force driven 2D micromirror". IEEE/ASME International Conference on Advanced Intelligent Mechatronics, AIM, pp. 1005-1007.

[25] Fan, C., and He, S., 2015. "A Two-Row InterdigitatingFinger Repulsive-Torque Electrostatic Actuator and Its Application to Micromirror Vector Display". Journal of Microelectromechanical Systems, 24(6), pp. 2049-2061.

[26] Li, G., Guo, X., Zhao, Q., and Hu, J., 2015. "An Electrostatic Repulsive-Force Based Micro Actuator for Capacitive RF MEMS Switch". pp. 1095-1098.

[27] Qiao, D. Y., Yuan, W. Z., and Li, X. Y., 2006. "Design of an electrostatic repulsive-force based vertical micro actuator". Proceedings of 1st IEEE International Conference on Nano Micro Engineered and Molecular Systems, 1st IEEE NEMS (90407020), pp. 168-171.

[28] Pallay, M., Daeichin, M., and Towfighian, S., 2016. "Dynamic Behavior of an Electrostatic MEMS Resonator with Repulsive Actuation". Nonlinear Dynamics, 89(2), pp. 1525-1538.

[29] Pallay, M., and Towfighian, S., 2017-67381. "Parametric Excitation of a Repulsive Force Actuator". Proceedings of the ASME 2017 International Design Engineering Technical Conferences, Aug. 6-9, 2017, Cleveland, OH, USA, DETC2017-67381, 7 pages.

[30] Ozdogan, M., Daeichin, M., Ramini, A., and Towfighian, S., 2017. "Parametric Resonance of a Repulsive Force MEMS Electrostatic Mirror". Sensors and Actuators A Physical (2017) in press.

[31] Dhakar, L., Tay, F., and Lee, C., 2015. "Broadband vibration energy harvesting using triboelectric mechanism". In International Conference on Experimental Mechanics 2014, International Society for Optics and Photonics, pp. 93021H-93021H.

[32] Du, W., Han, X., Lin, L., Chen, M., Li, X., Pan, C., and Wang, Z. L., 2014. "A three dimensional multi-layered sliding triboelectric nanogenerator". Advanced Energy Materials, 4(11).

[33] Xie, Y., Wang, S., Niu, S., Lin, L., Jing, Q., Yang, J., Wu, Z., and Wang, Z. L., 2014. "Grating-structured freestanding triboelectric-layer nanogenerator for harvesting mechanical energy at 85% total conversion efficiency". Advanced Materials, 26(38), pp. 6599-6607.

[34] Zhu, G., Pan, C., Guo, W., Chen, C.-Y., Zhou, Y., Yu, R., and Wang, Z. L., 2012. "Triboelectric-generator-driven pulse electrodeposition for micropatterning". Nano letters, 12(9), pp. 4960-4965.

[35] Niu, S., Liu, Y., Wang, S., Lin, L., Zhou, Y. S., Hu, Y., and Wang, Z. L., 2013. "Theory of sliding-mode triboelectric nanogenerators". Advanced Materials, 25(43), pp. 6184-6193.

[36] Zhang, C., Zhou, T., Tang, W., Han, C., Zhang, L., and Wang, Z. L., 2014. "Rotating-disk-based direct-current triboelectric nanogenerator". Advanced Energy Materials, 4(9).

[37] Zhu, G., Chen, J., Zhang, T., Jing, Q., and Wang, Z. L., 2014. "Radial-arrayed rotary electrification for high performance triboelectric generator". Nature communications, 5.

[38] Lin, L., Wang, S., Niu, S., Liu, C., Xie, Y., and Wang, Z. L., 2014. "Noncontact free-rotating disk triboelectric nanogenerator as a sustainable energy harvester and self-powered mechanical sensor". ACS applied materials & interfaces, 6(4), pp. 3031-3038.

[39] Zhang, H., Yang, Y., Zhong, X., Su, Y., Zhou, Y., Hu, C., and Wang, Z. L., 2013. "Single-electrode-based rotating triboelectric nanogenerator for harvesting energy from tires". Acs Nano, 8(1), pp. 680-689.

[40] Ibrahim, A., Ramini, A., and Towfighian, S., 2018. "Experimental and theoretical investigation of an impact vibration harvester with triboelectric transduction". Journal of Sound and Vibration, 416, pp. 111-124.

[41] Rao, S. S., 2010. Mechanical Vibrations, Vol. 67. Pearson Prentice Hall.

[42] Williams, J. A., and H. R. Le. "Tribology and MEMS." Journal of Physics D: Applied Physics 39, no. 12 (2006): R201.

[43] S. Sundaram, M. Tormen, B. Timotijevic, R. Lockhart, T. Overstolz, R. P. Stanley, H. R. Shea, Vibration and shock reliability of MEMS: modeling and experimental validation, J. Micromech. Microeng. 21 (2011) 045022.

[44] M. I. Younis, Mems Linear and Nonlinear Statics and Dynamics (Springer, New York, 2011).

[45] A. Alneamy, M. Al-Ghamdi, S. Park, M. Khater, E. AbdelRahman, and G. Heppler, Journal of Applied Physics 125, 024305 (2019).

[46] M. Al-Ghamdi, M. Khater, and E. Abdel-Rahman, Applied Physics Letters 113, 153501 (2018).

[47] M. A. Rosa, M. A. Bruyker, A. R. Volkel, E. Peeters, and J. Dunec, Journal of Micromechanics and Microengineering 14, 446 (2004).

[48] Q. Chen, Y.-C. Lai, J. Chae, and Y. Do, Physical Review B 87, 144304 (2013).

[49] Y. Linzon, B. Ilic, S. Lulinsky, and S. Krylov, Journal of Applied Physics 113 (2013), 10.1063/1.4802680. [50] R. N. Miles, IEEE Sensors 18, 5691 (2018).

[51] K. B. Lee and Y. H. Cho, Journal of Microelectromechanical Systems 10, 128 (2001).

[52] S. He and R. Ben Mrad, IEEE Transactions on Industrial Electronics 52, 974 (2005).

[53] C. Fan and S. He, Journal of Microelectromechanical Systems 24, 2049 (2015).

[54] M. Pallay, M. Daeichin, and S. Towfighian, Nonlinear Dynamics 89, 1525 (2017).

[55] M. Pallay and S. Towfighian, Sensors and Actuators A: Physical 277, 134 (2018).

[56] M. Ozdogan, M. Daeichin, A. Ramini, and S. Towfighian, Sensors and Actuators A Physical, 265, 20 (2017).

[57] M. Pallay and S. Towfighian, Applied Physics Letters 113, 213102 (2018).

[58] A. Cowen, B. Hardy, R. Mahadevan, and S. Wilcenski, "PolyMUMPs Design Handbook a MUMPsfi process," (2011).

[59] Park, S.-J. et al. Surface Engineering of Triboelectric Nanogenerator with an Electrodeposited Gold Nanoflower Structure. Sci. Rep. 5, 13866; doi: 10.1038/srep13866 (2015).

[60] Meysam Daeichin, Mehmet Ozdogan, Shahrzad Towfighian, Ronald Miles, "Dynamic response of a tunable MEMS accelerometer based on repulsive force", Sensors and Actuators A 289 (2019) 34-43.

[61] D. W. Burns, J. D. Zook, R. D. Horning, W. R. Herb, H. Guckel, Sealed-cavity resonant microbeam pressure sensor, Sens. Actuators A: Phys. 48 (3) (1995) 170-186.

[62] O. J. Woodman, An Introduction to Inertial Navigation, University of Cambridge, 2007, pp. 696.

[63] W. D. Cowan, M. K. Lee, B. M. Welsh, V. M. Bright, M. C. Roggemann, Surface micromachined segmented mirrors for adaptive optics, IEEE J. Select. Top. Quantum Electron. 5 (1) (1999) 90-101.

[64] M. I. Younis, MEMS Linear and Nonlinear Statics and Dynamics, vol. 20, Springer, New York, USA, 2011.

[65] G. N. Nielson, G. Barbastathis, Dynamic pull-in of parallel-plate and torsional electrostatic MEMS actuators, J. Microelectromech. Syst. 15 (4) (2006) 811-821.

[66] R. N. Miles, W. Cui, Q. T. Su, D. Homentcovschi, A MEMS low-noise sound pressure gradient microphone with capacitive sensing, J. Microelectromech. Syst. 24 (2015) 241-248.

[67] S. Towfighian, A. Seleim, E. Abdel-Rahman, G. Heppler, A large-stroke electrostatic micro-actuator, J. Micromech. Microeng. 21 (7) (2011) 075023.

[68] S. He, R. Ben Mrad, Large-stroke microelectrostatic actuators for vertical translation of micromirrors used in adaptive optics, IEEE Trans. Ind. Electron. 52 (4) (2005) 974-983.

[69] S. He, R. Ben Mrad, Design, modeling, and demonstration of a MEMS repulsive-force out-of-plane electrostatic micro actuator, J. Microelectromech. Syst. 17 (3) (2008) 532-547.

[70] J. Zhou, R. N. Miles, S. Towfighian, A novel capacitive sensing principle for microdevices, in: ASME 2015 International Design Engineering Technical Conferences and Computers and Information in Engineering Conference, American Society of Mechanical Engineers, 2015.

[71] S. Sundaram, M. Tormen, B. Timotijevic, R. Lockhart, T. Overstolz, R. P. Stanley, H. R. Shea, Vibration and shock reliability of MEMS: modeling and experimental validation, J. Micromech. Microeng. 21 (2011) 045022.

[72] K. B. Lee, Y.-H. Cho, Laterally driven electrostatic repulsive-force microactuators using asymmetric field distribution, J. Microelectromech. Syst. 10 (1) (2001) 128-136.

[73] S. He, R. Ben Mrad, Development of a bi-directional micro electrostatic comb actuator for optical MEMS devices, in: Proceedings of the SPIE Opto-Canada Conference, Ottawa, Canada, May 9-10, 2002.

[74] S. He, R. Ben Mrad, Development of a novel translation micromirror for adaptive optics, Proceedings of SPIE—The International Society for Optical Engineering (October 2003).

[75] M. Pallay, M. Daeichin, S. Towfighian, Dynamic behavior of an electrostatic MEMS resonator with repulsive actuation, Nonlinear Dyn. 89 (2) (2017) 1525-1538.

[76] M. Ozdogan, M. Daeichin, A. Ramini, S. Towfighian, Parametric resonance of a repulsive force MEMS electrostatic mirror, Sens. Actuators A: Phys. 265 (2017) 20-31.

[77] M. Pallay, S. Towfighian, A parametric electrostatic resonator using repulsive force, Sens. Actuators A: Phys. 277 (2018) 134-141.

[78] D. S. Eddy, R. dougLas, Sparks, Application of MEMS technology in automotive sensors and actuators, Proc. IEEE 86 (8) (1998) 1747-1755.

[79] A. Ibrahim, M. I. Younis, Simple fall criteria for MEMS sensors: data analysis and sensor concept, Sensors (2014) 12149-12173.

[80] M. I. Younis, F. M. Alsaleem, R. Miles, Q. Su, Characterization for the performance of capacitive switches activated by mechanical shock, J. Micromech. Microeng. (2011) 1360-1370.

[81] J. B. Starr, Squeeze-film damping in solid-state accelerometers, Proceeding of the IEEE Solid-State Sensor and Actuator Workshop (1990).

[82] J. J. Blech, On isothermal squeeze films, J. Lubric. Technol. (1983) 615-620.

[83] W. S. Griffin, H. H. Richardson, S. Yamanami, A study of fluid squeeze-film damping, J. Basic Eng. (1966) 451-456.

[84] P. French, Polysilicon: a versatile material for microsystems, Sens. Actuators A: Phys. 99 (1) (2002) 3-12.

[85] W. Cui, Analysis, Design and Fabrication of a Novel Silicon Microphone, Ph.D. Dissertation, SUNY Binghamton, 2004.

[86] A. H. Nayfeh, B. Balachandran, Applied Nonlinear Dynamics, Wiley, Virginia, USA, 2007.

[87] R. H. Olsson, K. E. Wojciechowski, M. S. Baker, M. R. Tuck, J. G. Fleming, Post-CMOS-compatible aluminum nitride resonant MEMS accelerometers, J. Microelectromech. Syst. 18 (3) (2009).

[88] H. Luo, G. Zhang, L. R. Carley, G. K. Fedder, A post-CMOS micromachined lateral accelerometer, J. Microelectromech. Syst. 11 (3) (2002) 188-195.

[89] Aksyuk, V. A., F. Pardo, D. Carr, D. Greywall, H. B. Chan, M. E. Simon, A. Gasparyan et al. "Beam-steering micromirrors for large optical cross-connects." Journal of lightwave technology 21, no. 3 (2003): 634.

[90] Chao, Fan, Siyuan He, James Chong, Ridha Ben Mrad, and Lei Feng. "Development of a micromirror based laser vector scanning automotive HUD." In 2011 IEEE International Conference on Mechatronics and Automation, pp. 75-79. IEEE, 2011.

[91] Chiou, Jin-Chem, Chin-Fu Kou, and Yung-Jiun Lin. "A micromirror with large static rotation and vertical actuation." IEEE Journal of selected topics in Quantum Electronics 13, no. 2 (2007): 297-303.

[92] Cho, Il-Joo, and Euisik Yoon. "A low-voltage three-axis electromagnetically actuated micromirror for fine alignment among optical devices." Journal of Micromechanics and Microengineering 19, no. 8 (2009): 085007.

[93] Chong, James, Siyuan He, and Ridha Ben Mrad. "Control of a surface micromachined repulsive-force driven 2D micromirror." In 2010 IEEE/ASME International Conference on Advanced Intelligent Mechatronics, pp. 1005-1007. IEEE, 2010.

[94] Chong, James, Siyuan He, and Ridha Ben Mrad. "Development of a vector display system based on a surface-micromachined micromirror." IEEE Transactions on Industrial Electronics 59, no. 12 (2011): 4863-4870.

[95] Cowen, Allen, Busbee Hardy, Ramaswamy Mahadevan, and Steve Wilcenski. "PolyMUMPs design handbook." MEMSCAP Inc.: Durham, NC, USA (2011).

[96] Fan, Chao, and Siyuan He. "A microelectrostatic repulsive-torque rotation actuator with two-width fingers." Journal of Micromechanics and Microengineering 25, no. 9 (2015): 095006.

[97] Fan, Chao, and Siyuan He. "A two-row interdigitating-finger repulsive-torque electrostatic actuator and its application to micromirror vector display." Journal of Microelectromechanical Systems 24, no. 6 (2015): 2049-2061.

[98] Fan, Chao, and Siyuan He. "Micromirror based virtual image automotive head-up display." Microsystem Technologies 23, no. 6 (2017): 1671-1676.

[99] He, S., and R. Ben Mrad. "Development of a multi-level repulsive force out-of-plane micro electrostatic actuator." In 2009 35th Annual Conference of IEEE Industrial Electronics, pp. 4020-4023. IEEE, 2009.

[100] He, S., and R. Ben Mrad. "Performance assessment of a multi-level repulsive-force out-of-plane microelectrostatic actuator." Canadian Journal of Electrical and Computer Engineering 31, no. 2 (2006): 71-75.

[101] He, S., R. Ben Mrad, and J. Chong. "Repulsive-force out-of-plane large stroke translation micro electrostatic actuator." Journal of Micromechanics and Microengineering 21, no. 7 (2011): 075002.

[102] He, Siyuan, and John S. Chang. "Experimental verification of an out-of-plane repulsive-force electrostatic actuator using a macroscopic mechanism." Microsystem Technologies 15, no. 3 (2009): 453-461.

[103] He, Siyuan, and R. Ben Mrad. "Large-stroke microelectrostatic actuators for vertical translation of micromirrors used in adaptive optics." IEEE Transactions on Industrial Electronics 52, no. 4 (2005): 974-983.

[104] He, Siyuan, and Ridha Ben Mrad. "Bi-directional actuator utilizing both attractive and repulsive electrostatic forces." U.S. Pat. No. 7,705,514, issued Apr. 27, 2010.

[105] He, Siyuan, and Ridha Ben Mrad. "Design, modeling, and demonstration of a MEMS repulsive-force out-of-plane electrostatic micro actuator." Journal of Microelectromechanical Systems 17, no. 3 (2008): 532-547.

[106] He, Siyuan, and Ridha Ben Mrad. "Development of a novel translation micromirror for adaptive optics." In Optomechatronic Systems IV, vol. 5264, pp. 154-161. International Society for Optics and Photonics, 2003.

[107] He, Siyuan, and Ridha Ben Mrad. "Repulsive force actuated rotary micromirror." In Optomechatronic Sensors, Actuators, and Control, vol. 5602, pp. 12-18. International Society for Optics and Photonics, 2004.

[108] He, Siyuan, R. Ben Mrad, and J. S. Chang. "Development of a high-performance microelectrostatic repulsive-force rotation actuator." Journal of Microelectromechanical Systems 19, no. 3 (2010): 561-569.

[109] Hu, Fangrong, Jun Yao, Chuankai Qiu, and Hao Ren. "A MEMS micromirror driven by electrostatic force." Journal of Electrostatics 68, no. 3 (2010): 237-242.

[110] Hu, Fangrong, Weiming Wang, and Jun Yao. "An electrostatic MEMS spring actuator with large stroke and out-of-plane actuation." Journal of Micromechanics and Microengineering 21, no. 11 (2011): 115029.

[111] Hu, Fangrong, Yalu Tang, and Yixian Qian. "Design of a MEMS micromirror actuated by electrostatic repulsive force." Optik-International Journal for Light and Electron Optics 123, no. 5 (2012): 387-390.

[112] Ikeda, Koichi. "Electrostatic drive type MEMS device and manufacturing method thereof, optical MEMS device, light modulation device, GLV device, and laser display." U.S. Pat. No. 7,116,462, issued Oct. 3, 2006.

[113] Kim, Yong-Sik, Nicholas G. Dagalakis, and Satyandra K. Gupta. "Creating large out-of-plane displacement electrothermal motion stage by incorporating beams with step features." Journal of Micromechanics and Microengineering 23, no. 5 (2013): 055008.

[114] Lee, Ki Bang, and Young-Ho Cho. "Laterally driven electrostatic repulsive-force microactuators using asymmetric field distribution." Journal of microelectromechanical systems 10, no. 1 (2001): 128-136.

[115] Li, Gang, Xingjun Guo, Qinghua Zhao, Jie Hu, Pengwei Li, Wendong Zhang, and Chaoqun Cheng. "An electrostatic repulsive-force based micro actuator for capacitive RF MEMS switch." In 2015 IEEE 15th International Conference on Nanotechnology (IEEE-NANO), pp. 1095-1098. IEEE, 2015.

[116] Linzon, Yoav, Bojan Ilic, Stella Lulinsky, and Slava Krylov. "Efficient parametric excitation of silicon-on-insulator microcantilever beams by fringing electrostatic fields." Journal of Applied Physics 113, no. 16 (2013): 163508.

[117] Liu, Zengtao, Myongseob Kim, Nick Yu-Min Shen, and Edwin C. Kan. "Actuation by electrostatic repulsion by nonvolatile charge injection." Sensors and Actuators A: Physical 119, no. 1 (2005): 236-244.

[118] Milanovic, Veljko, Gabriel A. Matus, and Daniel T. McCormick. "Gimbal-less monolithic silicon actuators for tip-tilt-piston micromirror applications." IEEE journal of selected topics in quantum electronics 10, no. 3 (2004): 462-471.

[119] Miles, Ronald N., Weili Cui, Quang T. Su, and Dorel Homentcovschi. "A MEMS low-noise sound pressure gradient microphone with capacitive sensing." Journal of Microelectromechanical Systems 24, no. 1 (2014): 241-248.

[120] Ozdogan, Mehmet, Meysam Daeichin, Abdallah Ramini, and Shahrzad Towfighian. "Parametric resonance of a repulsive force MEMS electrostatic mirror." Sensors and Actuators A: Physical 265 (2017): 20-31.

[121] Pallay, Mark, and Shahrzad Towfighian. "A parametric electrostatic resonator using repulsive force." Sensors and Actuators A: Physical 277 (2018): 134-141.

[122] Pallay, Mark, and Shahrzad Towfighian. "Parametric excitation of a repulsive force actuator." In ASME 2017 International Design Engineering Technical Conferences and Computers and Information in Engineering Conference, pp. V004T09A005-V004T09A005. American Society of Mechanical Engineers, 2017.

[123] Pallay, Mark, Meysam Daeichin, and Shahrzad Towfighian. "Dynamic behavior of an electrostatic MEMS resonator with repulsive actuation." Nonlinear Dynamics 89, no. 2 (2017): 1525-1538.

[124] Qiao, Da Y., Wei Z. Yuan, and Xiao Y. Li. "Design of an electrostatic repulsive-force based vertical micro actuator." In 2006 1st IEEE International Conference on Nano/Micro Engineered and Molecular Systems, pp. 168-171. IEEE, 2006.

[125] Ren, Hao, Fenggang Tao, Weimin Wang, and Jun Yao. "An out-of-plane electrostatic actuator based on the lever principle." Journal of Micromechanics and Microengineering 21, no. 4 (2011): 045019.

[126] Rezadad, Imen, Javaneh Boroumand, Evan M. Smith, and Robert E. Peale. "Micro electro mechanical cantilever with electrostatically controlled tip contact." Applied Physics Letters 105, no. 3 (2014): 033514.

[127] Saadon, Salem, and Yufridin Wahab. "From ambient vibrations to green energy source: MEMS piezoelectric energy harvester for low frequency application." In 2015 IEEE Student Symposium in Biomedical Engineering & Sciences (ISSBES), pp. 59-63. IEEE, 2015.

[128] Schaler, Ethan W., Tarek I. Zohdi, and Ronald S. Fearing. "Thin-film repulsive-force electrostatic actuators." Sensors and Actuators A: Physical 270 (2018): 252-261.

[129] Selbrede, Martin G. "Double-electret mems actuator." U.S. Pat. No. 7,256,927, issued Aug. 14, 2007.

[130] Sugimoto, Toshiyuki, Kenichiro Nonaka, and Mark N. Horenstein. "Bidirectional electrostatic actuator operated with charge control." Journal of microelectromechanical systems 14, no. 4 (2005): 718-724.

[131] Suzuki, Yuji, Daigo Miki, Masato Edamoto, and Makoto Honzumi. "A MEMS electret generator with electrostatic levitation for vibration-driven energy-harvesting applications." Journal of Micromechanics and Microengineering 20, no. 10 (2010): 104002.

[132] Towfighian, Shahrzad, Abdulrahman Seleim, E. M. Abdel-Rahman, and G. R. Heppler. "A large-stroke electrostatic micro-actuator." Journal of Micromechanics and Microengineering 21, no. 7 (2011): 075023.

[133] Towfighian, Shahrzad, Siyuan He, and Ridha Ben Mrad. "A low voltage electrostatic micro actuator for large out-of-plane displacement." In ASME 2014 International Design Engineering Technical Conferences and Computers and Information in Engineering Conference, pp. V004T09A015-V004T09A015. American Society of Mechanical Engineers, 2014.

[134] Wang, Weimin, Fenggang Tao, Qiang Wang, Chuankai Qiu, Zexiang Chen, and Jun Yao. "A 19-element segmented MEMS deformable mirror based on electrostatic repulsive-force actuator." In MEMS Adaptive Optics VII, vol. 8617, p. 861702. International Society for Optics and Photonics, 2013.

[135] Yao, Jun, Fangrong Hu, Dongmei Cai, and Wenhan Jiang. "Design and analysis of repulsive electrostatic driven MEMS actuators." In MEMS Adaptive Optics III, vol. 7209, p. 72090K. International Society for Optics and Photonics, 2009.

[136] Zuo, Hui, and Siyuan He. "FPCB micromirror-based laser projection availability indicator." IEEE Transactions on Industrial Electronics 63, no. 5 (2016): 3009-3018.

What is claimed is:

1. A microelectromechanical actuator, comprising:
   a substrate, having a surface;
   an electrostatically displaceable conductive element, suspended over the substrate;
   a center electrode, provided on the substrate under the electrostatically displaceable conductive element; and
   a peripheral electrode provided on the substrate;
   wherein:
   the center electrode is larger than a projection of the electrostatically displaceable conductive element on the substrate, and is configured to shield the electrostatically displaceable conductive element from electrostatic forces induced by the peripheral electrode from beneath the electrostatically displaceable conductive element,
   the peripheral electrode is configured to exert an electrostatic force normal to the surface of the substrate on the electrostatically displaceable conductive element that repulses the electrostatically displaceable conductive element from the substrate, and
   the center electrode is configured to have a voltage different from a voltage on the electrostatically displaceable conductive element, to thereby induce an attractive electrostatic force on the beam.

2. The microelectromechanical actuator according to claim 1, wherein:
   the electrostatically displaceable conductive element comprises a beam having a conductive portion, freely suspended over the substrate, and having a long axis parallel to the surface of the substrate, and being displaceable along an axis normal to the surface of the substrate;
   the peripheral electrode comprises a pair of side electrodes, axisymmetric with respect to the beam, provided on the substrate, configured to exert an electrostatic force normal to the surface of the substrate on the beam, that repulses the beam from the substrate, and to exert a balanced electrostatic force on the beam in a plane of the surface of the substrate; and
   the center electrode is provided on the substrate under the beam, and is configured to shield the beam from electrostatic forces induced by the side electrodes from beneath the beam,
   and to have a voltage different from a voltage on the beam, to thereby induce an attractive electrostatic force on the beam.

3. The microelectromechanical actuator according to claim 2, wherein the beam has a first state in which the beam is pulled in to the center electrode by the attractive electrostatic force on the beam, and a second state in which the attractive electrostatic force on the beam by the center electrode sufficient to pull in the beam is overcome by the repulsive electrostatic force exerted by the side electrodes.

4. The microelectromechanical actuator according to claim 1, further comprising a triboelectric generator, configured to induce an electrostatic voltage on the peripheral electrode with respect to the center electrode, to thereby selectively overcome the attractive electrostatic force on the electrostatically displaceable conductive element induced by the center electrode,
   wherein the electrostatically displaceable conductive element has a first state in which the electrostatically displaceable conductive element is pulled in to the center electrode by the attractive electrostatic force on the electrostatically displaceable conductive element, and a second state in which the attractive electrostatic force on the electrostatically displaceable conductive element by the center electrode is overcome by the repulsive electrostatic force exerted by the peripheral electrode from activation of the triboelectric generator.

5. The microelectromechanical actuator according to claim 1, wherein the electrostatically displaceable conductive element has an inertial mass, subject to displacement by inertial forces, and wherein a voltage on at least one of the center electrode and the peripheral electrode with respect to the electrostatically displaceable conductive element is adjusted to control an inertial state which triggers pull-in of the electrostatically displaceable conductive element to the center electrode.

6. A method of actuating a microelectromechanical actuator, comprising:
   providing the microelectromechanical actuator comprising:
   a substrate having a surface,
   a conductive element, suspended over the substrate, and being electrostatically displaceable normal to the surface of the substrate,
   a center electrode, larger than a projection of the conductive element on the substrate, and is provided on the substrate under the conductive element, and
   a peripheral electrode, provided on the substrate outside the center electrode, wherein the center electrode is configured to selectively shield the conductive element from electrostatic forces induced by the peripheral electrode from beneath the conductive element, and to permit electrostatic forces induced by the peripheral electrode to interact with the conductive element from above the conductive element;
   applying an electric potential between the conductive element and the center electrode; and
   repulsing the conductive element from the substrate by applying an electric potential between the conductive element and the peripheral electrode.

7. The method according to claim 6, wherein:
   the conductive beam comprises a beam having a conductive portion, freely suspended over the substrate, and having a long axis parallel to the surface of the substrate, and being displaceable along an axis normal to the surface of the substrate;
   the center electrode is provided on the substrate under the beam;
   the peripheral electrode comprises a pair of side electrodes, disposed on either side of the center electrode, axisymmetric with respect to the beam and configured to produce an axisymmetric electrostatic force on beam; the center conductive electrode is configured to selectively shield the beam from electrostatic forces induced by the side electrodes from beneath the beam, and not to shield the beam from electrostatic forces induced by the side electrodes from above the beam; the electric potential between the beam and the center electrode is sufficient to cause pullin; and the electrostatic force on the beam induced by the pair of side electrodes repulses the beam from the substrate.

8. The method according to claim 7, wherein the beam is pulled-in to the center electrode by the center electrode by the electric potential between the beam and the center electrode, and the electrostatic force induced on the beam by the pair of side electrodes releases the beam from pull-in.

9. A method, comprising:
providing:
a substrate, having a surface;
an electrostatically displaceable conductive element an electrostatically-repositionable tip suspended over the substrate;
a center electrode, provided on the substrate under the electrostatically displaceable conductive element, and being larger than a projection of the electrostatically displaceable conductive element on the substrate; and
a peripheral electrode provided on the substrate;
displacing the electrostatically-repositionable tip away from the substrate, by applying a non-zero bias voltage potential comprising a electrostatically displaceable conductive element potential between the center electrode and the electrostatically displaceable conductive element, and a peripheral electrode potential which produces a repulsive force normal to the surface of the substrate to levitate the electrostatically displaceable conductive element away from the substrate; and
detecting a displacement of the electrostatically displaceable conductive element.

10. The method according to claim 9, wherein the peripheral electrode comprises a pair of laterally located electrodes on the substrate that together exert a laterally balanced force on the electrostatically displaceable conductive element in response to the electrostatically displaceable conductive element potential.

11. The method according to claim 9, wherein the electrostatically displaceable conductive element is displaced to contact a second surface.

12. The method according to claim 11, wherein the second surface contact is detected by electrical conduction between the electrostatically displaceable conductive element and the second surface.

13. The method according to claim 11, where the repositionable tip is displaced to contact the second surface a plurality of times at a plurality of relative positions, further comprising determining a surface profile of the second surface.

14. The method according to claim 11, wherein the repositionable tip is scanned over a portion of the second surface, and the detected displacement of the electrostatically displaceable conductive element is determined for a plurality of scan positions, to map a surface profile of the second surface.

15. The method according to claim 11, wherein contact of the repositionable tip with the second surface is determined by a piezoelectric transducer.

16. The method according to claim 11, further comprising increasing wherein the peripheral electrode potential, to thereby increase an actuator beam deflection, until the repositionable tip contacts the second surface, and determining the deflection based on the voltage potential at a time of repositionable tip contact with the second surface.

17. The method according to claim 9, wherein the peripheral electrode potential is oscillatory, and temporal characteristics of the electrostatically displaceable conductive element are determined.

18. The method according to claim 9, further comprising tuning the non-zero bias voltage to control a response of the electrostatically displaceable conductive element to the peripheral electrode potential.

19. The method according to claim 9, wherein the peripheral electrode potential is generated by a triboelectric generator.

20. The method according to claim 9, wherein the displacement of the electrostatically displaceable conductive element is oscillatory, further comprising detecting the displacement as a dynamic displacement of the electrostatically displaceable conductive element.

* * * * *